US011725022B2

(12) United States Patent
Chen et al.

(10) Patent No.: US 11,725,022 B2
(45) **Date of Patent: *Aug. 15, 2023**

(54) ORGANIC ELECTROLUMINESCENT MATERIALS AND DEVICES

(71) Applicant: Universal Display Corporation, Ewing, NJ (US)

(72) Inventors: Hsiao-Fan Chen, Lawrence Township, NJ (US); Morgan C. MacInnis, Ewing, NJ (US); Nicholas J. Thompson, Ewing, NJ (US); Tyler Fleetham, Newtown, PA (US); Jason Brooks, Philadelphia, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/211,332

(22) Filed: Dec. 6, 2018

(65) Prior Publication Data

US 2019/0119312 A1 Apr. 25, 2019

Related U.S. Application Data

(63) Continuation-in-part of application No. 15/967,732, filed on May 1, 2018.

(Continued)

(51) Int. Cl.

*H01L 51/00* (2006.01)
*C07F 15/00* (2006.01)

(Continued)

(52) U.S. Cl.

CPC ....... *C07F 15/0086* (2013.01); *H10K 85/346* (2023.02); *H10K 50/11* (2023.02);

(Continued)

(58) Field of Classification Search

CPC ...... C09K 11/06; H01L 51/5012; H10K 50/11
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |

(Continued)

FOREIGN PATENT DOCUMENTS

| | | |
|---|---|---|
| CN | 106117269 | 11/2016 |
| CN | 108299505 | 7/2018 |

(Continued)

OTHER PUBLICATIONS

Fries, F., Reineke, S.,, Statistical treatment of photoluminescence quantum yield measurements, Scientific reports, 2019, 9:15638. (Year: 2019).*

(Continued)

*Primary Examiner* — Sean M DeGuire
(74) *Attorney, Agent, or Firm* — Duane Morris LLP

(57) ABSTRACT

A compound having the following formula

Formula I (Continued)

is disclosed. The compound is useful as an emitter in OLED applications.

18 Claims, 2 Drawing Sheets

Related U.S. Application Data

(60) Provisional application No. 62/524,080, filed on Jun. 23, 2017, provisional application No. 62/524,086, filed on Jun. 23, 2017.

(51) Int. Cl.

*H10K 85/30* (2023.01)
*H10K 50/11* (2023.01)
*H10K 85/60* (2023.01)
*H10K 101/10* (2023.01)
*H10K 101/40* (2023.01)

(52) U.S. Cl.

CPC ......... *H10K 85/622* (2023.02); *H10K 85/654* (2023.02); *H10K 85/6572* (2023.02); *H10K 85/6576* (2023.02); *H10K 2101/10* (2023.02); *H10K 2101/40* (2023.02)

(56) References Cited

U.S. PATENT DOCUMENTS

| | | | |
|---|---|---|---|
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,921,915 | B2 | 7/2005 | Takiguchi et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2012/0302753 | A1 | 11/2012 | Li |
| 2013/0026909 | A1* | 1/2013 | Zeng ..................... C07F 7/0814 313/504 |
| 2015/0105556 | A1* | 4/2015 | Li ...................... C07F 15/0086 546/4 |
| 2015/0295189 | A1 | 10/2015 | Brooks |
| 2016/0072082 | A1 | 3/2016 | Brooks |
| 2017/0183368 | A1 | 6/2017 | Hara |
| 2018/0090691 | A1 | 3/2018 | Brooks |
| 2018/0305384 | A1 | 10/2018 | Chen |
| 2018/0370978 | A1 | 12/2018 | Wolohan |

FOREIGN PATENT DOCUMENTS

| | | |
|---|---|---|
| EP | 0650955 | 5/1995 |
| EP | 1725079 | 11/2006 |
| EP | 2034538 | 3/2009 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |

(56) References Cited

FOREIGN PATENT DOCUMENTS

| | | |
|---|---|---|
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2012/162488 | 11/2012 |

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electro phosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

Hamada, Yuji et al., "High Luminance in Organic Electroluminescent Devices with Bis(10-hydroxybenzo[h]quinolinato) beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

Ikeda, Hisao et al., "P-185 Low-Drive-Voltage OLEDs with a Buffer Layer Having Molybdenum Oxide," SID Symposium Digest, 37:923-926 (2006).

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).

Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).

Kido, Junji et al., 1,2,4-Triazole Derivative as an Electron Transport Layer in Organic Electroluminescent Devices, Jpn. J. Appl. Phys., 32:L917-L920 (1993).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Kwong, Raymond C. et al., "High Operational Stability of Electrophosphorescent Devices," Appl. Phys. Lett., 81(1)162-164 (2002).

Lamansky, Sergey et al., "Synthesis and Characterization of Phosphorescent Cyclometalated Iridium Complexes," Inorg Chem., 40(7):1704-1711 (2001).

Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).

Lo, Shih-Chun et al., "Blue Phosphorescence from Iridium(III) Complexes at Room Temperature," Chem. Mater., 18(21)5119-5129 (2006).

Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).

Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).

Niu, Yu-Hua et al., "Highly Efficient Electrophosphorescent Devices with Saturated Red Emission from a Neutral Osmium Complex," Chem. Mater., 17(13):3532-3536 (2005).

Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).

Okumoto, Kenji et al., "Green Fluorescent Organic Light-Emitting Device with External Quantum Efficiency of Nearly 10%," Appl. Phys. Lett., 89:063504-1-063504-3 (2006).

Palilis, Leonidas C., "High Efficiency Molecular Organic Light-Emitting Diodes Based On Silole Derivatives And Their Exciplexes," Organic Electronics, 4:113-121 (2003).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Ranjan, Sudhir et al., "Realizing Green Phosphorescent Light-Emitting Materials from Rhenium(I) Pyrazolato Diimine Complexes," Inorg. Chem., 42(4):1248-1255 (2003).

Sakamoto, Youichi et al., "Synthesis, Characterization, and Electron-Transport Property of Perfluorinated Phenylene Dendrimers," J. Am. Chem. Soc., 122(8):1832-1833 (2000).

Salbeck, J. et al., "Low Molecular Organic Glasses for Blue Electroluminescence," Synthetic Metals, 91: 209-215 (1997).

Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1-153505-3 (2005).

Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).

T. Östergård et al., "Langmuir-Blodgett Light-Emitting Diodes Of Poly(3-Hexylthiophene) Electro-Optical Characteristics Related to Structure," Synthetic Metals, 88:171-177 (1997).

Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).

(56) References Cited

OTHER PUBLICATIONS

Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Fleetham, T., et al., "Efficient "Pure" Blue OLEDs Employing Tetradentate Pt Complexes with a Narrow Spectral Bandwidth," Adv. Mater., Nov. 2014, pp. 7116-7121, vol. 26, No. 41. DOI: 10.1002/adma.201401759.
Extended European Search Report dated Jun. 19, 2020 for corresponding EP Application No. 20165219.5.
Marie-Paule Van Den Eede et al: "Controlled Polymerization of a Cyclopentadithiophene-Phenylene Alternating Copolymer", Macromolecules, vol. 51, No. 21, Nov. 13, 2018 (Nov. 13, 2018), pp. 9043-9051, XP55702090, Washington, DC, United States ISSN: 0024-9297, DOI: 10.1021/acs.macromol.8b01820 *Figure 1 [Pd-PEPPSI-(Anisole)C12]*.
Joydev Dinda et al: ")-NHC", New Journal of Chemistry, vol. 37, No. 2, Jan. 1, 2013 (Jan. 1, 2013), pp. 431-438, XP55702144,GB ISSN: 1144-0546, DOI: 10.1039/C2NJ40740J *the whole document*.

* cited by examiner

ORGANIC ELECTROLUMINESCENT MATERIALS AND DEVICES

CROSS-REFERENCE TO RELATED APPLICATIONS

This application is a continuation-in-part of the co-pending U.S. patent application Ser. No. 15/967,732, filed on May 1, 2018, which claims priority under 35 U.S.C. § 119(e) to U.S. Provisional Applications No. 62/524,080, filed Jun. 23, 2017, and No. 62/524,086, filed Jun. 23, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted $Ir(ppy)_3$, which has the following structure:

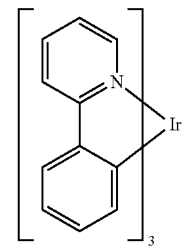

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

Tetradentate platinum complexes comprising an imidazole/benzimidazole carbene are disclosed. These platinum carbenes with the specific substituents disclosed herein are novel and provides phosphorescent emissive compounds that exhibit physical properties that can be tuned, such as sublimation temperature, emission color, and device stability. These compounds are useful in OLED applications.

A compound having the following formula

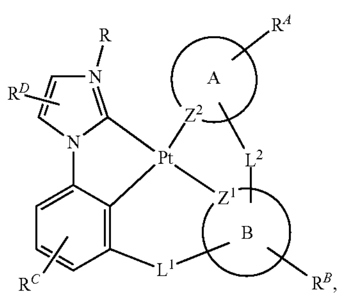

Formula I, is disclosed. The variables in Formula I are defined in detail below.

An OLED comprising the compound having the Formula I in one of its organic layers is also disclosed.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
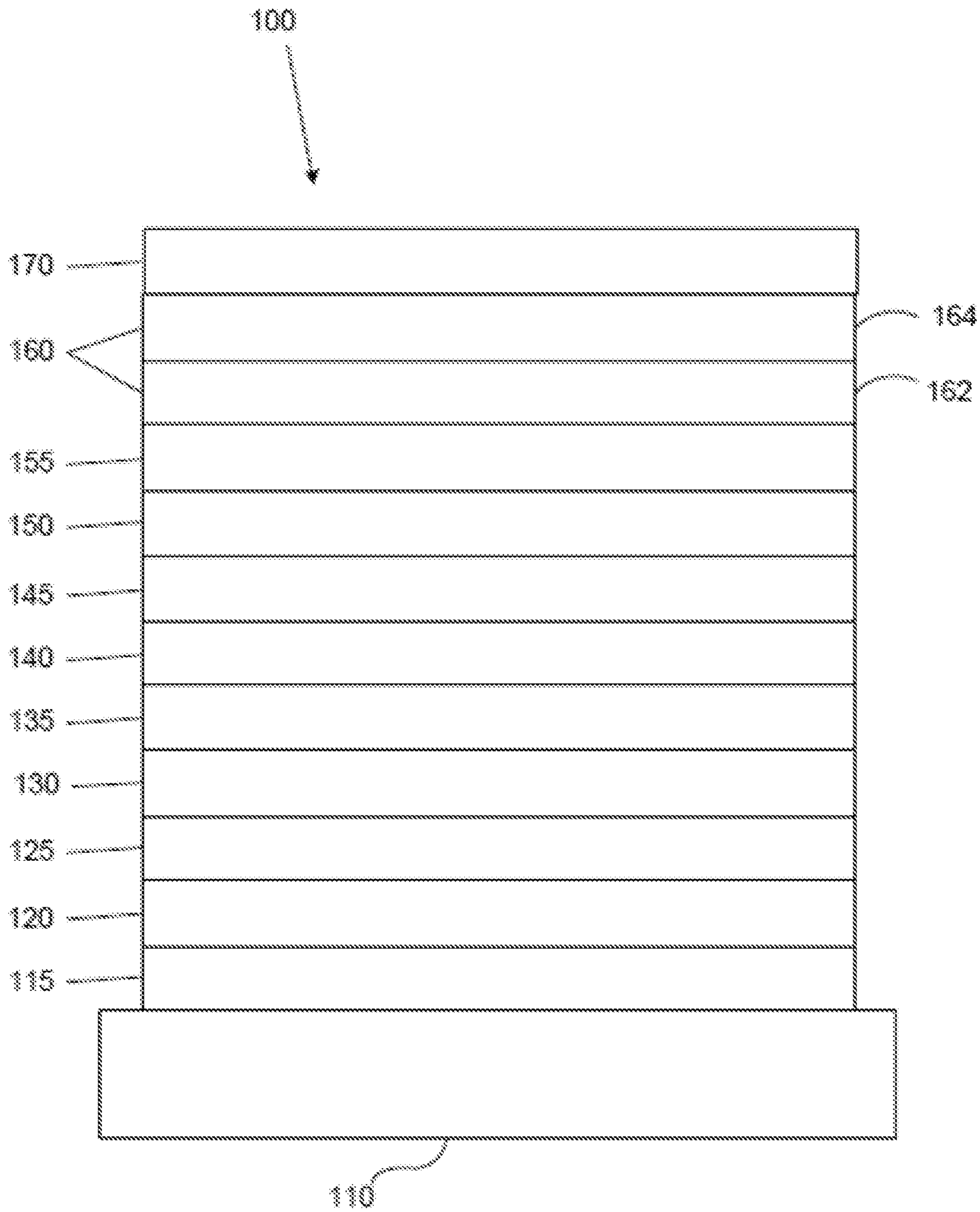
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
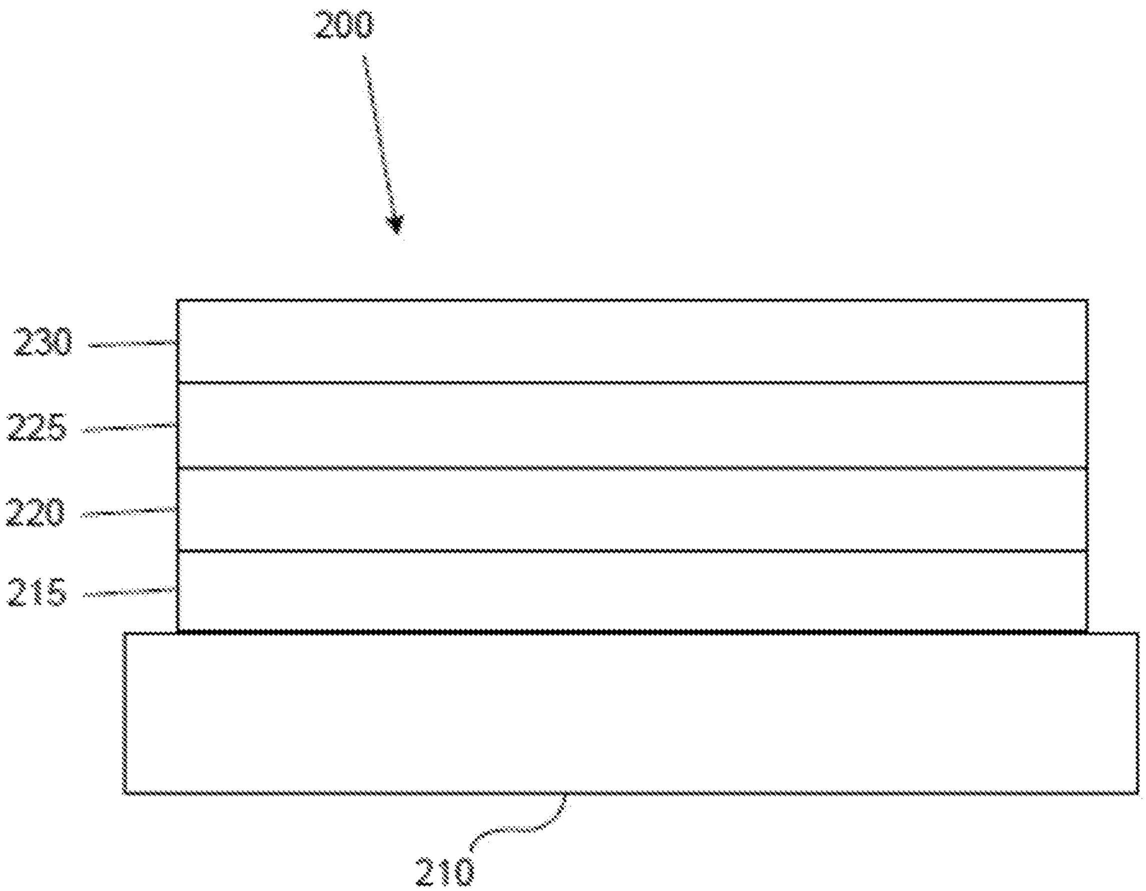
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —$OR_s$ radical.

The terms "sulfanyl" or "thio-ether" are used interchangeably and refer to a —$SR_s$ radical.

The term "sulfinyl" refers to a —S(O)—$R_s$ radical.

The term "sulfonyl" refers to a —$SO_2$—$R_s$ radical.

The term "phosphino" refers to a —$P(R_s)_3$ radical, wherein each $R_s$ can be same or different.

The term "silyl" refers to a —$Si(R_s)_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydropyran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfanyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

A compound having the following formula

Formula I,

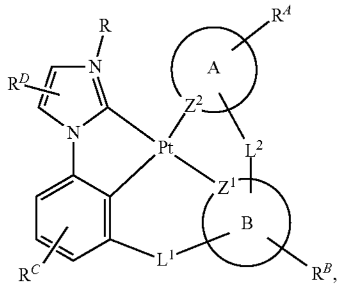

is disclosed. In Formula I, A and B are each independently a 5- or 6-membered aromatic ring; $Z^1$ and $Z^2$ are each independently selected from the group consisting of C and N; $L^1$ and $L^2$ are each independently selected from the group consisting of a direct bond, BR', NR', PR', O, S, Se, C═O, S═O, $SO_2$, CR'R", SiR'R", GeR'R", alkyl, cycloalkyl, and combinations thereof; $R^A$, $R^B$, $R^C$, and $R^D$, each represents mono to a maximum possible number of substitutions, or no substitution; each of R', R", $R^A$, $R^B$, $R^C$, and $R^D$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; R is selected from the group consisting of deuterium, alkyl, cycloalkyl, heteroalkyl, arylalkyl, silyl, aryl, heteroaryl, and combinations thereof; any substitutions in $R^A$, $R^B$, $R^C$, and $R^D$ may be joined or fused into a ring; $R^A$ or $R^B$ may be fused with $L^2$ to form a ring; wherein at least one of the following conditions (a), (b), and (c) is true:

(a) at least one of $R^A$ and $R^C$ is present and is a 5- or 6-membered aromatic ring attached to a carbon atom;

(b) $R^A$ is present and is an alkyl or cycloalkyl attached to a carbon atom, and each $R^C$ is independently H or aryl; and (c) both $R^A$ and $R^C$ are present and are an alkyl or cycloalkyl attached to a carbon atom, and R has a molecular weight equal to or greater than 16.0 grams per mole.

In some embodiments of the compound, each of R', R", $R^A$, $R^B$, $R^C$, and $R^D$ is independently a hydrogen or a substituent selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

In some embodiments, $R^A$ is a 6-membered aromatic ring. In some embodiments, $R^C$ is a 6-membered aromatic ring.

In some embodiments, $Z^2$ is N, and A is selected from the group consisting of pyridine, pyrazole, imidazole, and triazole. In some embodiments, $Z^1$ is C, and A is benzene. In some embodiments, $Z^1$ is N, $Z^2$ is C. In some further embodiment, both $Z^1$ and $Z^2$ is C, and one of them is a carbene carbon.

In some embodiments of the compound, $R^A$ contains substituents selected from the group consisting of hydrogen, deuterium, alkyl, cycloalkyl, partially or fully fluorinated alkyl or cycloalkyl, and combinations thereof.

In some embodiments of the compound where $R^A$ is a 6-membered aromatic ring, $R^C$ contains substituents selected from the group consisting of hydrogen, deuterium, alkyl, cycloalkyl, partially or fully fluorinated alkyl or cycloalkyl, and combinations thereof.

In some embodiments of the compound, two adjacent $R^D$ substituents are joined to form a fused 6-membered aromatic ring. In some embodiments of the compound, $L^1$ is an oxygen atom. In some embodiments of the compound, $L^2$ is NAr; and Ar is a 6-membered aromatic group.

In some embodiments of the compound, R is a 6-membered aromatic ring. In some embodiments of the compound, R is an alkyl group. In some embodiments of the compound, at least one of $R^A$ and $R^C$ is a tert-butyl group.

In some embodiments of the compound, the compound is selected from the group consisting of:

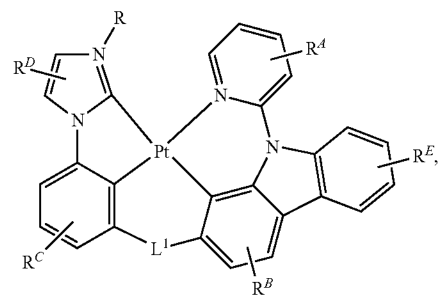

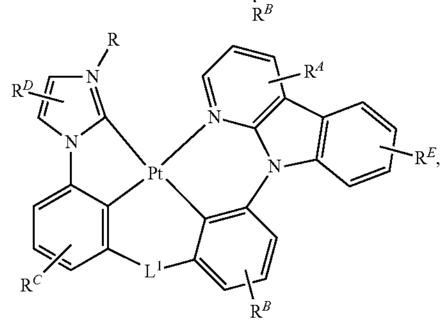

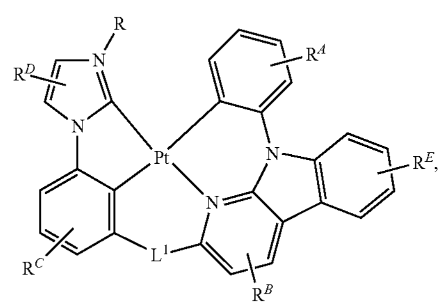

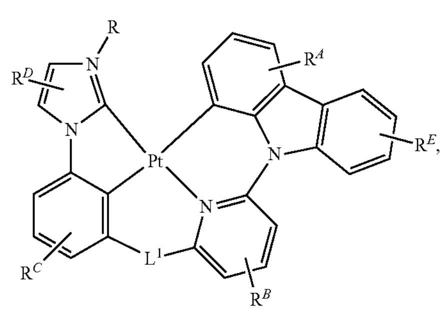

-continued

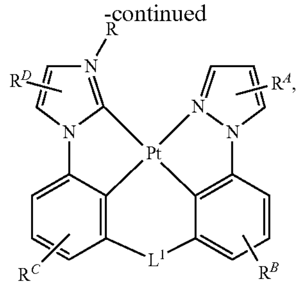

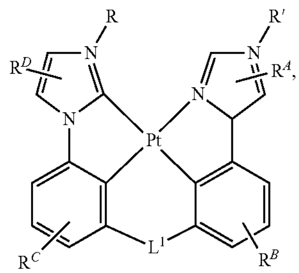

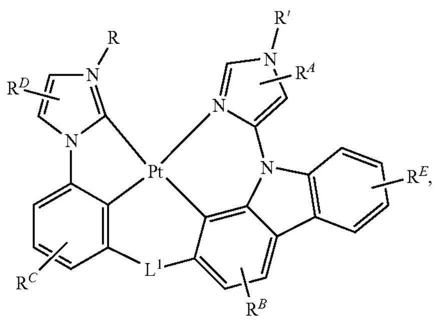

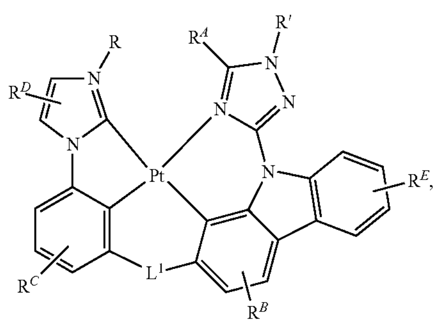

and

-continued

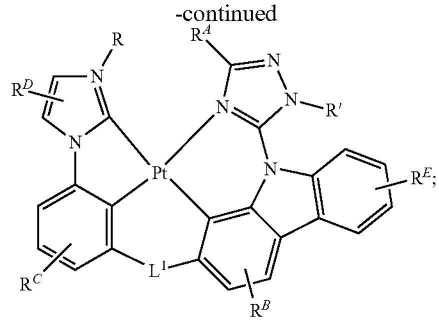

wherein R' is selected from the group consisting of deuterium, alkyl, cycloalkyl, heteroalkyl, arylalkyl, silyl, aryl, heteroaryl, and combinations thereof; wherein $R^E$ represents mono to a maximum possible number of substitutions, or no substitution; wherein $R^E$ is hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some embodiments of the compound, the compound is selected from the group consisting of Compound x having the formula $Pt(L_{Ay})(L_{Bz})$, wherein x is an integer defined by x=7320(z−1)+y, wherein y is an integer from 1 to 7320 and z is an integer from 1 to 17795, or x=41580(z−17796)+(y−7320)+130259400, wherein y is an integer from 7321 to 48900 and z is an integer from 17796 to 40673, or x=7320(z−17796)+y+1081526640, wherein y is an integer from 1 to 7320 and z is an integer from 17796 to 40673, or x=41580(z−1)+(y−7320)+1248993600, wherein y is an integer from 7321 to 48900 and z is an integer from 1 to 17795, provided that when k=1 in the structures for $L_{Ay}$ listed below, i is an integer from 1 to 10, or j is an integer from 1 to 10, wherein $L_{Ay}$ has the following structures:

| $L_{Ay}$ | Structure of $L_{Ay}$ | $Ar^1$, $R^1$ | y |
|---|---|---|---|
| wherein $L_{A1}$ to $L_{A900}$ have the structure | 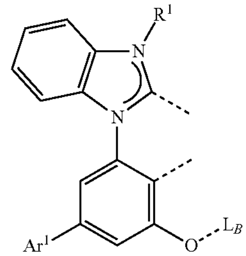 | wherein $Ar^1$ = Ai and $R^1$ = Rk, wherein i is an integer from 1 to 30 and k is an integer from 1 to 30, and | y = 30(i − 1) + k |

-continued

| $L_{Ay}$ | Structure of $L_{Ay}$ | $Ar^1$, $R^1$ | y |
|---|---|---|---|
| wherein $L_{A901}$-$L_{A1800}$ have the structure | 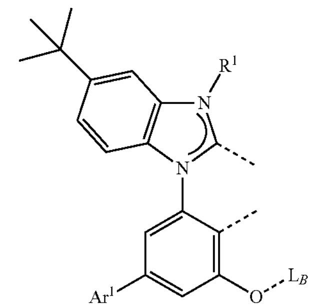 | wherein $Ar^1$ = Ai and $R^1$ = Rk, wherein i is an integer from 1 to 30 and k is an integer from 1 to 30, and | y = 30(i − 1) + k + 900 |
| wherein $L_{A1801}$-$L_{A2700}$ have the structure | 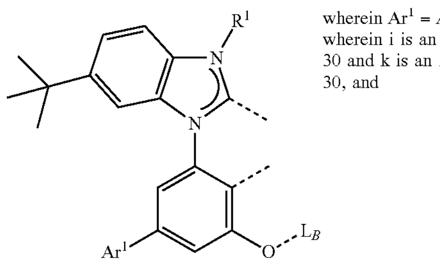 | wherein $Ar^1$ = Ai and $R^1$ = Rk, wherein i is an integer from 1 to 30 and k is an integer from 1 to 30, and | y = 30(i − 1) + k + 1800 |
| wherein $L_{A2701}$-$L_{A3600}$ have the structure | 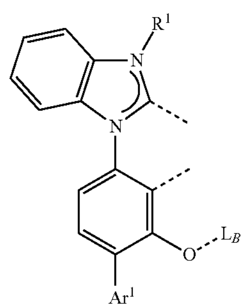 | wherein $Ar^1$ = Ai and $R^1$ = Rk, wherein i is an integer from 1 to 30 and k is an integer from 1 to 30, and | y = 30(i − 1) + k + 2700 |
| wherein $L_{A3601}$-$L_{A4500}$ have the structure | 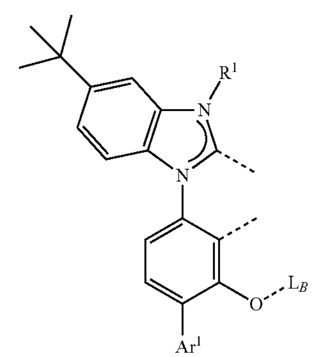 | wherein $Ar^1$ = Ai and $R^1$ = Rk, wherein i is an integer from 1 to 30 and k is an integer from 1 to 30, and | y = 30(i − 1) + k + 3600 |
| wherein $L_{A4501}$-$L_{A5400}$ have the structure | 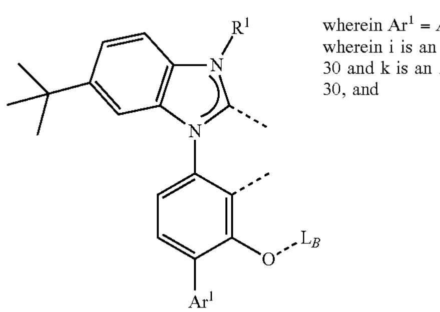 | wherein $Ar^1$ = Ai and $R^1$ = Rk, wherein i is an integer from 1 to 30 and k is an integer from 1 to 30, and | y = 30(i − 1) + k + 4500 |

-continued

| $L_{Ay}$ | Structure of $L_{Ay}$ | $Ar^1$, $R^1$ | y |
|---|---|---|---|
| wherein $L_{A5401}$-$L_{A6300}$ have the structure | 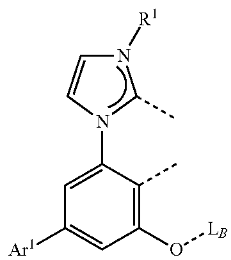 | wherein $Ar^1$ = Ai and $R^1$ = Rk, wherein i is an integer from 1 to 30 and k is an integer from 1 to 30, and | y = 30(i − 1) + k + 5400 |
| wherein $L_{A6301}$-$L_{A7200}$ have the structure | 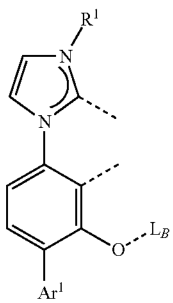 | wherein $Ar^1$ = Ai and $R^1$ = Rk, wherein i is an integer from 1 to 30 and k is an integer from 1 to 30, and | y = 30(i − 1) + k + 6300 |
| wherein $L_{A7201}$ to $L_{A7230}$ have the structure | 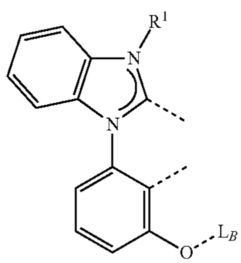 | wherein $R^1$ = Rk, wherein k is an integer from 1 to 30, and | y = k + 7200 |
| wherein $L_{A7231}$-$L_{A7260}$ have the structure | 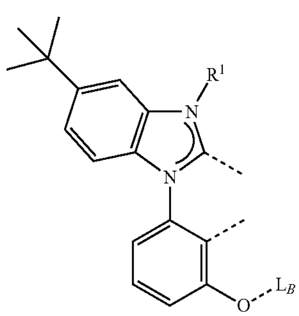 | wherein $R^1$ = Rk, wherein k is an integer from 1 to 30, and | y = k + 7230 |
| wherein $L_{A7261}$-$L_{A7290}$ have the structure | 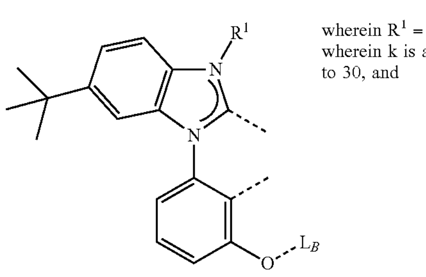 | wherein $R^1$ = Rk, wherein k is an integer from 1 to 30, and | y = k + 7260 |

-continued

| $L_{Ay}$ | Structure of $L_{Ay}$ | $Ar^1$, $R^1$ | y |
|---|---|---|---|
| wherein $L_{A7291}$-$L_{A7320}$ have the structure | 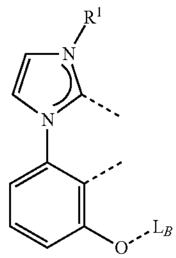 | wherein $R^1$ = Rk, wherein k is an integer from 1 to 30, and | y = k + 7290 |
| wherein $L_{A7321}$ to $L_{A9420}$ have the structure | 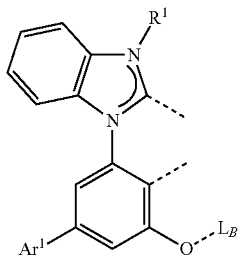 | wherein $Ar^1$ = Ai and $R^1$ = Rk, wherein i is an integer from 1 to 30 and k is an integer from 31 to 100, and | y = 70(i − 1) + (k − 30) + 7320 |
| wherein $L_{A9421}$-$L_{A11520}$ have the structure | 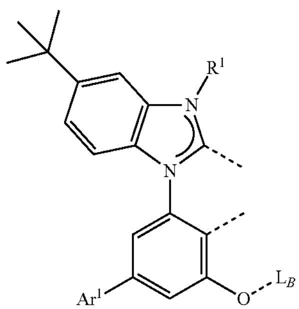 | wherein $Ar^1$ = Ai and $R^1$ = Rk, wherein i is an integer from 1 to 30 and k is an integer from 31 to 100, and | y = 70(i − 1) + (k − 30) + 9420 |
| wherein $L_{A11521}$-$L_{A13620}$ have the structure | 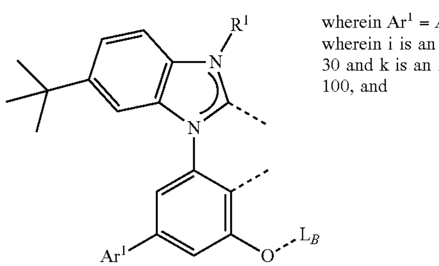 | wherein $Ar^1$ = Ai and $R^1$ = Rk, wherein i is an integer from 1 to 30 and k is an integer from 31 to 100, and | y = 70(i − 1) + (k − 30) + 11520 |
| wherein $L_{A13621}$-$L_{A15720}$ have the structure | 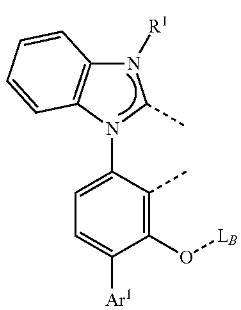 | wherein $Ar^1$ = Ai and $R^1$ = Rk, wherein i is an integer from 1 to 30 and k is an integer from 31 to 100, and | y = 70(i − 1) + (k − 30) + 13620 |

-continued

| $L_{Ay}$ | Structure of $L_{Ay}$ | $Ar^1$, $R^1$ | y |
|---|---|---|---|
| wherein $L_{A15721}$-$L_{A17820}$ have the structure | 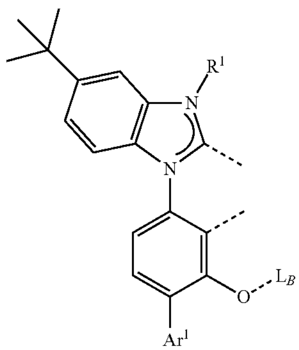 | wherein $Ar^1$ = Ai and $R^1$ = Rk, wherein i is an integer from 1 to 30 and k is an integer from 31 to 100, and | y = 70(i − 1) + (k − 30) + 15720 |
| wherein $L_{A17821}$-$L_{A19920}$ have the structure | 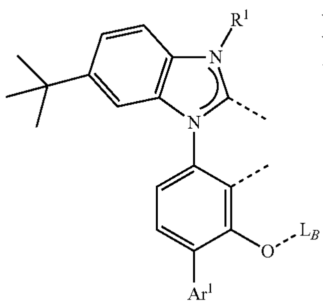 | wherein $Ar^1$ = Ai and $R^1$ = Rk, wherein i is an integer from 1 to 30 and k is an integer from 31 to 100, and | y = 70(i − 1) + (k − 30) + 17820 |
| wherein $L_{A19921}$-$L_{A22020}$ have the structure | 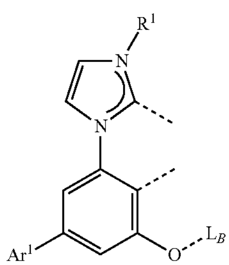 | wherein $Ar^1$ = Ai and $R^1$ = Rk, wherein i is an integer from 1 to 30 and k is an integer from 31 to 100, and | y = 70(i − 1) + (k − 30) + 19920 |
| wherein $L_{A22021}$-$L_{A24120}$ have the structure | 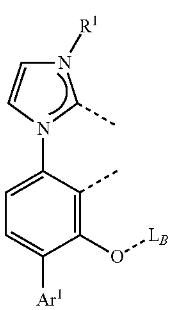 | wherein $Ar^1$ = Ai and $R^1$ = Rk, wherein i is an integer from 1 to 30 and k is an integer from 31 to 100, and | y = 70(i − 1) + (k − 30) + 22020 |
| wherein $L_{A24121}$ to $L_{A24190}$ have the structure | 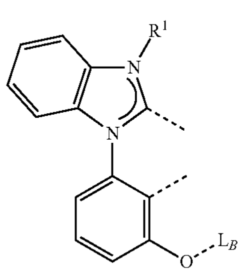 | wherein $R^1$ = Rk, wherein k is an integer from 31 to 100, and | y = (k − 30) + 24120 |

-continued

| $L_{Ay}$ | Structure of $L_{Ay}$ | $Ar^1$, $R^1$ | y |
|---|---|---|---|
| wherein $L_{A24191}$-$L_{A24260}$ have the structure | 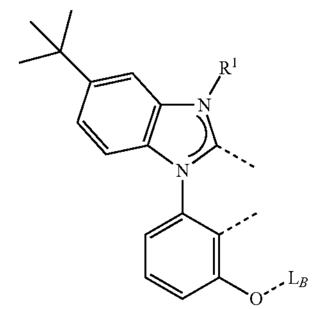 | wherein $R^1$ = Rk, wherein k is an integer from 31 to 100, and | y = (k − 30) + 24190 |
| wherein $L_{A24261}$-$L_{A24330}$ have the structure | 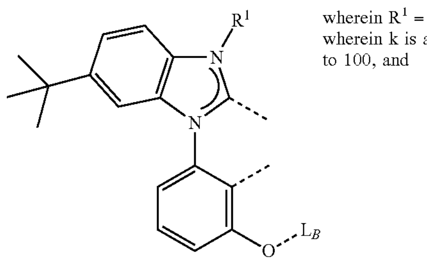 | wherein $R^1$ = Rk, wherein k is an integer from 31 to 100, and | y = (k − 30) + 24260 |
| wherein $L_{A24331}$-$L_{A24400}$ have the structure | 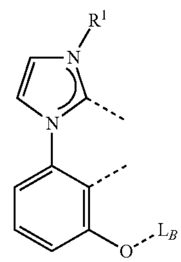 | wherein $R^1$ = Rk, wherein k is an integer from 31 to 100, and | y = (k − 30) + 24330 |
| wherein $L_{A24401}$ to $L_{A27400}$ have the structure | 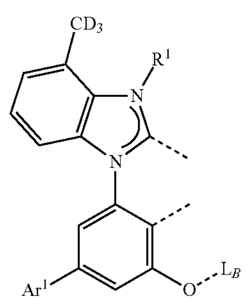 | wherein $Ar^1$ = Ai and $R^1$ = Rk, wherein i is an integer from 1 to 30 and k is an integer from 1 to 100, and | y = 100(i − 1) + k + 24400 |
| wherein $L_{A27401}$ to $L_{A30400}$ have the structure | 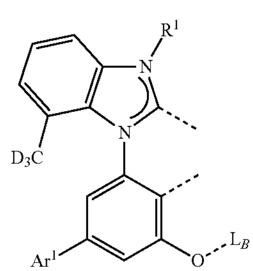 | wherein $Ar^1$ = Ai and $R^1$ = Rk, wherein i is an integer from 1 to 30 and k is an integer from 1 to 100, and | y = 100(i − 1) + k + 27400 |

-continued

| $L_{Ay}$ | Structure of $L_{Ay}$ | $Ar^1$, $R^1$ | y |
|---|---|---|---|
| wherein $L_{A30401}$ to $L_{A33400}$ have the structure | 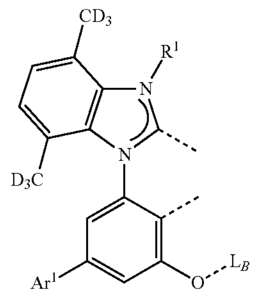 | wherein $Ar^1$ = Ai and $R^1$ = Rk, wherein i is an integer from 1 to 30 and k is an integer from 1 to 100, and | y = 100(i − 1) + k + 27400 |
| wherein $L_{A30401}$ to $L_{A33400}$ have the structure | 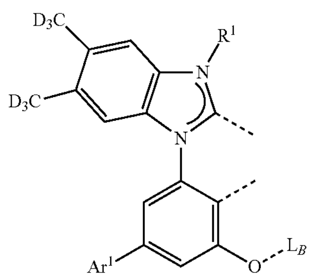 | wherein $Ar^1$ = Ai and $R^1$ = Rk, wherein i is an integer from 1 to 30 and k is an integer from 1 to 100, and | y = 100(i − 1) + k + 30400 |
| wherein $L_{A33401}$ to $L_{A36400}$ have the structure | 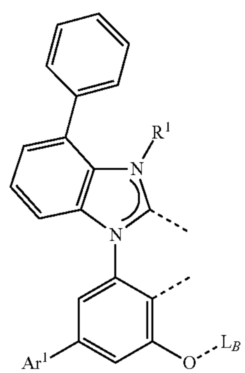 | wherein $Ar^1$ = Ai and $R^1$ = Rk, wherein i is an integer from 1 to 30 and k is an integer from 1 to 100, and | y = 100(i − 1) + k + 33400 |
| wherein $L_{A36401}$ to $L_{A39400}$ have the structure | 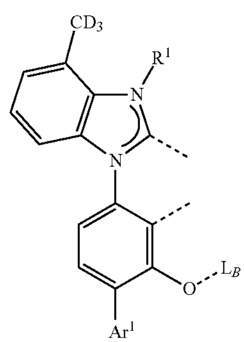 | wherein $Ar^1$ = Ai and $R^1$ = Rk, wherein i is an integer from 1 to 30 and k is an integer from 1 to 100, and | y = 100(i − 1) + k + 36400 |
| wherein $L_{A39401}$ to $L_{A42400}$ have the structure | 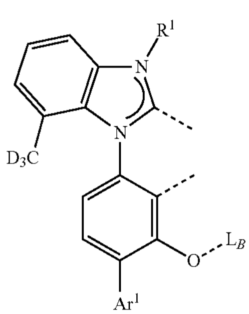 | wherein $Ar^1$ = Ai and $R^1$ = Rk, wherein i is an integer from 1 to 30 and k is an integer from 1 to 100, and | y = 100(i − 1) + k + 39400 |

-continued

| $L_{Ay}$ | Structure of $L_{Ay}$ | $Ar^1$, $R^1$ | y |
|---|---|---|---|
| wherein $L_{A42401}$ to $L_{A45400}$ have the structure | 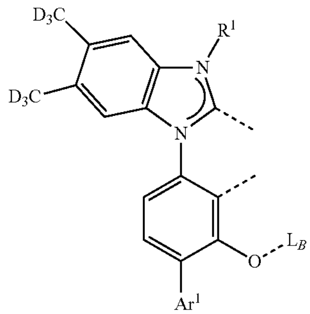 | wherein $Ar^1$ = Ai and $R^1$ = Rk, wherein i is an integer from 1 to 30 and k is an integer from 1 to 100, and | y = 100(i − 1) + k + 42400 |
| wherein $L_{A45401}$ to $L_{A48400}$ have the structure | 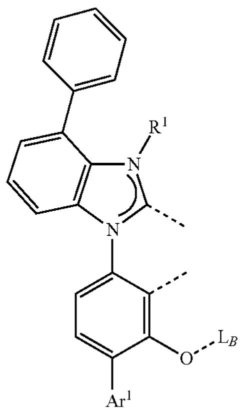 | wherein $Ar^1$ = Ai and $R^1$ = Rk, wherein i is an integer from 1 to 30 and k is an integer from 1 to 100, and | y = 100(i − 1) + k + 45400 |
| wherein $L_{A48401}$ to $L_{A48500}$ have the structure | 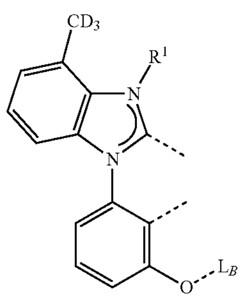 | wherein $R^1$ = Rk, wherein k is an integer from 1 to 100, and | y = k + 48400 |
| wherein $L_{A48501}$ to $L_{A48600}$ have the structure | 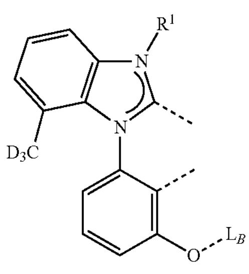 | wherein $R^1$ = Rk, wherein k is an integer from 1 to 100, and | y = k + 48500 |
| wherein $L_{A48601}$ to $L_{A48700}$ have the structure | 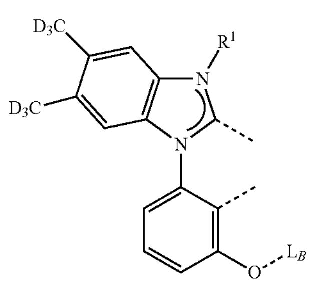 | wherein $R^1$ = Rk, wherein k is an integer from 1 to 100, and | y = k + 48600 |

-continued

| $L_{Ay}$ | Structure of $L_{Ay}$ | $Ar^1$, $R^1$ | y |
|---|---|---|---|
| wherein $L_{A48701}$ to $L_{A48800}$ have the structure | 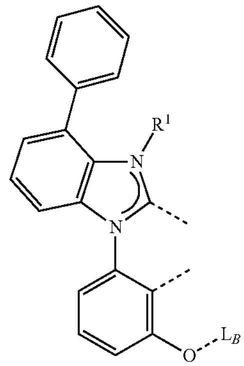 | wherein $R^1$ = Rk, wherein k is an integer from 1 to 100, and | y = k + 48700 |
| wherein $L_{A48801}$ to $L_{A48900}$ have the structure | 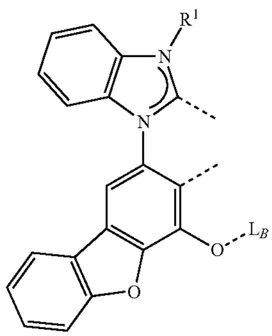 | wherein $R^1$ = Rk, wherein k is an integer from 1 to 100, and | y = k + 48800, |

in one embodiment, when k=1 in the formulas for $L_{Ay}$ listed above, i is an integer from 1 to 10, or j is an integer from 1 to 10, wherein $L_{Bz}$ has the following structures:

| $L_{Bz}$ | $L_{Bz}$ structure | $Ar^2$, $Ar^3$, $R^2$ | z |
|---|---|---|---|
| wherein $L_{B1}$-$L_{B30}$ have the structure | 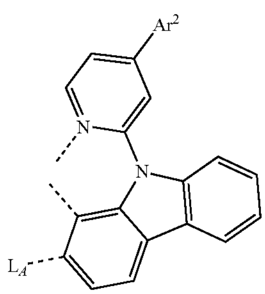 | wherein $Ar^2$ = Aj, wherein j is an integer from 1 to 30, and | z = j |
| wherein $L_{B31}$ have the structure | 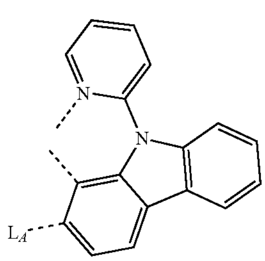 | | z = 31 |

-continued

| $L_{Bz}$ | $L_{Bz}$ structure | $Ar^2$, $Ar^3$, $R^2$ | z |
| --- | --- | --- | --- |
| wherein $L_{B32}$-$L_{B931}$ have the structure | 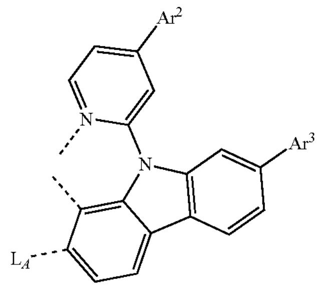 | wherein $Ar^2$ = Aj and $Ar^3$ = Am, wherein j is an integer from 1 to 30 and m is an integer from 1 to 30, and | z = 30(j − 1) + m + 31 |
| wherein $L_{B932}$-$L_{B961}$ have the structure | 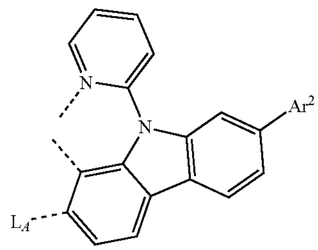 | wherein $Ar^2$ = Aj, wherein j is an integer from 1 to 30, and | z = j + 931 |
| wherein $L_{B962}$-$L_{B1861}$ have the structure | 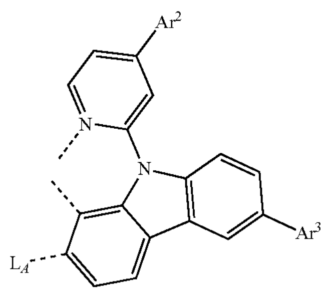 | wherein $Ar^2$ = Aj and $Ar^3$ = Am, wherein j is an integer from 1 to 30 and m is an integer from 1 to 30, and | z = 30(j − 1) + m + 961 |
| wherein $L_{B1862}$-$L_{B1891}$ have the structure | 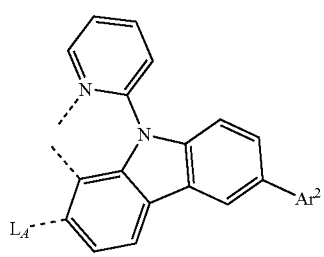 | wherein $Ar^2$ = Aj, wherein j is an integer from 1 to 30, and | z = j + 1861 |
| wherein $L_{B1892}$-$L_{B1921}$ have the structure | 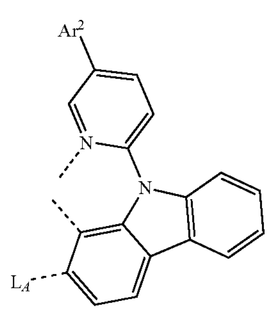 | wherein $Ar^2$ = Aj, wherein j is an integer from 1 to 30, and | z = j + 1891 |

-continued

| $L_{Bz}$ | $L_{Bz}$ structure | $Ar^2$, $Ar^3$, $R^2$ | z |
|---|---|---|---|
| wherein $L_{B1922}$-$L_{B2821}$ have the structure | 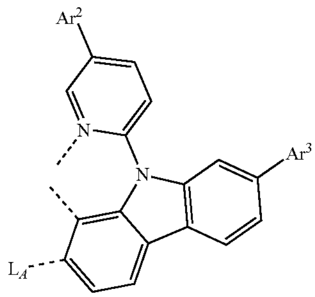 | wherein $Ar^2$ = Aj and $Ar^3$ = Am, wherein j is an integer from 1 to 30 and m is an integer from 1 to 30, and | z = 30(j − 1) + m + 1921 |
| wherein $L_{B2822}$-$L_{B3721}$ have the structure | 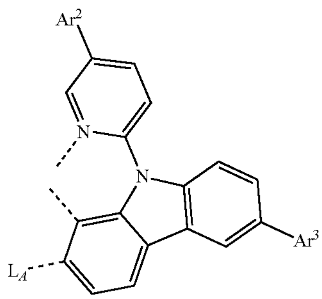 | wherein $Ar^2$ = Aj and $Ar^3$ = Am, wherein j is an integer from 1 to 30 and m is an integer from 1 to 30, and | z = 30(j − 1) + m + 2821 |
| wherein $L_{B3722}$-$L_{B4621}$ have the structure | 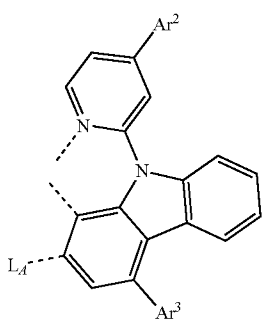 | wherein $Ar^2$ = Aj and $Ar^3$ = Am, wherein j is an integer from 1 to 30 and m is an integer from 1 to 30, and | z = 30(j − 1) + m + 3721 |
| wherein $L_{B4622}$-$L_{B4651}$ have the structure | 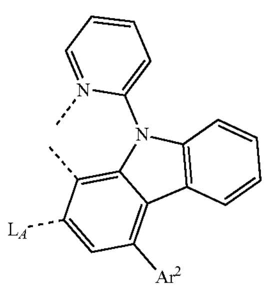 | wherein $Ar^2$ = Aj, wherein j is an integer from 1 to 30, and | z = j + 4621 |
| wherein $L_{B4652}$-$L_{B5551}$ have the structure | 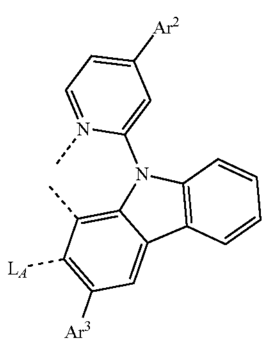 | wherein $Ar^2$ = Aj and $Ar^3$ = Am, wherein j is an integer from 1 to 30 and m is an integer from 1 to 30, and | z = 30(j − 1) + m + 4651 |

-continued

| $L_{Bz}$ | $L_{Bz}$ structure | $Ar^2$, $Ar^3$, $R^2$ | z |
|---|---|---|---|
| wherein $L_{B5552}$-$L_{B5581}$ have the structure | 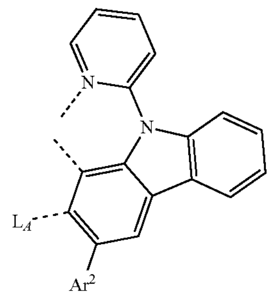 | wherein $Ar^2$ = Aj, wherein j is an integer from 1 to 30, and | z = j + 5551 |
| wherein $L_{B5582}$-$L_{B6481}$ have the structure | 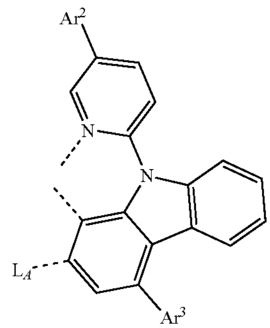 | wherein $Ar^2$ = Aj and $Ar^3$ = Am, wherein j is an integer from 1 to 30 and m is an integer from 1 to 30, and | z = 30(j − 1) + m + 5581 |
| wherein $L_{B6482}$-$L_{B7381}$ have the structure | 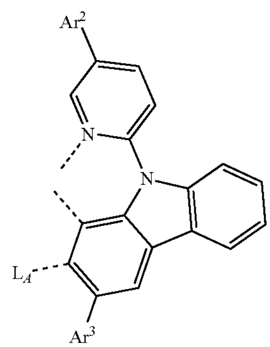 | wherein $Ar^2$ = Aj and $Ar^3$ = Am, wherein j is an integer from 1 to 30 and m is an integer from 1 to 30, and | z = 30(j − 1) + m + 6481 |
| wherein $L_{B7382}$ have the structure | 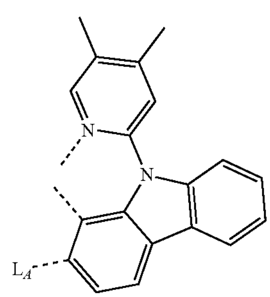 | | z = 7382 |
| wherein $L_{B7383}$-$L_{B7412}$ have the structure | 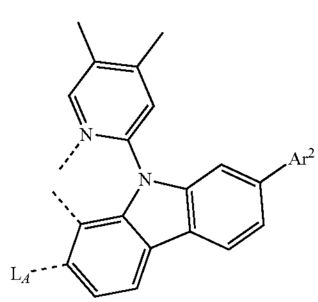 | wherein $Ar^2$ = Aj, wherein j is an integer from 1 to 30, and | z = j + 7382 |

-continued

| $L_{Bz}$ | $L_{Bz}$ structure | $Ar^2$, $Ar^3$, $R^2$ | z |
|---|---|---|---|
| wherein $L_{B7413}$-$L_{B7442}$ have the structure | 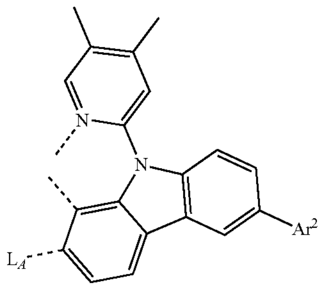 | wherein $Ar^2$ = Aj, wherein j is an integer from 1 to 30, and | z = j + 7412 |
| wherein $L_{B7443}$-$L_{B7472}$ have the structure | 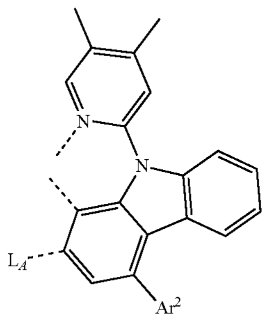 | wherein $Ar^2$ = Aj, wherein j is an integer from 1 to 30, and | z = j + 7442 |
| wherein $L_{B7473}$-$L_{B7502}$ have the structure | 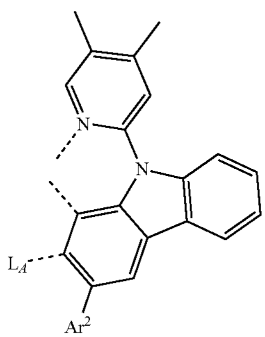 | wherein $Ar^2$ = Aj, wherein j is an integer from 1 to 30, and | z = j + 7472 |
| wherein $L_{B7503}$ have the structure | 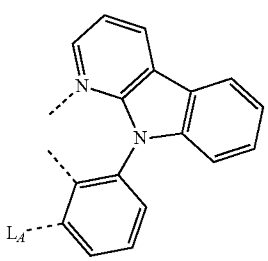 | | z = 7503 |
| wherein $L_{B7504}$-$L_{B7533}$ have the structure | 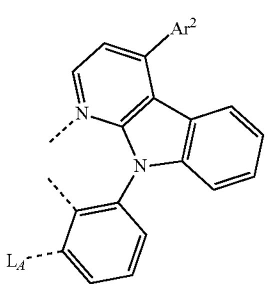 | wherein $Ar^2$ = Aj, wherein j is an integer from 1 to 30, and | z = j + 7503 |

-continued

| $L_{Bz}$ | $L_{Bz}$ structure | $Ar^2$, $Ar^3$, $R^2$ | z |
|---|---|---|---|
| wherein $L_{B7534}$-$L_{B8433}$ have the structure | 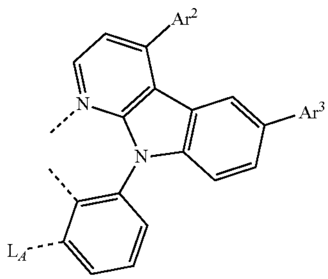 | wherein $Ar^2$ = Aj and $Ar^3$ = Am, wherein j is an integer from 1 to 30 and m is an integer from 1 to 30, and | z = 30(j − 1) + m + 7533 |
| wherein $L_{B8434}$-$L_{B8463}$ have the structure | 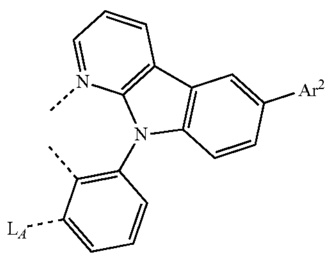 | wherein $Ar^2$ = Aj, wherein j is an integer from 1 to 30, and | z = j + 8433 |
| wherein $L_{B8464}$-$L_{B9363}$ have the structure | 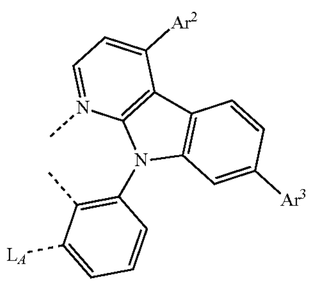 | wherein $Ar^2$ = Aj and $Ar^3$ = Am, wherein j is an integer from 1 to 30 and m is an integer from 1 to 30, and | z = 30(j − 1) + m + 8463 |
| wherein $L_{B9364}$-$L_{B9393}$ have the structure | 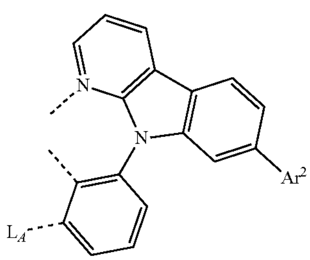 | wherein $Ar^2$ = Aj, wherein j is an integer from 1 to 30, and | z = j + 9363 |
| wherein $L_{B9394}$-$L_{B9423}$ have the structure | 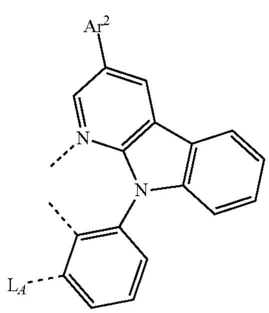 | wherein $Ar^2$ = Aj, wherein j is an integer from 1 to 30, and | z = j + 9393 |

-continued

| $L_{Bz}$ | $L_{Bz}$ structure | $Ar^2$, $Ar^3$, $R^2$ | z |
|---|---|---|---|
| wherein $L_{B9424}$-$L_{B10323}$ have the structure | 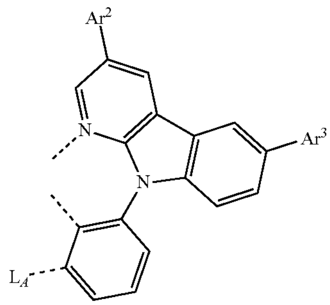 | wherein $Ar^2$ = Aj and $Ar^3$ = Am, wherein j is an integer from 1 to 30 and m is an integer from 1 to 30, and | z = 30(j − 1) + m + 9423 |
| wherein $L_{B10324}$-$L_{B11223}$ have the structure | 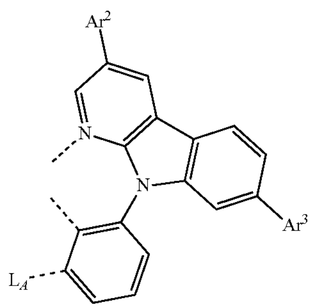 | wherein $Ar^2$ = Aj and $Ar^3$ = Am, wherein j is an integer from 1 to 30 and m is an integer from 1 to 30, and | z = 30(j − 1) + m + 10323 |
| wherein $L_{B11224}$-$L_{B11253}$ have the structure | 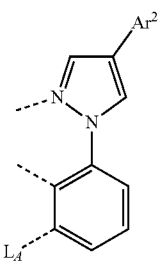 | wherein $Ar^2$ = Aj, wherein j is an integer from 1 to 30, and | z = j + 11223 |
| wherein $L_{B11254}$ have the structure | 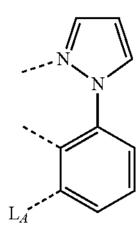 | | z = 11254 |
| wherein $L_{B11255}$-$L_{B11284}$ have the structure | 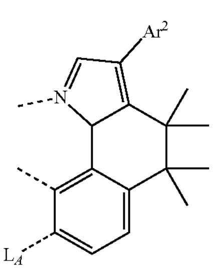 | wherein $Ar^2$ = Aj, wherein j is an integer from 1 to 30, and | z = j + 11254 |
| wherein $L_{B11285}$ have the structure | 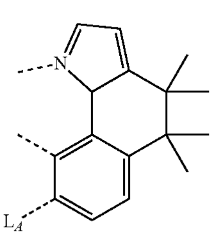 | | z = 11285 |

-continued

| $L_{Bz}$ | $L_{Bz}$ structure | $Ar^2$, $Ar^3$, $R^2$ | z |
|---|---|---|---|
| wherein $L_{B11286}$-$L_{B12185}$ have the structure | 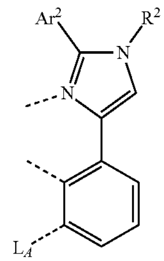 | wherein $Ar^2$ = Aj and $R^2$ = Rl, wherein j is an integer from 1 to 30 and l is an integer from 1 to 30, and | z = 30(j − 1) + l + 11285 |
| wherein $L_{B12186}$-$L_{B12215}$ have the structure | 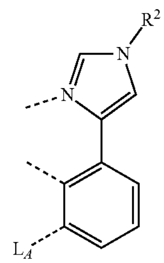 | wherein $R^2$ = Rl, wherein l is an integer from 1 to 30, and | z = l + 12185 |
| wherein $L_{B12216}$-$L_{B13115}$ have the structure | 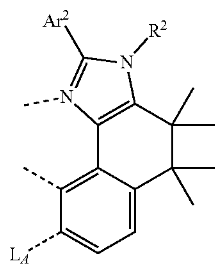 | wherein $Ar^2$ = Aj and $R^2$ = Rl, wherein j is an integer from 1 to 30 and l is an integer from 1 to 30, and | z = 30(j − 1) + l + 12215 |
| wherein $L_{B13116}$-$L_{B13145}$ have the structure | 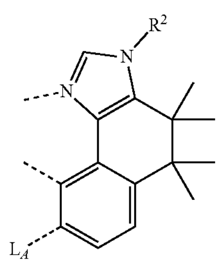 | wherein $R^2$ = Rl, wherein l is an integer from 1 to 30, and | z = l + 13115 |
| wherein $L_{B13146}$-$L_{B14045}$ have the structure | 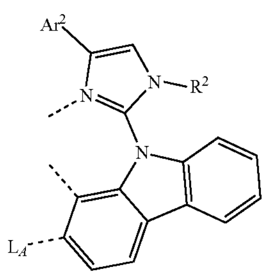 | wherein $Ar^2$ = Aj and $R^2$ = Rl, wherein j is an integer from 1 to 30 and l is an integer from 1 to 30, and | z = 30(j − 1) + l + 13145 |
| wherein $L_{B14046}$-$L_{B14075}$ have the structure | 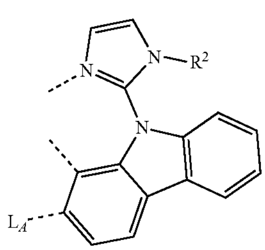 | wherein $R^2$ = Rl, wherein l is an integer from 1 to 30, and | z = l + 14045 |

-continued

| $L_{Bz}$ | $L_{Bz}$ structure | $Ar^2$, $Ar^3$, $R^2$ | z |
|---|---|---|---|
| wherein $L_{B14076}$-$L_{B14975}$ have the structure | 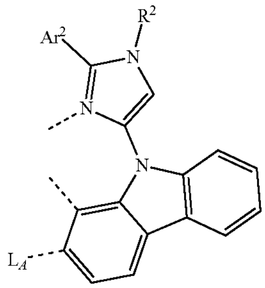 | wherein $Ar^2$ = Aj and $R^2$ = Rl, wherein j is an integer from 1 to 30 and l is an integer from 1 to 30, and | z = 30(j − 1) + l + 14075 |
| wherein $L_{B14976}$-$L_{B15005}$ have the structure | 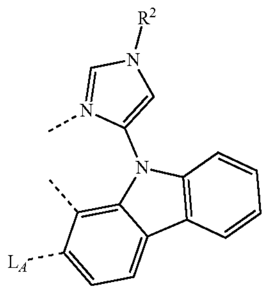 | wherein $R^2$ = Rl, wherein l is an integer from 1 to 30, and | z = l + 14975 |
| wherein $L_{B15006}$-$L_{B15905}$ have the structure | 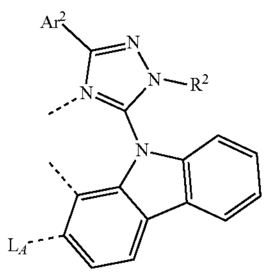 | wherein $Ar^2$ = Aj and $R^2$ = Rl, wherein j is an integer from 1 to 30 and l is an integer from 1 to 30, and | z = 30(j − 1) + l + 15005 |
| wherein $L_{B15906}$-$L_{B15935}$ have the structure | 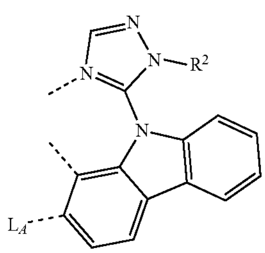 | wherein $R^2$ = Rl, wherein l is an integer from 1 to 30, and | z = l + 15905 |
| wherein $L_{B15936}$-$L_{B16835}$ have the structure | 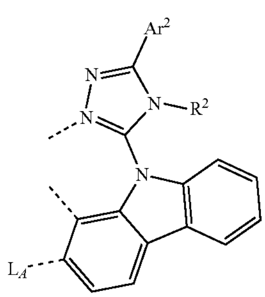 | wherein $Ar^2$ = Aj and $R^2$ = Rl, wherein j is an integer from 1 to 30 and l is an integer from 1 to 30, and | z = 30(j − 1) + l + 15935 |

-continued

| $L_{Bz}$ | $L_{Bz}$ structure | $Ar^2$, $Ar^3$, $R^2$ | z |
|---|---|---|---|
| wherein $L_{B16836}$-$L_{B16865}$ have the structure | 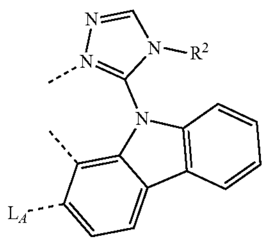 | wherein $R^2$ = Rl, wherein l is an integer from 1 to 30, and | z = l + 16835 |
| wherein $L_{B16866}$-$L_{B17765}$ have the structure | 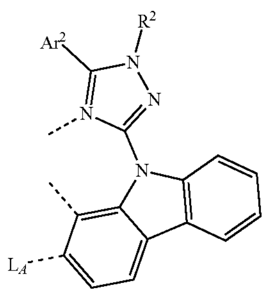 | wherein $Ar^2$ = Aj and $R^2$ = Rl, wherein j is an integer from 1 to 30 and l is an integer from 1 to 30, and | z = 30(j − 1) + l + 16865 |
| wherein $L_{B17766}$-$L_{B17795}$ have the structure | 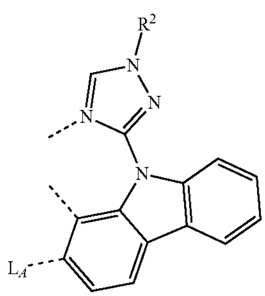 | wherein $R^2$ = Rl, wherein l is an integer from 1 to 30, and | z = l + 17765 |
| wherein $L_{B17796}$-$L_{B17825}$ have the structure | 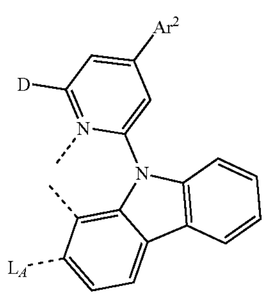 | wherein $Ar^2$ = Aj, wherein j is an integer from 1 to 30, and | z = j + 17795 |
| wherein $L_{B17826}$ have the structure | 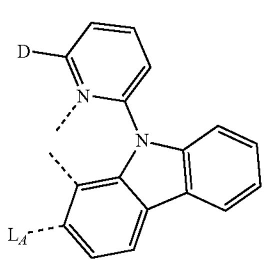 | | z = 17826 |

-continued

| $L_{Bz}$ | $L_{Bz}$ structure | $Ar^2$, $Ar^3$, $R^2$ | z |
|---|---|---|---|
| wherein $L_{B17827}$-$L_{B18726}$ have the structure | 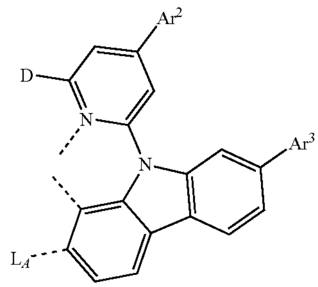 | wherein $Ar^2$ = Aj and $Ar^3$ = Am, wherein j is an integer from 1 to 30 and m is an integer from 1 to 30, and | z = 30(j − 1) + m + 17826 |
| wherein $L_{B18727}$-$L_{B18756}$ have the structure | 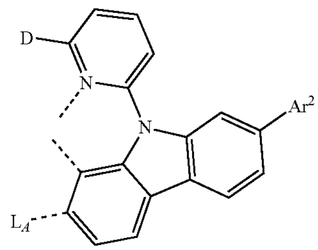 | wherein $Ar^2$ = Aj, wherein j is an integer from 1 to 30, and | z = j + 18726 |
| wherein $L_{B18757}$-$L_{B19656}$ have the structure | 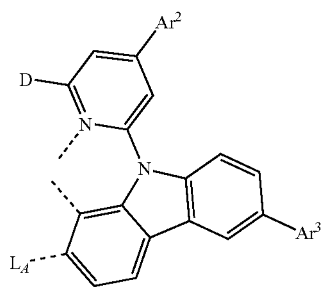 | wherein $Ar^2$ = Aj and $Ar^3$ = Am, wherein j is an integer from 1 to 30 and m is an integer from 1 to 30, and | z = 30(j − 1) + m + 18756 |
| wherein $L_{B19657}$-$L_{B19686}$ have the structure | 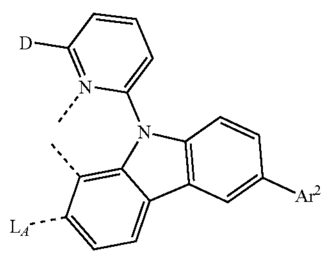 | wherein $Ar^2$ = Aj, wherein j is an integer from 1 to 30, and | z = j + 19656 |
| wherein $L_{B19687}$-$L_{B19716}$ have the structure | 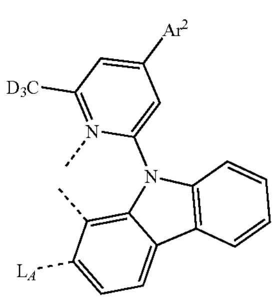 | wherein $Ar^2$ = Aj, wherein j is an integer from 1 to 30, and | z = j + 19686 |

-continued

| $L_{Bz}$ | $L_{Bz}$ structure | $Ar^2$, $Ar^3$, $R^2$ | z |
|---|---|---|---|
| wherein $L_{B19717}$ have the structure | 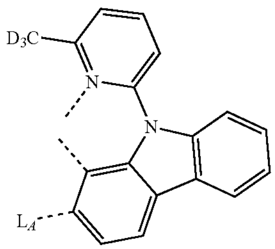 | | z = 19717 |
| wherein $L_{B19718}$-$L_{B20617}$ have the structure | 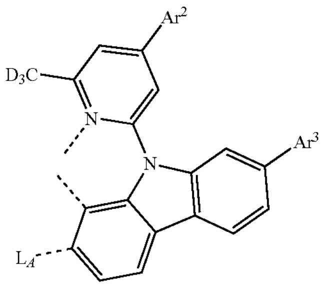 | wherein $Ar^2$ = Aj and $Ar^3$ = Am, wherein j is an integer from 1 to 30 and m is an integer from 1 to 30, and | z = 30(j − 1) + m + 19717 |
| wherein $L_{B20618}$-$L_{B20647}$ have the structure | 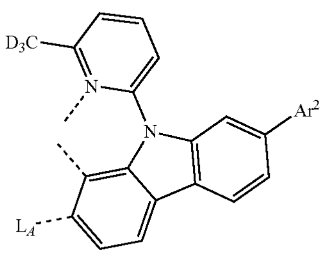 | wherein $Ar^2$ = Aj, wherein j is an integer from 1 to 30, and | z = j + 20617 |
| wherein $L_{B20648}$-$L_{B21547}$ have the structure | 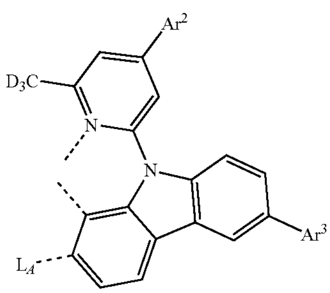 | wherein $Ar^2$ = Aj and $Ar^3$ = Am, wherein j is an integer from 1 to 30 and m is an integer from 1 to 30, and | z = 30(j − 1) + m + 20647 |
| wherein $L_{B21548}$-$L_{B21577}$ have the structure | 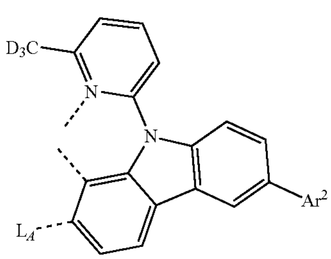 | wherein $Ar^2$ = Aj, wherein j is an integer from 1 to 30, and | z = j + 21547 |

-continued

| $L_{Bz}$ | $L_{Bz}$ structure | $Ar^2$, $Ar^3$, $R^2$ | z |
|---|---|---|---|
| wherein $L_{B21578}$-$L_{B22477}$ have the structure | 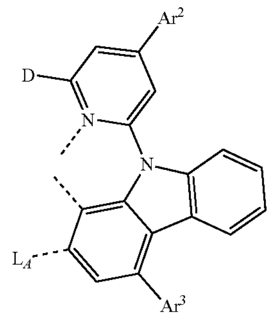 | wherein $Ar^2$ = Aj and $Ar^3$ = Am, wherein j is an integer from 1 to 30 and m is an integer from 1 to 30, and | z = 30(j − 1) + m + 21577 |
| wherein $L_{B22478}$-$L_{B22507}$ have the structure | 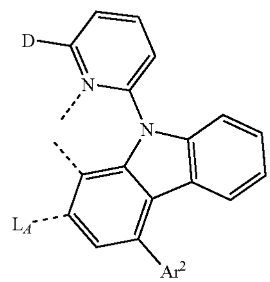 | wherein $Ar^2$ = Aj, wherein j is an integer from 1 to 30, and | z = j + 22477 |
| wherein $L_{B22508}$-$L_{B23407}$ have the structure | 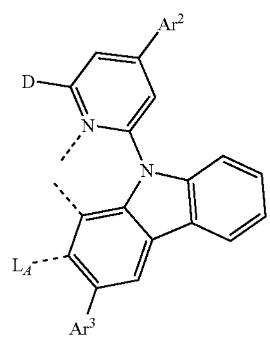 | wherein $Ar^2$ = Aj and $Ar^3$ = Am, wherein j is an integer from 1 to 30 and m is an integer from 1 to 30, and | z = 30(j − 1) + m + 22507 |
| wherein $L_{B23408}$-$L_{B23437}$ have the structure | 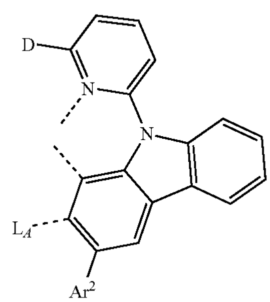 | wherein $Ar^2$ = Aj, wherein j is an integer from 1 to 30, and | z = j + 23407 |
| wherein $L_{B23438}$-$L_{B24337}$ have the structure | 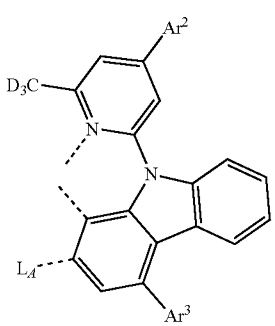 | wherein $Ar^2$ = Aj and $Ar^3$ = Am, wherein j is an integer from 1 to 30 and m is an integer from 1 to 30, and | z = 30(j − 1) + m + 23437 |

-continued

| $L_{Bz}$ | $L_{Bz}$ structure | $Ar^2$, $Ar^3$, $R^2$ | z |
|---|---|---|---|
| wherein $L_{B24338}$-$L_{B24367}$ have the structure | 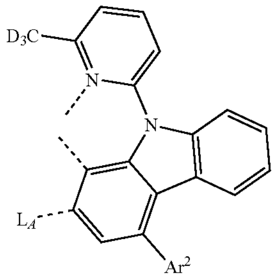  | wherein $Ar^2$ = Aj, wherein j is an integer from 1 to 30, and | z = j + 24337 |
| wherein $L_{B24368}$-$L_{B25267}$ have the structure | 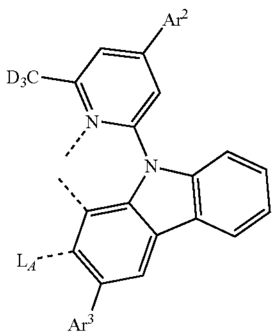  | wherein $Ar^2$ = Aj and $Ar^3$ = Am, wherein j is an integer from 1 to 30 and m is an integer from 1 to 30, and | z = 30(j − 1) + m + 24367 |
| wherein $L_{B25268}$-$L_{B25297}$ have the structure | 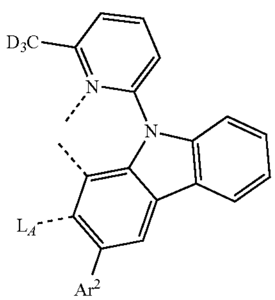  | wherein $Ar^2$ = Aj, wherein j is an integer from 1 to 30, and | z = j + 25267 |
| wherein $L_{B25298}$-$L_{B25327}$ have the structure | 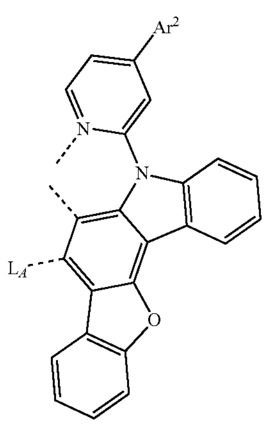  | wherein $Ar^2$ = Aj, wherein j is an integer from 1 to 30, and | z = j + 25297 |

-continued
| $L_{Bz}$ | $L_{Bz}$ structure | $Ar^2$, $Ar^3$, $R^2$ | z |
|---|---|---|---|
| wherein $L_{B25328}$-$L_{B25357}$ have the structure | 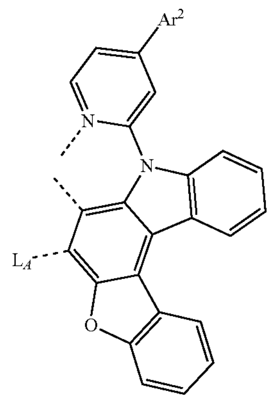 | wherein $Ar^2$ = Aj, wherein j is an integer from 1 to 30, and | z = j + 25327 |
| wherein $L_{B25358}$-$L_{B25387}$ have the structure | 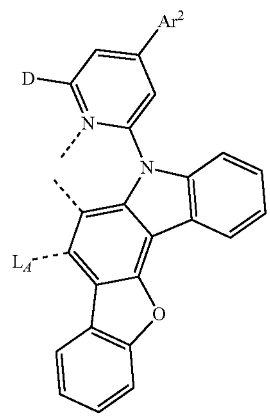 | wherein $Ar^2$ = Aj, wherein j is an integer from 1 to 30, and | z = j + 25357 |
| wherein $L_{B25388}$-$L_{B25417}$ have the structure | 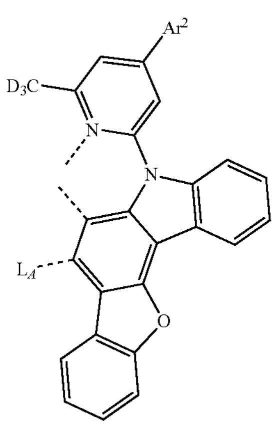 | wherein $Ar^2$ = Aj, wherein j is an integer from 1 to 30, and | z = j + 25387 |

-continued
| $L_{Bz}$ | $L_{Bz}$ structure | $Ar^2$, $Ar^3$, $R^2$ | z |
|---|---|---|---|
| wherein $L_{B25418}$-$L_{B25447}$ have the structure | 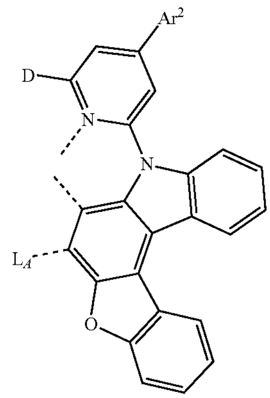 | wherein $Ar^2$ = Aj, wherein j is an integer from 1 to 30, and | z = j + 25417 |
| wherein $L_{B25448}$-$L_{B25477}$ have the structure | 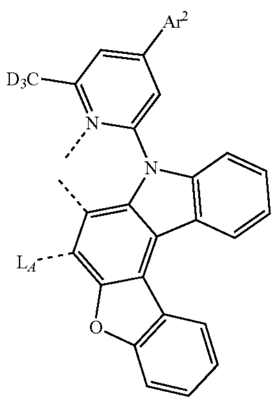 | wherein $Ar^2$ = Aj, wherein j is an integer from 1 to 30, and | z = j + 25447 |
| wherein $L_{B25478}$ have the structure | 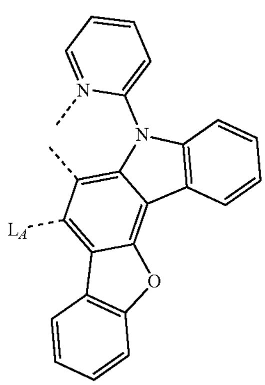 | | z = 25478 |
| wherein $L_{B25479}$ have the structure | 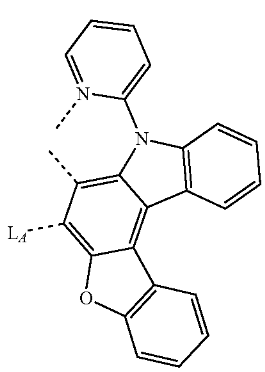 | | z = 25479 |

-continued
| $L_{Bz}$ | $L_{Bz}$ structure | $Ar^2$, $Ar^3$, $R^2$ | z |
|---|---|---|---|
| wherein $L_{B25480}$ have the structure | 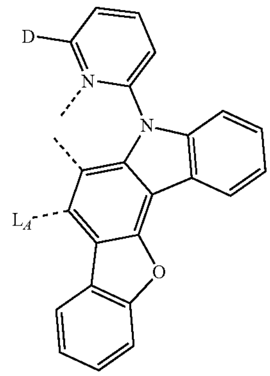 | | z = 25480 |
| wherein $L_{B25481}$ have the structure | 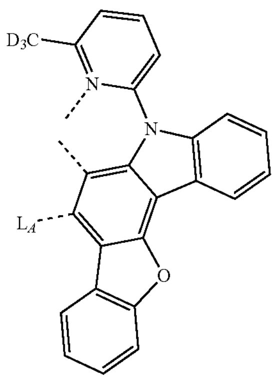 | | z = 25481 |
| wherein $L_{B25482}$ have the structure | 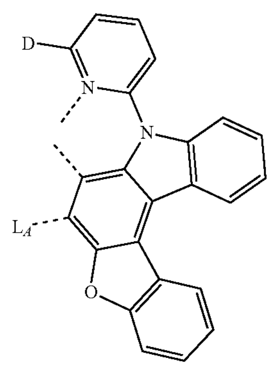 | | z = 25482 |
| wherein $L_{B25483}$ have the structure | 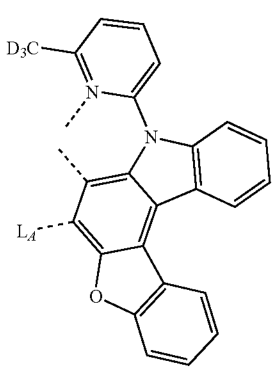 | | z = 25483 |

-continued

| $L_{Bz}$ | $L_{Bz}$ structure | $Ar^2$, $Ar^3$, $R^2$ | z |
|---|---|---|---|
| wherein $L_{B25484}$-$L_{B27583}$ have the structure | 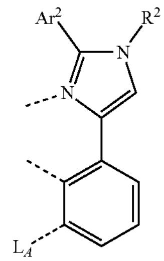 | wherein $Ar^2$ = Aj and $R^2$ = Rl, wherein j is an integer from 1 to 30 and l is an integer from 31 to 100, and | z = 70(j − 1) + (l − 30) + 25483 |
| wherein $L_{B27584}$-$L_{B27653}$ have the structure | 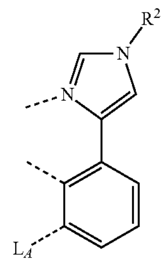 | wherein $R^2$ = Rl, wherein l is an integer from 31 to 100, and | z = (l − 30) + 27583 |
| wherein $L_{B27654}$-$L_{B29753}$ have the structure | 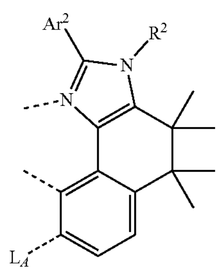 | wherein $Ar^2$ = Aj and $R^2$ = Rl, wherein j is an integer from 1 to 30 and l is an integer from 31 to 100, and | z = 70(j − 1) + (l − 30) + 27653 |
| wherein $L_{B29754}$-$L_{B29823}$ have the structure | 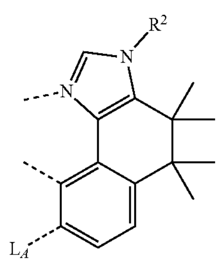 | wherein $R^2$ = Rl, wherein l is an integer from 31 to 100, and | z = (l − 30) + 29753 |
| wherein $L_{B29824}$-$L_{B31923}$ have the structure | 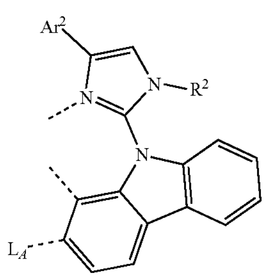 | wherein $Ar^2$ = Aj and $R^2$ = Rl, wherein j is an integer from 1 to 30 and l is an integer from 31 to 100, and | z = 70(j − 1) + (l − 30) + 29823 |
| wherein $L_{B31924}$-$L_{B31993}$ have the structure | 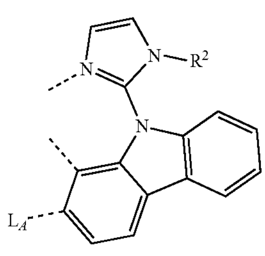 | wherein $R^2$ = Rl, wherein l is an integer from 31 to 100, and | z = (l − 30) + 31923 |

-continued

| $L_{Bz}$ | $L_{Bz}$ structure | $Ar^2$, $Ar^3$, $R^2$ | z |
|---|---|---|---|
| wherein $L_{B31994}$-$L_{B34093}$ have the structure | 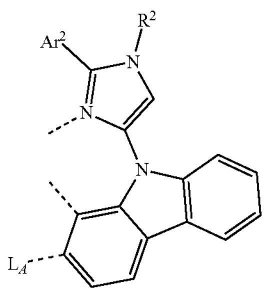 | wherein $Ar^2$ = Aj and $R^2$ = Rl, wherein j is an integer from 1 to 30 and l is an integer from 31 to 100, and | z = 70(j − 1) + (l − 30) + 31993 |
| wherein $L_{B34094}$-$L_{B34163}$ have the structure | 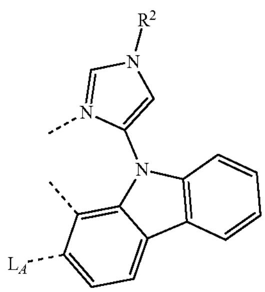 | wherein $R^2$ = Rl, wherein l is an integer from 31 to 100, and | z = l + 34093 |
| wherein $L_{B34164}$-$L_{B36263}$ have the structure | 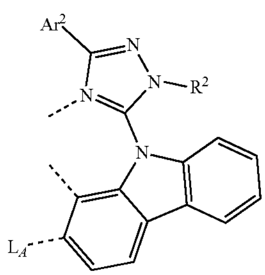 | wherein $Ar^2$ = Aj and $R^2$ = Rl, wherein j is an integer from 1 to 30 and l is an integer from 31 to 100, and | z = 70(j − 1) + (l − 30) + 34163 |
| wherein $L_{B36264}$-$L_{B36333}$ have the structure | 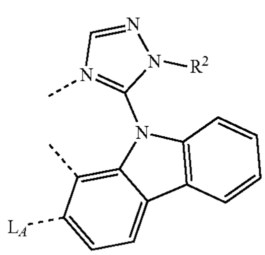 | wherein $R^2$ = Rl, wherein l is an integer from 31 to 100, and | z = l + 36263 |
| wherein $L_{B36334}$-$L_{B38433}$ have the structure | 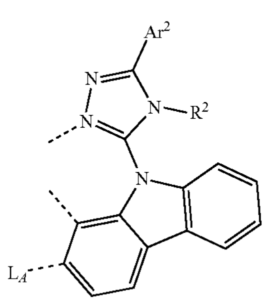 | wherein $Ar^2$ = Aj and $R^2$ = Rl, wherein j is an integer from 1 to 30 and l is an integer from 31 to 100, and | z = 70(j − 1) + (l − 30) + 36333 |

-continued

| $L_{Bz}$ | $L_{Bz}$ structure | $Ar^2$, $Ar^3$, $R^2$ | z |
|---|---|---|---|
| wherein $L_{B38434}$-$L_{B38503}$ have the structure | 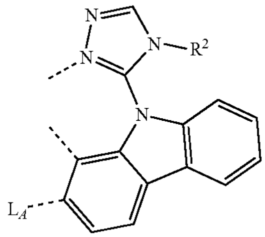 | wherein $R^2$ = Rl, wherein l is an integer from 31 to 100, and | z = l + 38433 |
| wherein $L_{B38504}$-$L_{B40603}$ have the structure | 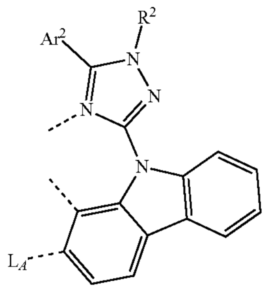 | wherein $Ar^2$ = Aj and $R^2$ = Rl, wherein j is an integer from 1 to 30 and l is an integer from 31 to 100, and | z = 70(j − 1) + (l − 30) + 38503 |
| wherein $L_{B40604}$-$L_{B40673}$ have the structure | 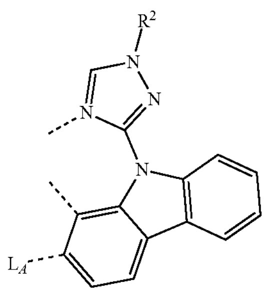 | wherein $R^2$ = Rl, wherein l is an integer from 31 to 100, and | z = l + 40603 |

wherein A1 to A30 have the following structures:

A1

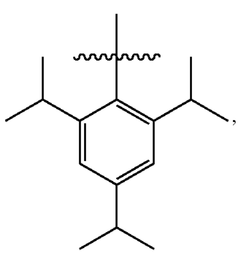

A2

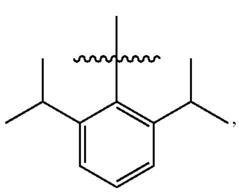

A3

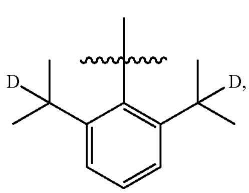

-continued

A4

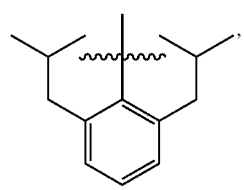

A5

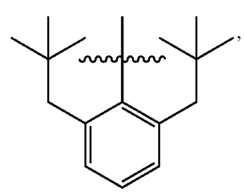

A6

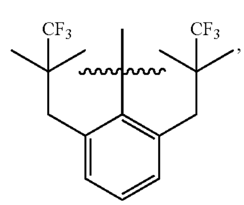

-continued
A7
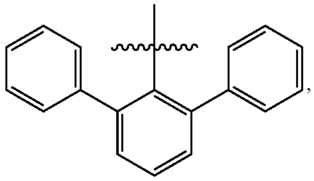
A8
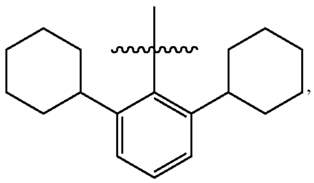
A9
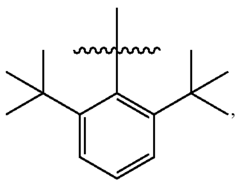
A10
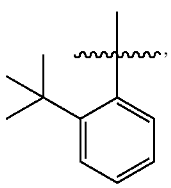
A11
Me,
A12
iPr,
A13
tBu,
A14
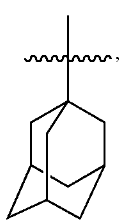
A15
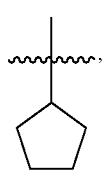
A16
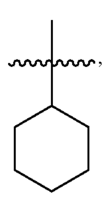
-continued
A17
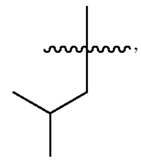
A18
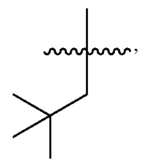
A19
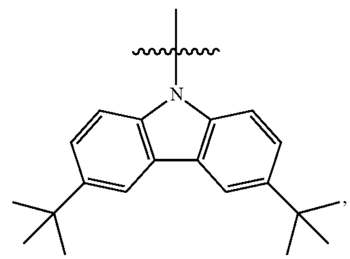
A20
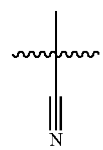
A21
$CD_3$,
A22
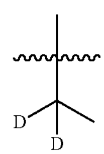
A23
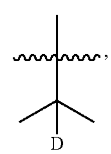
A24
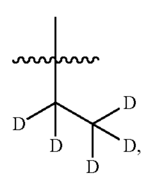
A25
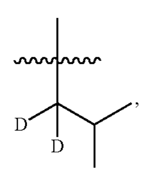
A26
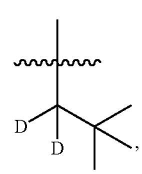

-continued
A27
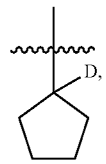
A28
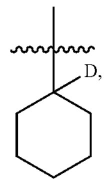
A29
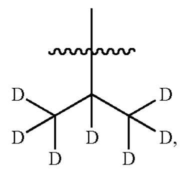
A30
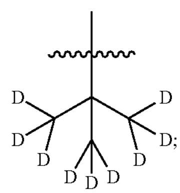
and wherein R1 to R100 have the following structures:
R1
Me,
R2
iPr,
R3
tBu,
R4
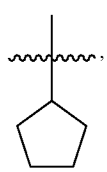
R5
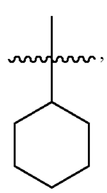
R6
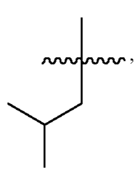
-continued
R7
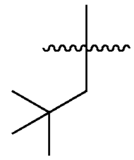
R8
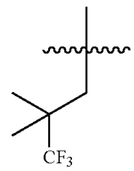
R9
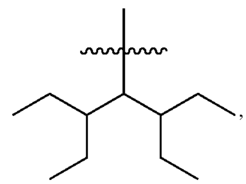
R10
$CD_3$,
R11
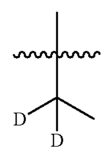
R12
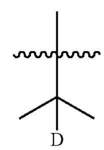
R13
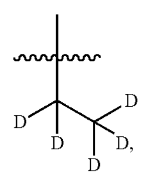
R14
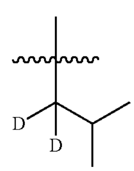
R15
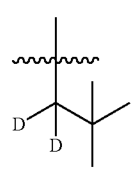
R16
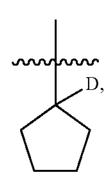

-continued
R17
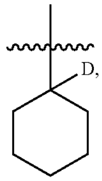
R18
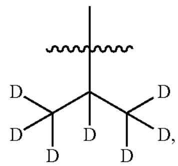
R19
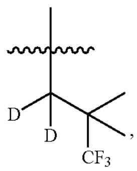
R20
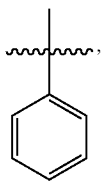
R21
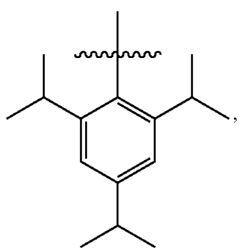
R22
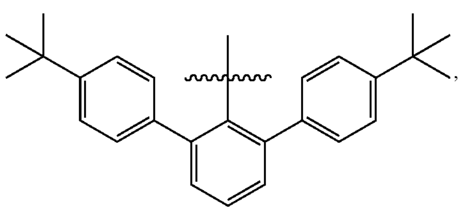
R23
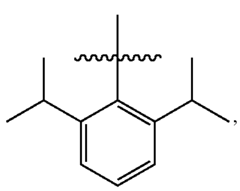
R24
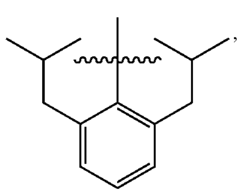
-continued
R25
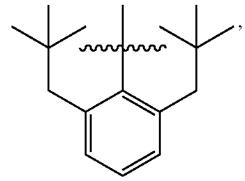
R26
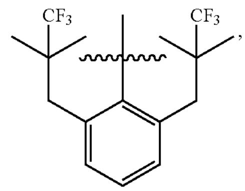
R27
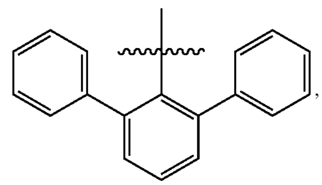
R28
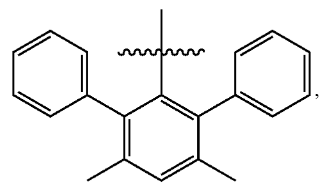
R29
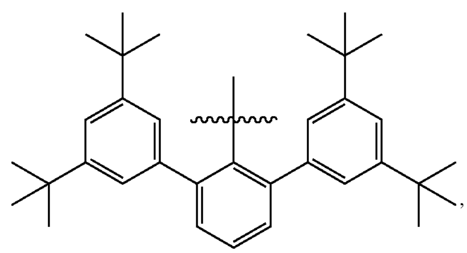
R30
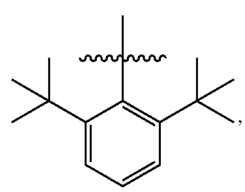
R31
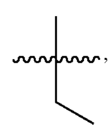
R32
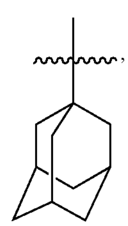

-continued
R33
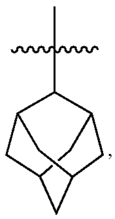
R34
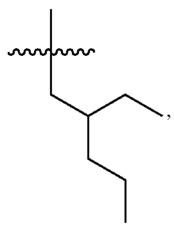
R35
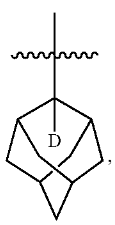
R36
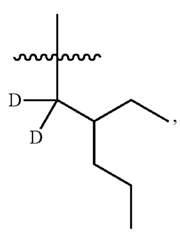
R37
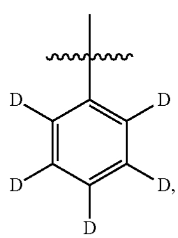
R38
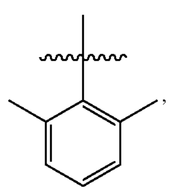
R39
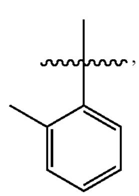
-continued
R40
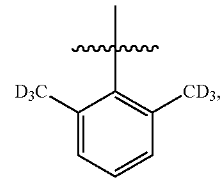
R41
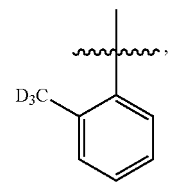
R42
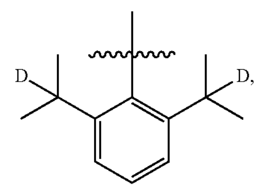
R43
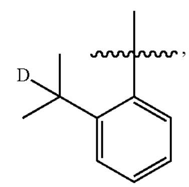
R44
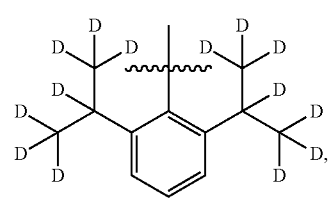
R45
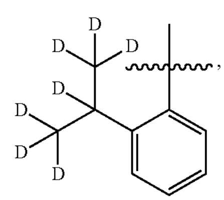
R46
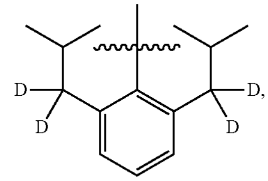
R47
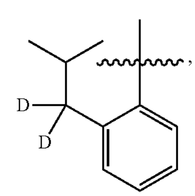

-continued
R48
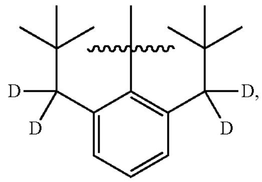
R49
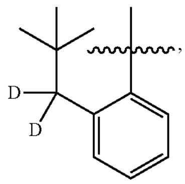
R50
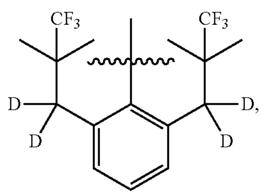
R51
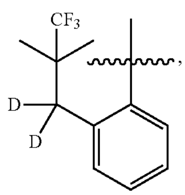
R52
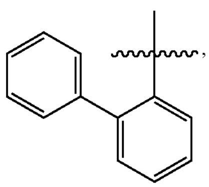
R53
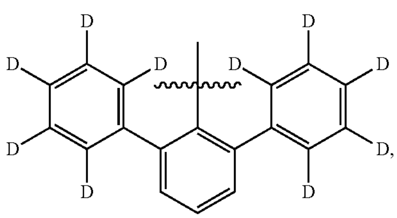
R54
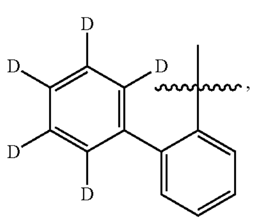
R55
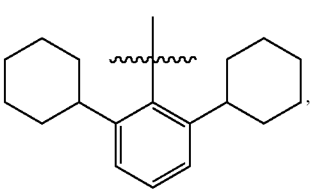
-continued
R56
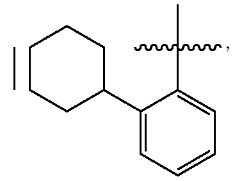
R57
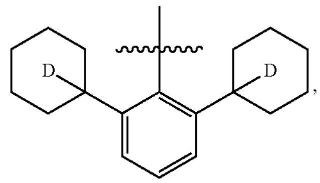
R58
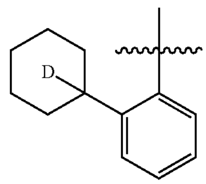
R59
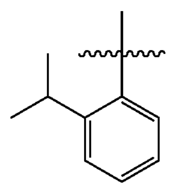
R60
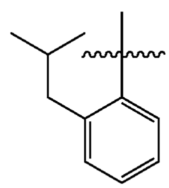
R61
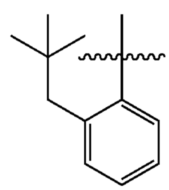
R62
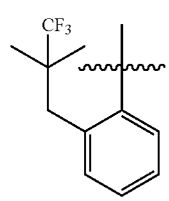
R63
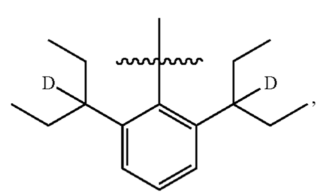

-continued
R64
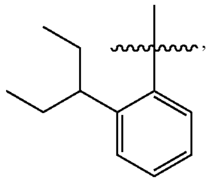
R65
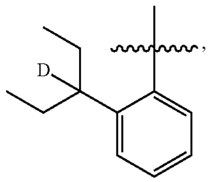
R66
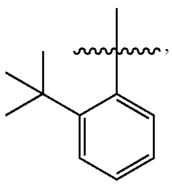
R67
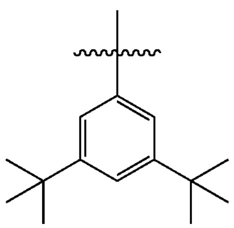
R68
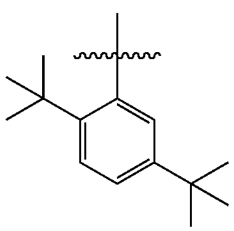
R69
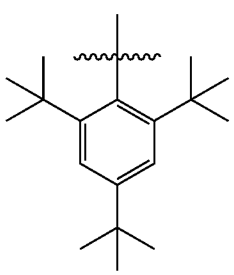
R70
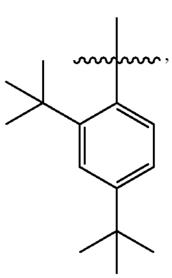
-continued
R71
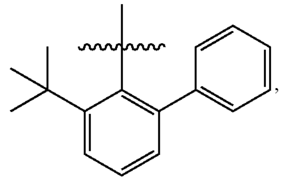
R72
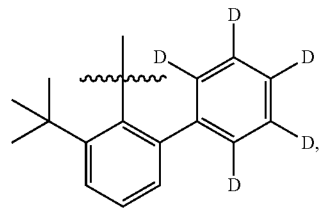
R73
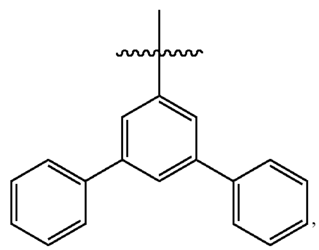
R74
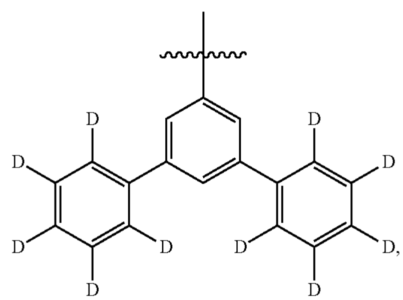
R75
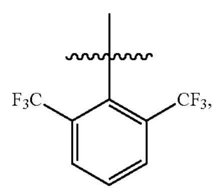
R76
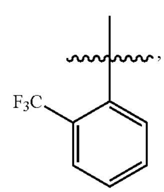
R77
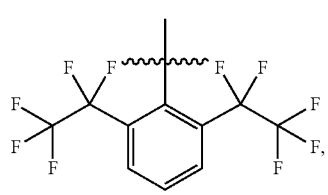

-continued
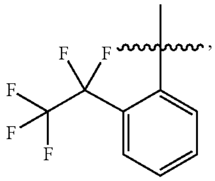
R78
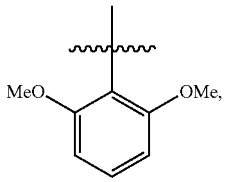
R79
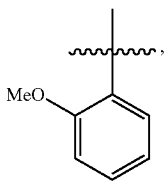
R80
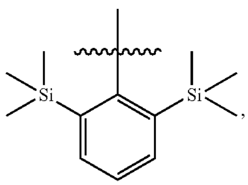
R81
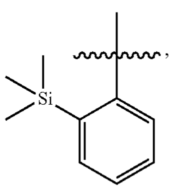
R82
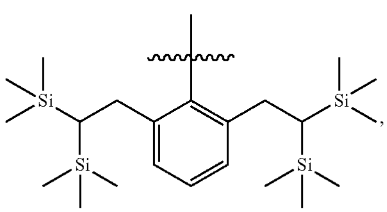
R83
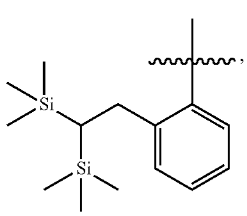
R84
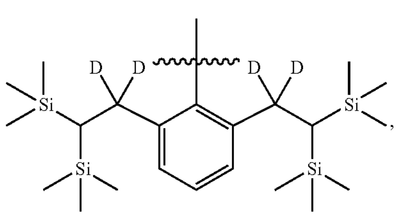
R85
-continued
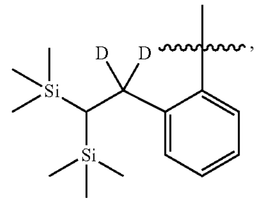
R86
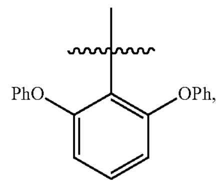
R87
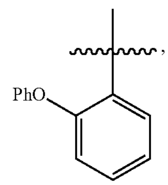
R88
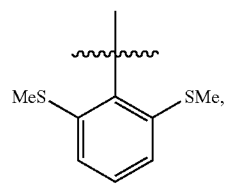
R89
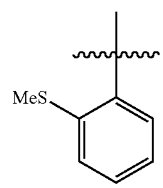
R90
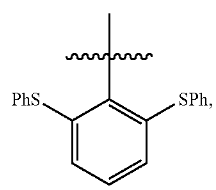
R91
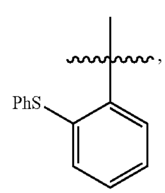
R92
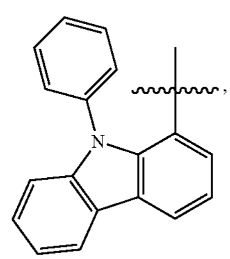
R93

-continued

R94

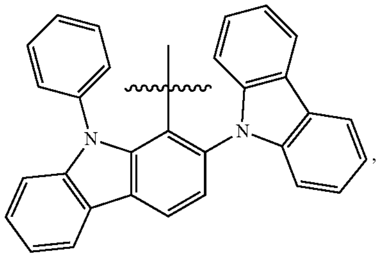

R95

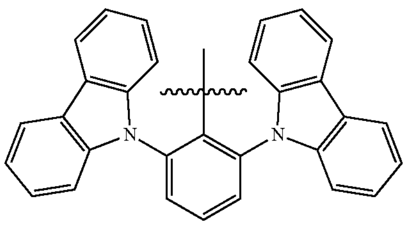

R96

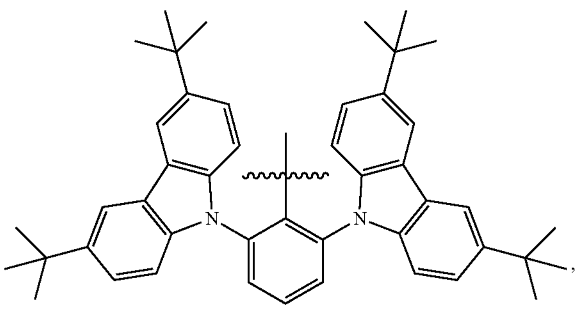

R97

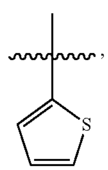

R98

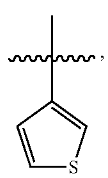

R99

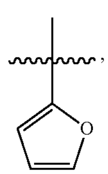

R100

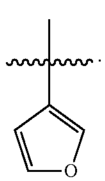

An organic light emitting device (OLED) is also disclosed. The OLED comprises: an anode; a cathode; and an organic layer, disposed between the anode and the cathode, comprising a compound having the formula:

Formula I,

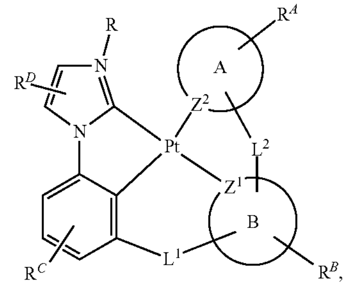

wherein Formula I is defined as provided above.

In some embodiments of the OLED, each of R', R", $R^A$, $R^B$, $R^C$, and $R^D$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

A consumer product comprising the OLED is also disclosed, wherein the organic layer in the OLED comprises the compound having the Formula I.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An emissive region in an OLED is also disclosed. The emissive region comprises a compound having the formula:

Formula I,

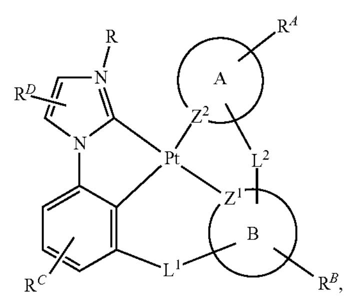

In Formula I, A and B are each independently a 5- or 6-membered aromatic ring; $Z^1$ and $Z^2$ are each independently selected from the group consisting of C and N; $L^1$ and $L^2$ are each independently selected from the group consisting of a direct bond, BR', NR', PR', O, S, Se, C═O, S═O, $SO_2$, CR'R", SiR'R", GeR'R", alkyl, cycloalkyl, and combinations thereof; $R^A$, $R^B$, $R^C$, and $R^D$, each represents mono to a maximum possible number of substitutions, or no substitution; each of R', R", $R^A$, $R^B$, $R^C$, and $R^D$ is independently a hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; R is selected from the group consisting of deuterium, alkyl, cycloalkyl, heteroalkyl, arylalkyl, silyl, aryl, heteroaryl, and combinations thereof, any substitutions in $R^A$, $R^B$, $R^C$, and $R^D$ may be joined or fused into a ring; $R^A$ or $R^B$ may be fused with $L^2$ to form a ring;

wherein at least one of the following conditions (a), (b), and (c) is true:

(a) at least one of $R^A$ and $R^C$ is present and is a 5- or 6-membered aromatic ring attached to a carbon atom;

(b) $R^A$ is present and is an alkyl or cycloalkyl attached to a carbon atom, and each $R^C$ is independently H or aryl; and (c) both $R^A$ and $R^C$ are present and are an alkyl or cycloalkyl attached to a carbon atom, and R has a molecular weight equal to or greater than 16.0 grams per mole.

In some embodiments of the emissive region, each of R', R", $R^A$, $R^B$, $R^C$, and $R^D$ is independently a hydrogen or a substituent selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, sulfanyl, nitrile, isonitrile, and combinations thereof.

In some embodiments of the emissive region, the compound is an emissive dopant or a non-emissive dopant.

In some embodiments of the emissive region, the emissive region further comprises a host, wherein the host comprises at least one selected from the group consisting of metal complex, triphenylene, carbazole, dibenzothiophene, dibenzofuran, dibenzoselenophene, aza-triphenylene, azacarbazole, aza-dibenzothiophene, aza-dibenzofuran, and aza-dibenzoselenophene.

In some embodiments of the emissive region, the emissive region further comprises a host, wherein the host is selected from the group consisting of:

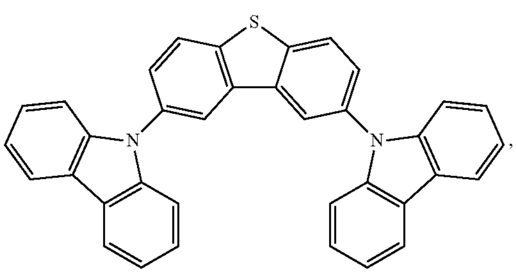

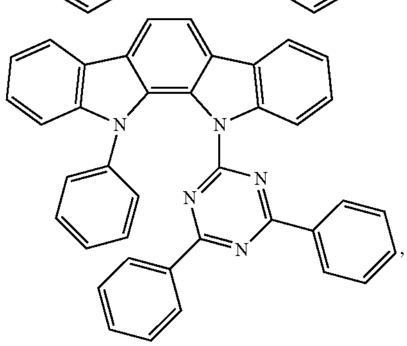

-continued

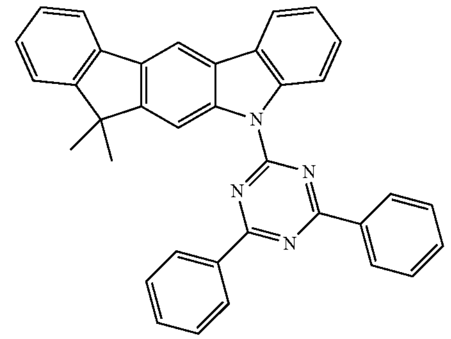

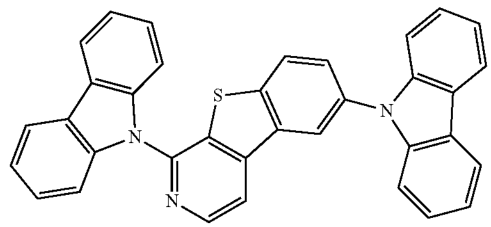

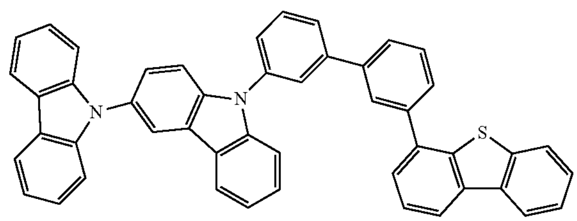

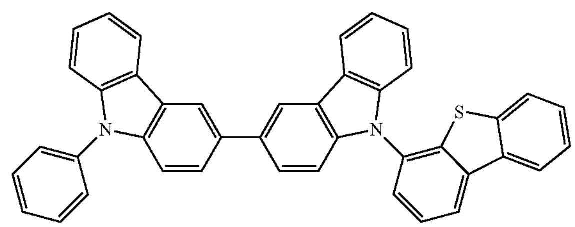

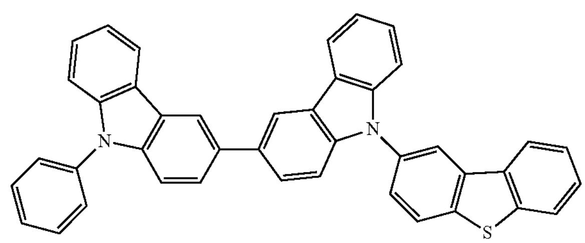

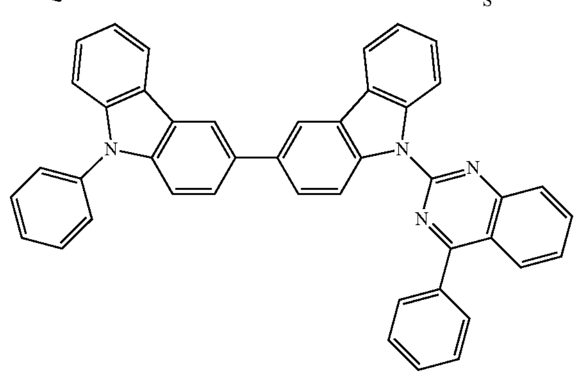

-continued
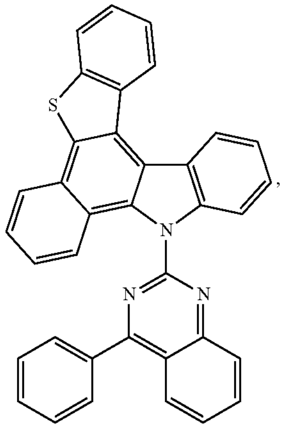
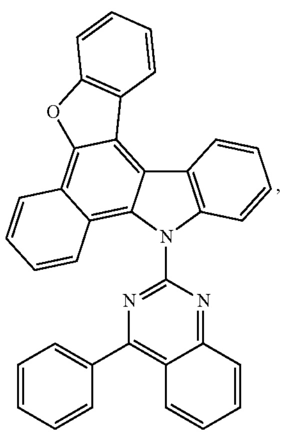
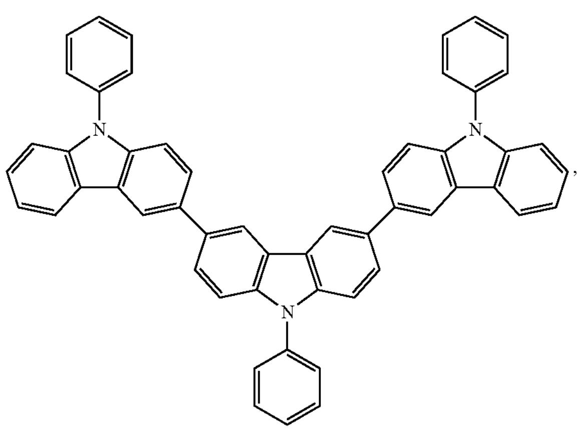
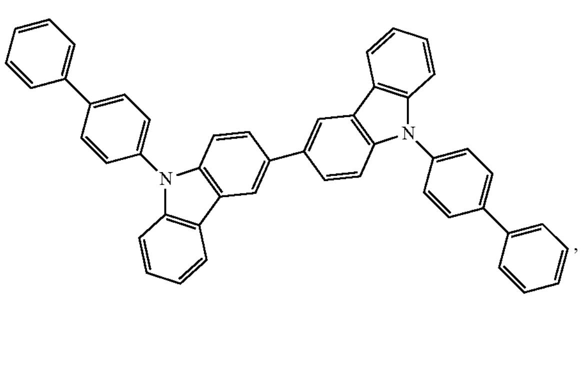
-continued
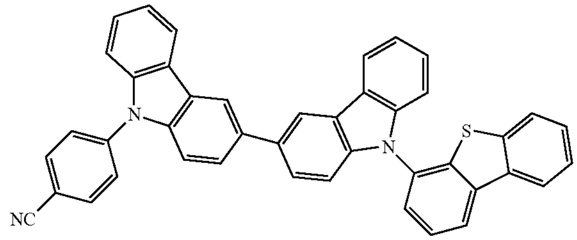
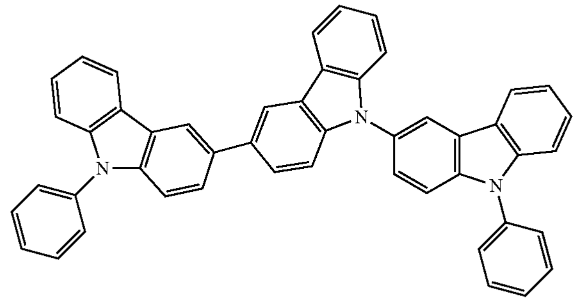
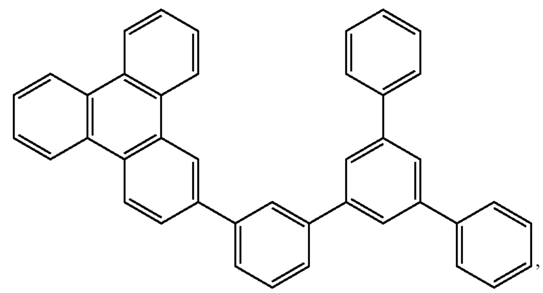
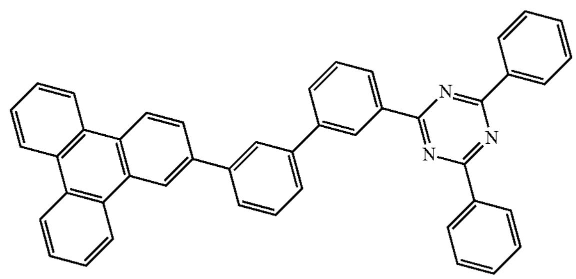
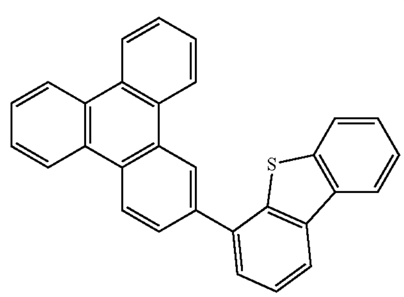
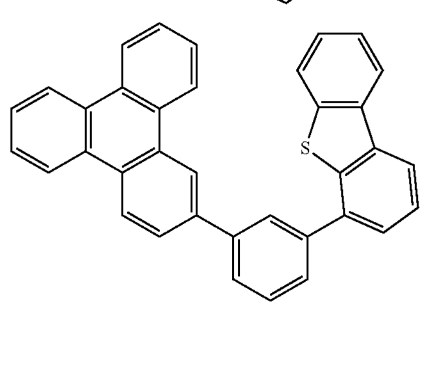

-continued

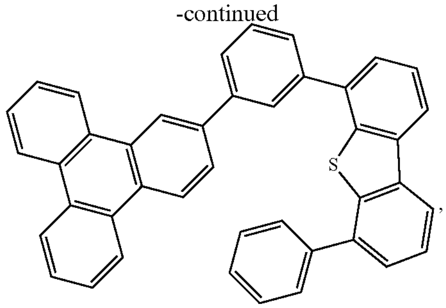

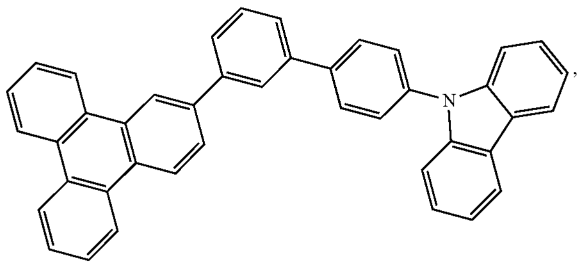

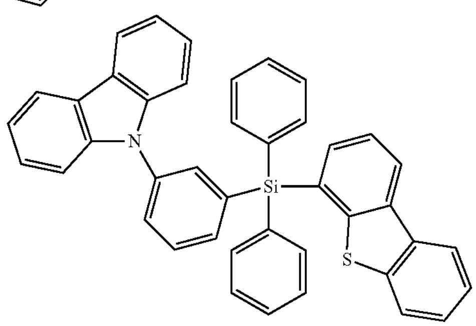

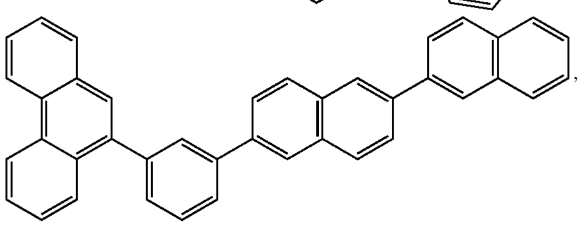

and combinations thereof.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes. In some embodiments, the emissive dopant can be a racemic mixture, or can be enriched in one enantiomer.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH{=}CH{-}C_nH_{2n+1}$, $C{\equiv}C{-}C_nH_{2n+1}$, $Ar_1$, $Ar_1$-$Ar_2$, and $C_nH_{2n}{-}Ar_1$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

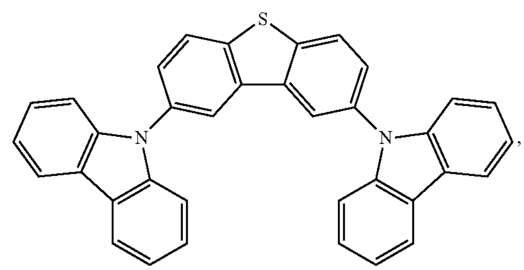

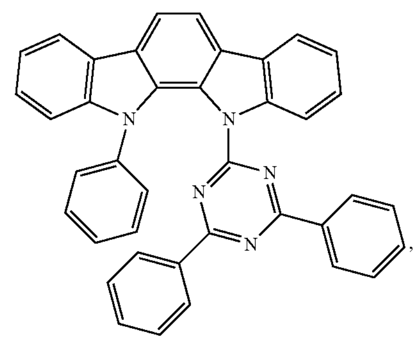

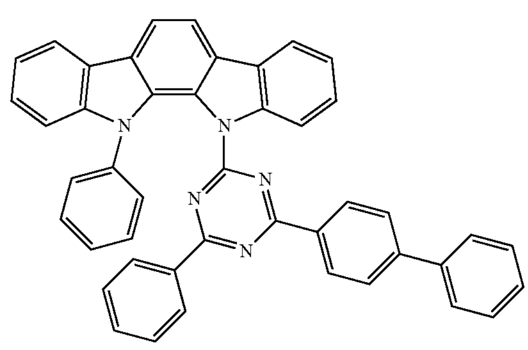

-continued
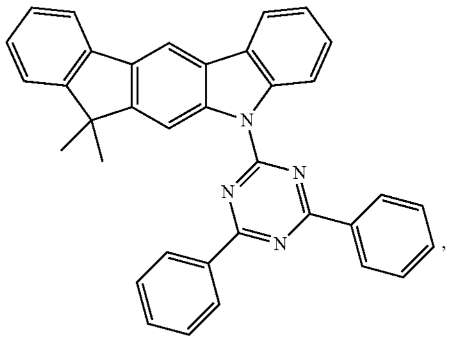
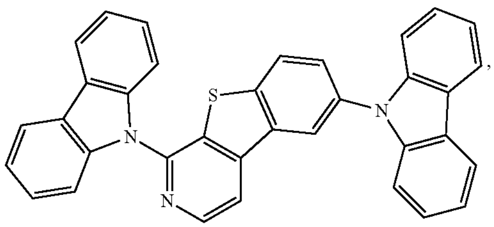
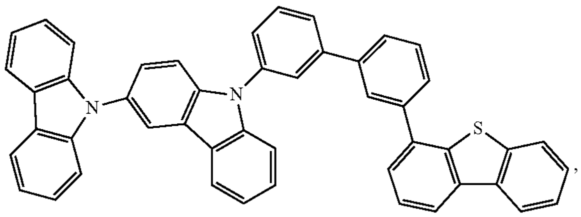
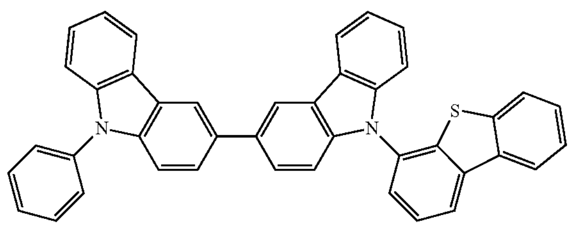
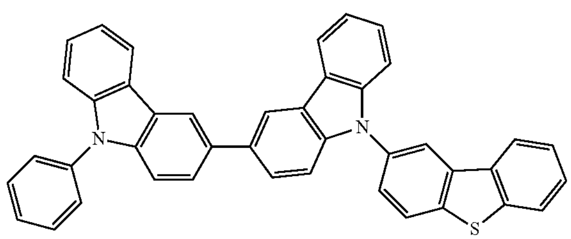
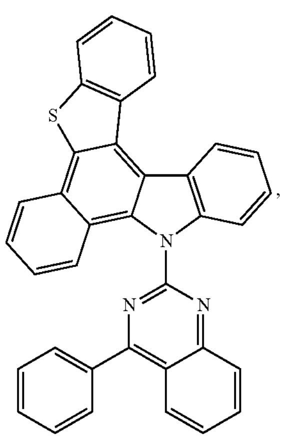
-continued
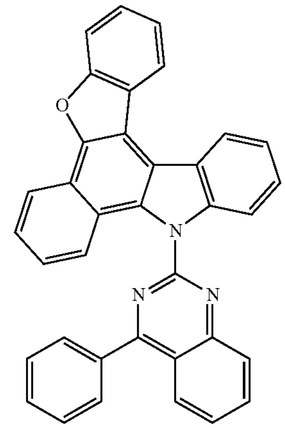
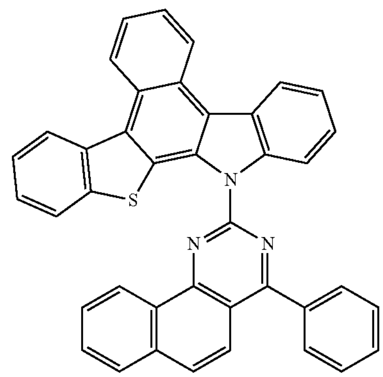
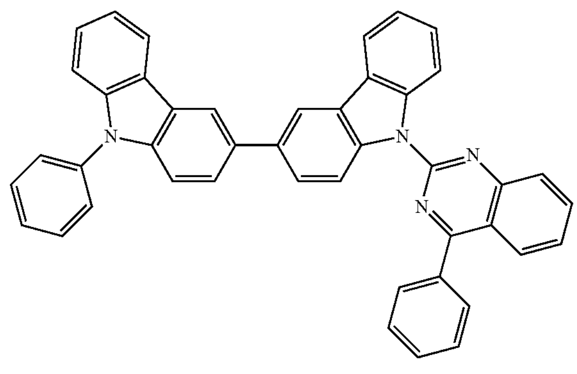
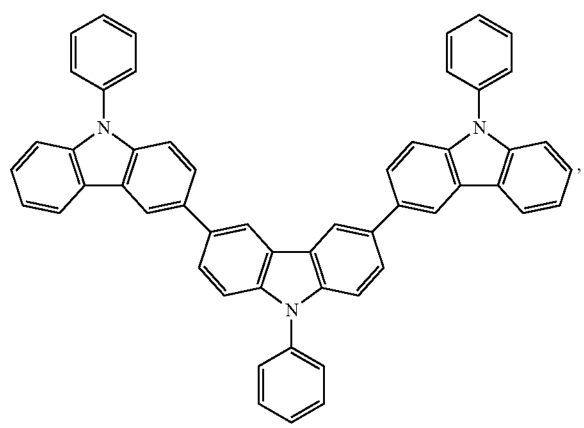

-continued
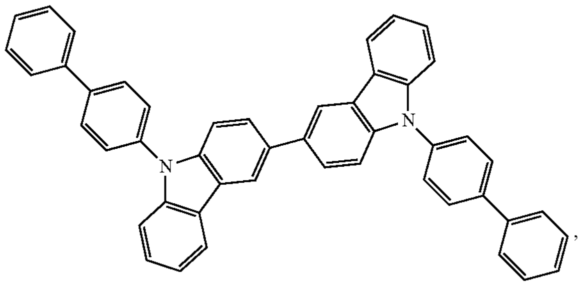
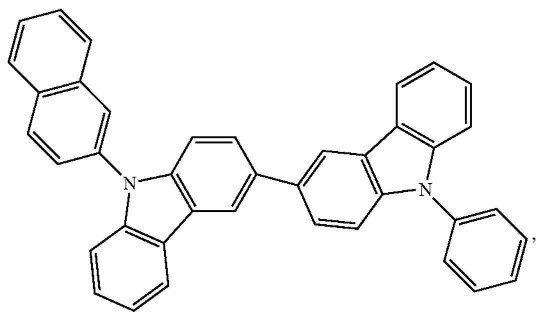
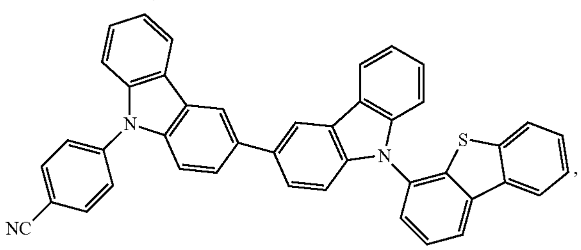
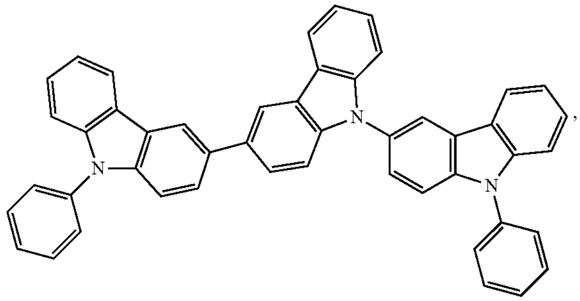
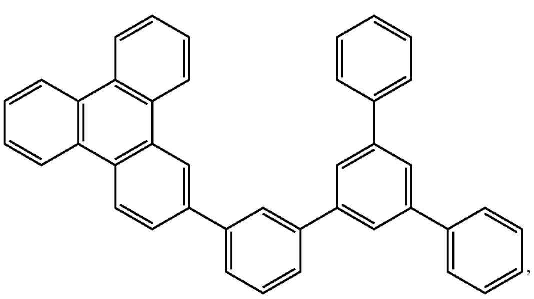
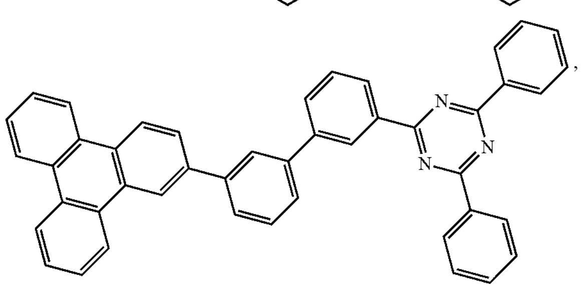
-continued
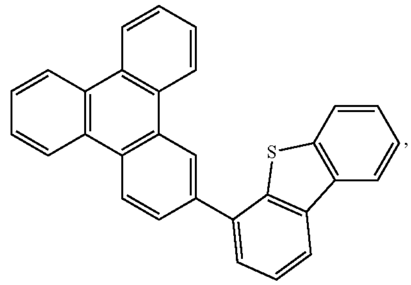
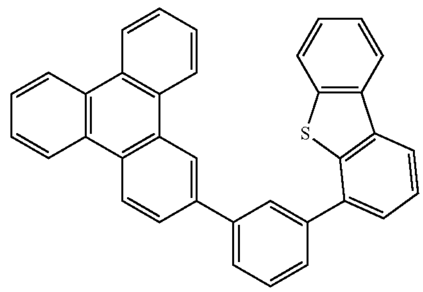
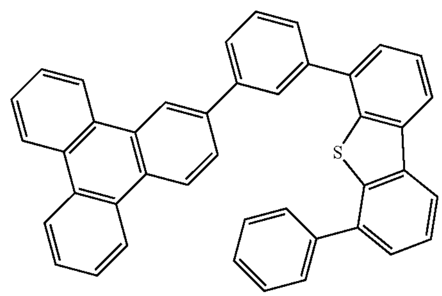
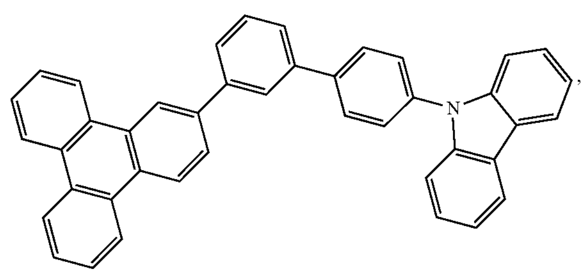
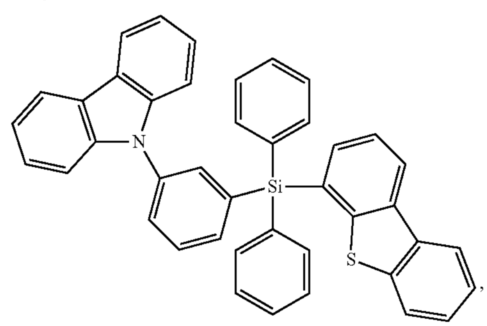
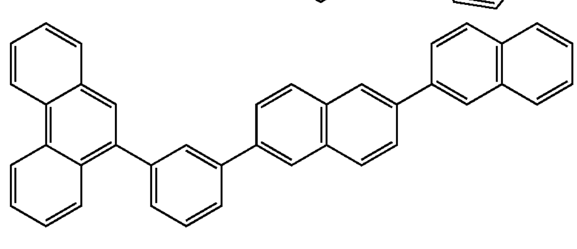
and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.

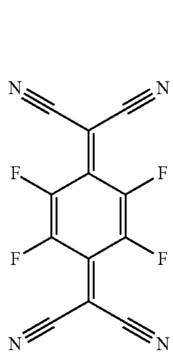

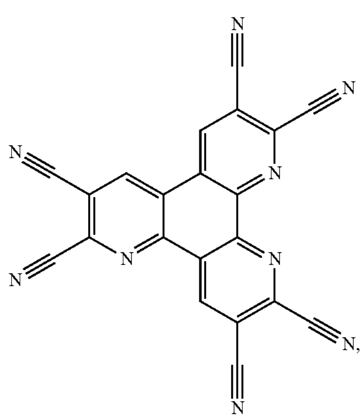

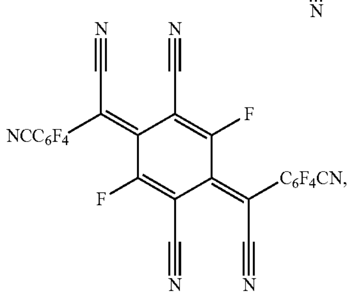

-continued

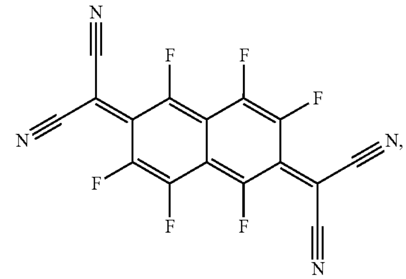

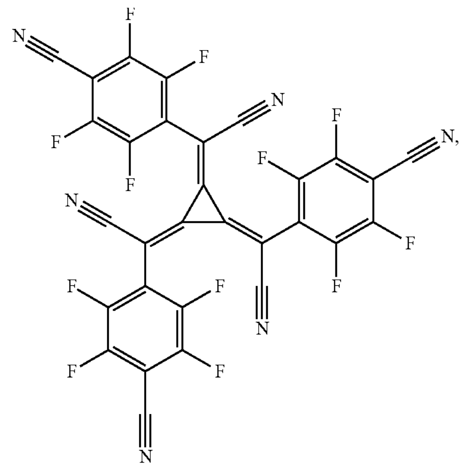

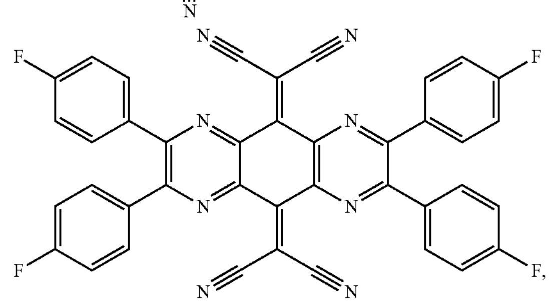

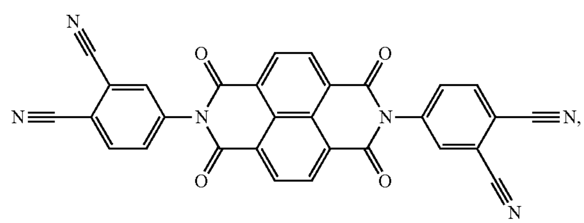

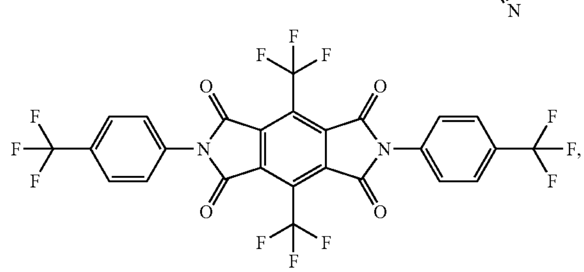

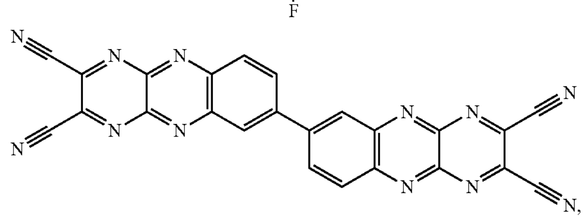

-continued

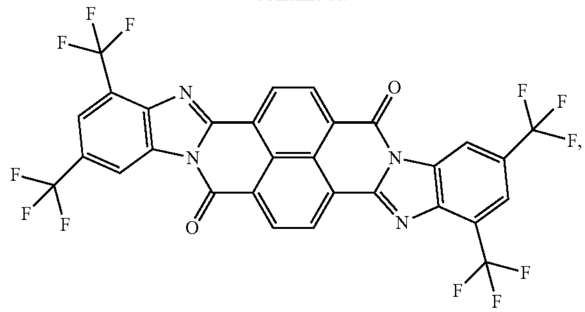

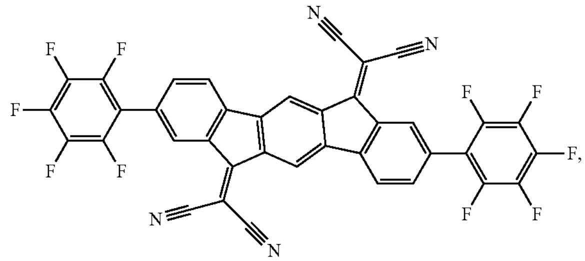

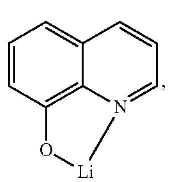

, and

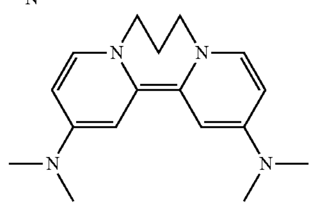

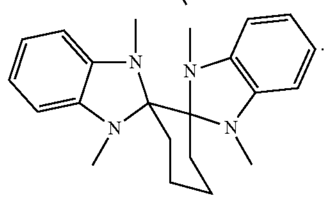

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

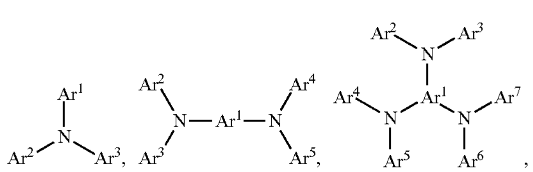

-continued

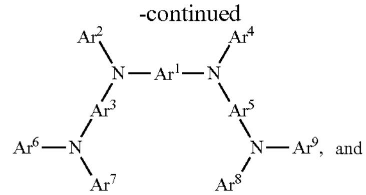

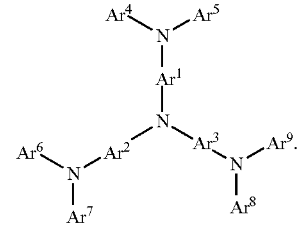

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

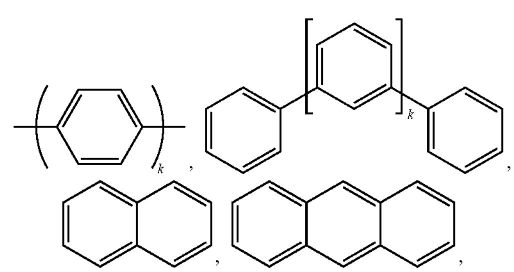

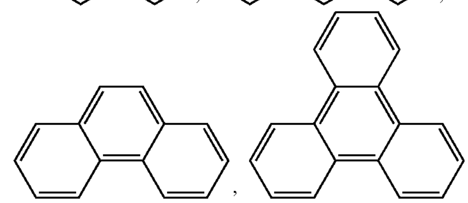

-continued

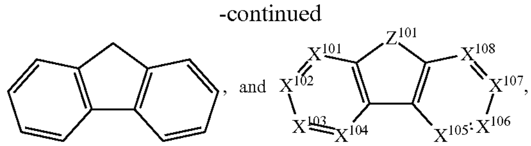

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

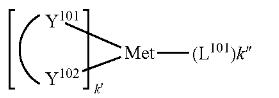

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

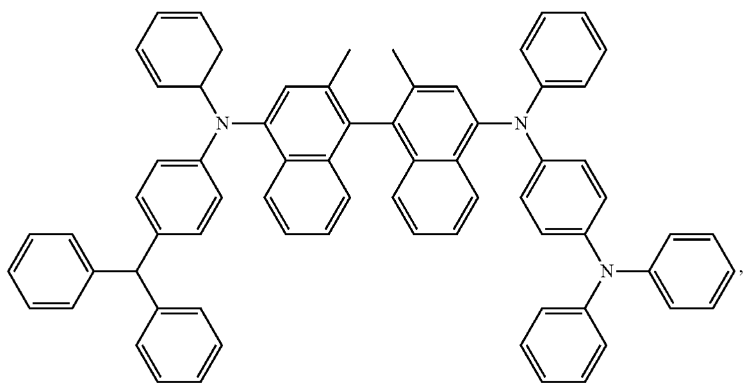

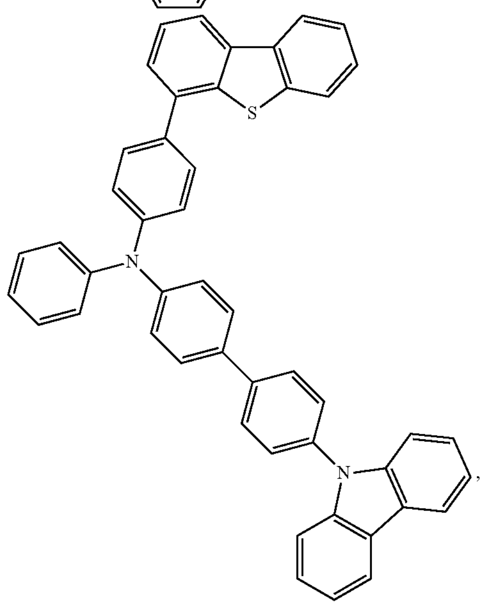

-continued
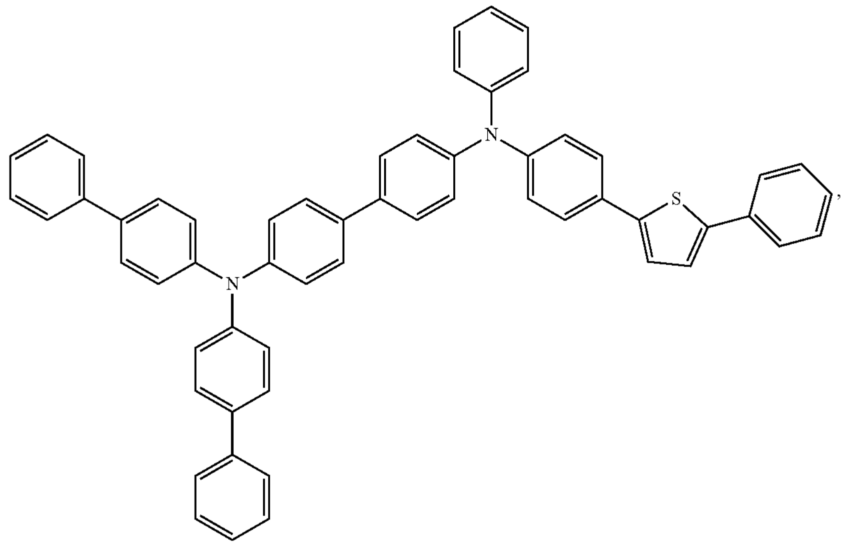
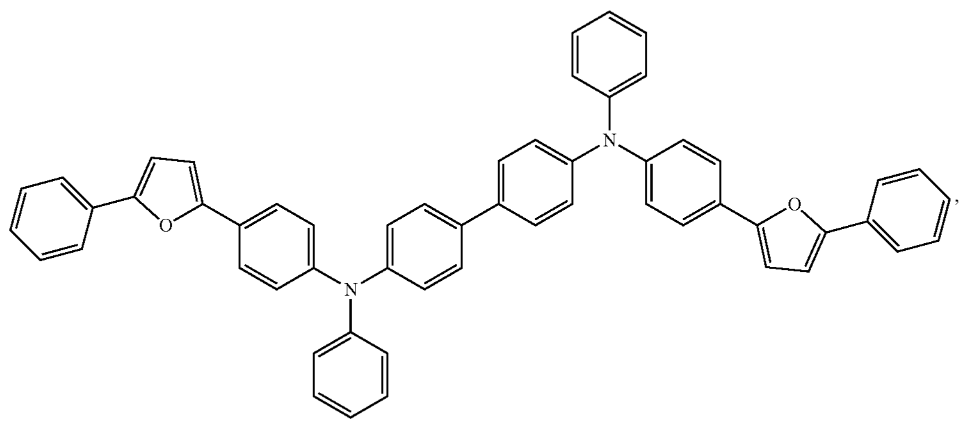
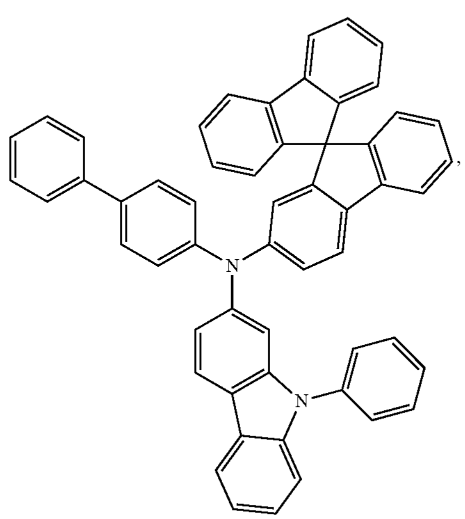

-continued
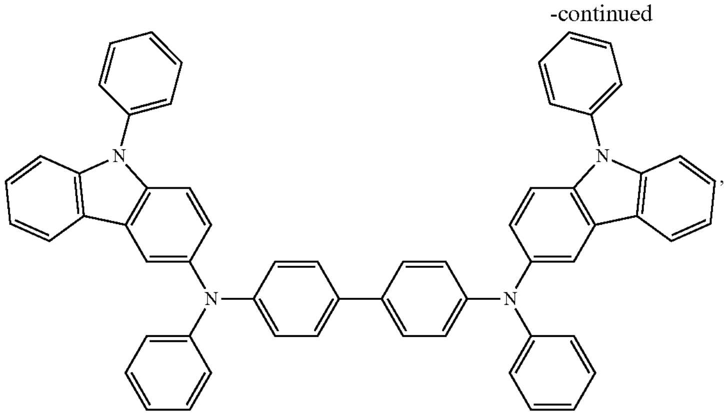
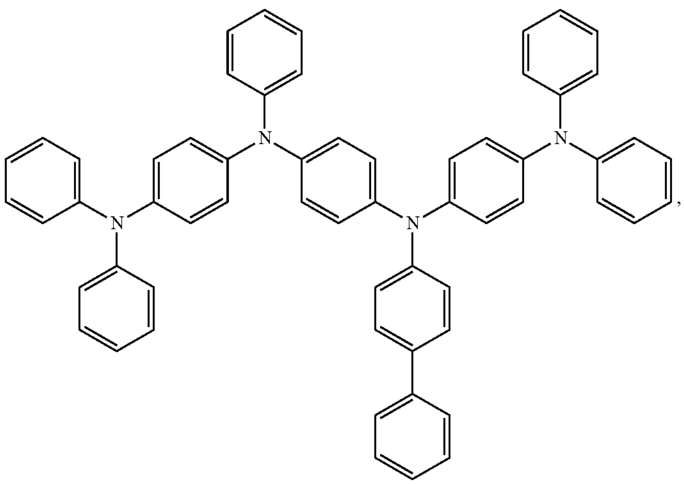
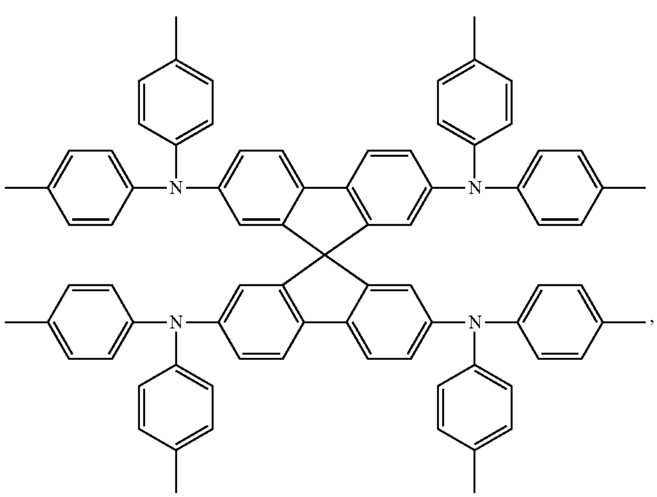

-continued
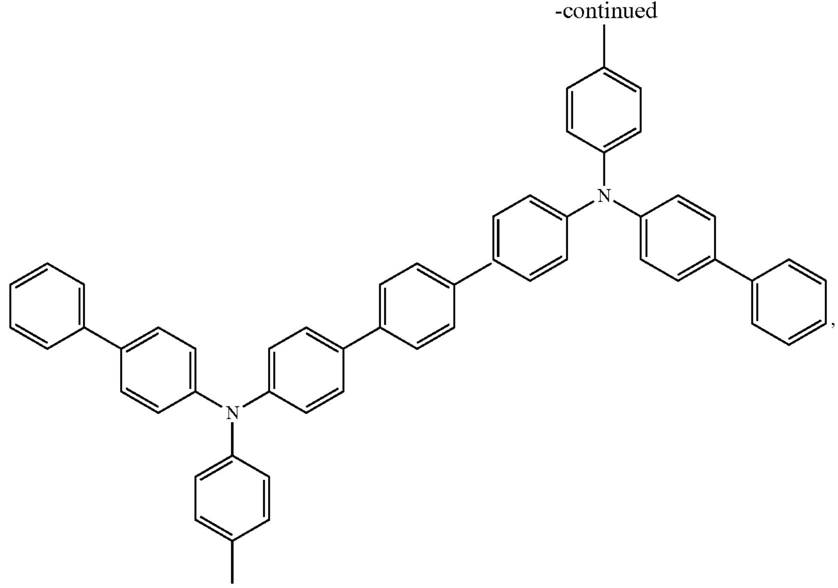
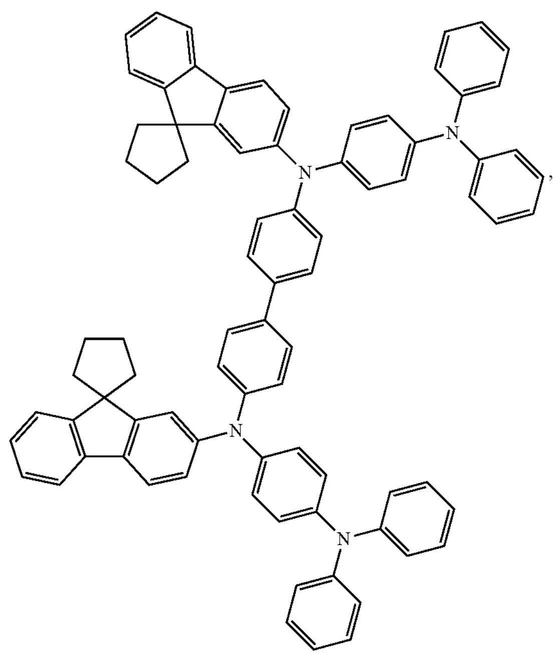
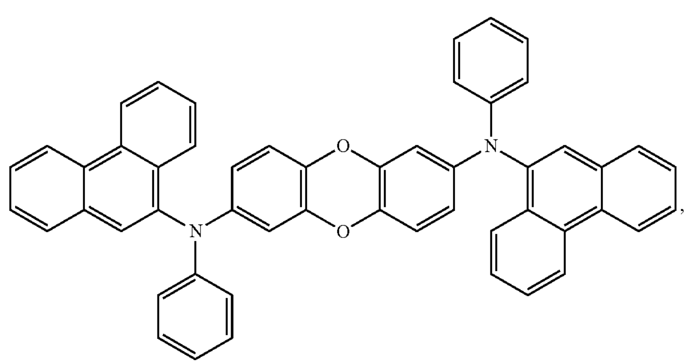

-continued
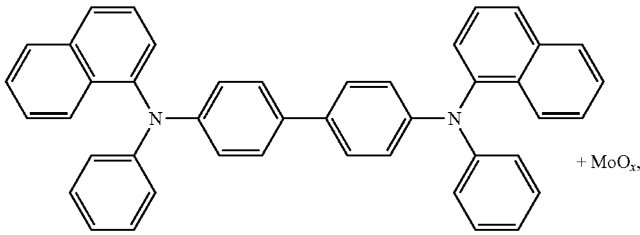
+ $MoO_x$,
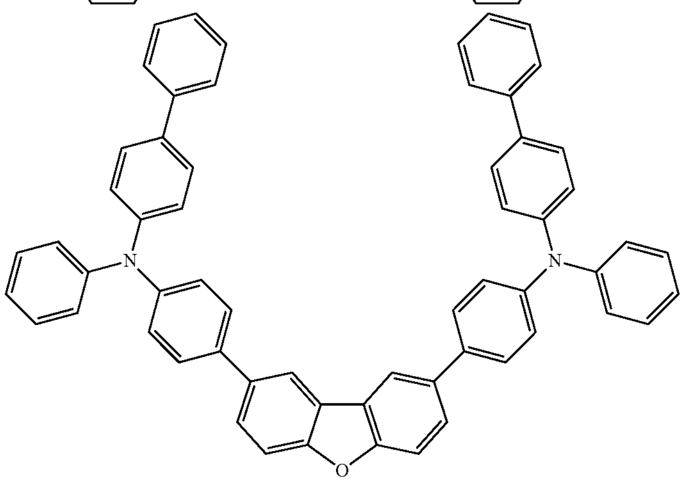
,
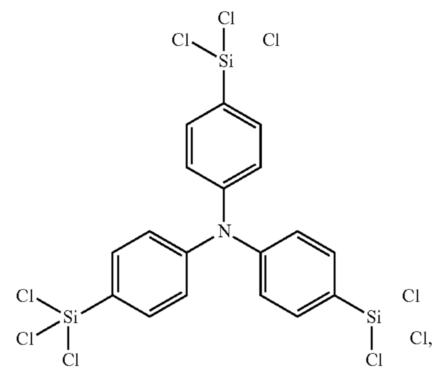
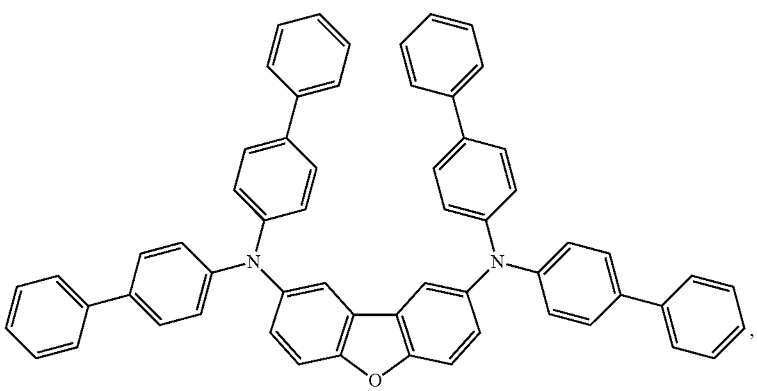
,
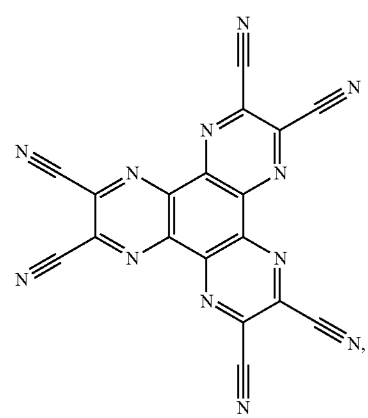
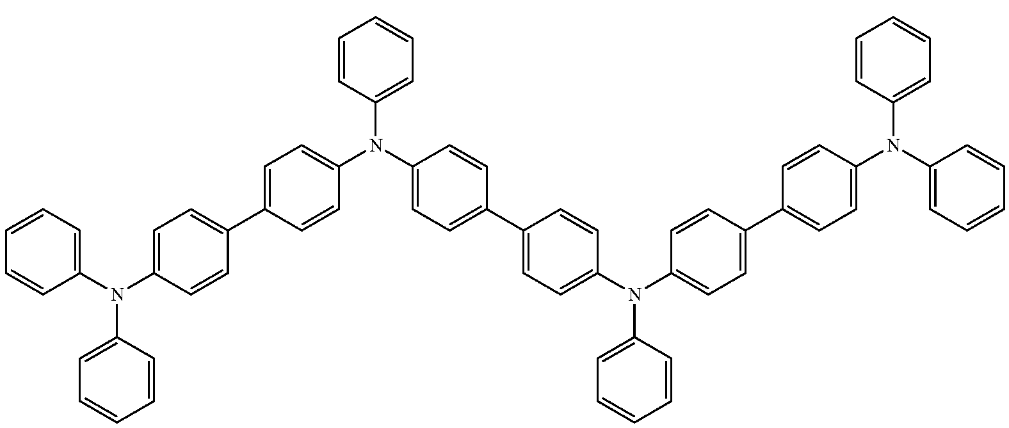
, -continued
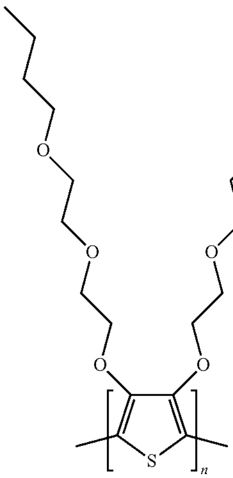
,
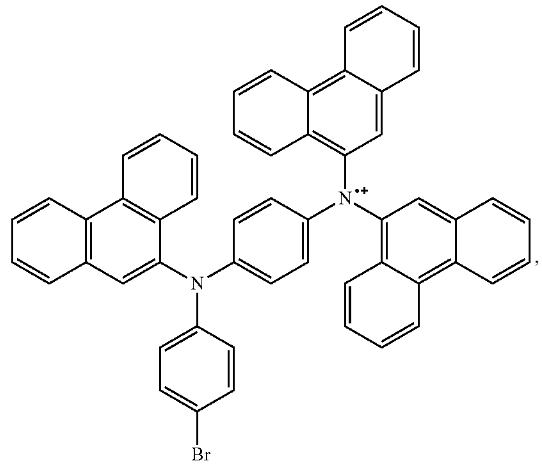
,
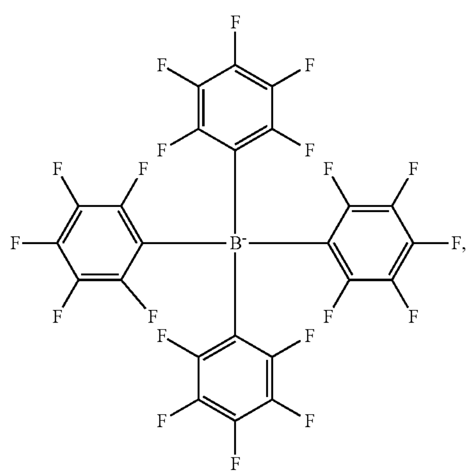
,
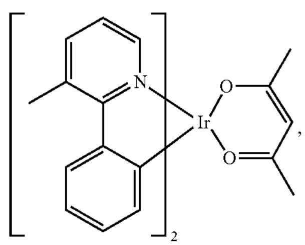
,
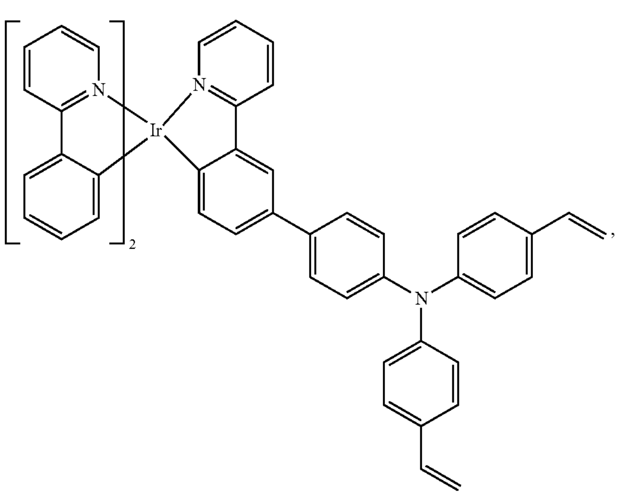
, -continued
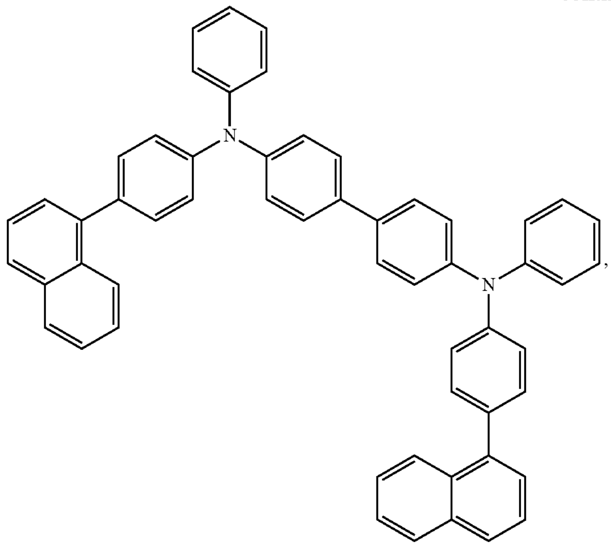
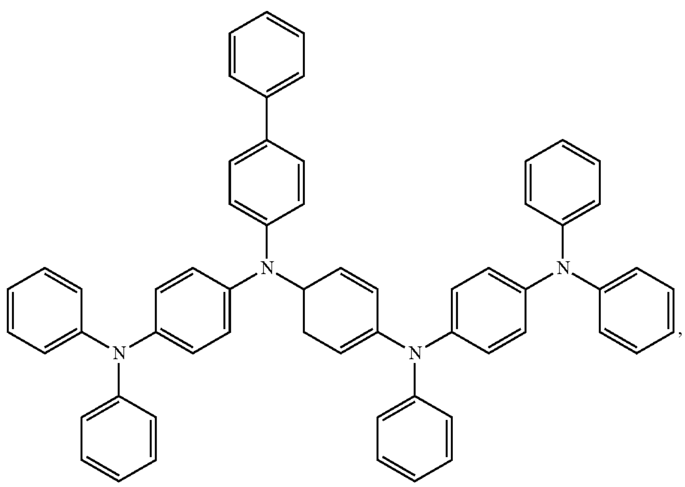
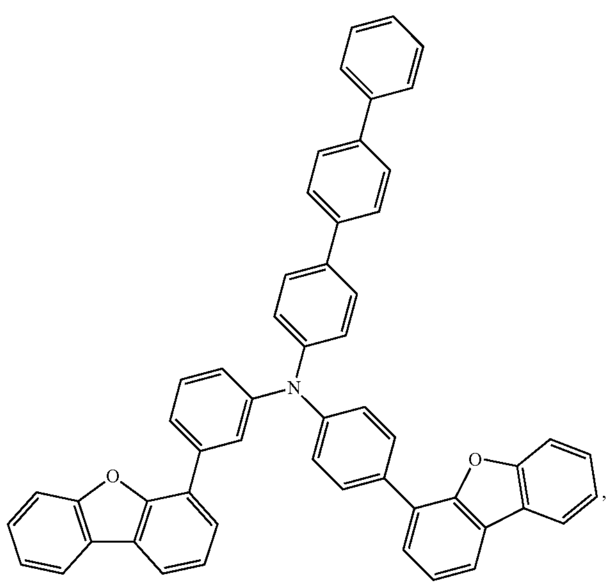

-continued
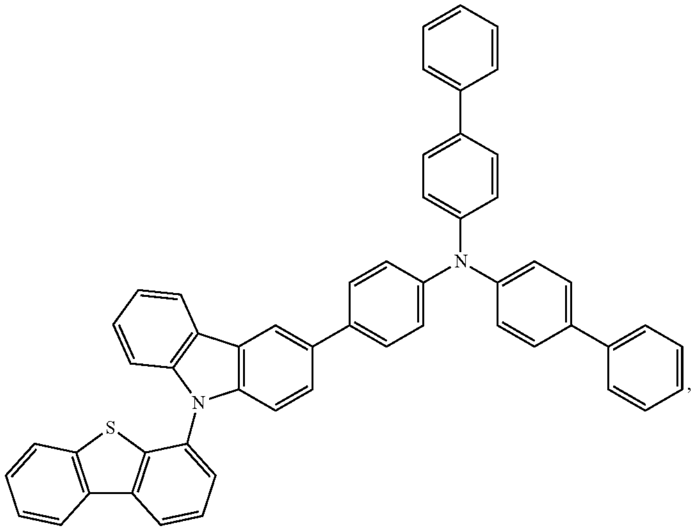
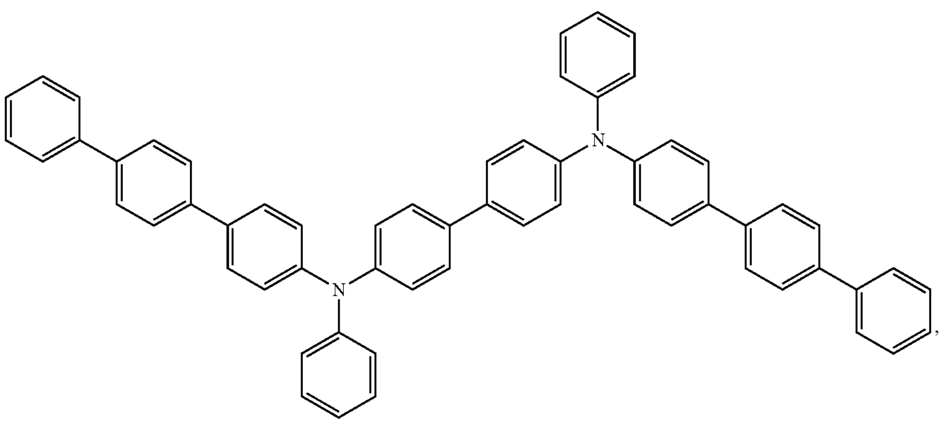
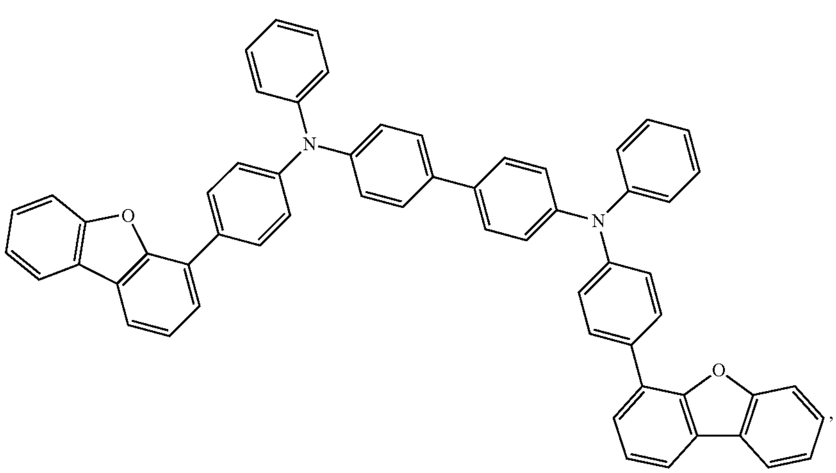

-continued
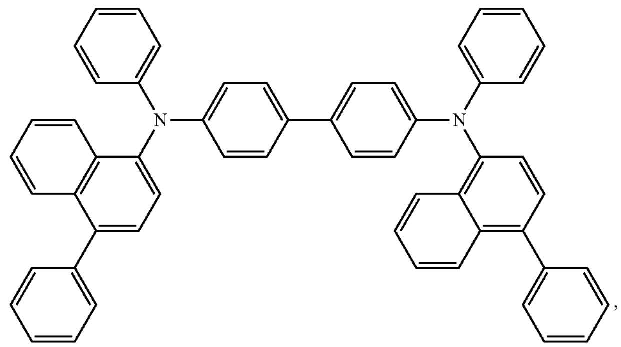
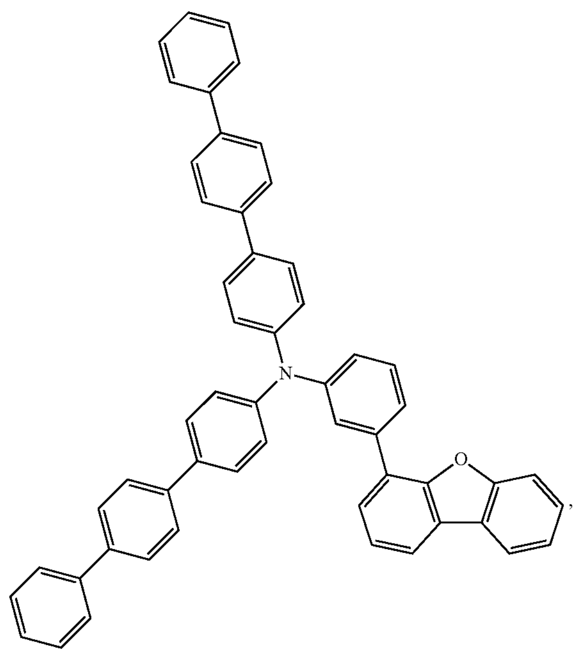
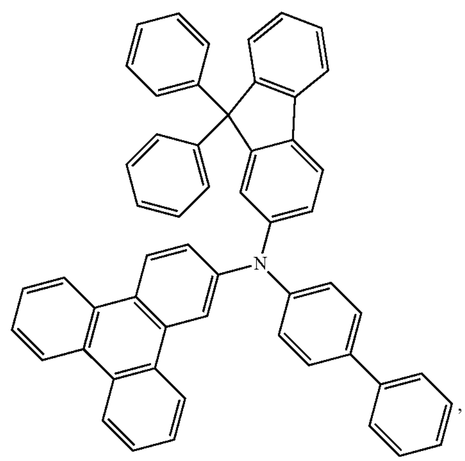
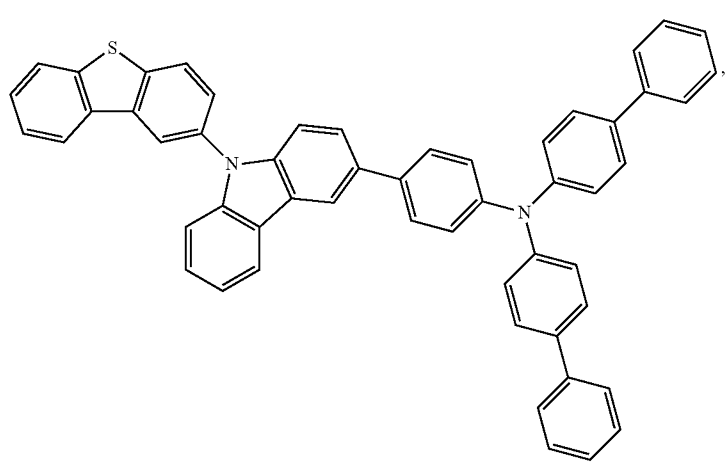

-continued
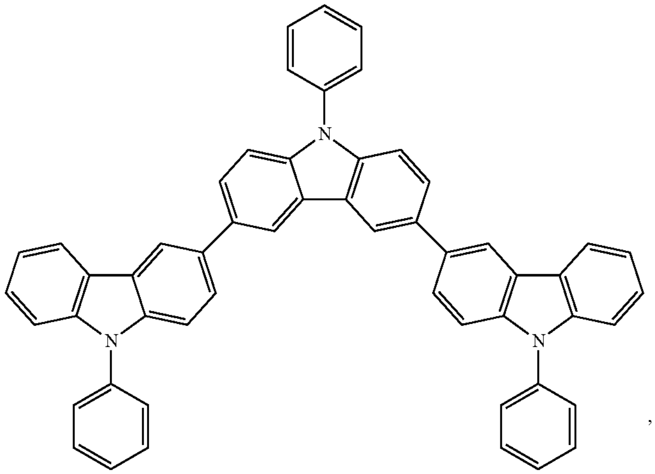
,
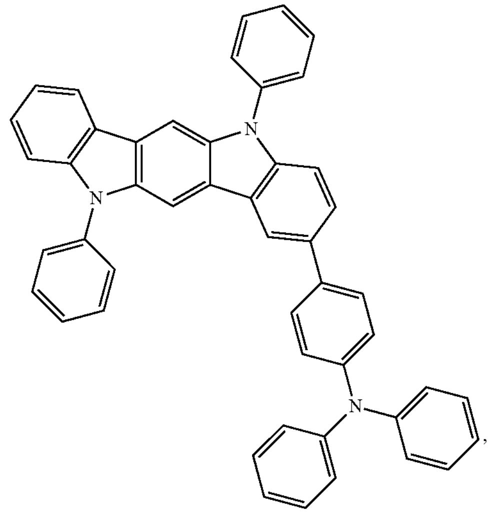
,
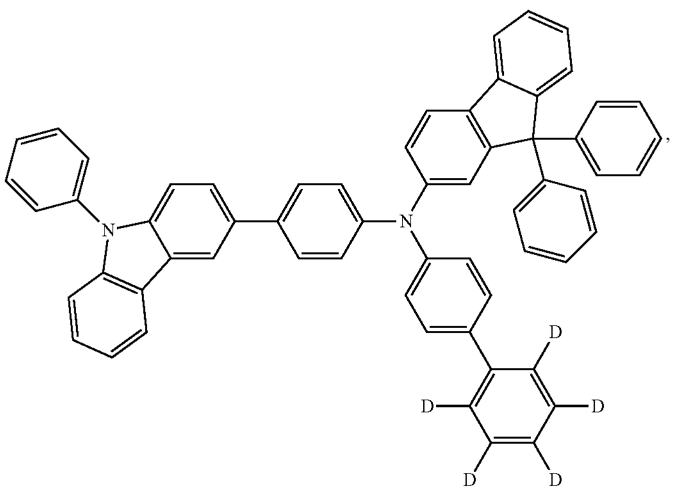
,
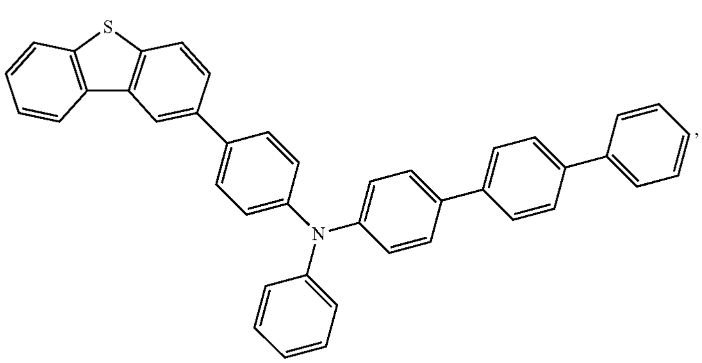
,

-continued
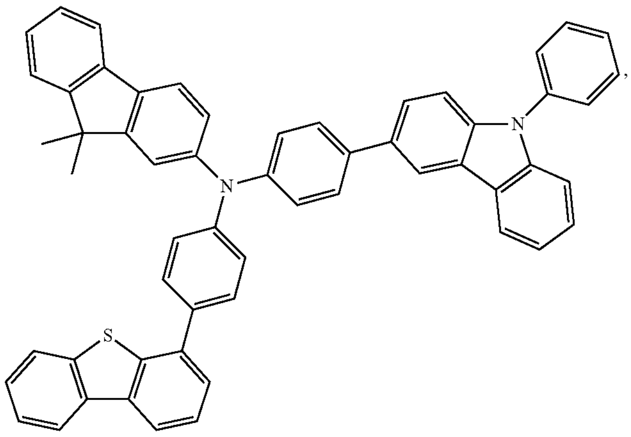
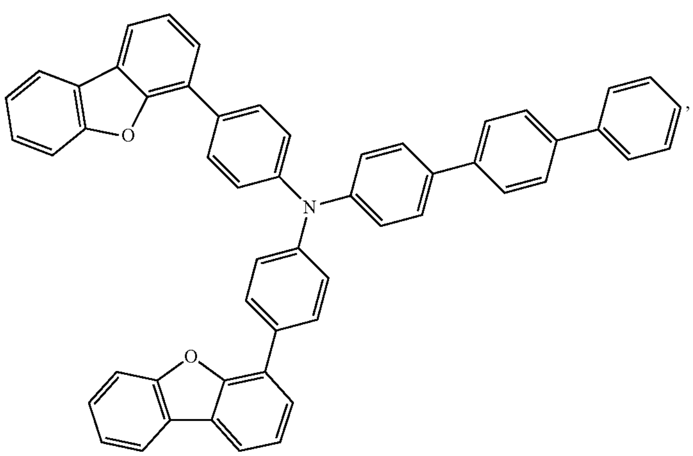
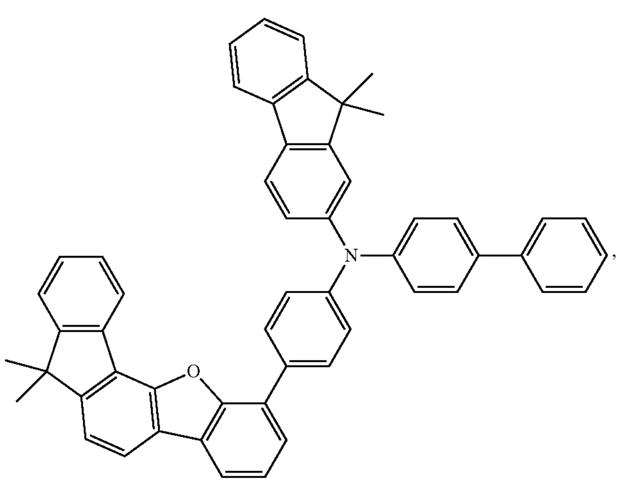
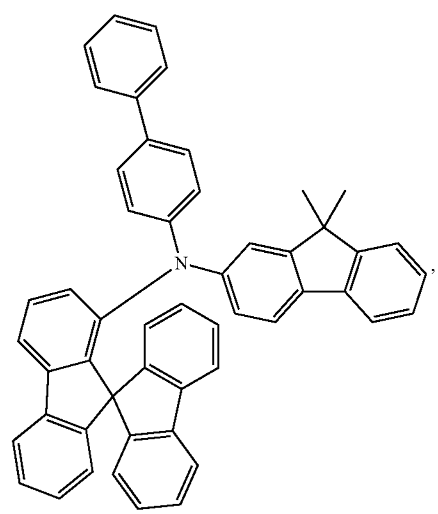

-continued
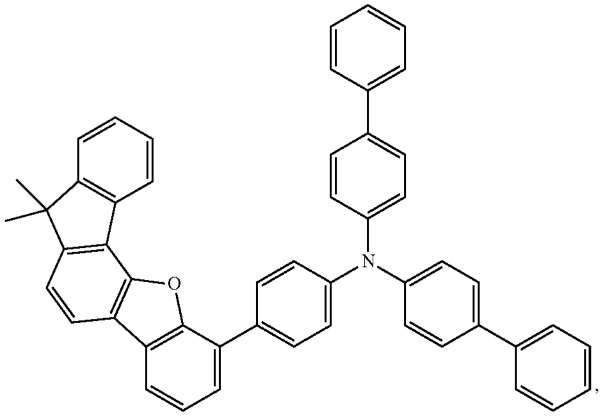
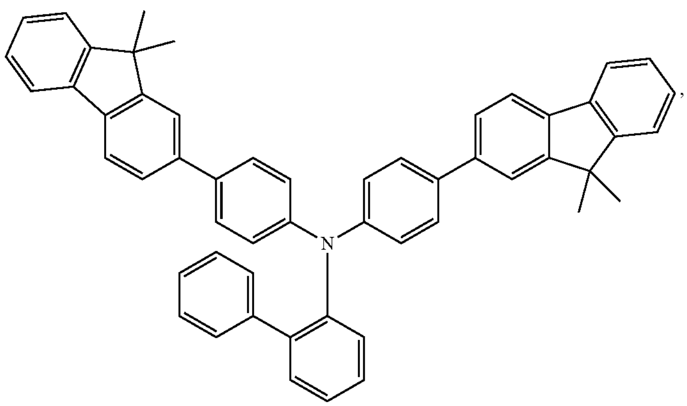
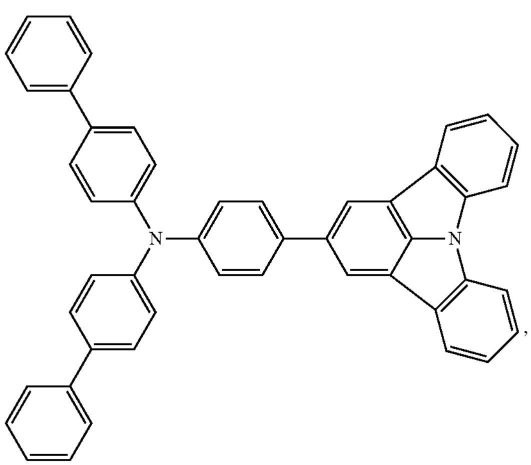
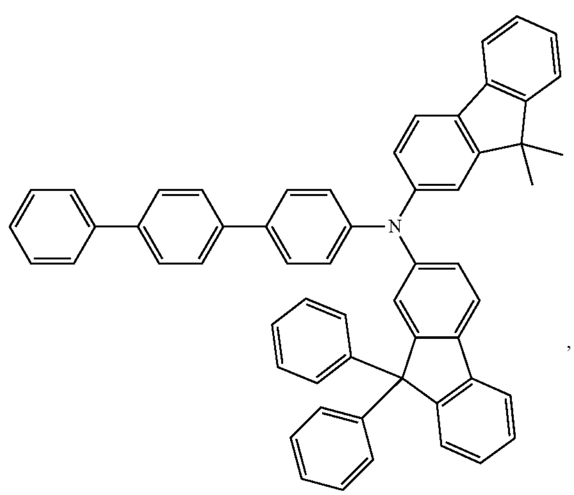

-continued
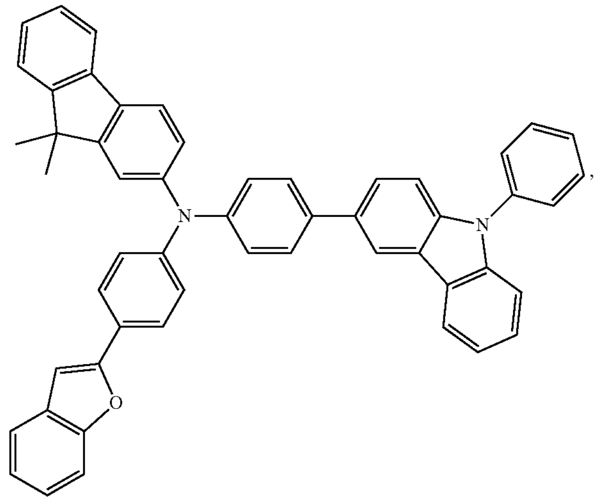
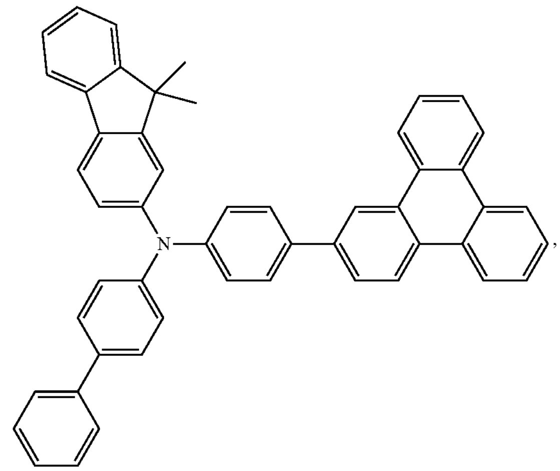
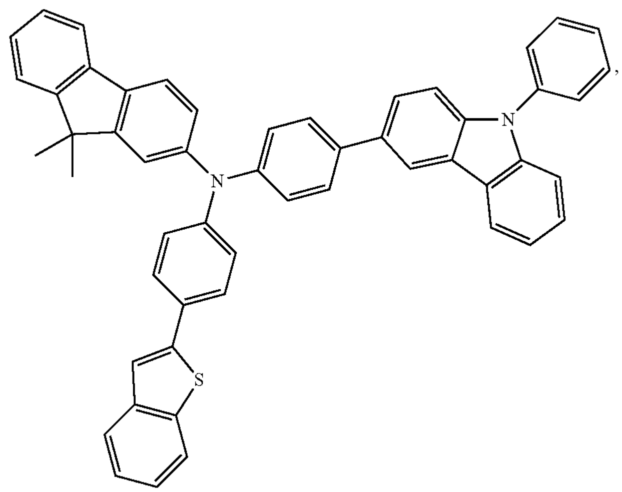
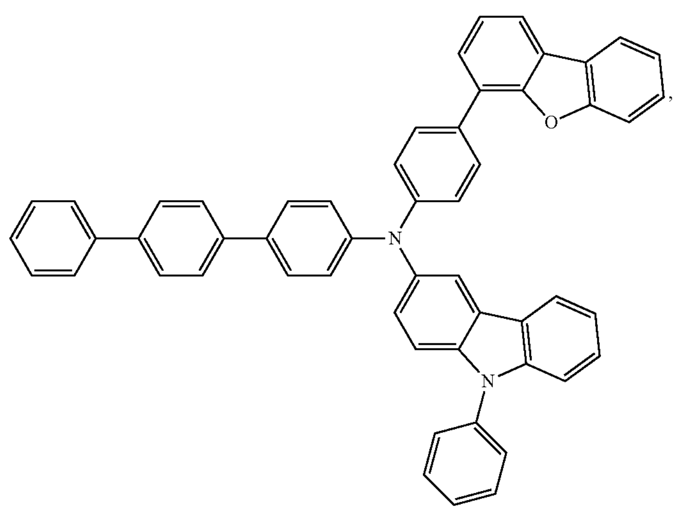

-continued
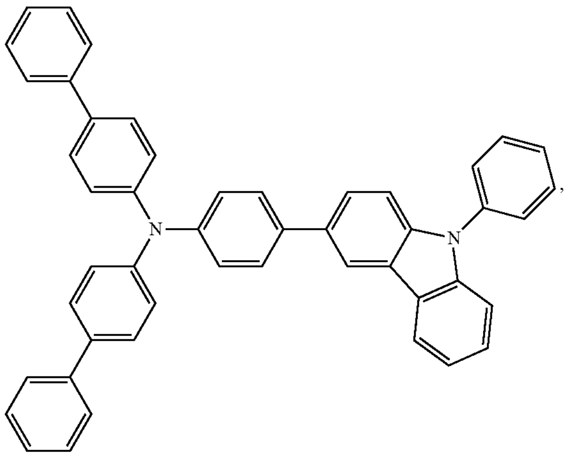
,
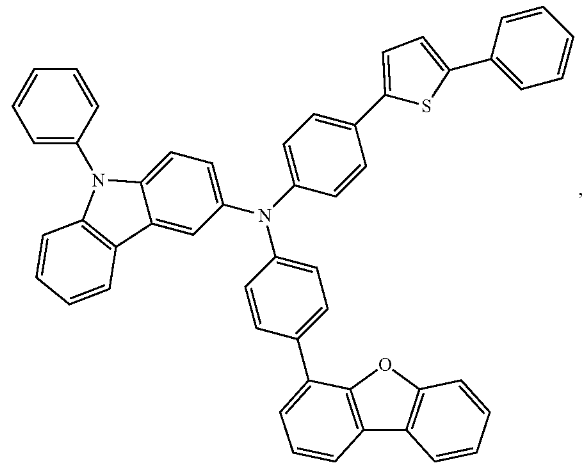
,
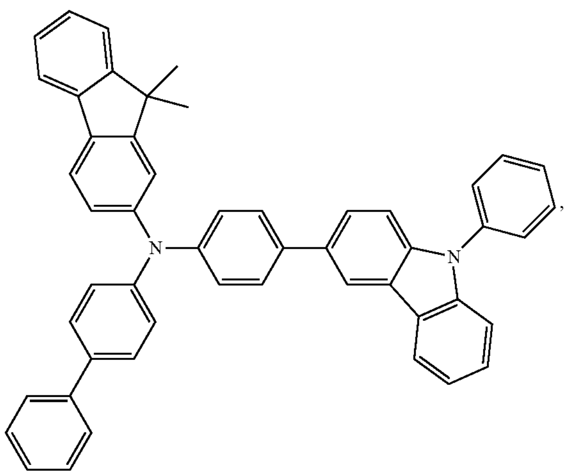
,
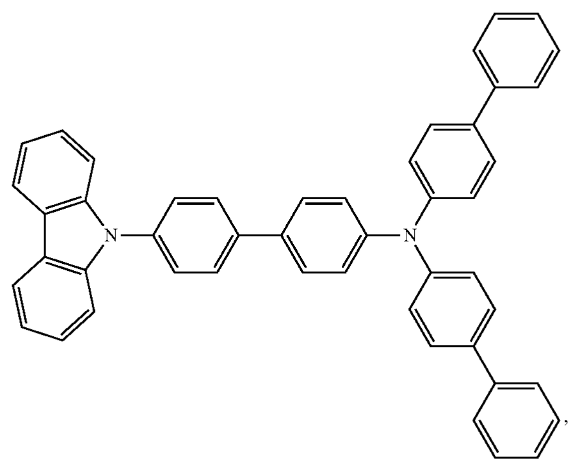
,
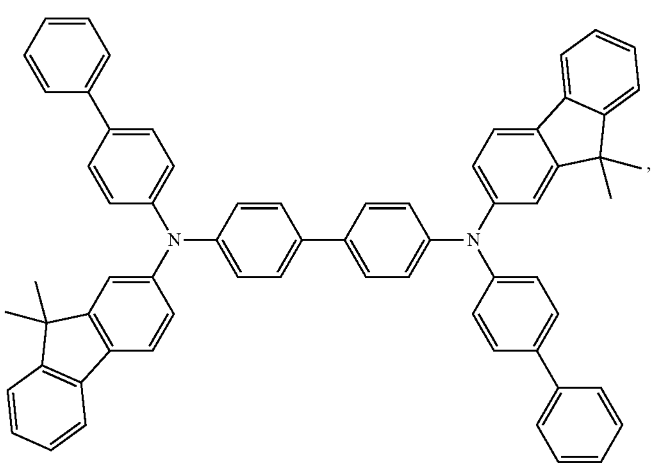
, -continued
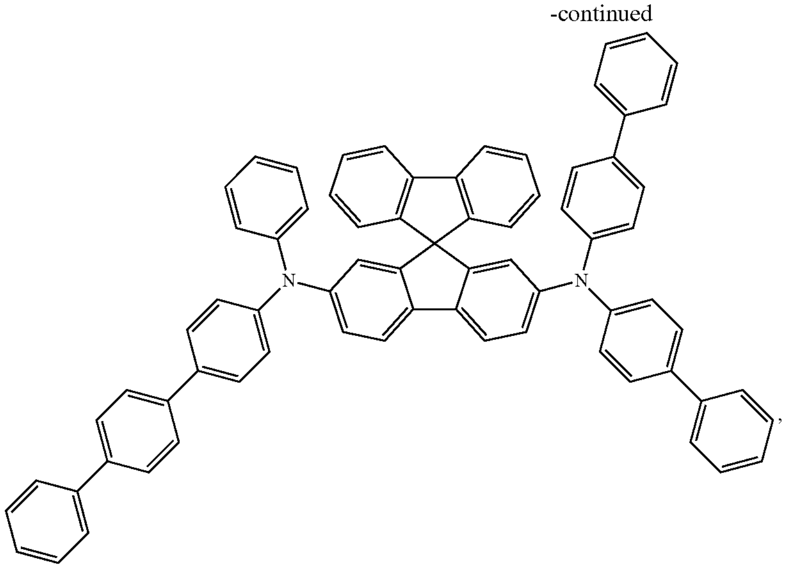
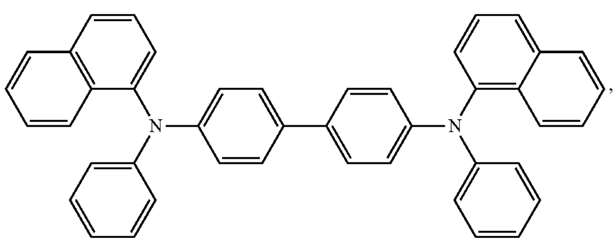
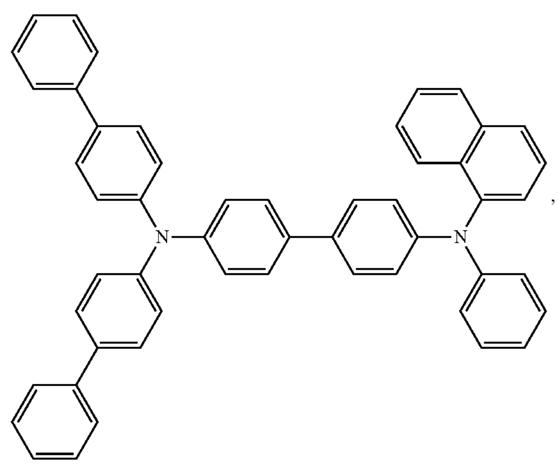
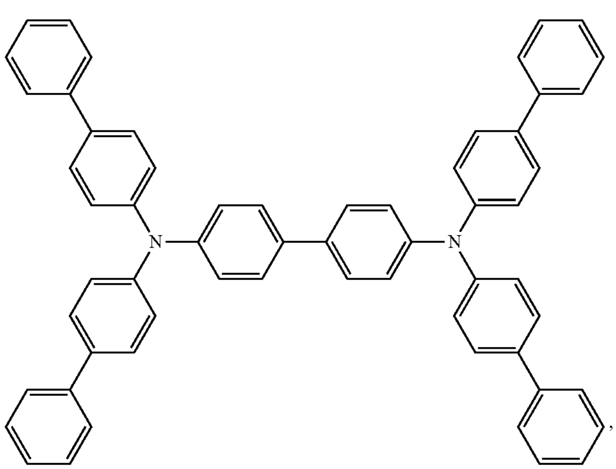

-continued
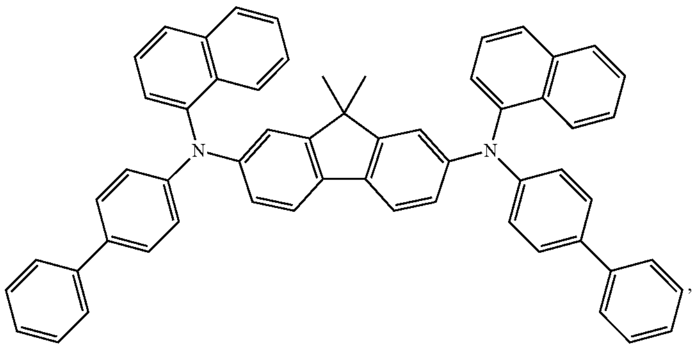
,
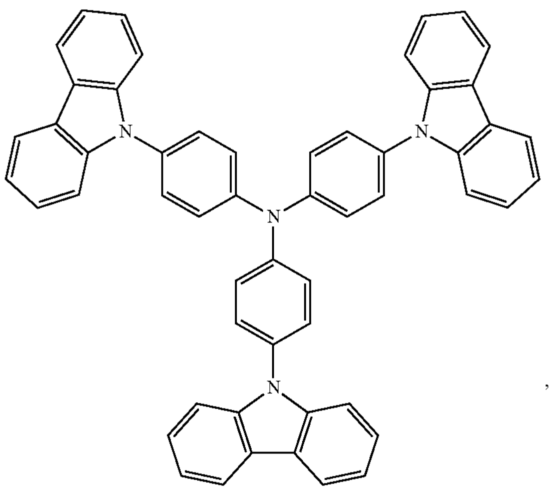
,
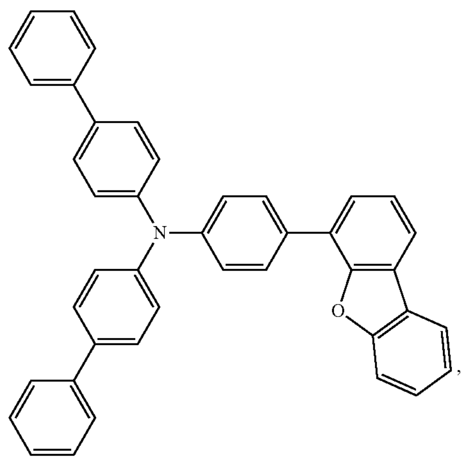
,
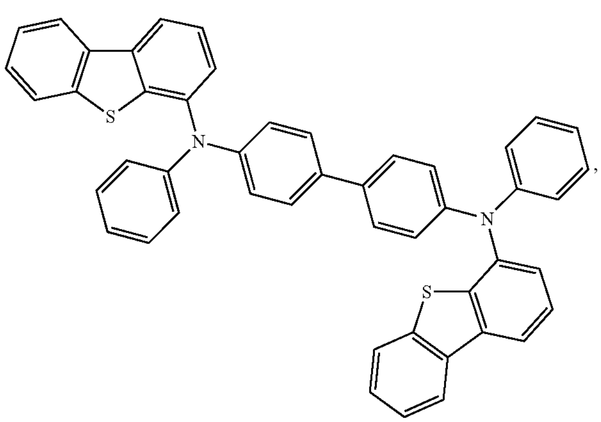
,
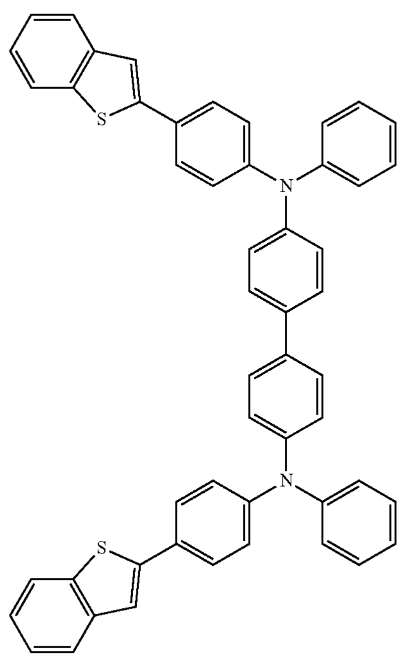
, and -continued

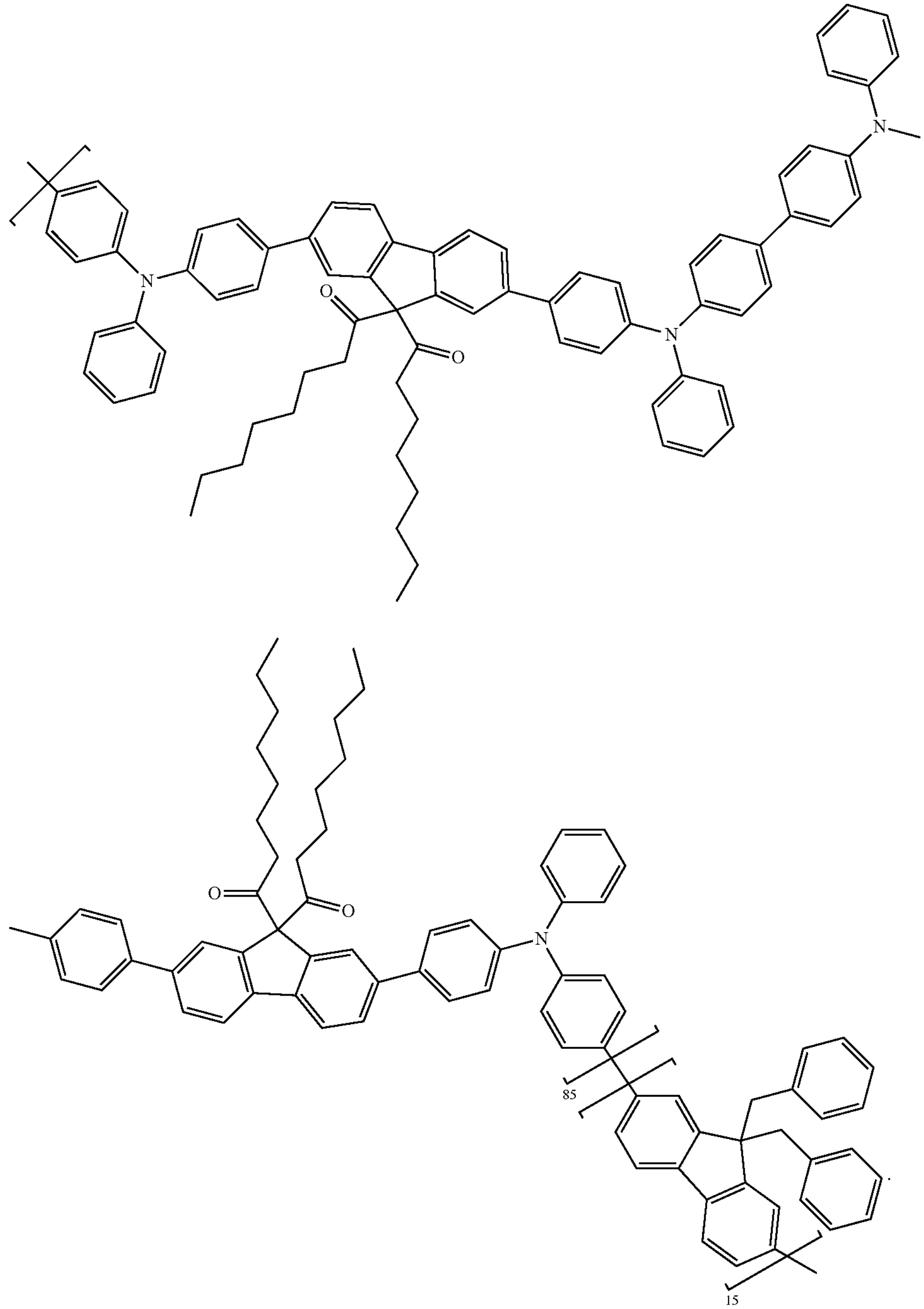

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

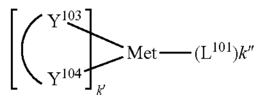

wherein Met is a metal; ($Y^{103}$-$Y^{104}$) is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

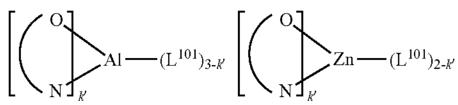

wherein (O—N) is a bidentate ligand, having metal coordinated to atoms O and N.

In another aspect, Met is selected from Ir and Pt. In a further aspect, ($Y^{103}$-$Y^{104}$) is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

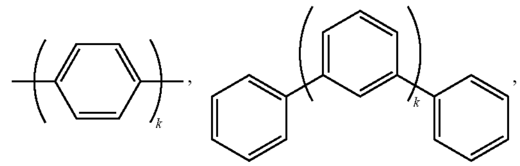

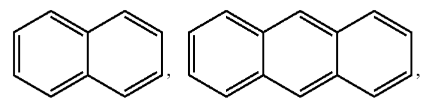

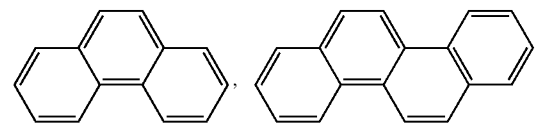

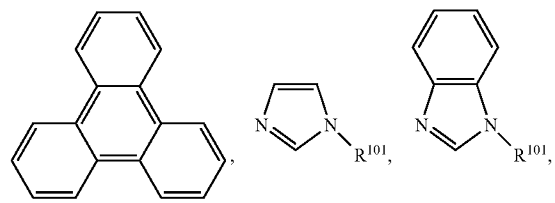

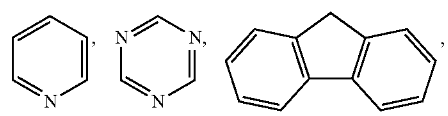

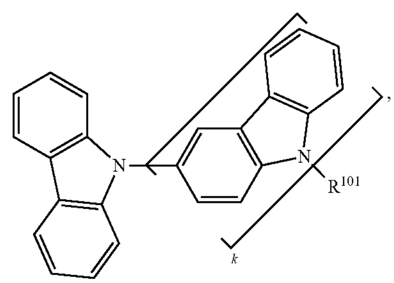

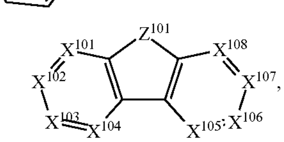

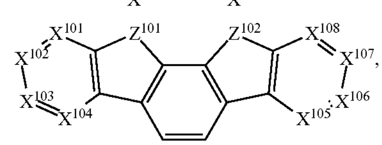

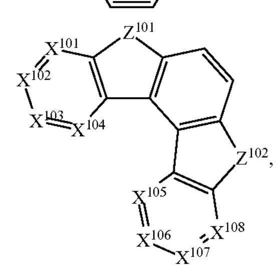

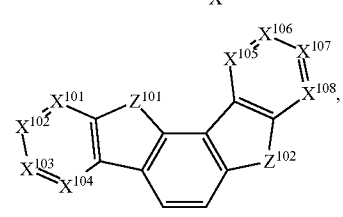

-continued

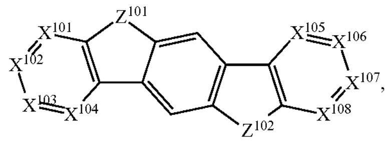

and

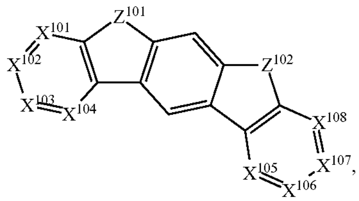

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

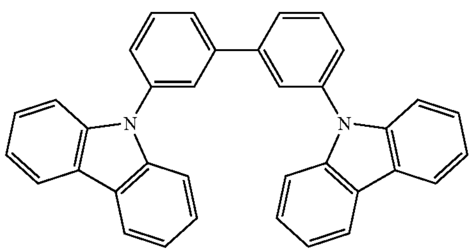

,

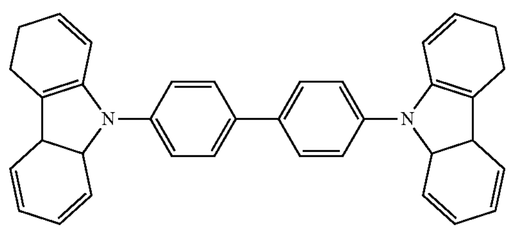

,

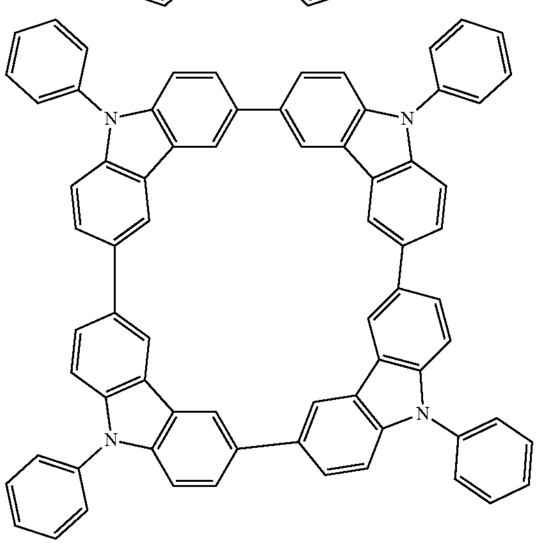

,

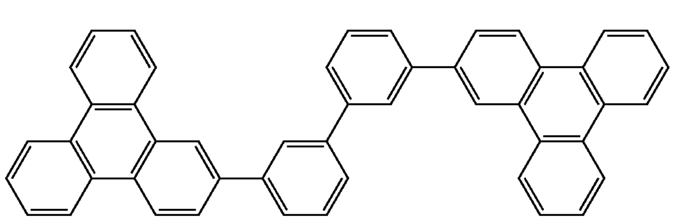

,

-continued
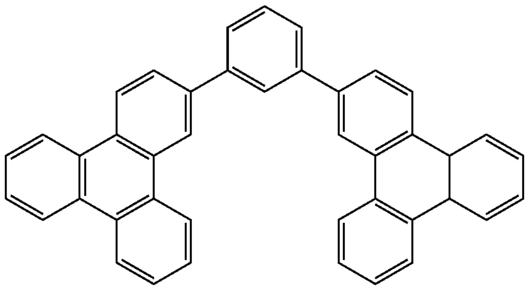
,
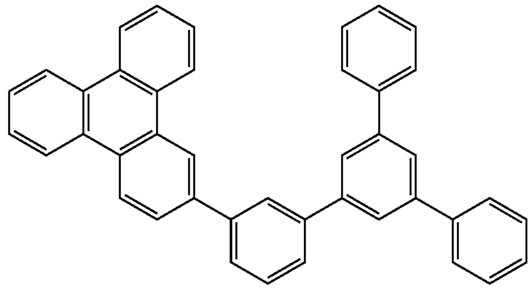
,
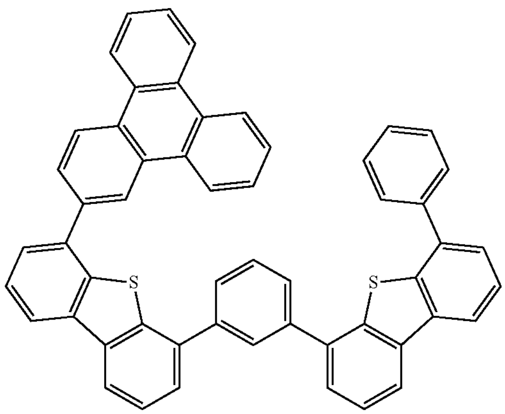
,
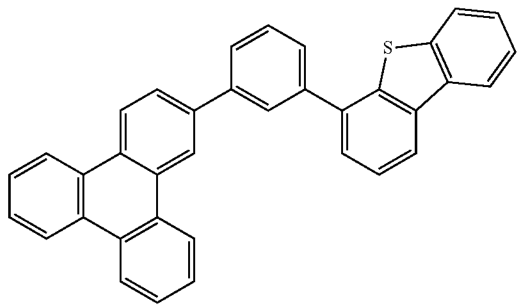
,
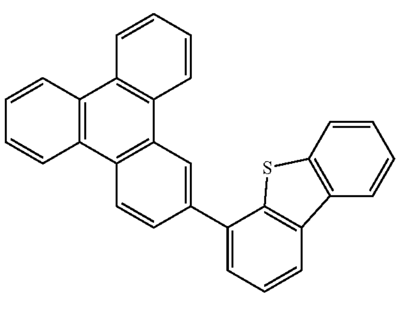
,
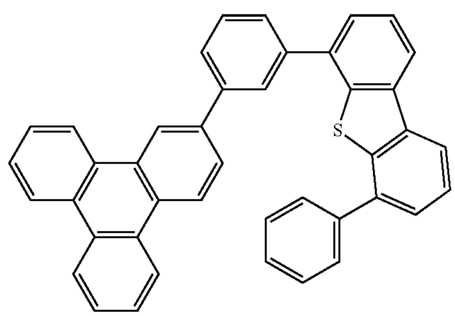
,
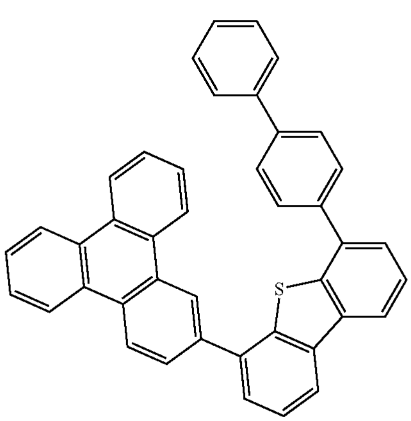
,
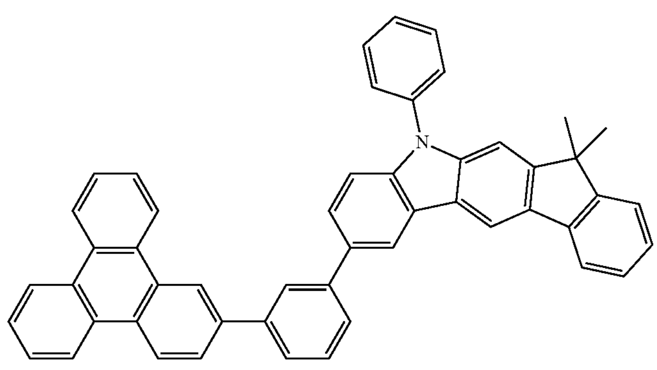
, -continued
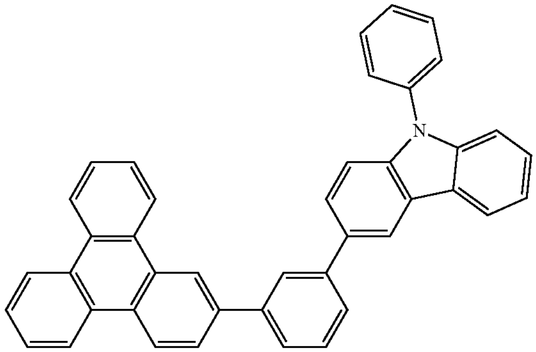,
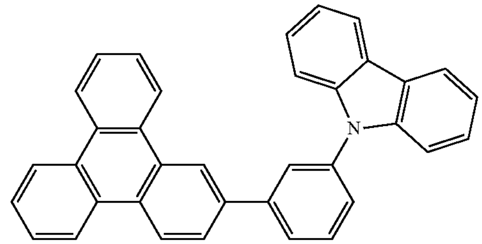,
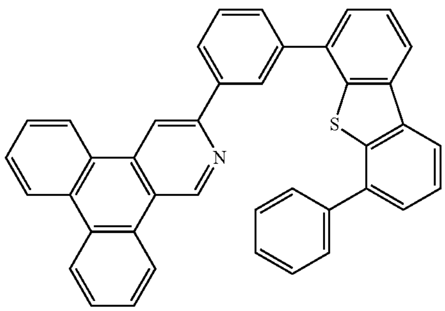,
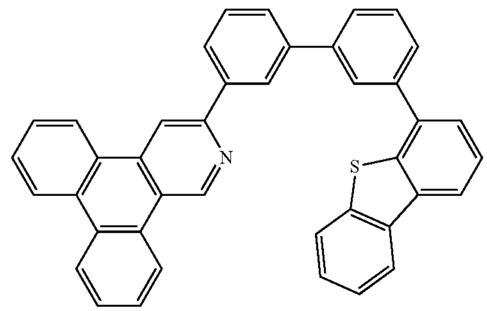,
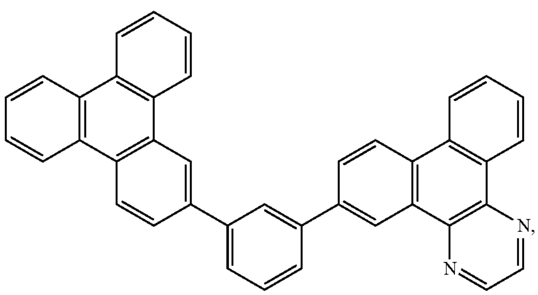
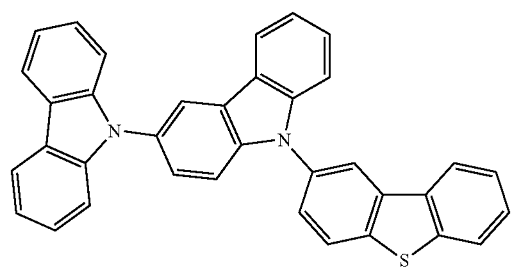,
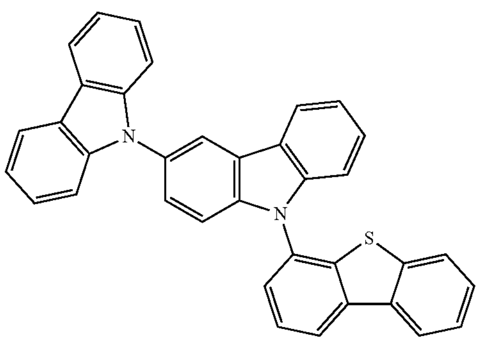,
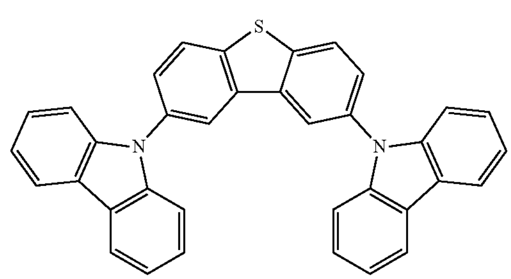,
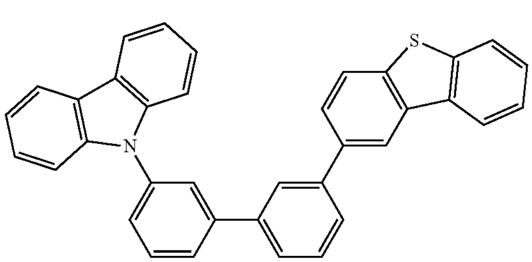,
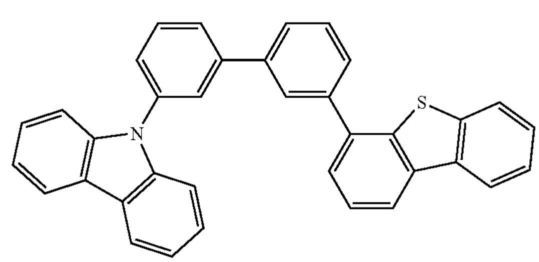, -continued
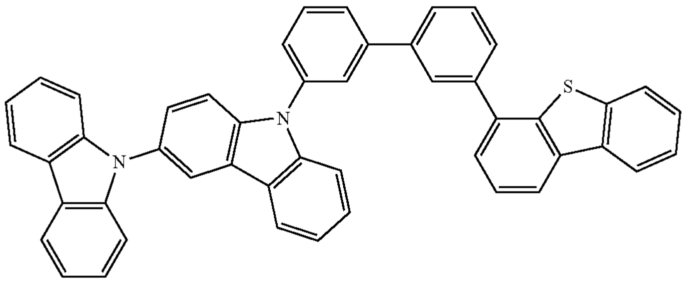
,
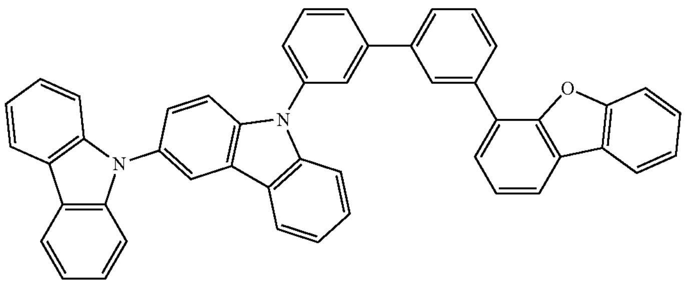
,
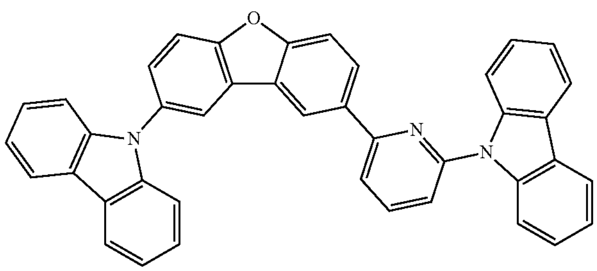
,
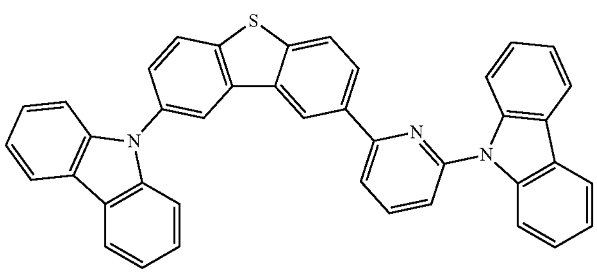
,
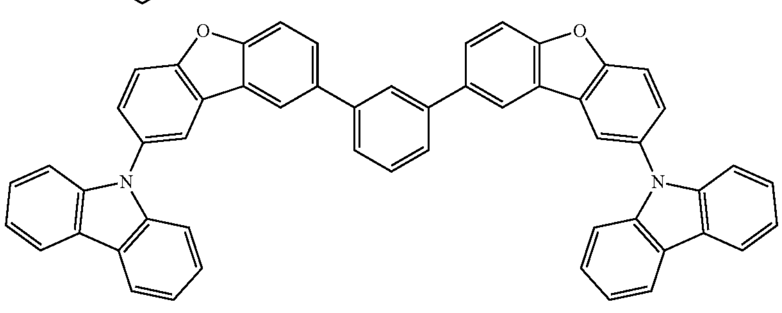
,
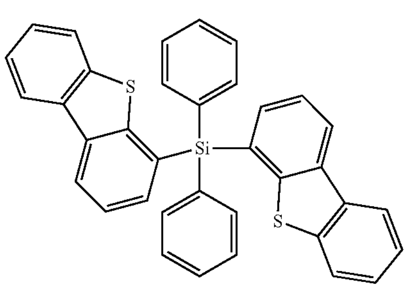
,
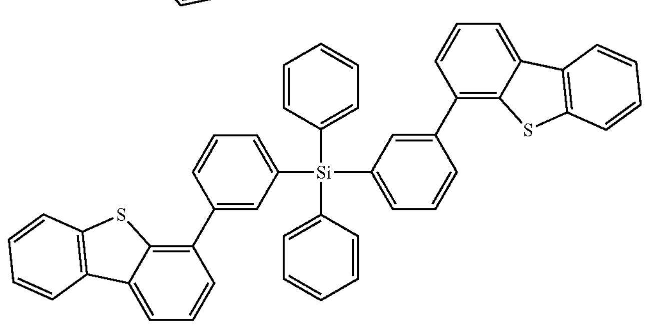
, -continued
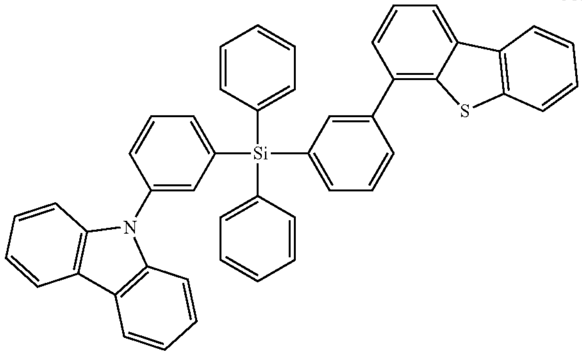
,
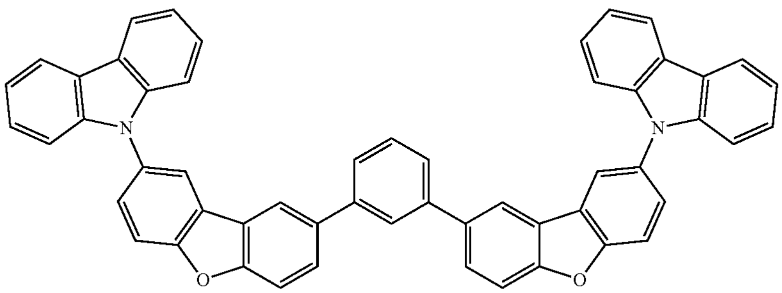
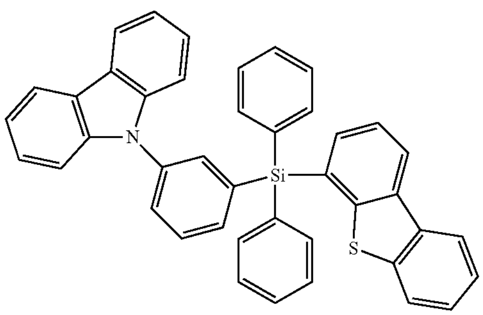
,
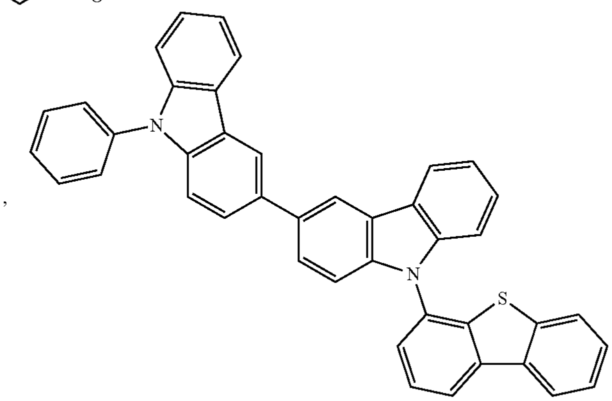
,
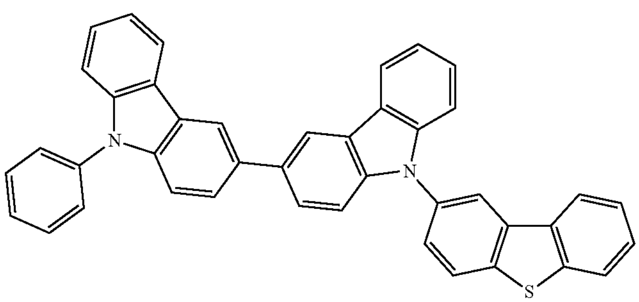
,
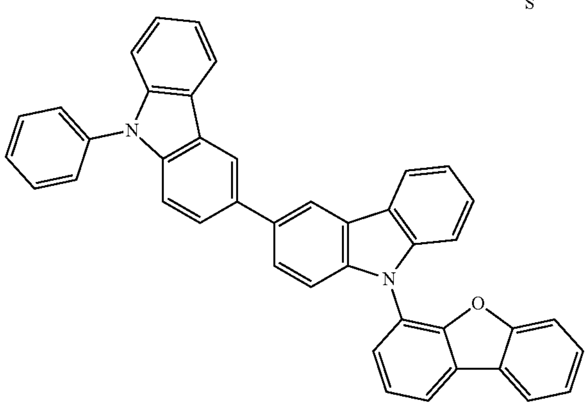
, -continued
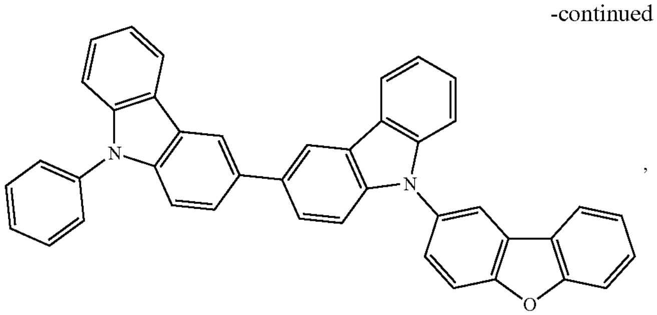
,
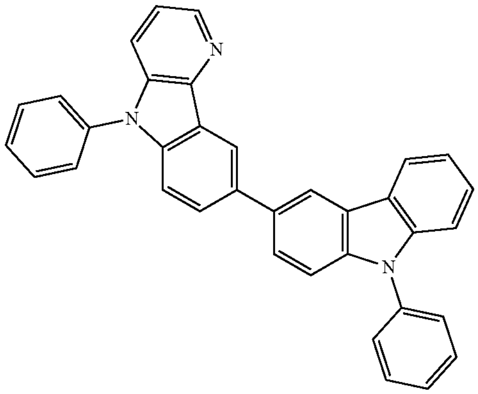
,
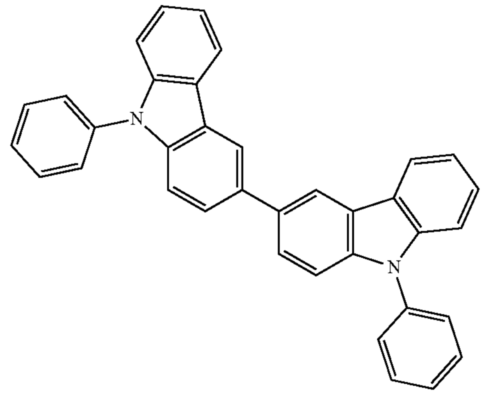
,
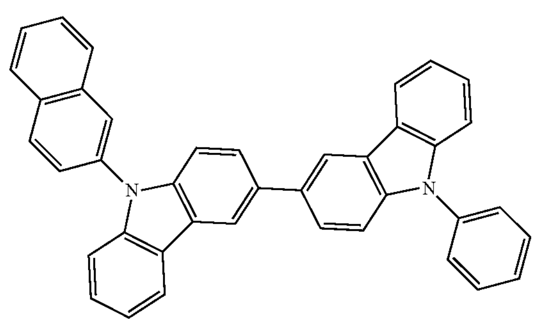
,
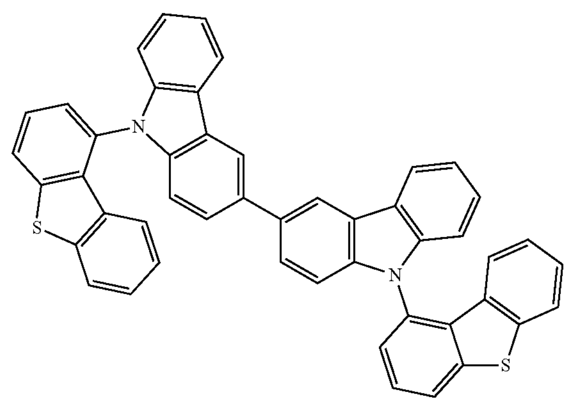
,
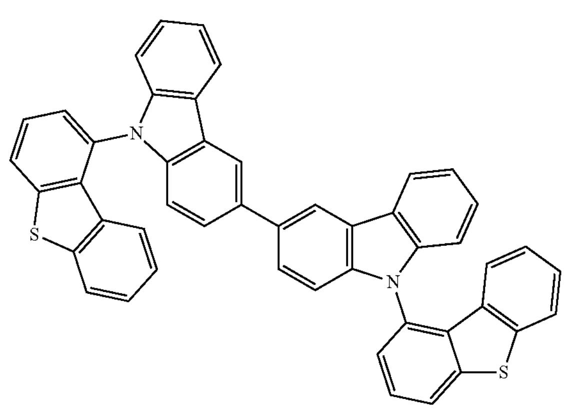
,
, -continued
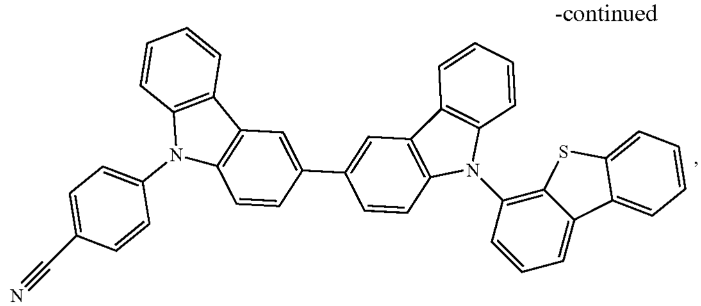
,
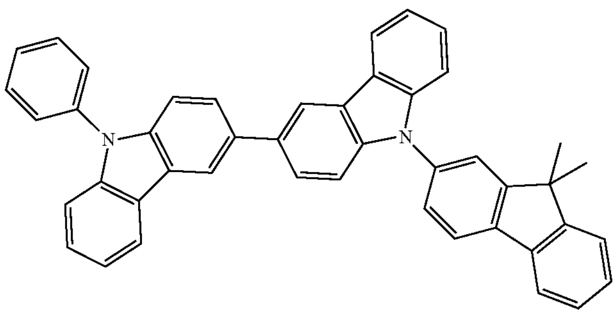
,
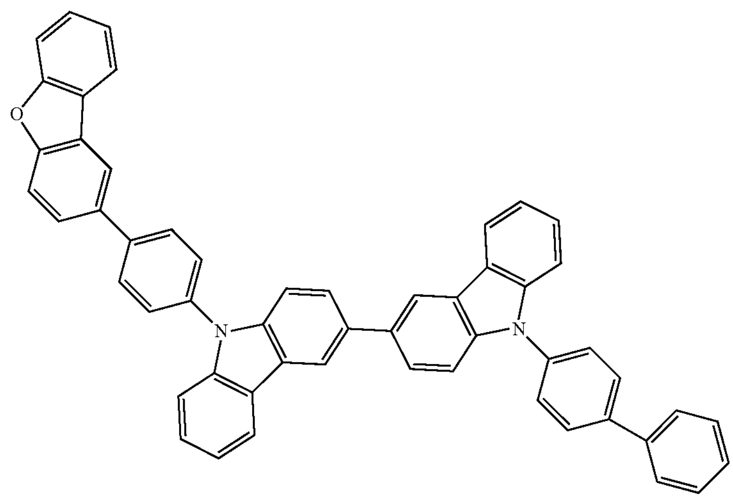
,
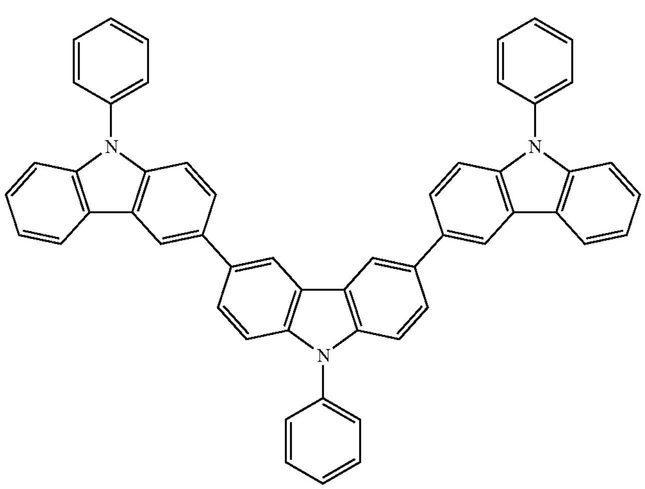
, -continued
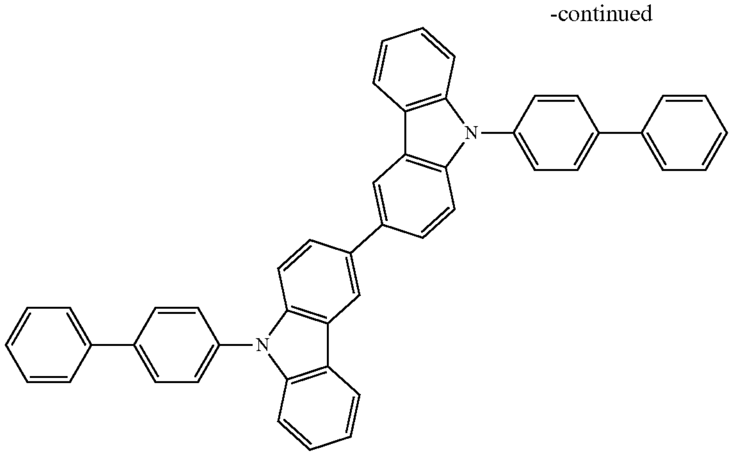
,
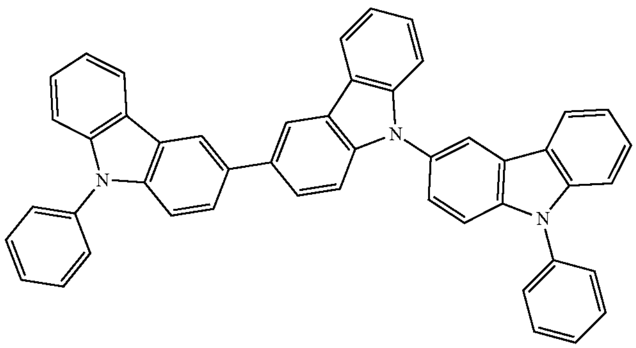
,
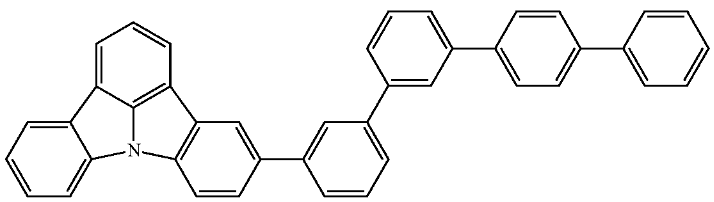
,
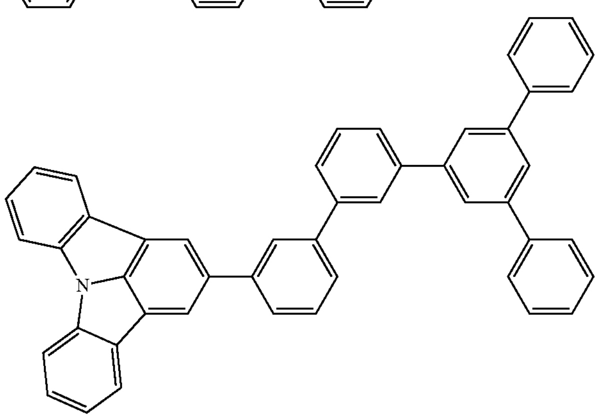
,
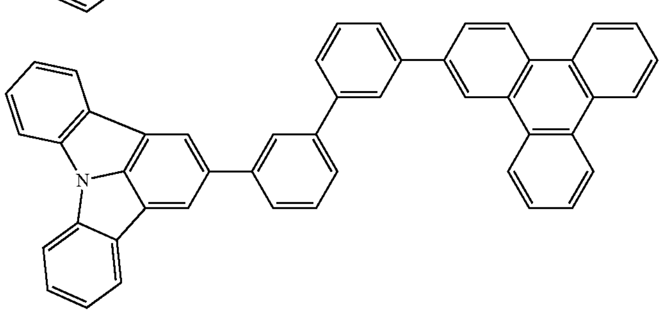
, -continued
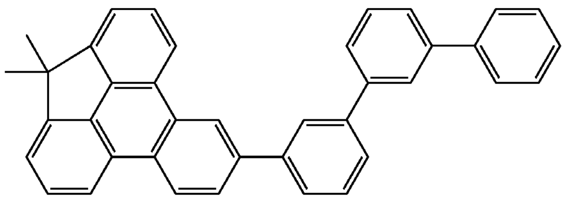
,
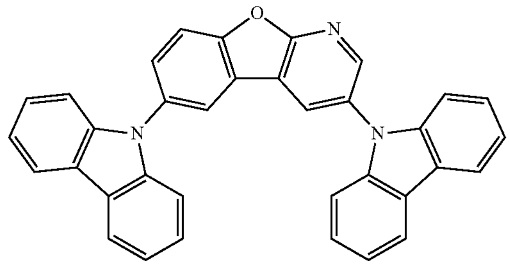
,
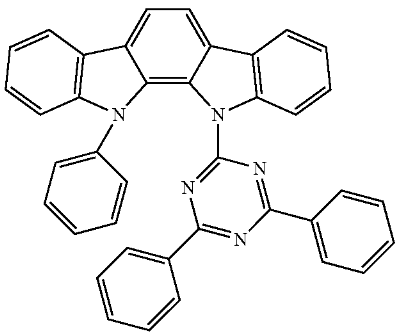
,
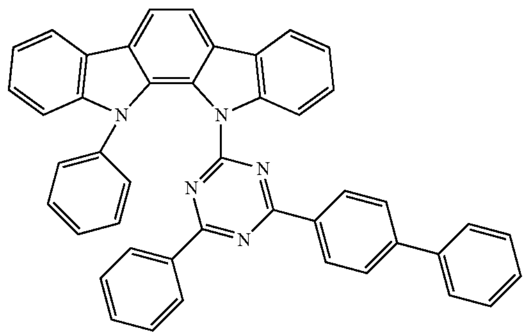
,
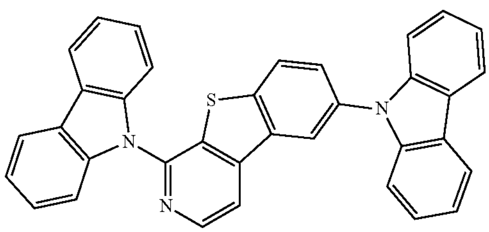
,
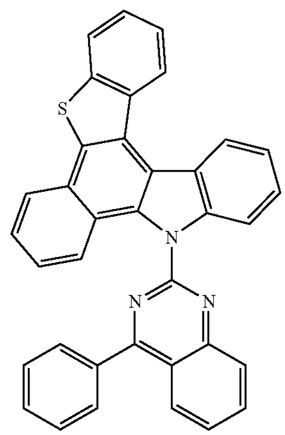
,
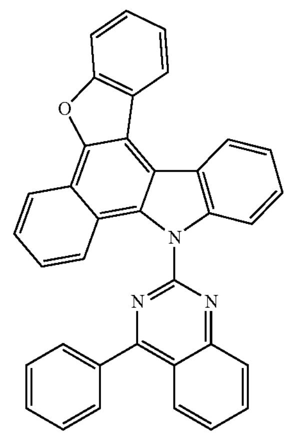
,
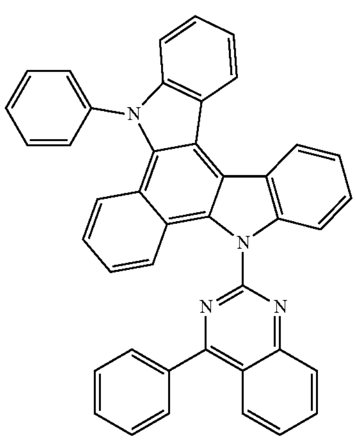
,
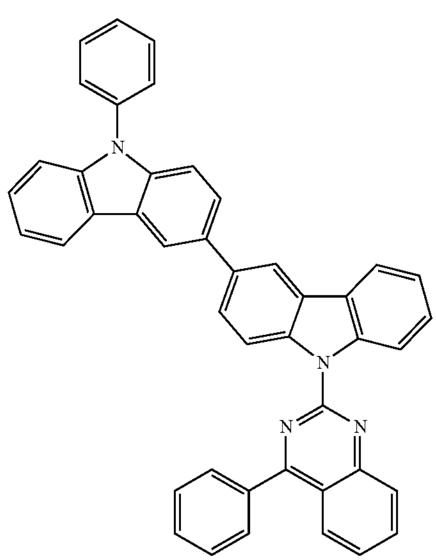
, -continued
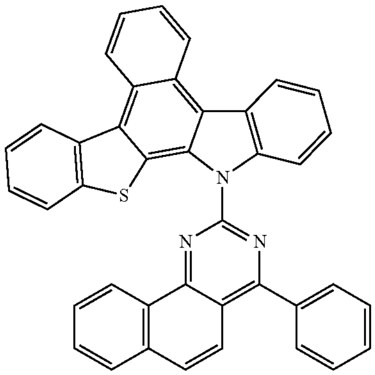
,
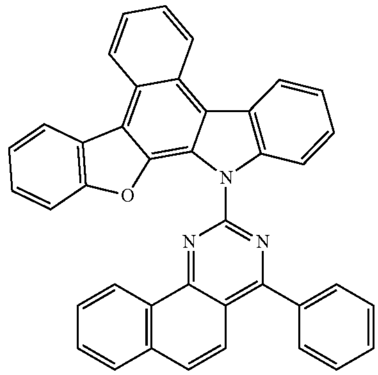
,
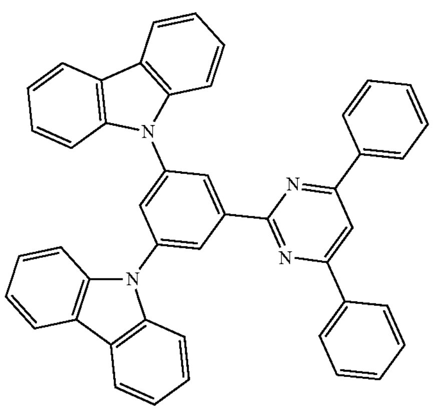
,
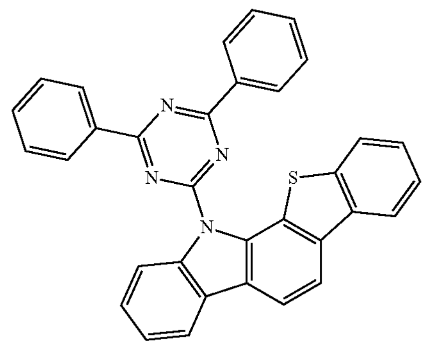
,
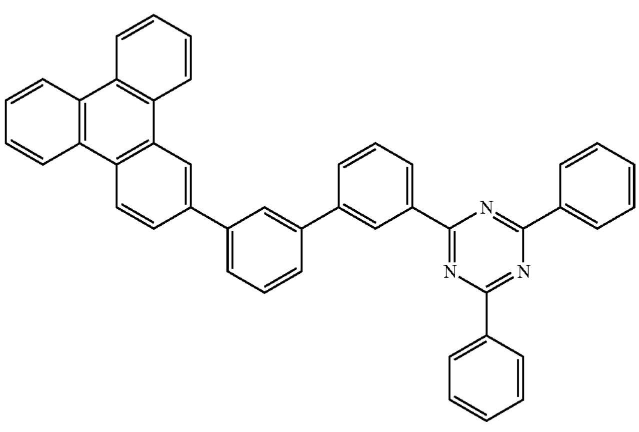
,
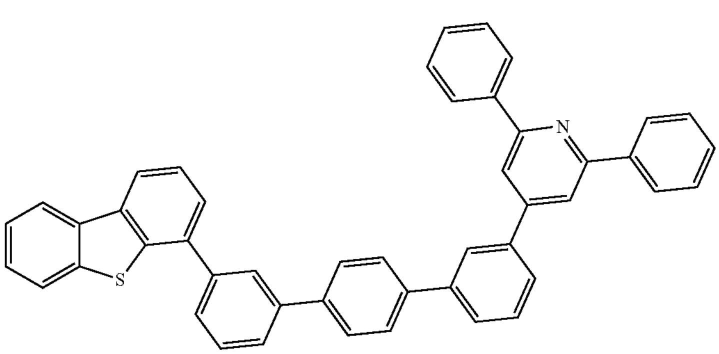
, -continued
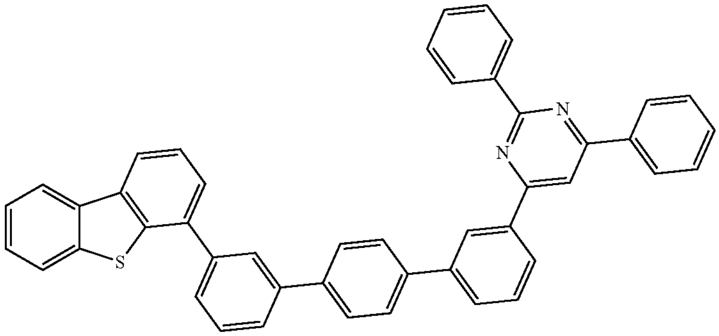
,
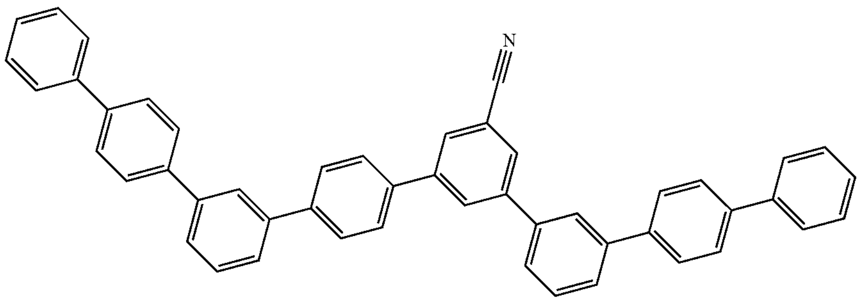
,
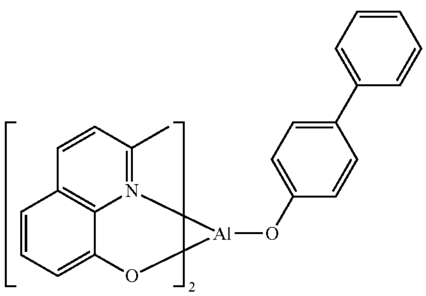
,
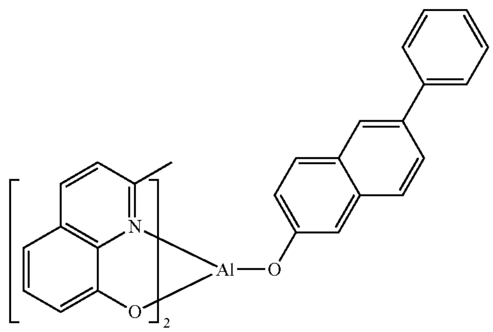
,
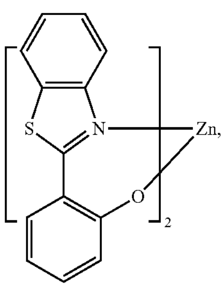
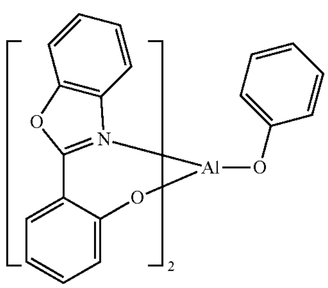
,
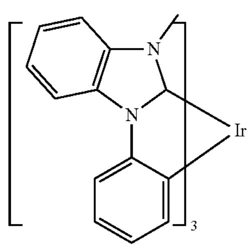
,
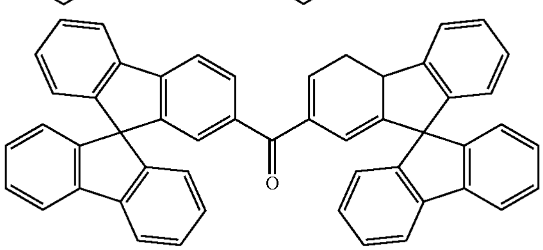
,
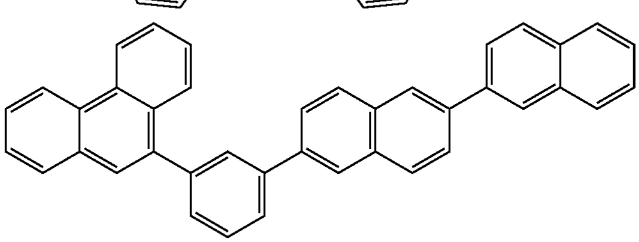
, -continued

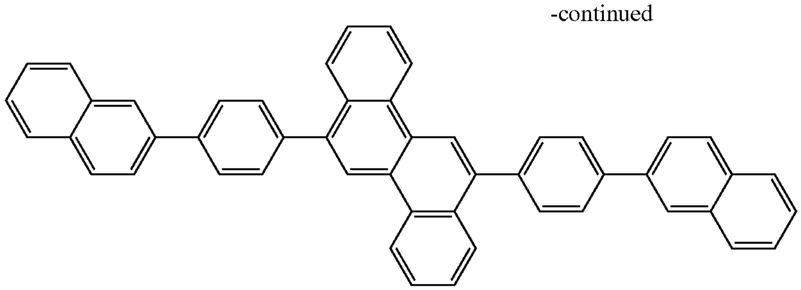

, and

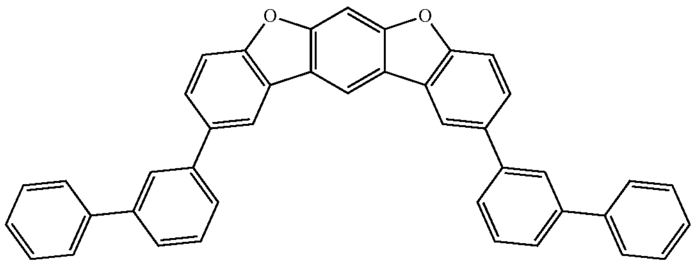

.

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

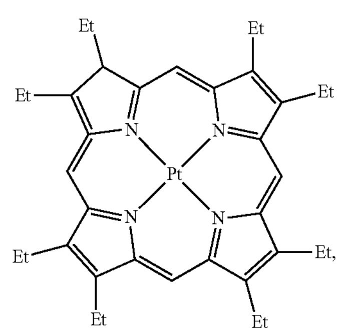

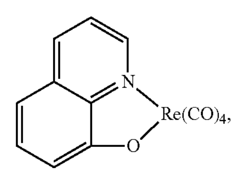

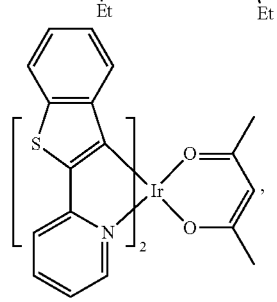

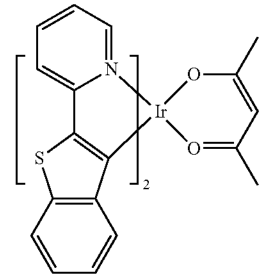

-continued
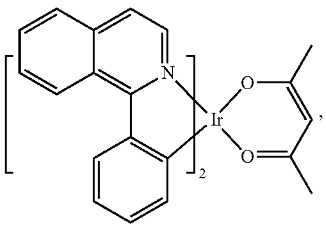
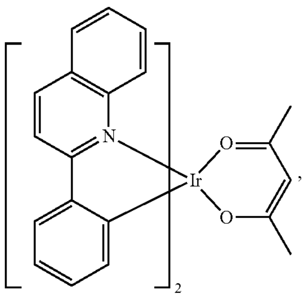
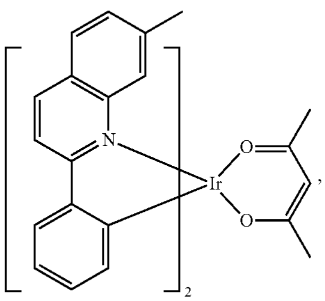
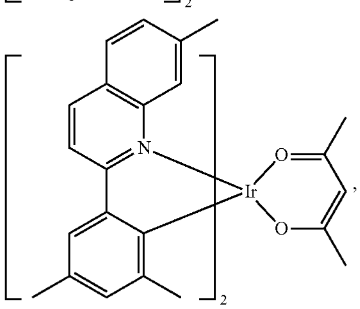
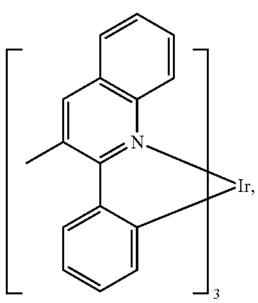
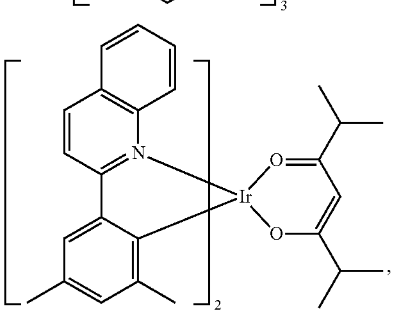
-continued
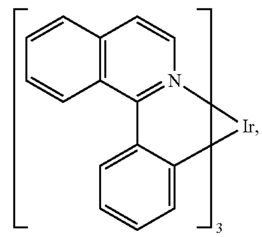
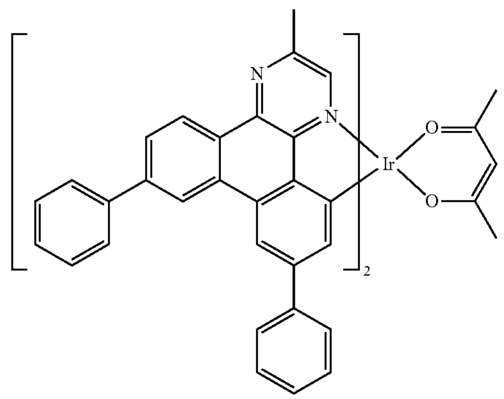
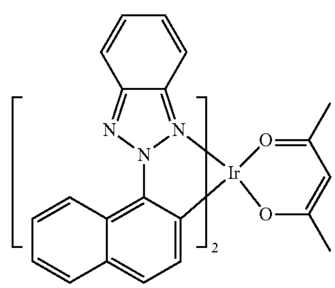
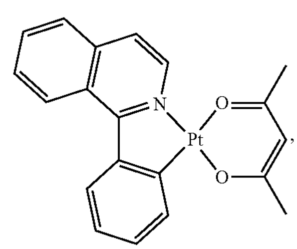
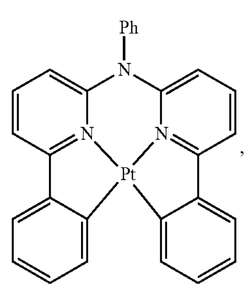
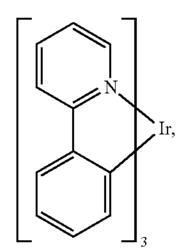

-continued
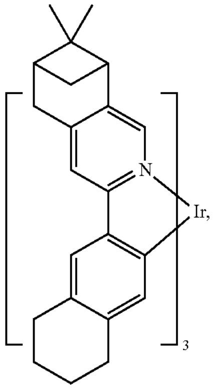
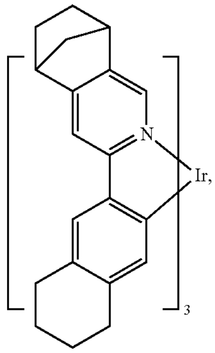
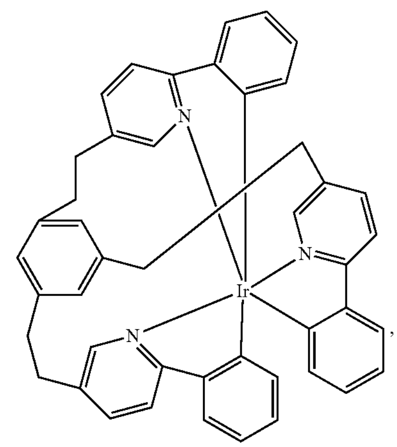
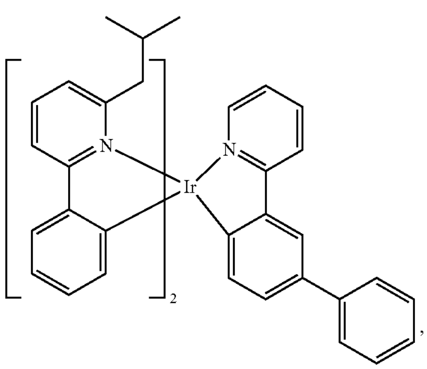
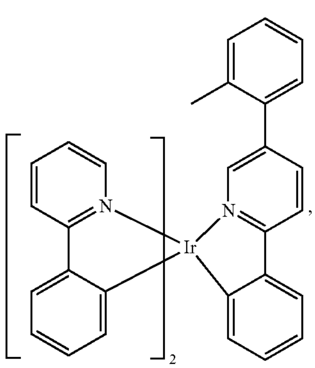
-continued
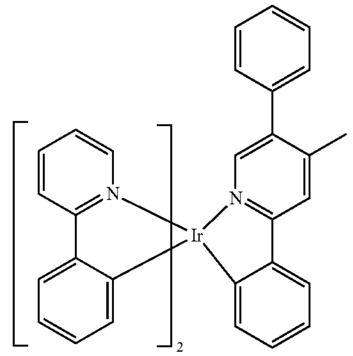
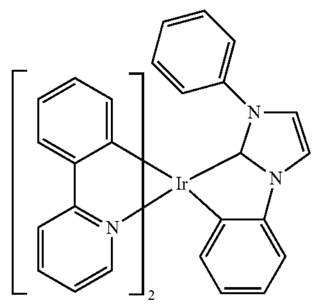
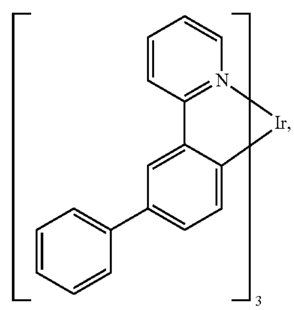
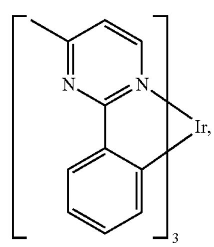
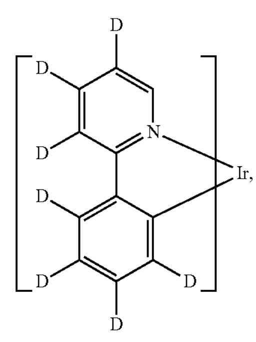
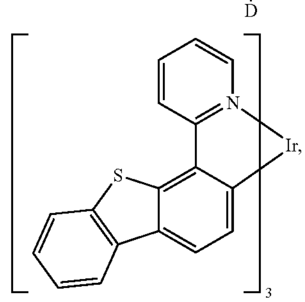

-continued
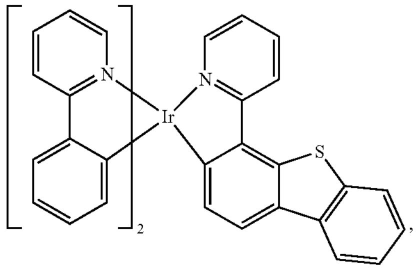
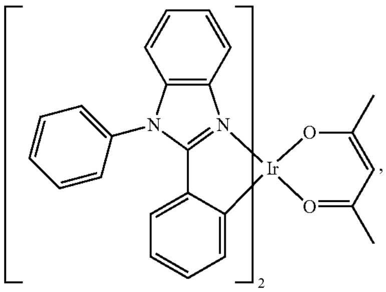
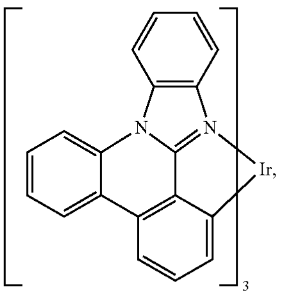
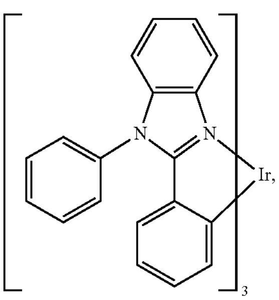
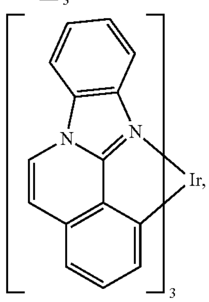
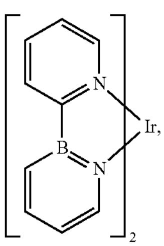
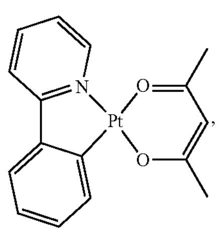
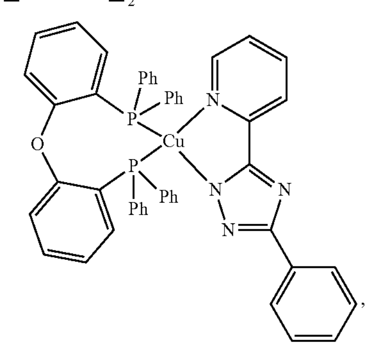
-continued
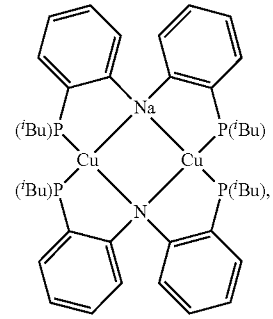
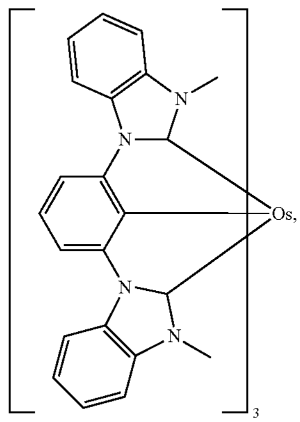
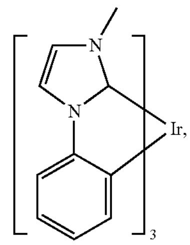
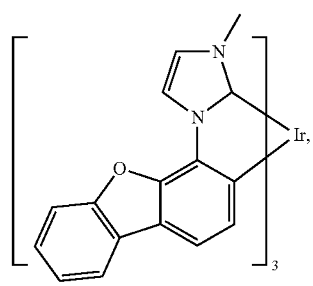
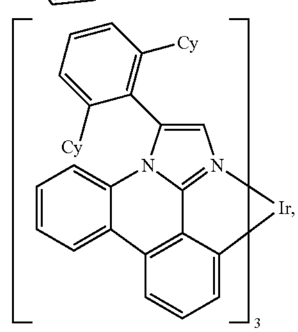
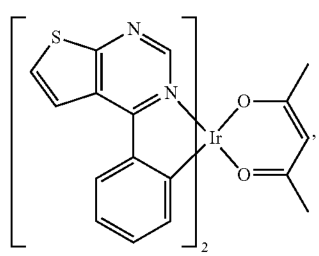

-continued
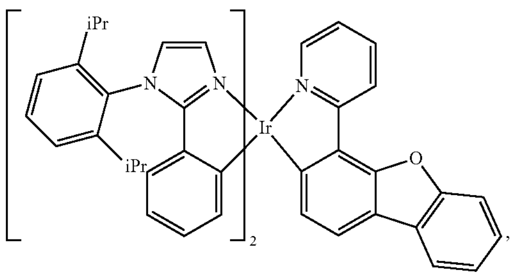
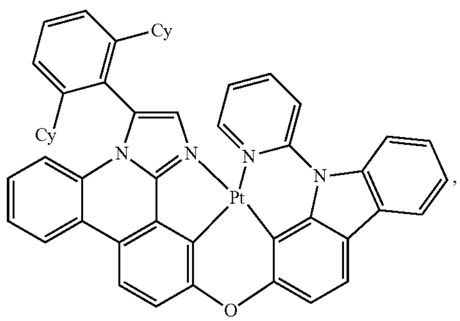
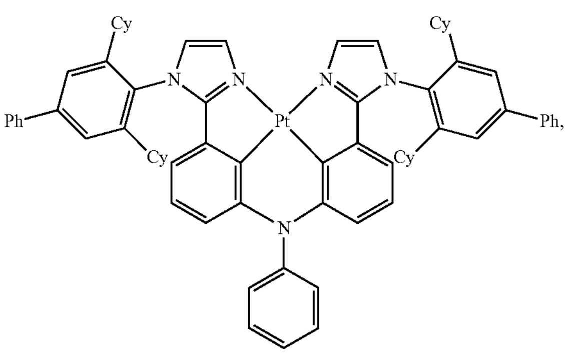
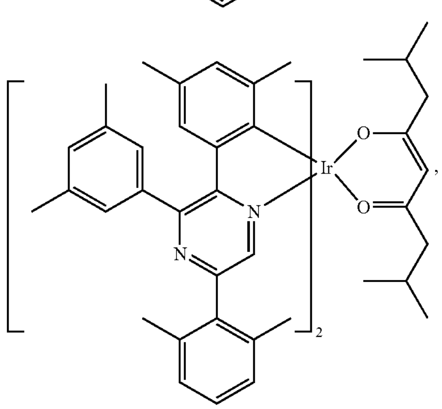
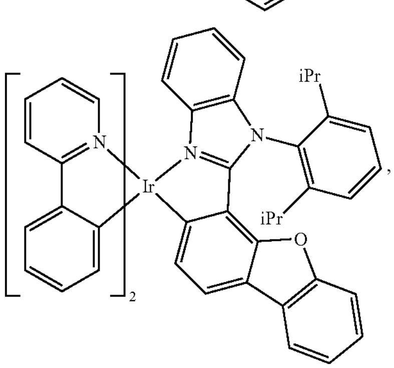
-continued
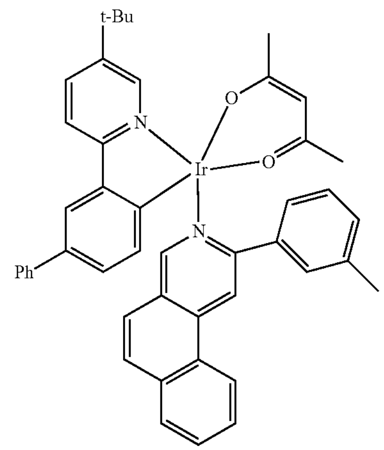
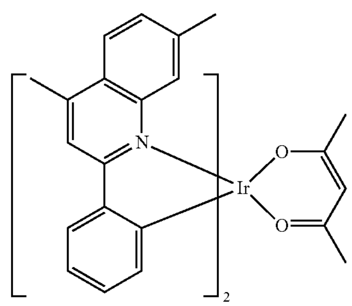
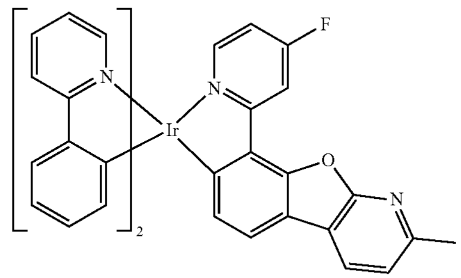
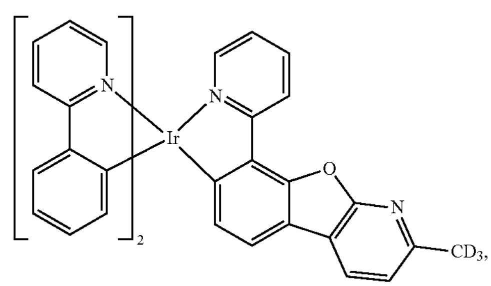
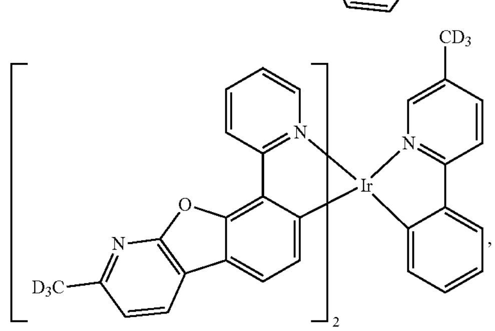

-continued
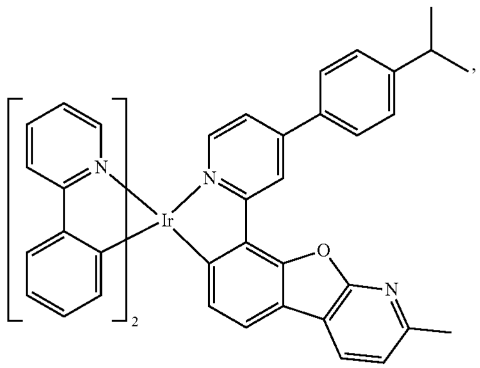
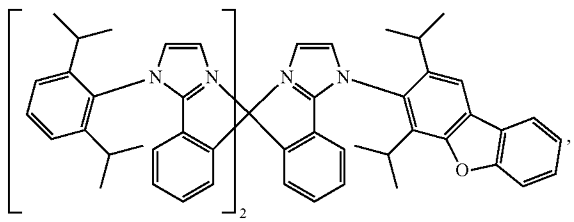
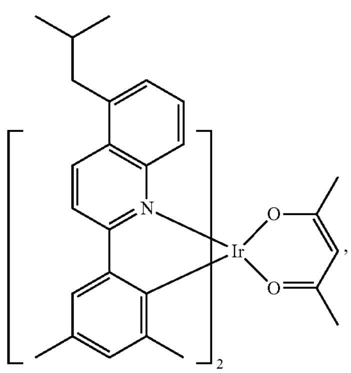
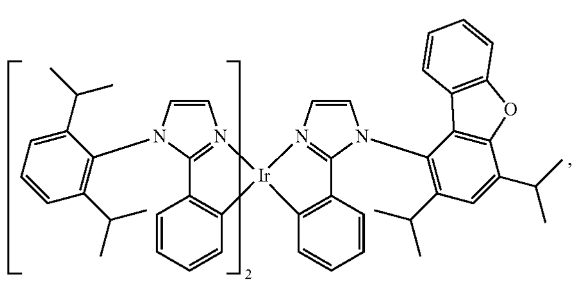
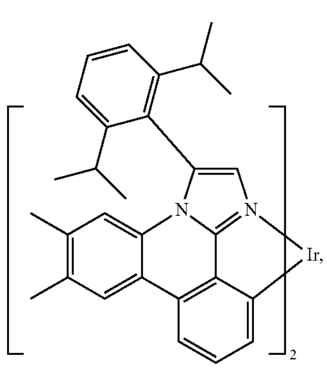
-continued
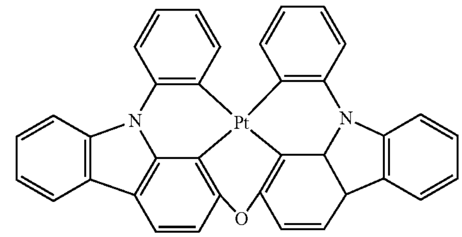
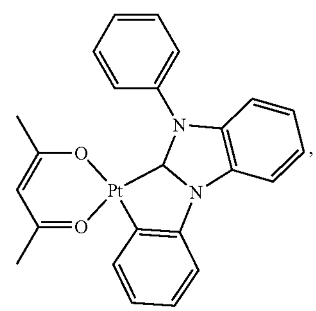
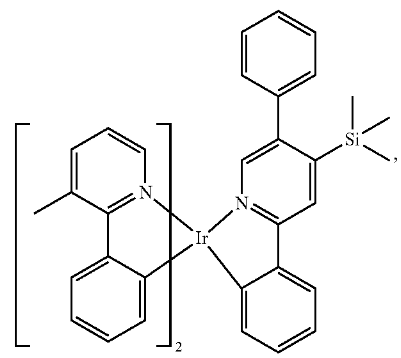
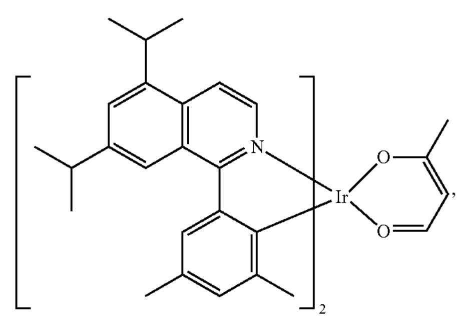
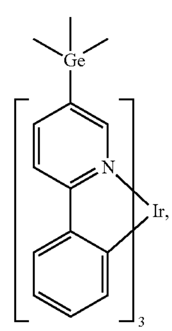

-continued
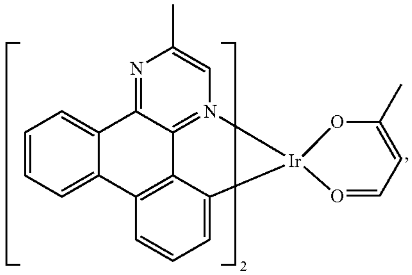
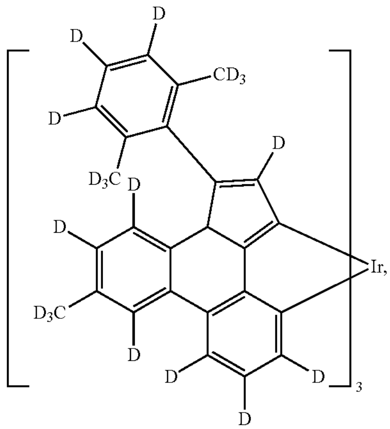
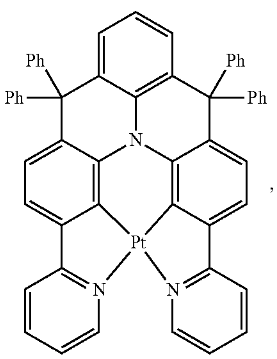
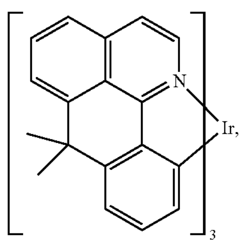
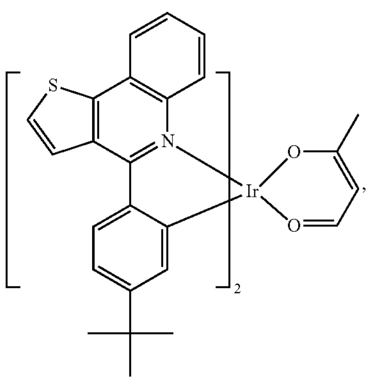
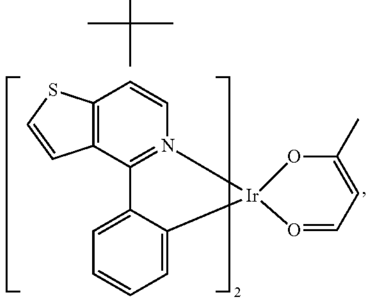
-continued
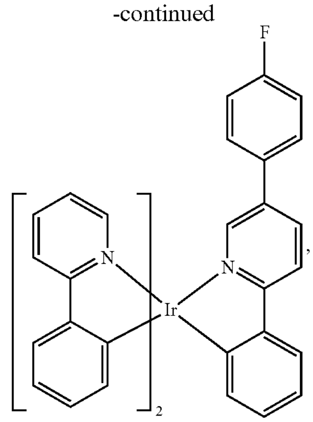
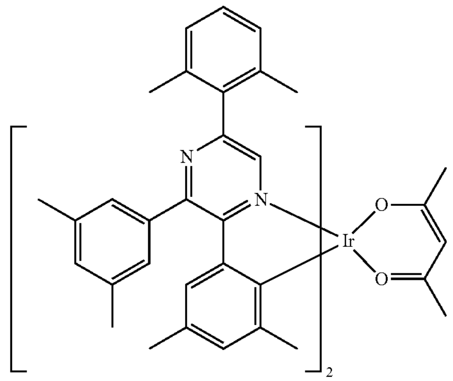
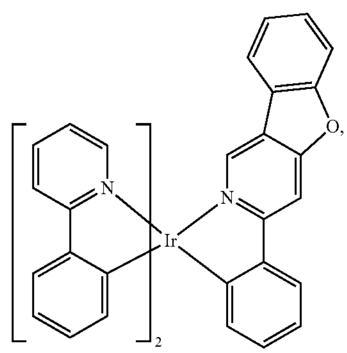
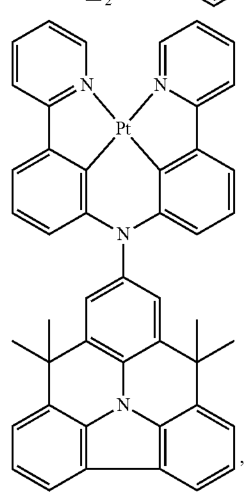

-continued
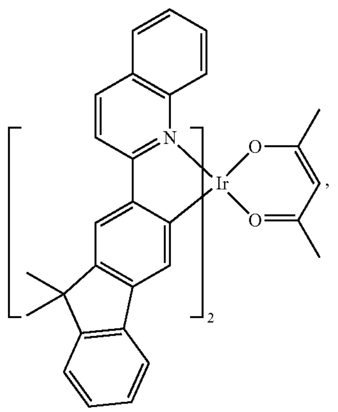
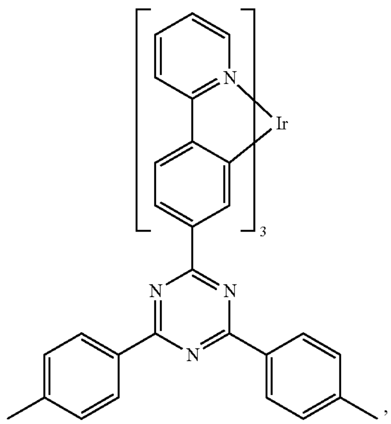
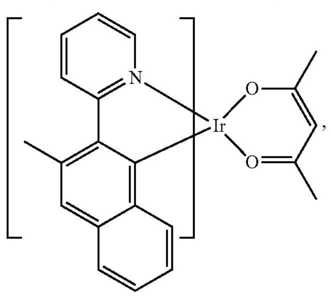
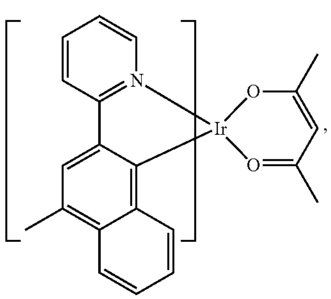
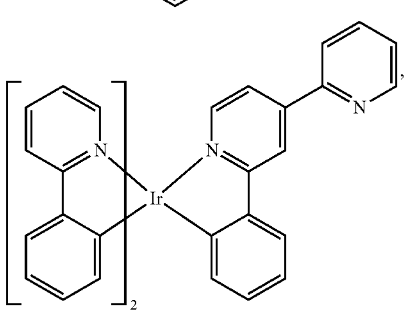
-continued
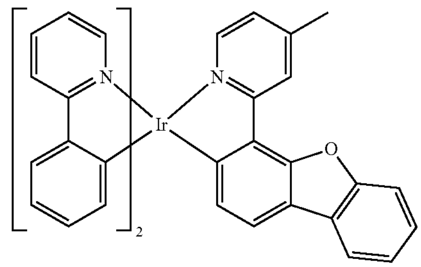
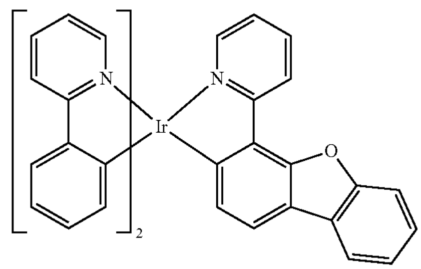
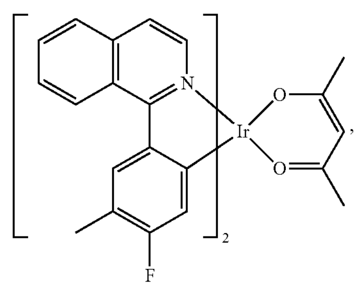
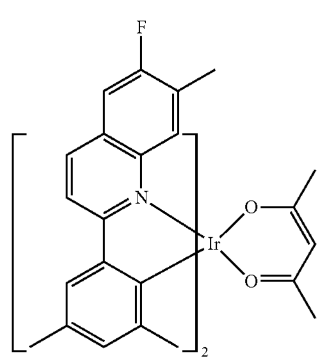
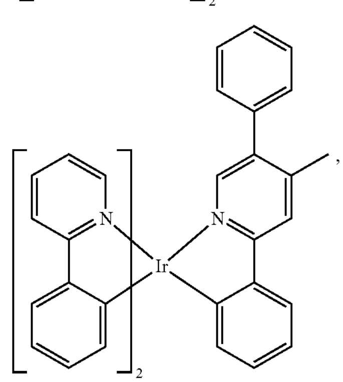

-continued
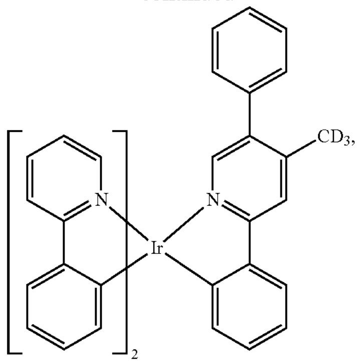
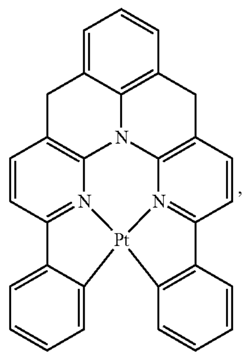
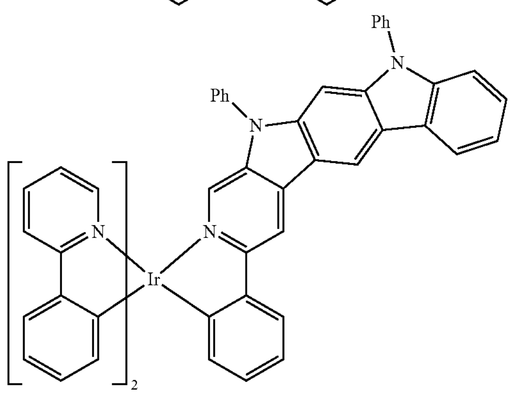
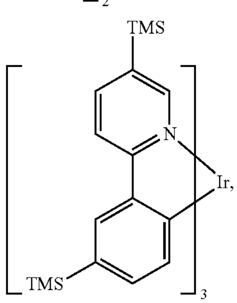
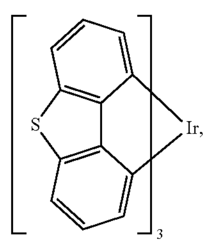
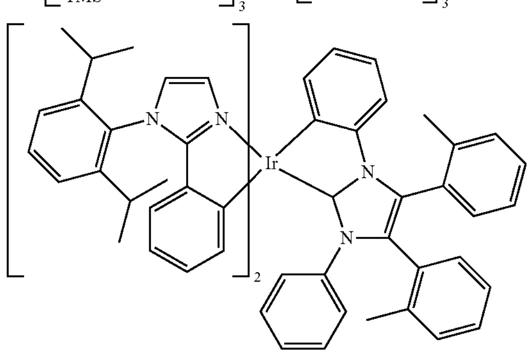
-continued
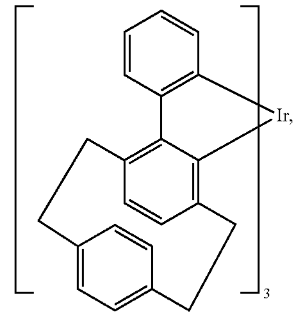
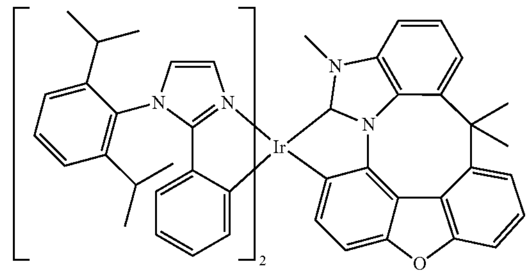
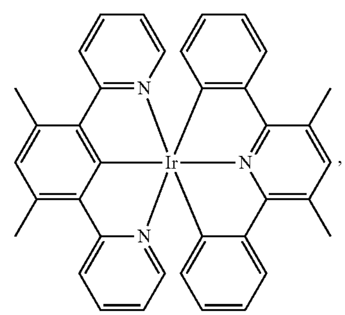
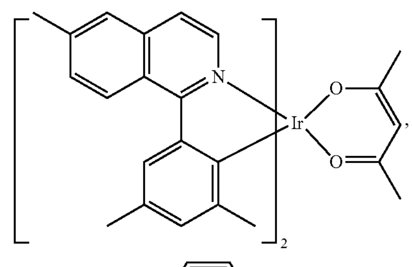
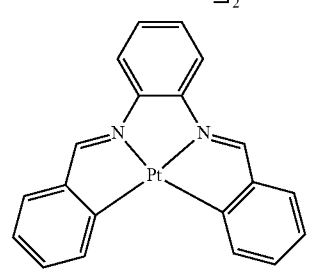
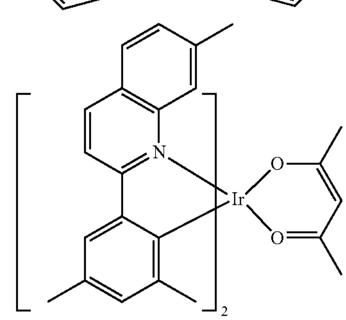

-continued
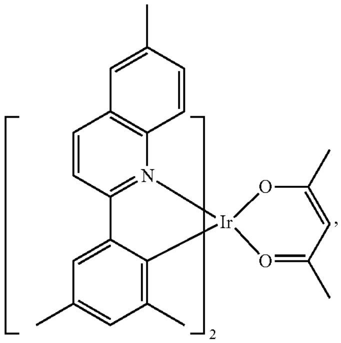
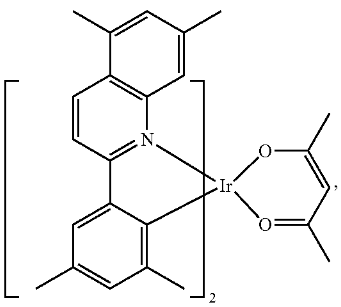
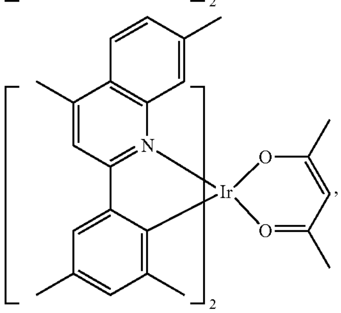
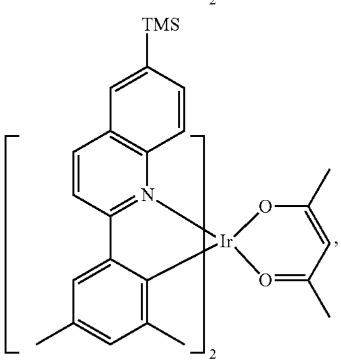
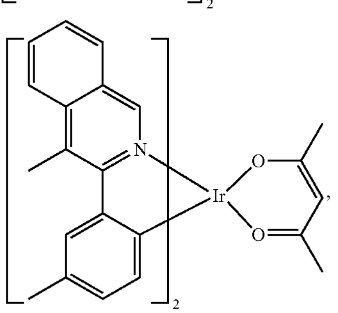
-continued
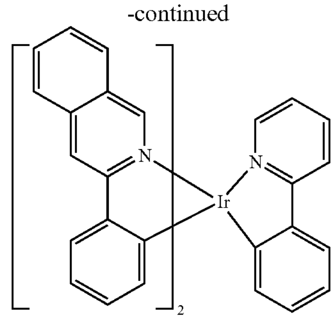
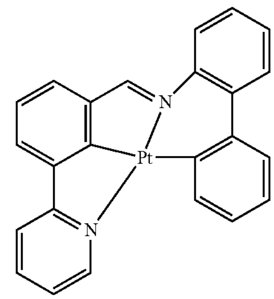
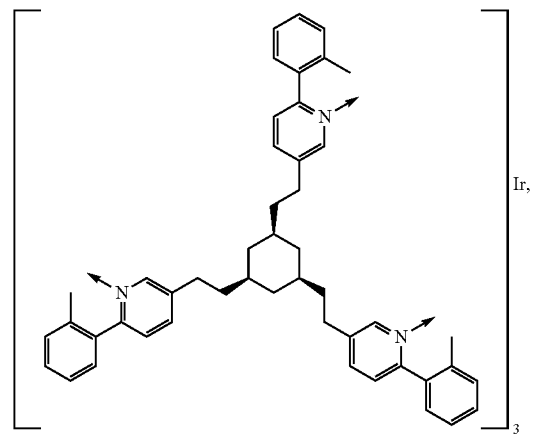
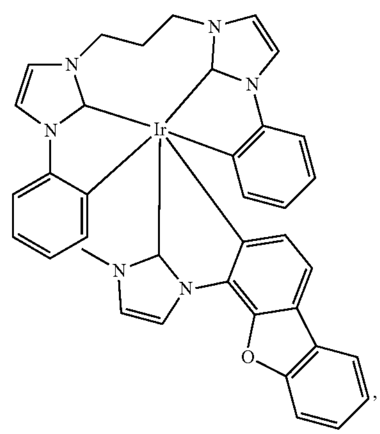
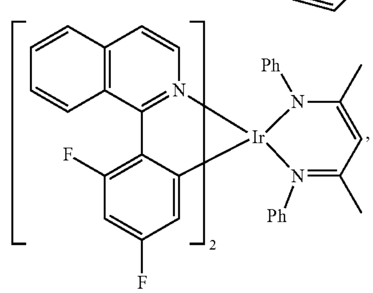

-continued
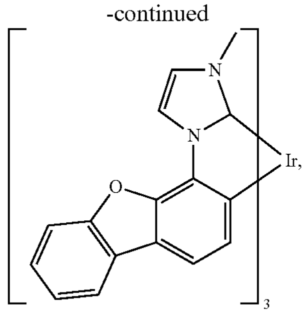
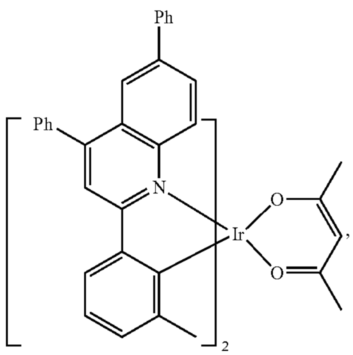
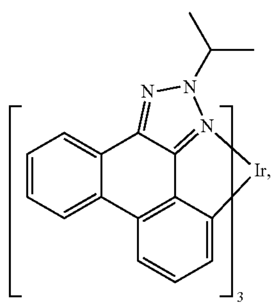
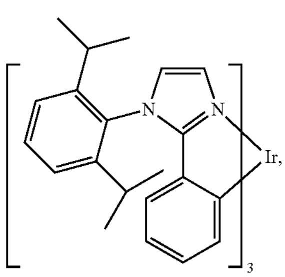
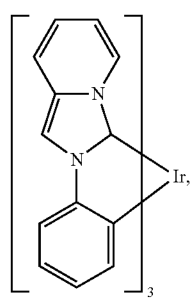
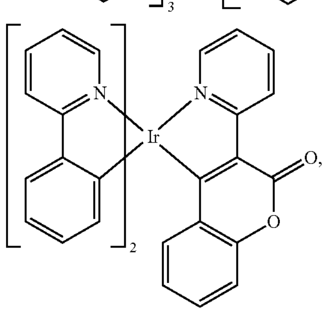
-continued
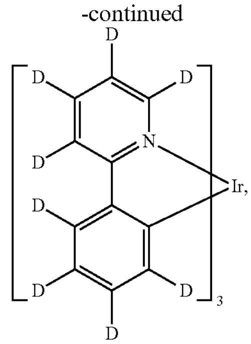
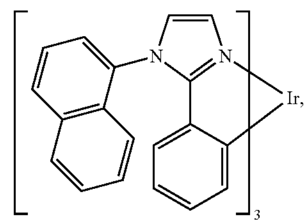
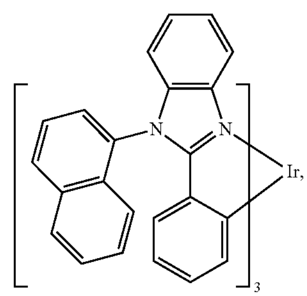
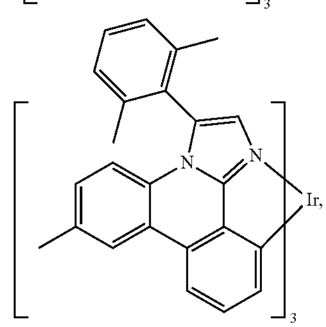
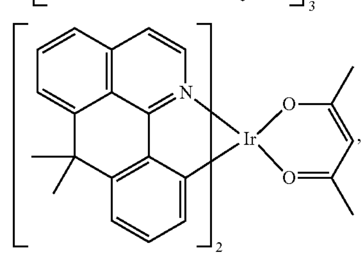
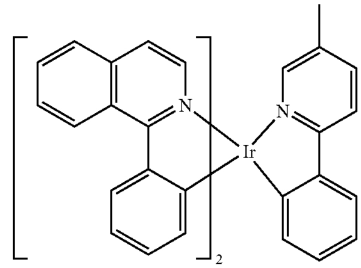

-continued

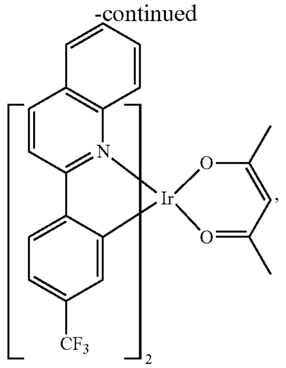

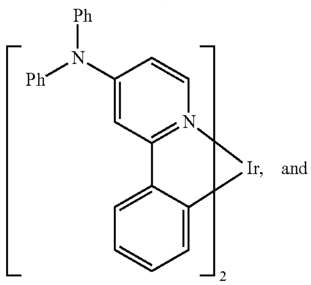

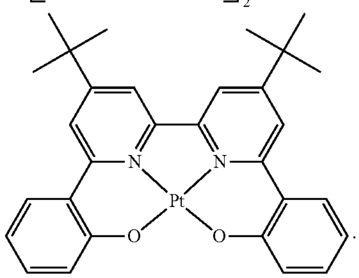

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

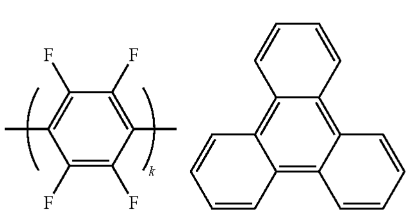

-continued

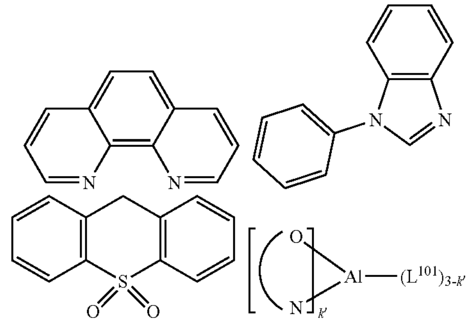

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

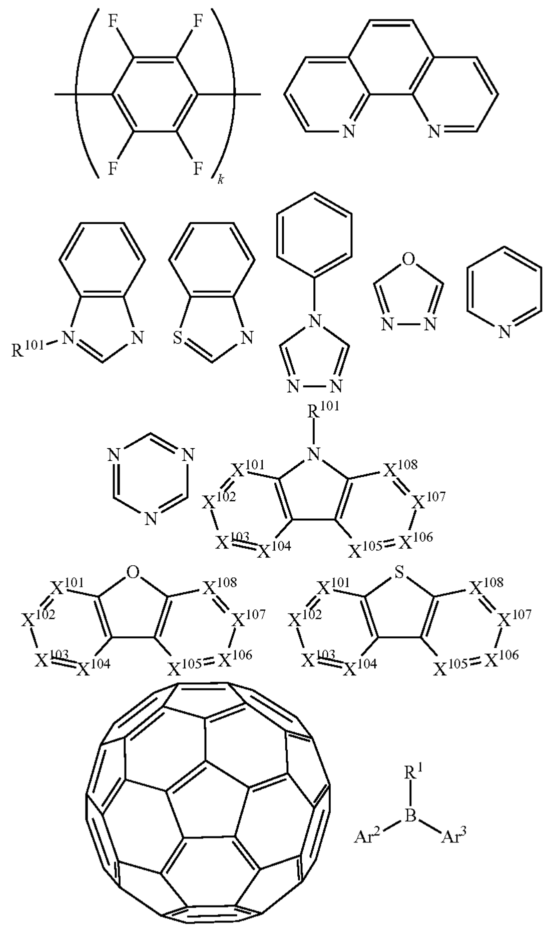

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

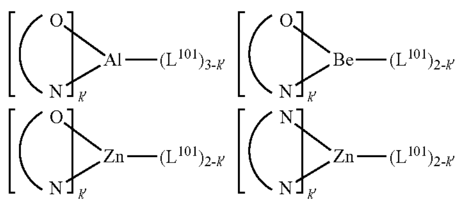

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

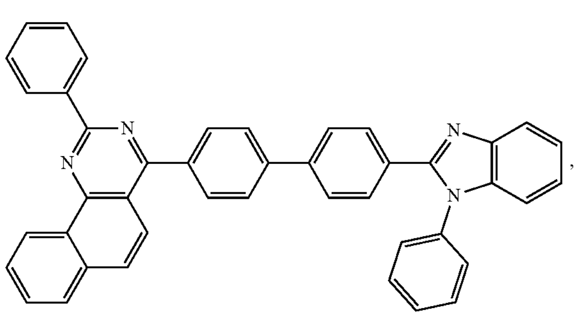

-continued

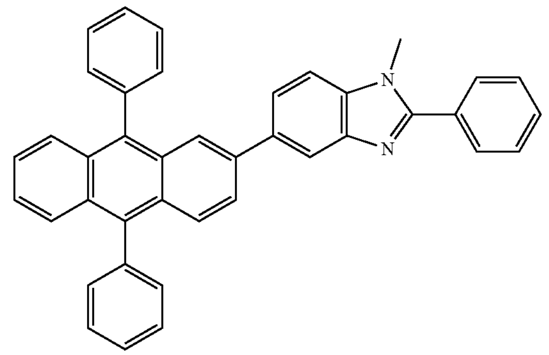

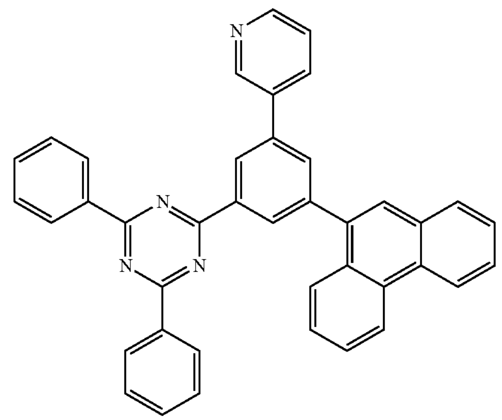

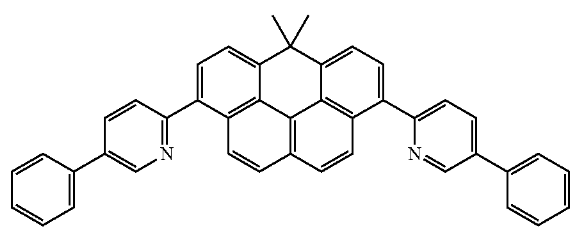

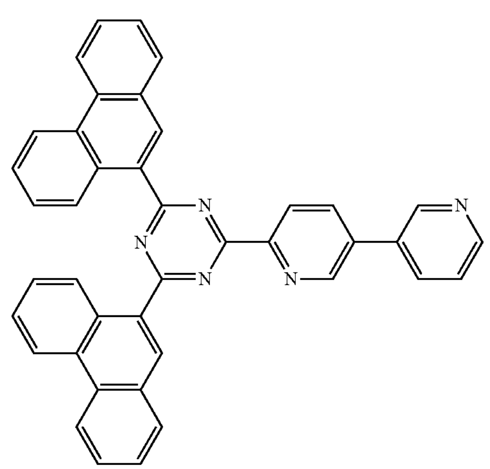

-continued
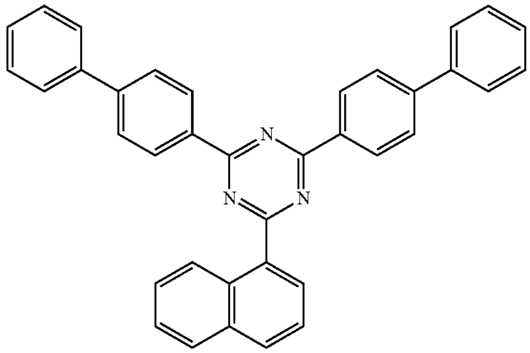
,
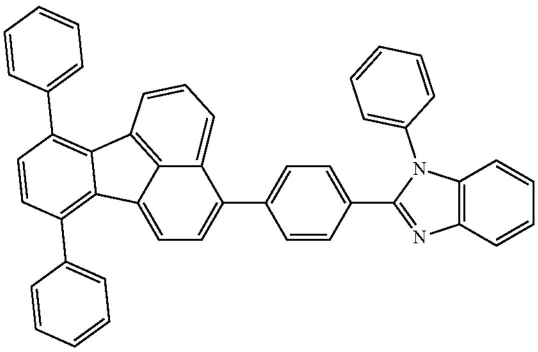
,
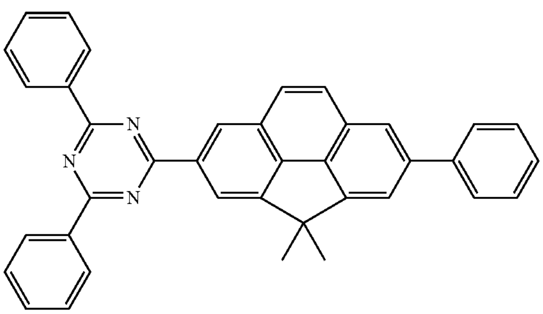
,
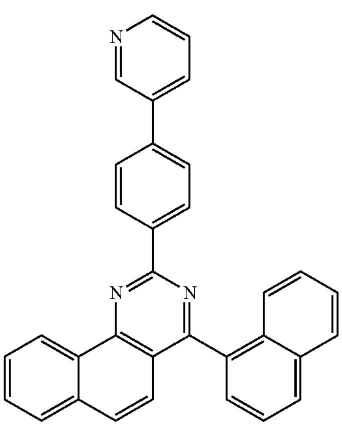
,
-continued
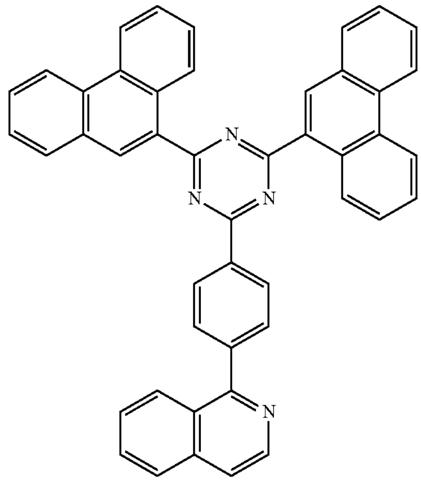
,
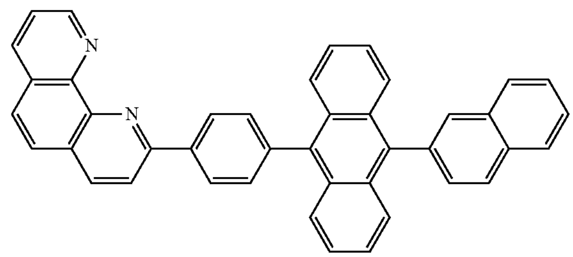
,
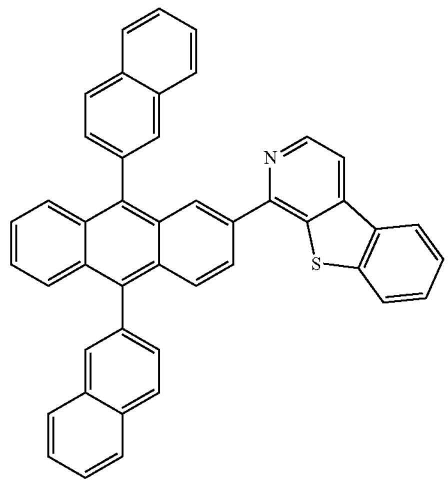
,
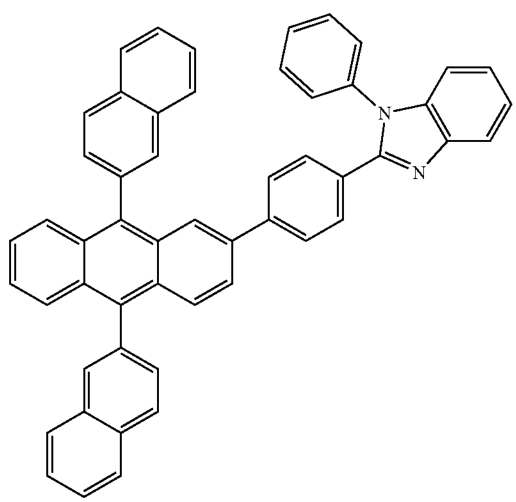
, -continued
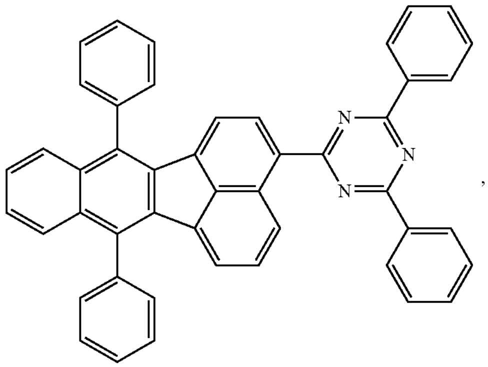
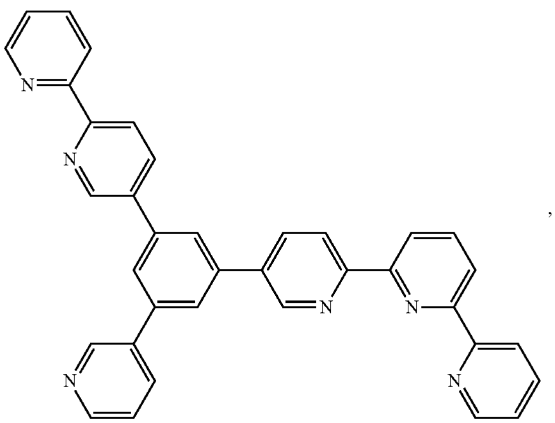
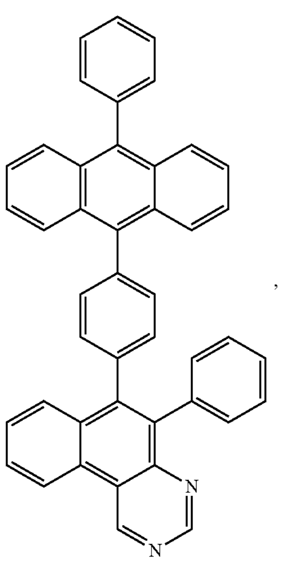
-continued
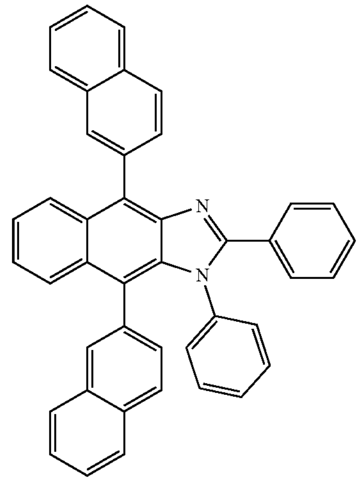
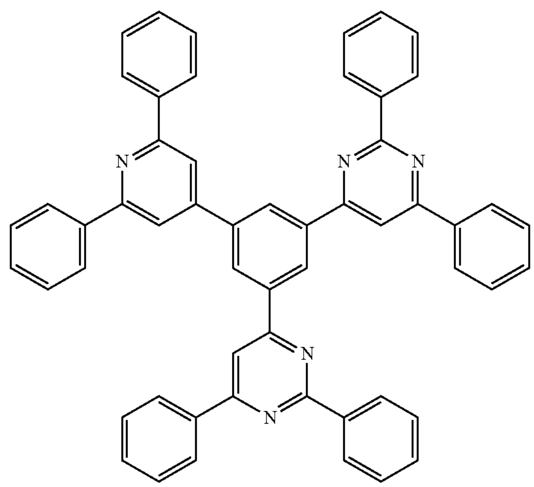
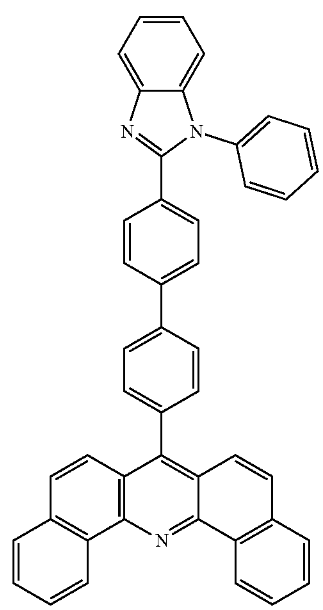

-continued
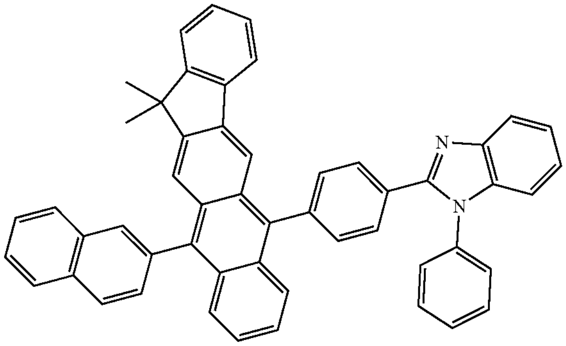
,
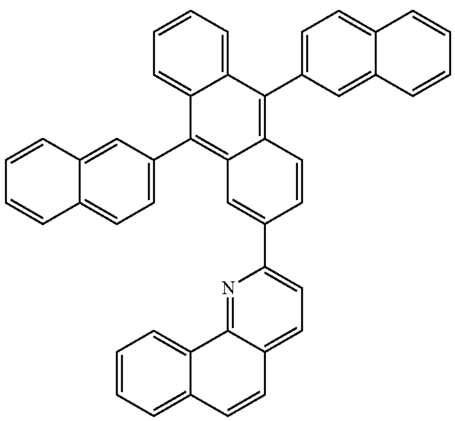
,
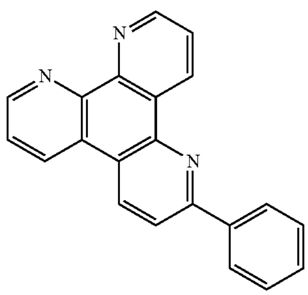
,
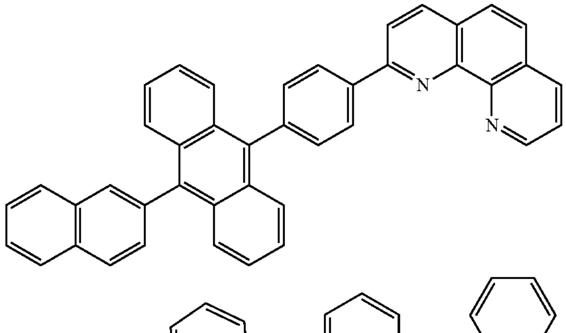
,
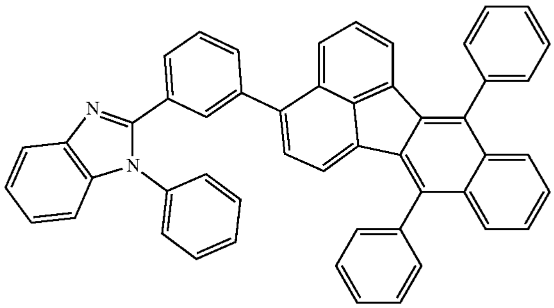
,
-continued
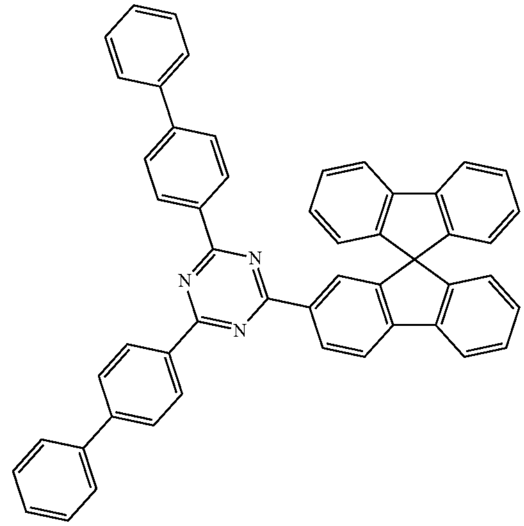
,
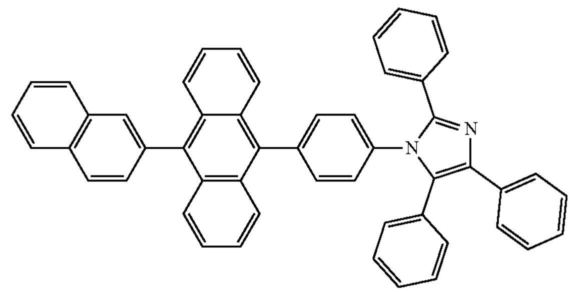
,
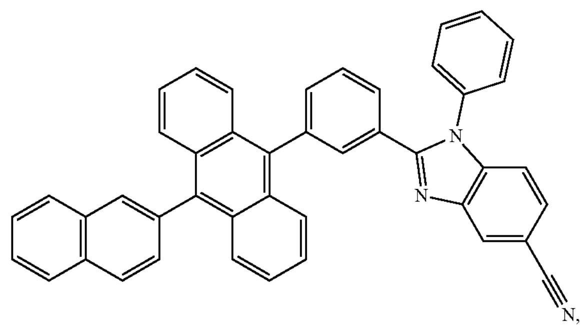
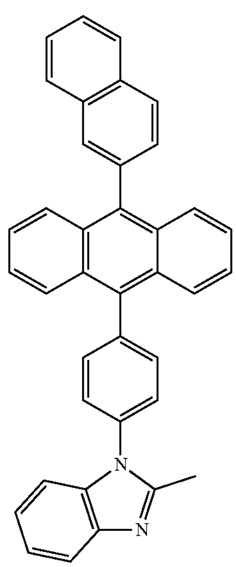
, -continued

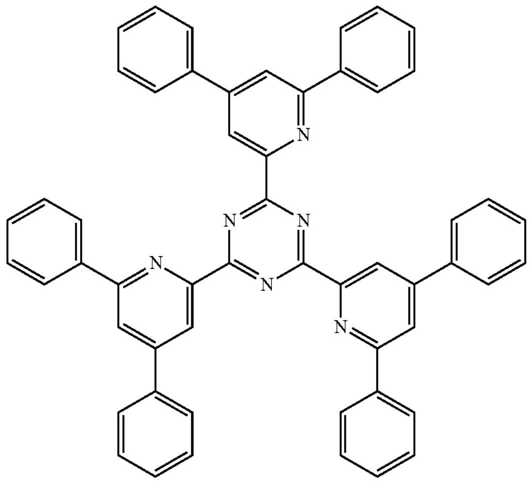

,

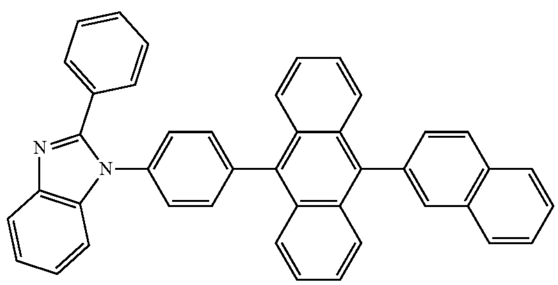

,

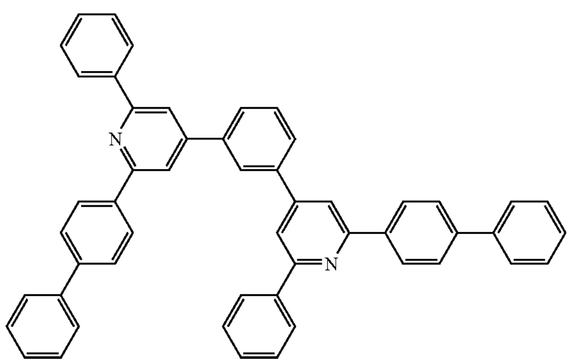

,

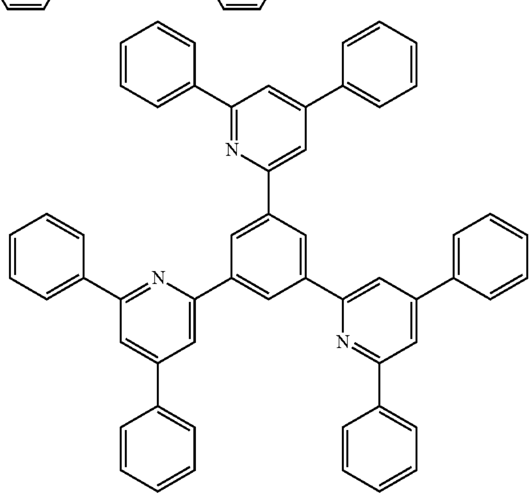

,

-continued

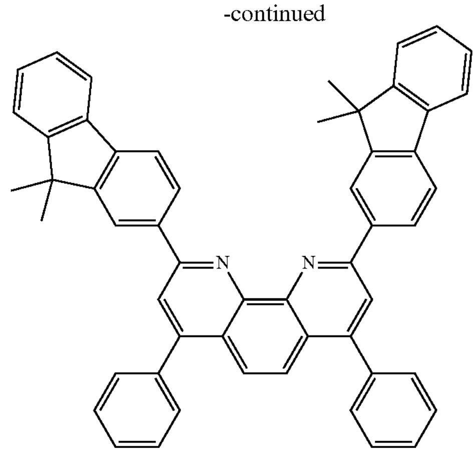

, and

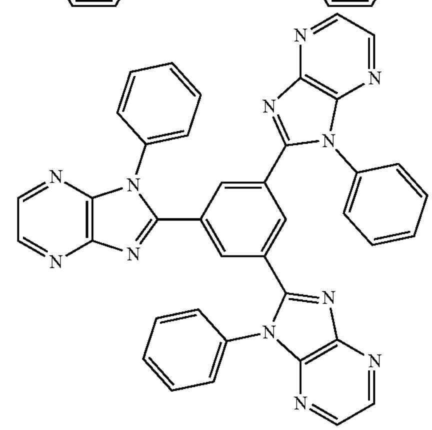

.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Synthesis of Compound 20

Synthesis of 2-fluoro-4-(2,4,6-triisopropylphenyl)pyridine

A mixture of (2,4,6-triisopropylphenyl)boronic acid (8.46 g, 34.1 mmol), SPhos-Pd-G2 (0.818 g, 1.136 mmol), SPhos (0.467 g, 1.136 mmol), and potassium phosphate (18.09 g, 85 mmol) was vacuum and back-filled with nitrogen.

4-bromo-2-fluoropyridine (2.92 ml, 28.4 mmol), toluene (80 ml), and water (16 ml) were added to the reaction mixture and refluxed for 18 hrs then partitioned between ethyl acetate (EA) and brine and collected the organic portion. The aqueous layer was extracted with dichloromethane (DCM) and the combined organic extracts were dried with $MgSO_4$ and coated on celite. The product was chromatographed on silica (EA/Hep=1/6) and obtained white solid product (84% yield).

Synthesis of 2-bromo-9-(4-(2,4,6-triisopropylphenyl)pyridin-2-yl)-9H-carbazole A mixture of 2-bromo-9H-carbazole (3 g, 12.19 mmol), 2-fluoro-4-(2,4,6-triisopropylphenyl)pyridine (4.02 g, 13.41 mmol), and potassium carbonate (5.05 g, 36.6 mmol) in DMSO (60 ml) was heated at 150° C. for 48 hrs. The reaction mixture was cooled down and water (80 mL) was added. The solid product was collected by filtration and washed with water. The solid was triturated in EA/MeOH (1/10) and filtered. The off-white solid was dried in the vacuum oven (89% yield).

Synthesis of 3'-chloro-2,4,6-triisopropyl-5'-methoxy-1,1'-biphenyl

A mixture of (3-chloro-5-methoxyphenyl)boronic acid (5 g, 26.8 mmol), $Pd(PPh_3)_4$ (1.240 g, 1.073 mmol), and sodium carbonate (5.69 g, 53.6 mmol) was vacuum and back-filled with nitrogen. 2-bromo-1,3,5-triisopropylbenzene (6.80 ml, 26.8 mmol), Dioxane (75 ml), and water (15 ml) were added to the reaction mixture and refluxed for 18 hrs. The mixture was cooled down, most of dioxane was evaporated and extracted with DCM/brine. The product was chromatographed on silica (DCM/Hep=1/3) and the solvent was evaporated to afford a off-white solid product (66% yield).

Synthesis of 5-chloro-2',4',6'-triisopropyl-[1,1'-biphenyl]-3-ol tribromoborane (29.8 ml, 29.8 mmol) was added to a solution of 3'-chloro-2,4,6-triisopropyl-5'-methoxy-1,1'-biphenyl (3.43 g, 9.94 mmol) under nitrogen in dry DCM (30 ml) at 0° C. and stirred at room temperature (R.T.) for 5 hrs. The reaction was quenched with water slowly. After removing DCM, the white solid was stirred in water/MeOH (10/1) for 3 hrs and filtered (96% yield).

Synthesis of 2-((5-chloro-2',4',6'-triisopropyl-[1,1'-biphenyl]-3-yl)oxy)-9-(4-(2,4,6-triisopropylphenyl)pyridin-2-yl)-9H-carbazole A mixture of 5-chloro-2',4',6'-triisopropyl-[1,1'-biphenyl]-3-ol (1.322 g, 4.00 mmol), 2-bromo-9-(4-(2,4,6-triisopropylphenyl)pyridin-2-yl)-9H-carbazole (2 g, 3.81 mmol), copper(I) iodide (0.145 g, 0.761 mmol), picolinic acid (0.187 g, 1.522 mmol), and potassium phosphate (1.616 g, 7.61 mmol) was vacuum and back-filled with nitrogen. DMSO (20 ml) was added to the reaction mixture and heated at 140° C. for 18 hrs. The mixture was cooled down and water (30 mL) was added. The resulting solid was collected by filtration and washed with water and dissolved in DCM. The product was chromatographed on silica (DCM/Hep=3/1) and the solvent was evaporated to obtain the product (77% yield).

Synthesis of N1-phenyl-N2-(2',4',6'-triisopropyl-5-((9-(4-(2,4,6-triisopropylphenyl)pyridin-2-yl)-9H-carbazol-2-yl)oxy)-[1,1'-biphenyl]-3-yl)benzene-1,2-diamine A mixture of N1-phenylbenzene-1,2-diamine (0.591 g, 3.21 mmol), 2-((5-chloro-2',4',6'-triisopropyl-[1,1'-biphenyl]-3-yl)oxy)-9-(4-(2,4,6-triisopropylphenyl)pyridin-2-yl)-9H-carbazole (2.26 g, 2.91 mmol), (allyl)PdCl-dimer (0.032 g, 0.087 mmol), cBRIDP (0.123 g, 0.350 mmol), and sodium 2-methylpropan-2-olate (0.700 g, 7.29 mmol) was vacuumed and back-filled with nitrogen several times. Toluene (15 ml) was added to the reaction mixture and refluxed for 3 hrs. The reaction mixture was coated on celite and chromatographed on silica (DCM/Hep=2/1) to afford product (75% yield).

Synthesis of 3-phenyl-1-(2',4',6'-triisopropyl-5-((9-(4-(2,4,6-triisopropylphenyl)pyridin-2-yl)-9H-carbazol-2-yl)oxy)-[1,1'-biphenyl]-3-yl)-1H-benzo[d]imidazol-3-ium chloride N1-phenyl-N2-(2',4',6'-triisopropyl-5-((9-(4-(2,4,6-triisopropylphenyl)pyridin-2-yl)-9H-carbazol-2-yl)oxy)-[1,1'-biphenyl]-3-yl)benzene-1,2-diamine (2 g, 2.166 mmol) was dissolved in triethoxymethane (18.01 ml, 108 mmol) and hydrogen chloride (0.213 ml, 2.60 mmol) was added. The reaction mixture was heated at 80° C. for 18 hrs. About half the amount of triehoxymethane was removed by distillation under vacuum until solid appeared. The solid was washed with diethyl ether and filtered (89% yield).

Synthesis of Compound 20

A mixture of 3-phenyl-1-(2',4',6'-triisopropyl-5-((9-(4-(2,4,6-triisopropylphenyl)pyridin-2-yl)-9H-carbazol-2-yl)oxy)-[1,1'-biphenyl]-3-yl)-1H-benzo[d]imidazol-3-ium chloride (1.83 g, 1.887 mmol) and silver oxide (0.219 g, 0.944 mmol) was stirred in 1,2-dichloroethane (25 ml) at R.T. for 18 hrs. After removing 1,2-dichloroethane, $Pt(COD)Cl_2$ (0.706 g, 1.887 mmol) was added and the reaction mixture was vacuumed and back-filled with nitrogen. 1,2-dichlorobenzene (25 ml) was added and heated at 190° C. for 48 hrs. The solvent was removed and coated on celite and chromatographed on silica (DCM/Hep=1/1). The product was triturated in MeOH (81% yield).

Synthesis of Compound 7300

Synthesis 2-(3-(1H-imidazol-1-yl)phenoxy)-9-(4-(2,4,6-triisopropylphenyl)pyridin-2-yl)-9H-carbazole A mixture of 3-(1H-imidazol-1-yl)phenol (0.274 g, 1.708 mmol), 2-bromo-9-(4-(2,4,6-triisopropylphenyl)pyridin-2-yl)-9H-carbazole (0.88 g, 1.674 mmol), copper(I) iodide (0.064 g, 0.335 mmol), picolinic acid (0.082 g, 0.670 mmol), and potassium phosphate (0.711 g, 3.35 mmol) was vacuumed and back-filled with nitrogen several times. DMSO (10 ml) was added to the reaction mixture and heated at 140° C. for 18 hrs. The mixture was cooled down and water (15 mL) was added. The resulting solid was collected by filtration and dissolved in DCM and dried with $MgSO_4$. The product was chromatographed on silica (DCM/EA=3/1) to afford product (63% yield).

Synthesis of 3-(methyl-d3)-1-(3-((9-(4-(2,4,6-triisopropylphenyl)pyridin-2-yl)-9H-carbazol-2-yl)oxy)phenyl)-1H-imidazol-3-ium iodide 2-(3-(1H-imidazol-1-yl)phenoxy)-9-(4-(2,4,6-triisopropylphenyl)pyridin-2-yl)-9H-carbazole (622 mg, 1.028 mmol) was dissolved in EA (10 ml) and iodomethane-d3 (0.320 ml, 5.14 mmol) was added. The reaction mixture was stirred at R.T. for 3 days. The resulting off-white solid was collected by filtration and washed with EA and diethyl ether and dried under vacuum. (77% yield).

Synthesis of Compound 7300

A mixture of 3-(methyl-d3)-1-(3-((9-(4-(2,4,6-triisopropylphenyl)pyridin-2-yl)-9H-carbazol-2-yl)oxy)phenyl)-1H-imidazol-3-ium iodide (0.59 g, 0.787 mmol) and silver oxide (0.091 g, 0.393 mmol) was stirred in 1,2-dichloroethane (12 ml) at R.T. for 18 hrs. After removing 1,2-dichloroethane, $Pt(COD)Cl_2$ (0.294 g, 0.787 mmol) was added and the reaction mixture was vacuumed and back-filled with nitrogen. 1,2-dichlorobenzene (12 ml) was added and heated at 190° C. for 24 hrs. The solvent was removed and coated on celite and chromatrographed on silica (DCM/Hep=2/1). The product was triturated in MeOH and dried in the vacuum oven (57% yield).

Synthesis of Compound 87920

Synthesis of 2-bromo-9-(4-(tert-butyl)pyridin-2-yl)-9H-carbazole

A mixture of 2-bromo-4-(tert-butyl)pyridine (5.65 g, 26.4 mmol), 2-bromo-9H-carbazole (5 g, 20.32 mmol), copper(I) iodide (1.548 g, 8.13 mmol), 1-methyl-1H-imidazole (1.612 ml, 20.32 mmol), and lithium 2-methylpropan-2-olate (3.25 g, 40.6 mmol) was vacuumed and back-filled with nitrogen several times. Toluene (60 ml) was added to the reaction mixture and heated at reflux for 4 hrs. The moisture was cooled down and partitioned between EA and water with ~30 mL 30% $NH_4OH$(aq). The organic layer was separated and the aqueous layer was extracted with DCM. Chromatographed on silica (DCM) (89% yield).

Synthesis of 9-(4-(tert-butyl)pyridin-2-yl)-2-((5-chloro-2',6'-diisopropyl-[1,1'-biphenyl]-3-yl)oxy)-9H-carbazole A mixture of 2-bromo-9-(4-(tert-butyl)pyridin-2-yl)-9H-carbazole (1.5 g, 3.95 mmol), copper(I) iodide (0.151 g, 0.791 mmol), picolinic acid (0.195 g, 1.582 mmol), and potassium carbonate (1.679 g, 7.91 mmol) was vacuum and back-filled with nitrogen. 5-chloro-2',6'-diisopropyl-[1,1'-biphenyl]-3-ol (1.199 g, 4.15 mmol) and DMSO (15 ml) was added to the reaction mixture and heated at 140° C. for 18 hrs. The mixture was cooled down and water (20 mL) was added. The resulting solid was collected by filtration and washed with water and dissolved in DCM. The product was coated on celite and chromatographed on silica (DCM/Hep=4/1) (82% yield).

Synthesis 3'-chloro-2,6-diisopropyl-5'-methoxy-1,1'-biphenyl

A mixture of (3-chloro-5-methoxyphenyl)boronic acid (6 g, 32.2 mmol), $Pd(PPh_3)_4$ (1.488 g, 1.288 mmol), and sodium carbonate (6.82 g, 64.4 mmol) was vacuum and back-filled with nitrogen. 2-bromo-1,3-diisopropylbenzene (6.63 ml, 32.2 mmol), dioxane (75 ml), and water (15 ml) were added to the reaction mixture and refluxed for 16 hrs. The mixture was cooled down and dioxane was removed and extracted with DCM/brine. The product was chromatographed on silica (DCM/Hep=2/3) to obtain a colorless liquid which solidified under vacuum (67% yield).

Synthesis of 5-chloro-2',6'-diisopropyl-[1,1'-biphenyl]-3-ol tribromoborane (42.9 ml, 42.9 mmol) was added to a solution of 3'-chloro-2,6-diisopropyl-5'-methoxy-1,1'-biphenyl (6.5 g, 21.46 mmol) under nitrogen in dry dichloromethane (40 ml) at 0° C. and stirred at R.T. for 5 hrs. The reaction mixture was quenched in an ice bath until some solid appeared. After removing DCM, the resulting white solid was stirred in water for 1 hr and filtered. The product was dried in the vacuum oven overnight (100% yield).

Synthesis N1-(5-((9-(4-(tert-butyl)pyridin-2-yl)-9H-carbazol-2-yl)oxy)-2',6'-diisopropyl-[1,1'-biphenyl]-3-yl)-N2-phenylbenzene-1,2-diamine A mixture of N1-phenylbenzene-1,2-diamine (0.327 g, 1.774 mmol), 9-(4-(tert-butyl)pyridin-2-yl)-2-((5-chloro-2',6'-diisopropyl-[1,1'-biphenyl]-3-yl)oxy)-9H-carbazole (0.947 g, 1.613 mmol), (allyl)PdCl-dimer (0.018 g, 0.048 mmol), cBRIDP (0.068 g, 0.194 mmol), and sodium 2-methylpropan-2-olate (0.387 g, 4.03 mmol) was vacuumed and back-filled with nitrogen several times. Toluene (10 ml) was added to the reaction mixture and refluxed for 3 hrs. The reaction mixture was coated on celite and chromatographed on silica (DCM/Hep=5/1 to 8/1) (75% yield).

Synthesis 1-(5-((9-(4-(tert-butyl)pyridin-2-yl)-9H-carbazol-2-yl)oxy)-2',6'-diisopropyl-[1,1'-biphenyl]-3-yl)-3-phenyl-1H-benzo[d]imidazol-3-ium chloride N1-(5-((9-(4-(tert-butyl)pyridin-2-yl)-9H-carbazol-2-yl)oxy)-2',6'-diisopropyl-[1,1'-biphenyl]-3-yl)-N2-phenylbenzene-1,2-diamine (0.89 g, 1.211 mmol) was dissolved in triethoxymethane (10.07 ml, 60.5 mmol) and hydrogen chloride (0.119 ml, 1.453 mmol) was added. The reaction mixture was heated at 80° C. for 16 hrs. The mixture was cooled down and the solid was washed with diethyl ether and filtered and dried in the vacuum oven (85% yield).

Synthesis of Compound 87920

A mixture of 1-(5-((9-(4-(tert-butyl)pyridin-2-yl)-9H-carbazol-2-yl)oxy)-2',6'-diisopropyl-[1,1'-biphenyl]-3-yl)-3-phenyl-1H-benzo[d]imidazol-3-ium chloride (0.8 g, 1.024 mmol) and silver oxide (0.119 g, 0.512 mmol) was stirred in 1,2-dichloroethane (10 ml) at R.T. for 16 hrs. After removing 1,2-dichloroethane, $Pt(COD)Cl_2$ (0.383 g, 1.024 mmol) was added and the reaction mixture was vacuumed and back-filled with nitrogen. 1,2-dichlorobenzene (10 ml) was added and heated at 190° C. for 5 days. The solvent was removed and coated on celite and chromatographed on silica (DCM/Hep=1/1). The product was triturated in MeOH and dried in the vacuum oven (62% yield).

Synthesis of Compound 95050

Synthesis of 9-(4-(tert-butyl)pyridin-2-yl)-2-methoxy-9H-carbazole

A mixture of 4-(tert-butyl)-2-chloropyridine (1.720 g, 10.14 mmol), 2-methoxy-9H-carbazole (2 g, 10.14 mmol), (allyl)PdCl-dimer (0.074 g, 0.203 mmol), and cBRIDP (0.286 g, 0.811 mmol) was vacuumed and back-filled with nitrogen several times. Toluene (30 ml) was added and the reaction mixture was refluxed for 4 hrs, partitioned between EA/water and extracted. The aqueous layer was extracted with DCM, then coated on celite and chromatographed on silica (DCM/EA=30/1) (81% yield).

Synthesis of 9-(4-(tert-butyl)pyridin-2-yl)-9H-carbazol-2-ol 9-(4-(tert-butyl)pyridin-2-yl)-2-methoxy-9H-carbazole (2.72 g, 8.23 mmol) was heated in hydrogen bromide (46.6 ml, 412 mmol) at 140° C. (oil temp) for 1 hr. The mixture was cooled down and partitioned between DCM and water and extracted with DCM. The DCM layer was washed with $NaHCO_3$(sat). Evaporation of organic solvent to obtain light yellow solid (86% yield).

Synthesis of 9-(4-(tert-butyl)pyridin-2-yl)-9H-carbazol-2-ol

A mixture of 1H-benzo[d]imidazole (3 g, 25.4 mmol), 1-bromo-3-iodobenzene (3.89 ml, 30.5 mmol), copper(I) iodide (0.484 g, 2.54 mmol), 1,10-phenanthroline (0.458 g, 2.54 mmol), and potassium carbonate (4.21 g, 30.5 mmol) was heated in DMF (70 ml) at 150° C. for 16 hrs. The mixture was cooled down and poured in cold water and extracted with DCM (insoluble salts were removed by filtration). Chromatographed on silica (EA/DCM=2/1) to obtain pale yellow tacky oil which solidified under vacuum overnight (59% yield).

Synthesis of 2-(3-(1H-benzo[d]imidazol-1-yl)phenoxy)-9-(4-(tert-butyl)pyridin-2-yl)-9H-carbazole A mixture of 1-(3-bromophenyl)-1H-benzo[d]imidazole (1.295 g, 4.74 mmol), 9-(4-(tert-butyl)pyridin-2-yl)-9H-carbazol-2-ol (1.5 g, 4.74 mmol), copper(I) iodide (0.181 g, 0.948 mmol), picolinic acid (0.233 g, 1.896 mmol), and potassium phosphate (2.013 g, 9.48 mmol) was vacuumed and back-filled with nitrogen several times. DMSO (15 ml) was added to the reaction mixture and heated at 140° C. for 16 hrs. The mixture was cooled down and water (20 mL) was added. The resulting solid was collected by filtration and dissolved in DCM and dried with $MgSO_4$. Chromatographed on silica (EA/DCM=1/1) (71% yield).

Synthesis of 1-(3-((9-(4-(tert-butyl)pyridin-2-yl)-9H-carbazol-2-yl)oxy)phenyl)-3-(methyl-d3)-1H-benzo[d]imidazol-3-ium iodide (SC2017-4-024)

A mixture of 2-(3-(1H-benzo[d]imidazol-1-yl)phenoxy)-9-(4-(tert-butyl)pyridin-2-yl)-9H-carbazole (0.75 g, 1.475 mmol) and iodomethane-d3 (0.459 ml, 7.37 mmol) was refluxed in Acetonitrile (15 ml) for 3 days. The solvent was removed and triturated in EA (100% yield).

Synthesis of Compound 95050

A mixture of 1-(3-((9-(4-(tert-butyl)pyridin-2-yl)-9H-carbazol-2-yl)oxy)phenyl)-3-(methyl-d3)-1H-benzo[d]imidazol-3-ium iodide (1 g, 1.530 mmol) and silver oxide (0.177 g, 0.765 mmol) was stirred in 1,2-dichloroethane (15 ml) at R.T. for 16 hrs. After removing 1,2-dichloroethane, $Pt(COD)Cl_2$ (0.572 g, 1.530 mmol) was added and the reaction mixture was vacuumed and back-filled with nitrogen. 1,2-dichlorobenzene (15 ml) was added and heated at 190° C. for 3 days. The solvent was removed and coated on celite and chromatrographed on silica (DCM/Hep=2/1). The product was triturated in MeOH and dried in the vacuum oven (7% yield).

Synthesis of Compound 226820

Synthesis of 2-bromo-9-(pyridin-2-yl)-9H-carbazole

A mixture of 2-bromo-9H-carbazole (8 g, 32.5 mmol), 2-fluoropyridine (5.59 ml, 65.0 mmol), and potassium carbonate (13.48 g, 98 mmol) in DMSO (80 ml) was heated at 140° C. for 16 hrs. The mixture was cooled down, then the reaction mixture was extracted with EA and water and the organic portion was washed with brine and concentrated. The product solidified under vacuum (100% yield).

Synthesis of 2-(3-chlorophenoxy)-9-(pyridin-2-yl)-9H-carbazole

A mixture of 2-bromo-9-(pyridin-2-yl)-9H-carbazole (2.05 g, 6.34 mmol), copper(I) iodide (0.242 g, 1.269 mmol), picolinic acid (0.312 g, 2.54 mmol), and potassium carbonate (2.69 g, 12.69 mmol) was vacuum and back-filled with nitrogen. 3-chlorophenol (0.703 ml, 6.66 mmol) and DMSO (30 ml) was added to the reaction mixture and heated at 140° C. for 16 hrs. The mixture was cooled down and partitioned between EA and water and extracted with EA. The organic extracts were washed with brine and concentrated, then chromatographed on silica (DCM) (75% yield).

Synthesis of N1-phenyl-N2-(3-((9-(pyridin-2-yl)-9H-carbazol-2-yl)oxy)phenyl)benzene-1,2-diamine A mixture of N1-phenylbenzene-1,2-diamine (0.820 g, 4.45 mmol), 2-(3-chlorophenoxy)-9-(pyridin-2-yl)-9H-carbazole (1.5 g, 4.04 mmol), (allyl)PdCl-dimer (0.044 g, 0.121 mmol), cBRIDP (0.171 g, 0.485 mmol), and sodium 2-methylpropan-2-olate (0.972 g, 10.11 mmol) was vacuumed and back-filled with nitrogen several times. Toluene (15 ml) was added to the reaction mixture and refluxed for 3 hrs. The product was coated on celite and chromatographed on silica (EA/Hep=1/2) (66% yield).

Synthesis of 3-phenyl-1-(3-((9-(pyridin-2-yl)-9H-carbazol-2-yl)oxy)phenyl)-1H-benzo[d]imidazol-3-ium chloride N1-phenyl-N2-(3-((9-(pyridin-2-yl)-9H-carbazol-2-yl)oxy)phenyl)benzene-1,2-diamine (1.4 g, 2.70 mmol) was dissolved in triethoxymethane (22.45 ml, 135 mmol) and hydrogen chloride (0.266 ml, 3.24 mmol) was added. The reaction mixture was heated at 80° C. for 30 min. The mixture was cooled down and diethyl ether (~50 mL, solid appeared) was added to the reaction mixture and stirred for 5 hrs. The product was collected by filtration and was washed with diethyl ether and dried in the vacuum oven (75% yield).

Synthesis of 226820

A mixture of 3-phenyl-1-(3-((9-(pyridin-2-yl)-9H-carbazol-2-yl)oxy)phenyl)-1H-benzo[d]imidazol-3-ium chloride (1.14 g, 2.017 mmol) and silver oxide (0.234 g, 1.009 mmol) was stirred in 1,2-dichloroethane (25 ml) at R.T. for 16 hrs. After removing 1,2-dichloroethane, $Pt(COD)Cl_2$ (0.755 g, 2.017 mmol) was added and the reaction mixture was vacuumed and back-filled with nitrogen. 1,2-dichlorobenzene (25 ml) was added and heated at 190° C. for 48 hrs. The solvent was removed and coated on celite and chromatrographed on silica (DCM/Hep=2/1). The product was triturated in MeOH and dried in the vacuum oven (50% yield).

Synthesis of Compound 82166890

Synthesis of 1-(3-(3-(4-(2,6-diisopropylphenyl)-1H-pyrazol-1-yl)phenoxy)phenyl)-1H-benzo[d]imidazole A mixture of 1-(3-bromophenyl)-1H-benzo[d]imidazole (0.8 g, 2.93 mmol), 3-(4-(2,6-diisopropylphenyl)-1H-pyrazol-1-yl)phenol (0.939 g, 2.93 mmol), copper(I) iodide (0.112 g, 0.586 mmol), picolinic acid (0.144 g, 1.172 mmol), and potassium phosphate (1.243 g, 5.86 mmol) was vacuumed and back-filled with nitrogen several times. DMSO (12 ml) was added to the reaction mixture and heated at 140° C. for 16 hrs. The mixture was cooled down and water (20 mL) was added. The resulting solid was collected by filtration and dissolved in DCM and dried with $MgSO_4$. The product was coated on celite and chromatographed on silica (EA/DCM=1/4) (66% yield).

Synthesis of 1-(3-(3-(4-(2,6-diisopropylphenyl)-1H-pyrazol-1-yl)phenoxy)phenyl)-3-(methyl-d3)-1H-benzo[d]imidazol-3-ium iodide 1-(3-(3-(4-(2,6-diisopropylphenyl)-1H-pyrazol-1-yl)phenoxy)phenyl)-1H-benzo[d]imidazole (0.987 g, 1.925 mmol) was dissolved in Ethyl acetate (15 ml) and iodomethane-d3 (0.359 ml, 5.78 mmol) was added and the reaction mixture was heated at 60° C. for 16 hrs. White precipitation appeared and it was collected by filtration and dried in the vacuum oven (75% yield).

Synthesis of Compound 82166890

A mixture of 1-(3-(3-(4-(2,6-diisopropylphenyl)-1H-pyrazol-1-yl)phenoxy)phenyl)-3-(methyl-d3)-1H-benzo[d]imidazol-3-ium iodide (820 mg, 1.247 mmol) and silver oxide (144 mg, 0.623 mmol) was stirred in 1,2-dichloroethane (8 ml) at R.T. for 16 hrs. After removing 1,2-dichloroethane, $Pt(COD)Cl_2$ (467 mg, 1.247 mmol) was added and the reaction mixture was vacuumed and back-filled with nitrogen. 1,2-dichlorobenzene (8 ml) was added and heated at 80° C. for 16 hrs and 190° C. for 7 days. The solvent was removed and coated on celite and chromatrographed on silica (DCM/Hep=2/1). The product was triturated in MeOH and dried in the vacuum oven (63% yield).

Synthesis of Compound 89355323

Synthesis 1-(3-bromophenyl)-2-((2,6-diisopropylphenyl)amino)ethan-1-one

A mixture of 2-bromo-1-(3-bromophenyl)ethan-1-one (3 g, 10.79 mmol) and 2,6-diisopropylaniline (4.02 g, 22.67 mmol) was stirred in Ethanol (15 ml) at R.T. for 2 days. EtOH was removed and triturated in diethyl ether. The white solid (salt) was removed by filtration. The filtrate was concentrated and chromatographed on silica (THF/Hep=1/20). Obtained yellow oil. (74% yield).

Synthesis of 4-(3-bromophenyl)-1-(2,6-diisopropylphenyl)-1H-imidazole

A mixture of 1-(3-bromophenyl)-2-((2,6-diisopropylphenyl)amino)ethan-1-one (2.3 g, 6.14 mmol), formaldehyde, 37% in water (0.503 ml, 6.76 mmol), and ammonium acetate (4.74 g, 61.4 mmol) was heated in Acetic Acid (20 ml) at reflux overnight. The mixture was cooled down and partitioned between EA and brine and extracted with EA. The organic extract was basified with $Na_2CO_3$(sat) until basic. Coated on celite and chromatographed on silica (EA/Hep=1/3) (20% yield).

Synthesis of 4-(3-((5-chloro-2',6'-diisopropyl-[1,1'-biphenyl]-3-yl)oxy)phenyl)-1-(2,6-diisopropylphenyl)-1H-imidazole A mixture of 4-(3-bromophenyl)-1-(2,6-diisopropylphenyl)-1H-imidazole (0.8 g, 2.087 mmol), copper(I) iodide (0.079 g, 0.417 mmol), picolinic acid (0.103 g, 0.835 mmol), and potassium carbonate (0.886 g, 4.17 mmol) was vacuum and back-filled with nitrogen. 5-chloro-2',6'-diisopropyl-[1,1'-biphenyl]-3-ol (0.633 g, 2.191 mmol) and DMSO (15 ml) was added to the reaction mixture and heated at 140° C. for 16 hrs. The mixture was cooled down and added water (20 mL). The resulting solid was collected by filtration and washed with water and dissolved in DCM. The product was coated on celite and chromatographed on silica (DCM/Hep=3/1 to 5/1) (71% yield).

Synthesis of 2,6-diisopropyl-N-(2-nitrophenyl)aniline

A mixture of (allyl)PdCl-dimer (0.125 g, 0.342 mmol) and cBRIDP (0.482 g, 1.366 mmol) was vacuumed and back-filled with nitrogen. Toluene (10 ml) was added and refluxed for 3 minutes. The pre-formed catalyst was transferred to a mixture of 1-bromo-2-nitrobenzene (2.3 g, 11.39 mmol), 2,6-diisopropylaniline (2.58 ml, 13.66 mmol), and sodium 2-methylpropan-2-olate (2.74 g, 28.5 mmol) in Toluene (10 ml) and the reaction was refluxed for 2 hrs. The mixture was cooled down and coated on celite and chromatographed on silica (120 g×2, EA/Hep=1/9) (40% yield).

Synthesis of N1-(2,6-diisopropylphenyl)benzene-1,2-diamine 2,6-diisopropyl-N-(2-nitrophenyl)aniline (1.37 g, 4.59 mmol) was dissolved in ethanol (40 ml) and palladium or charcoal on dry basis (0.489 g, 0.459 mmol) was added. The reaction mixture was vacuumed and back-filled with a hydrogen balloon several times and stirred at R.T. for 16 hrs. Filtered through celite and washed with EA and concentrated to give product (93% yield).

Synthesis of N1-(2,6-diisopropylphenyl)-N2-(5-(3-(1-(2,6-diisopropylphenyl)-1H-imidazol-4-yl)phenoxy)-2',6'-diisopropyl-[1,1'-biphenyl]-3-yl)benzene-1,2-diamine A mixture of N1-(2,6-diisopropylphenyl)benzene-1,2-diamine (0.363 g, 1.353 mmol), 4-(3-((5-chloro-2',6'-diisopropyl-[1,1'-biphenyl]-3-yl)oxy)phenyl)-1-(2,6-diisopropylphenyl)-1H-imidazole (0.8 g, 1.353 mmol), (allyl)PdCl-dimer (0.015 g, 0.041 mmol), cBRIDP (0.057 g, 0.162 mmol), and sodium 2-methylpropan-2-olate (0.325 g, 3.38 mmol) was vacuumed and back-filled with nitrogen several times. Toluene (10 ml) was added to the reaction mixture and refluxed for 2 hrs. Coated on celite and chromatographed on silica (DCM/Hep=5/1) (69% yield).

Synthesis of 3-(2,6-diisopropylphenyl)-1-(5-(3-(1-(2,6-diisopropylphenyl)-1H-imidazol-4-yl)phenoxy)-2',6'-diisopropyl-[1,1'-biphenyl]-3-yl)-1H-benzo[d]imidazol-3-ium chloride N1-(2,6-diisopropylphenyl)-N2-(5-(3-(1-(2,6-diisopropylphenyl)-1H-imidazol-4-yl)phenoxy)-2',6'-diisopropyl-[1,1'-biphenyl]-3-yl)benzene-1,2-diamine (0.76 g, 0.923 mmol) was dissolved in triethoxymethane (7.68 ml, 46.2 mmol) and hydrogen chloride (0.091 ml, 1.108 mmol) was added. The reaction mixture was heated at 80° C. for 16 hrs. Triethyl orthoformate was removed by distillation under vacuum until solid appeared. The solid was washed with diethyl ether and filtered and dried in the vacuum oven (76% yield).

Synthesis of Compound 89355323

A mixture of 3-(2,6-diisopropylphenyl)-1-(5-(3-(1-(2,6-diisopropylphenyl)-1H-imidazol-4-yl)phenoxy)-2',6'-diisopropyl-[1,1'-biphenyl]-3-yl)-1H-benzo[d]imidazol-3-ium chloride (0.6 g, 0.690 mmol) and silver oxide (0.080 g, 0.345 mmol) was stirred in 1,2-dichloroethane (10 ml) at R.T. for 16 hrs. After removing 1,2-dichloroethane, $Pt(COD)Cl_2$ (0.258 g, 0.690 mmol) was added and the reaction mixture was vacuumed and back-filled with nitrogen. 1,2-dichlorobenzene (10 ml) was added and heated at 190° C. for 2 days. The solvent was removed and 1,3-diisopropylbenzene (5 mL) was added and refluxed in a sand bath for 7 days. The solvent was removed and coated on celite and chromatrographed on silica (DCM/Hep=1/1). The product was triturated in MeOH and dried in the vacuum oven (52% yield).

Synthesis of Compound 87893

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. overnight. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(5-((9-(4-(tert-butyl)pyridin-2-yl)-9H-carbazol-2-yl)oxy)-2',6'-diisopropyl-[1,1'-biphenyl]-3-yl)-N2-(2,6-diisopropylphenyl)benzene-1,2-diamine N1-(2,6-diisopropylphenyl)benzene-1,2-diamine (0.683 g, 2.54 mmol), 9-(4-(tert-butyl)pyridin-2-yl)-2-((5-chloro-2',6'-diisopropyl-[1,1'-biphenyl]-3-yl)oxy)-9H-carbazole (1.358 g, 2.313 mmol), Pd(allyl)Cl (0.025 g, 0.069 mmol), cBRIDP (0.098 g, 0.278 mmol), and sodium 2-methylpropan-2-olate (0.556 g, 5.78 mmol) were added to a 250 mL round-bottom flask with a stirbar. The reaction was cycled onto the line via three vacuum/$N_2$ refill cycles. Anhydrous toluene (15 mL) was added and the reaction was heated to reflux for two hours. Reaction was cooled to r.t. and solvent was removed in vacuo. Coated onto Celite and purified by column chromatography (5:1 DCM:Hep→8:1 DCM:Hep) to give a white solid (80% yield).

Synthesis of 3-(5-((9-(4-(tert-butyl)pyridin-2-yl)-9H-carbazol-2-yl)oxy)-2',6'-diisopropyl-[1,1'-biphenyl]-3-yl)-1-(2,6-diisopropylphenyl)-1H-benzo[d]imidazol-3-ium chloride N1-(5-((9-(4-(tert-butyl)pyridin-2-yl)-9H-carbazol-2-yl)oxy)-2',6'-diisopropyl-[1,1'-biphenyl]-3-yl)-N2-(2,6-diisopropylphenyl)benzene-1,2-diamine (1.3 g, 1.587 mmol) was dissolved in triethoxymethane (13.20 ml, 79 mmol) in a 100 mL round-bottom flask with a stirbar. Hydrogen chloride (0.156 ml, 1.904 mmol) was added to give a color change from dark red to black. The reaction was heated to 80° C. overnight. The reaction was cooled to r.t. and the solvent was removed in vacuo to give a sticky solid (99% yield).

Synthesis of Compound 87893

A mixture of 1-(5-((9-(4-(tert-butyl)pyridin-2-yl)-9H-carbazol-2-yl)oxy)-2',6'-diisopropyl-[1,1'-biphenyl]-3-yl)-3-(2,6-diisopropylphenyl)-1H-benzo[d]imidazol-3-ium chloride (1.37 g, 1.583 mmol) and silver oxide (0.183 g, 0.791 mmol) was stirred in 1,2-dichloroethane (10 mL) at r.t. overnight. Removed solvent and added $Pt(COD)Cl_2$ (0.592 g, 1.583 mmol). The reaction mixture was refluxed in 1,2-dichlorobenzene (10 ml) for three nights. Removed solvent and coated on celite. Chromatographed on silica (2:3 DCM:Hep) to give a yellow solid (55% yield).

Synthesis of Compound 87894

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. overnight. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(5-((9-(4-(tert-butyl)pyridin-2-yl)-9H-carbazol-2-yl)oxy)-2',6'-diisopropyl-[1,1'-biphenyl]-3-yl)-N2-(2,6-diisobutylphenyl)benzene-1,2-diamine 9-(4-(tert-butyl)pyridin-2-yl)-2-((5-chloro-2',6'-diisopropyl-[1,1'-biphenyl]-3-yl)oxy)-9H-carbazole (0.928 g, 1.580 mmol), N1-(2,6-diisobutylphenyl)benzene-1,2-diamine (0.515 g, 1.738 mmol), Pd(allyl)Cl (0.017 g, 0.047 mmol), cBRIDP (0.067 g, 0.190 mmol), and sodium 2-methylpropan-2-olate (0.380 g, 3.95 mmol) were added to a 250 mL round-bottom flask with a stirbar. The reaction was cycled onto the line via three vacuum/$N_2$ refill cycles. Anhydrous toluene (5 mL) was added and the reaction was heated to reflux. After 2 hr, the reaction was cooled to r.t. and the solvent was removed in vacuo. The reaction was coated onto Celite and purified by column chromatography (5:1 DCM:Hep→8:1 DCM:Hep). Pure fractions were pumped down to give a white foam (49% yield).

Synthesis of 3-(5-((9-(4-(tert-butyl)pyridin-2-yl)-9H-carbazol-2-yl)oxy)-2',6'-diisopropyl-[1,1'-biphenyl]-3-yl)-1-(2,6-diisobutylphenyl)-1H-benzo[d]imidazol-3-ium chloride N1-(5-((9-(4-(tert-butyl)pyridin-2-yl)-9H-carbazol-2-yl)oxy)-2',6'-diisopropyl-[1,1'-biphenyl]-3-yl)-N2-(2,6-diisobutylphenyl)benzene-1,2-diamine (651 mg, 0.768 mmol) was dissolved in triethoxymethane (6391 μl, 38.4 mmol) in a 100 mL rbf with a stirbar. hydrogen chloride (76 μl, 0.922 mmol) was added to give a color change from dark to lighter red. The reaction was heated to 80° C. overnight. The solvent was removed in vacuo to give a pink solid. Added $Et_2O$ and collected solid by filtration (78% yield).

Synthesis of Compound 87894

3-(5-((9-(4-(tert-butyl)pyridin-2-yl)-9H-carbazol-2-yl)oxy)-2',6'-diisopropyl-[1,1'-biphenyl]-3-yl)-1-(2,6-diisobutylphenyl)-1H-benzo[d]imidazol-3-ium chloride (534 mg, 0.598 mmol) and monosilver(I) monosilver(III) monoxide (69.2 mg, 0.299 mmol) were dissolved in 1,2-dichloroethane (10 ml) and stirred at r.t. overnight. The solvent was removed in vacuo and $Pt(COD)Cl_2$ (224 mg, 0.598 mmol) was added along with ortho-dichlorobenzene (10.00 ml). The reaction was heated to reflux. After several days the reaction was cooled to r.t. and the solvent was removed in vacuo. The material was coated onto Celite and purified by column chromatography (3:2 Hep:DCM) to give a yellow solid (45% yield).

Synthesis of Compound 1249492644

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. overnight. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(2,6-bis(propan-2-yl-d7)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine N1-(2,6-bis(propan-2-yl-d7)phenyl)benzene-1,2-diamine (0.550 g, 1.948 mmol), 9-(4-(tert-butyl)pyridin-2-yl)-2-((5-chloro-2',6'-diisopropyl-[1,1'-biphenyl]-3-yl)oxy)-9H-carbazole (1.04 g, 1.771 mmol), Pd(allyl)Cl (0.019 g, 0.053 mmol), di-tert-butyl(1-methyl-2,2-diphenylcyclopropyl)phosphane (0.075 g, 0.213 mmol), and sodium 2-methylpropan-2-olate (0.426 g, 4.43 mmol) were added to a 250 mL round-bottom flask with a stirbar. The reaction was cycled onto the line via three vacuum/$N_2$ refill cycles. Anhydrous toluene (15 mL) was added and the reaction was heated to reflux for two hours. Reaction was cooled to r.t. and solvent was removed in vacuo. Coated onto Celite and purified by column chromatography (5:1 DCM:Hep→8:1 DCM:Hep) to give a white solid (24% yield).

Synthesis of 1-(2,6-bis(propan-2-yl-d7)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride N1-(2,6-bis(propan-2-yl-d7)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine (0.346 g, 0.415 mmol) was dissolved in triethoxymethane (3.45 ml, 20.76 mmol) in a 100 mL round-bottom flask with a stirbar. Hydrogen chloride (0.041 ml, 0.498 mmol) was added to give a color change from dark red to black. The reaction was heated to 80° C. overnight. The reaction was cooled to r.t. and the solvent was removed in vacuo to give a sticky solid. $Et_2O$ was added and the solid was collected by filtration (71% yield).

Synthesis of Compound 1249492644

1-(2,6-bis(propan-2-yl-d7)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride (260 mg, 0.296 mmol) and monosilver(I) monosilver (III) monoxide (34.2 mg, 0.148 mmol) were added to a 50 mL round-bottom flask with a stirbar. 1,2-dichloroethane (3 ml) was added and the reaction was allowed to stir at r.t. overnight. The reaction solvent was removed in vacuo and $(COD)PtCl_2$ (111 mg, 0.296 mmol) was added along with ortho-dichlorobenzene (3.00 mL) and the reaction was heated to reflux for two nights. The reaction solvent was removed in vacuo and reaction was coated onto Celite and purified by column chromatography (1:1 DCM:Hep) to give a yellow solid (71% yield).

Synthesis of Compound 1249492638

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. overnight. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(5-((9-(4-(tert-butyl)pyridin-2-yl)-9H-carbazol-2-yl)oxy)-2',6'-diisopropyl-[1,1'-biphenyl]-3-yl)-N2-(2,6-dimethylphenyl)benzene-1,2-diamine N1-(2,6-dimethylphenyl)benzene-1,2-diamine (0.768 g, 3.62 mmol), 9-(4-(tert-butyl)pyridin-2-yl)-2-((5-chloro-2',6'-diisopropyl-[1,1'-biphenyl]-3-yl)oxy)-9H-carbazole (1.93 g, 3.29 mmol), Pd(allyl)Cl (0.036 g, 0.099 mmol), di-tert-butyl(1-methyl-2,2-diphenylcyclopropyl)phosphane (0.139 g, 0.394 mmol), and sodium 2-methylpropan-2-olate (0.790 g, 8.22 mmol) were added to a 500 mL round-bottom flask. Anhydrous toluene (30 ml) was added and the reaction was heated to reflux overnight. Solvent was removed in vacuo and the material was coated onto Celite and purified by column chromatography (4:1 DCM:Hep) to give an off-white foam (53% yield).

Synthesis of 1-(5-((9-(4-(tert-butyl)pyridin-2-yl)-9H-carbazol-2-yl)oxy)-2',6'-diisopropyl-[1,1'-biphenyl]-3-yl)-3-(2,6-dimethylphenyl)-1H-benzo[d]imidazol-3-ium chloride N1-(5-((9-(4-(tert-butyl)pyridin-2-yl)-9H-carbazol-2-yl)oxy)-2',6'-diisopropyl-[1,1'-biphenyl]-3-yl)-N2-(2,6-dimethylphenyl)benzene-1,2-diamine (1.3 g, 1.704 mmol) was added to a 100 mL round-bottom flask with a stirbar. Triethoxymethane (14.17 ml, 85 mmol) was added followed by hydrogen chloride (0.168 ml, 2.044 mmol). The reaction was heated at 80 deg C. overnight. The reaction was cooled to r.t. and heptanes and Et2O were added to give a white ppt, which was collected by filtration (88% yield).

Synthesis of Compound 1249492638

3-(5-((9-(4-(tert-butyl)pyridin-2-yl)-9H-carbazol-2-yl)oxy)-2',6'-diisopropyl-[1,1'-biphenyl]-3-yl)-1-(2,6-dimethylphenyl)-1H-benzo[d]imidazol-3-ium chloride (834 mg, 1.030 mmol) and monosilver(I) monosilver(III) monoxide (119 mg, 0.515 mmol) were added to a 100 mL round-bottom flask with a stirbar. 1,2-dichloroethane (3 ml) was added and the reaction was stirred at r.t. overnight. The reaction solvent was removed under vacuum and (COD)PtCl2 (385 mg, 1.030 mmol) was added along with ortho-dichlorobenzene (3.00 mL). The reaction was then placed to heat at reflux for four nights. The solvent was removed in vacuo and the reaction was coated onto Celite and purified by column chromatography (1:1 DCM:Hep) to give a yellow solid (69% yield).

Synthesis of Compound 87897

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. overnight. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-([1,1':3',1"-terphenyl]-2'-yl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine N1-([1,1':3',1"-terphenyl]-2'-yl)benzene-1,2-diamine hydrochloride (0.601 g, 1.611 mmol), 9-(4-(tert-butyl)pyridin-2-yl)-2-((5-chloro-2',6'-diisopropyl-[1,1'-biphenyl]-3-yl)oxy)-9H-carbazole (0.946 g, 1.611 mmol), Pd(allyl)Cl (0.018 g, 0.048 mmol), di-tert-butyl(1-methyl-2,2-diphenylcyclopropyl)phosphane (0.068 g, 0.193 mmol), and sodium 2-methylpropan-2-olate (0.542 g, 5.64 mmol) were added to a 500 mL round-bottom flask with a stirbar. The reagents were cycled onto the line via three vacuum/$N_2$ refill cycles. After three hours the reaction was pumped down to dryness and the material was coated onto Celite and purified by column chromatography (3:1 DCM:Hep). Pure fractions were combined and pumped down to give an off-white foam (39% yield).

Synthesis of 1-([1,1':3',1"-terphenyl]-2'-yl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride N1-([1,1':3',1"-terphenyl]-2'-yl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine (0.55 g, 0.620 mmol) was added to a 250 mL round-bottom flask with a stirbar. Triethoxymethane (5.16 ml, 31.0 mmol) was added followed by hydrogen chloride (0.061 ml, 0.744 mmol). The reaction was placed to heat at 80° C. overnight. The reaction was cooled to r.t. and heptanes was added giving a ppt. This was collected by filtration and dried in a vacuum oven (76% yield).

Synthesis of Compound 87897

1-([1,1':3',1"-terphenyl]-2'-yl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride (439 mg, 0.470 mmol) and monosilver(I) monosilver(III) monoxide (54.5 mg, 0.235 mmol) were added to a 100 mL round-bottom flask with a stirbar. 1,2-dichloroethane (3 ml) was added and the reaction was stirred at r.t. overnight. The solvent was removed in vacuo and (COD)PtCl2 (176 mg, 0.470 mmol) was added along with ortho-dichlorobenzene (3.00 mL). The reaction was heated to reflux for three nights. Cooled to r.t. and the solvent was removed using the Kugelrohr. The compound was coated onto Celite and purified by column chromatography (1:1 Hep:DCM) to give a yellow solid that was triturated with MeOH (52% yield).

Synthesis of Compound 1249492666

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. overnight. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(2-(tert-butyl)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine N1-(2-(tert-butyl)phenyl)benzene-1,2-diamine (0.336 g, 1.396 mmol), 9-(4-(tert-butyl)pyridin-2-yl)-2-((5-chloro-2',6'-diisopropyl-[1,1'-biphenyl]-3-yl)oxy)-9H-carbazole (0.82 g, 1.396 mmol), Pd(allyl)Cl (0.015 g, 0.042 mmol), di-tert-butyl(1-methyl-2,2-diphenylcyclopropyl)phosphane (0.059 g, 0.168 mmol), and sodium 2-methylpropan-2-olate (0.336 g, 3.49 mmol) were added to a 250 mL round-bottom flask with a stirbar. The reaction was cycled onto the line via three vacuum/$N_2$ refill cycles. Anhydrous toluene (15 ml) was added and the reaction was placed to heat at reflux overnight. The reaction was cooled to r.t. and the solvent was removed in vacuo. A FC was run (3:1 DCM:Hep). The pure fractions were combined and dried to give a white foam (63% yield).

Synthesis of 1-(2-(tert-butyl)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride N1-(2-(tert-butyl)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine (697 mg, 0.881 mmol) was added to a 100 mL round-bottom flask with a stirbar. Triethoxymethane (7327 μl, 44.1 mmol) was added along with hydrogen chloride (87 μl, 1.057 mmol). The solution was placed to heat at 80° C. overnight. The solvent was removed in vacuo to give a reddish-white solid (99% yield).

Synthesis of Compound 1249492666

1-(2-(tert-butyl)phenyl)-3-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride (950 mg, 1.134 mmol) and monosilver(I) monosilver(III) monoxide (131 mg, 0.567 mmol) were added to a 100 mL round-bottom flask with a stirbar. 1,2-dichloroethane (5 ml) was added and the reaction was stirred at r.t. overnight. The solvent was removed under vacuum and (COD)PtCl2 (424 mg, 1.134 mmol) was added along with ortho-dichlorobenzene (10 ml). The reaction was degassed and heated to reflux for four nights. The reaction was cooled to r.t. and the solvent was removed using the Kugelrohr. The compound was coated onto Celite and purified by column chromatography (1:1 Hep:DCM). The pure fractions were combined and pumped down. The material was dissolved in the minimum amount of DCM and then precipitated using MeOH. The yellow solid was collected on filter paper (62% yield).

Synthesis of Compound 95067

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-(3-chlorophenoxy)-9H-carbazole 2-bromo-9-(4-(tert-butyl)pyridin-2-yl)-9H-carbazole (5.96 g, 15.71 mmol), picolinic acid (0.774 g, 6.29 mmol), copper(I) iodide (0.599 g, 3.14 mmol), and potassium phosphate, tribasic (6.67 g, 31.4 mmol) were added to a 500 mL round-bottom flask with a stirbar. This was cycled onto the line via three vacuum/$N_2$ refill cycles. Anhydrous DMSO (79 ml) and 3-chlorophenol (1.704 ml, 16.50 mmol) were then added and the reaction was heated to 140° C. overnight. The reaction was cooled to r.t. and water was added to give a precipitate. The solid remaining after filtration was dissolved in DCM and washed with brine. The organic layer was dried over $MgSO_4$, filtered, and coated onto Celite. The product was isolated via column chromatography (4:1 DCM:Hep) to give a white foam (76% yield).

Synthesis of N1-([1,1':3',1"-terphenyl]-2'-yl)-N2-(3-((9-(4-(tert-butyl)pyridin-2-yl)-9H-carbazol-2-yl)oxy)phenyl)benzene-1,2-diamine N1-([1,1':3',1"-terphenyl]-2'-yl)benzene-1,2-diamine hydrochloride (0.891 g, 2.389 mmol), 9-(4-(tert-butyl)pyridin-2-yl)-2-(3-chlorophenoxy)-9H-carbazole (1.02 g, 2.389 mmol), Pd(allyl)Cl (0.026 g, 0.072 mmol), di-tert-butyl(1-methyl-2,2-diphenylcyclopropyl)phosphane (0.101 g, 0.287 mmol), and sodium 2-methylpropan-2-olate (0.804 g, 8.36 mmol) were added to a 250 mL round-bottom flask with a stirbar and cycled onto the line via three vacuum/$N_2$ refill cycles. Anhydrous toluene (15 mL) was added and the reaction was heated to reflux overnight. The solvent was removed in vacuo and the product was isolated via column chromatography (3:1 DCM:Hep) as a white foam (83% yield).

Synthesis of 1-([1,1':3',1"-terphenyl]-2'-yl)-3-(3-((9-(4-(tert-butyl)pyridin-2-yl)-9H-carbazol-2-yl)oxy)phenyl)-1H-benzo[d]imidazol-3-ium chloride N1-([1,1':3',1"-terphenyl]-2'-yl)-N2-(3-((9-(4-(tert-butyl)pyridin-2-yl)-9H-carbazol-2-yl)oxy)phenyl)benzene-1,2-diamine (1.44 g, 1.981 mmol) was added to a 100 mL round-bottom flask with a stirbar. Triethoxymethane (16.47 ml, 99 mmol) and hydrogen chloride (0.195 ml, 2.377 mmol) were added and the reaction was heated to 80° C. overnight. The reaction solvent was removed in vacuo and the compound was isolated as a red-white solid in quantitative yield.

Synthesis of Compound 95067

1-([1,1':3',1"-terphenyl]-2'-yl)-3-(3-((9-(4-(tert-butyl)pyridin-2-yl)-9H-carbazol-2-yl)oxy)phenyl)-1H-benzo[d]imidazol-3-ium chloride (1.532 g, 1.981 mmol) and monosilver(I) monosilver(III) monoxide (0.230 g, 0.990 mmol) were added to a 250 mL round-bottom flask with a stirbar. 1,2-dichloroethane (10 ml) was added and the reaction was stirred at r.t. overnight. The solvent was removed in vacuo and (COD)$PtCl_2$ (0.741 g, 1.981 mmol) and ortho-dichlorobenzene (10 ml) were added and the reaction was heated to reflux for five nights. The solvent was removed using a Kugelrohr apparatus and the compound was isolated via column chromatography (2:1 DCM:Hep) as a yellow solid. It was triturated in MeOH and dried in the vacuum oven (35% yield).

Synthesis of Compound 1249509396

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-(3-chlorophenoxy)-9H-carbazole 2-bromo-9-(4-(tert-butyl)pyridin-2-yl)-9H-carbazole (5.96 g, 15.71 mmol), picolinic acid (0.774 g, 6.29 mmol), copper(I) iodide (0.599 g, 3.14 mmol), and potassium phosphate, tribasic (6.67 g, 31.4 mmol) were added to a two-neck round-bottom flask with a stirbar. This was cycled onto the line via three vacuum/$N_2$ refill cycles. Anhydrous dimethyl sulfoxide (79 ml) and 3-chlorophenol (1.704 ml, 16.50 mmol) were then added and the reaction was heated to 140° C. overnight. The reaction was cooled to r.t. and water was added to give a precipitate. The solid was collected via filtration, dissolved in DCM, and washed with brine. The organic layer was dried over $MgSO_4$, filtered, and coated onto Celite. FC run (4:1 DCM:Hep). The pure fractions were collected and pumped down to give a sticky white foam (76% yield).

Synthesis of N1-(2-(tert-butyl)phenyl)-N2-(3-((9-(4-(tert-butyl)pyridin-2-yl)-9H-carbazol-2-yl)oxy)phenyl)benzene-1,2-diamine N1-(2-(tert-butyl)phenyl)benzene-1,2-diamine (0.576 g, 2.396 mmol), 9-(4-(tert-butyl)pyridin-2-yl)-2-(3-chlorophenoxy)-9H-carbazole (1.023 g, 2.396 mmol), Pd(allyl)Cl (0.026 g, 0.072 mmol), di-tert-butyl(1-methyl-2,2-diphenylcyclopropyl)phosphane (0.101 g, 0.288 mmol), and sodium 2-methylpropan-2-olate (0.576 g, 5.99 mmol) were added to a two-neck flask with a stirbar. The reagents were cycled onto the line via three vacuum/$N_2$ refill cycles. Anhydrous toluene (15 ml) was added and the reaction was heated to reflux. After 3 hrs, the solvent was removed in vacuo and a FC was run (3:1 DCM:Hep). The material was isolated as an off-white foam (69% yield).

Synthesis of 1-(2-(tert-butyl)phenyl)-3-(3-((9-(4-(tert-butyl)pyridin-2-yl)-9H-carbazol-2-yl)oxy)phenyl)-1H-benzo[d]imidazol-3-ium chloride N1-(2-(tert-butyl)phenyl)-N2-(3-((9-(4-(tert-butyl)pyridin-2-yl)-9H-carbazol-2-yl)oxy)phenyl)benzene-1,2-diamine (1.05 g, 1.664 mmol) was added to a 100 mL round-bottom flask with a stirbar. Triethoxymethane (13.84 ml, 83 mmol) was added to give a clear green solution. Addition of conc. hydrogen chloride (0.164 ml, 1.997 mmol) resulted in an immediate color change to orange. The solution was placed to heat at 80° C. overnight. The solvent was removed in vacuo to give a red-white solid (99% yield).

Synthesis of Compound 1249509396

1-(2-(tert-butyl)phenyl)-3-(3-((9-(4-(tert-butyl)pyridin-2-yl)-9H-carbazol-2-yl)oxy)phenyl)-1H-benzo[d]imidazol-3-ium chloride (1.12 g, 1.654 mmol) and monosilver(I) monosilver(III) monoxide (0.192 g, 0.827 mmol) were added to a 100 mL round-bottom flask with a stirbar. 1,2-dichloroethane (5 ml) was added and the reaction was stirred at r.t. overnight. The solvent was removed in vacuo. (COD)$PtCl_2$ (0.619 g, 1.654 mmol) was added along with ortho-dichlorobenzene (10 ml). The reaction was placed to heat at reflux. After heating for five nights, the reaction was cooled to r.t. and the solvent was removed on the Kugelrohr. Coated onto Celite and FC run (2:1 DCM:Hep). Isolated a yellow solid (59% yield).

Synthesis of Compound 1249492640

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-((5-chloro-2',6'-diisopropyl-[1,1'-biphenyl]-3-yl)oxy)-9H-carbazole 5-chloro-2',6'-diisopropyl-[1,1'-biphenyl]-3-ol (1.135 g, 3.93 mmol), 2-bromo-9-(4-(tert-butyl)pyridin-2-yl)-9H-carbazole (1.42 g, 3.74 mmol), copper(I) iodide (0.143 g, 0.749 mmol), picolinic acid (0.184 g, 1.497 mmol), and potassium phosphate, tribasic (1.589 g, 7.49 mmol) were added to a 250 mL round-bottom flask with a stirbar. The flask was cycled onto the line via three vacuum/$N_2$ refill cycles. Dimethyl sulfoxide (25 ml) was added and the reaction was heated to 140° C. overnight. The reaction was cooled to r.t. and water was added to give a white ppt. The solid was then dissolved in DCM and dried with $MgSO_4$, filtered, and coated onto Celite. FC run (4:1 DCM:Hep). Collected pure fractions and pumped down to give a white solid (63% yield).

Synthesis of N1-(2,6-bis(methyl-d3)phenyl)-N2-(5-((9-(4-(tert-butyl)pyridin-2-yl)-9H-carbazol-2-yl)oxy)-2',6'-diisopropyl-[1,1'-biphenyl]-3-yl)benzene-1,2-diamine N-(2-(chloro-15-azaneyl)phenyl)-2,6-bis(methyl-d3)aniline (0.807 g, 3.17 mmol), 9-(4-(tert-butyl)pyridin-2-yl)-2-((5-chloro-2',6'-diisopropyl-[1,1'-biphenyl]-3-yl)oxy)-9H-carbazole (1.69 g, 2.88 mmol), Pd(allyl)Cl (0.032 g, 0.086 mmol), di-tert-butyl(1-methyl-2,2-diphenylcyclopropyl)phosphane (0.122 g, 0.345 mmol), and sodium 2-methylpropan-2-olate (0.968 g, 10.07 mmol) were added to a 250 mL round-bottom flask with a stirbar. Anhydrous toluene (30 ml) was added and the reaction was heated to reflux. After 2 hr, the solvent was removed in vacuo and the compound was isolated via column chromatography (4:1 DCM:Hep) as a white solid (23% yield).

Synthesis of 3-(2,6-bis(methyl-d3)phenyl)-1-(5-((9-(4-(tert-butyl)pyridin-2-yl)-9H-carbazol-2-yl)oxy)-2',6'-diisopropyl-[1,1'-biphenyl]-3-yl)-1H-benzo[d]imidazol-3-ium chloride N1-(2,6-bis(methyl-d3)phenyl)-N2-(5-((9-(4-(tert-butyl)pyridin-2-yl)-9H-carbazol-2-yl)oxy)-2',6'-diisopropyl-[1,1'- biphenyl]-3-yl)benzene-1,2-diamine (0.51 g, 0.663 mmol) was added to a 250 mL round-bottom flask with a stirbar. Triethoxymethane (5.52 ml, 33.2 mmol) was then added followed by hydrogen chloride (0.065 ml, 0.796 mmol) and the reaction was heated at 80° C. overnight. The reaction was pumped down to dryness to give a reddish white solid in quantitative yield.

Synthesis of Compound 1249492640

1-(2,6-bis(methyl-d3)phenyl)-3-(5-((9-(4-(tert-butyl) pyridin-2-yl)-9H-carbazol-2-yl)oxy)-2',6'-diisopropyl-[1,1'-biphenyl]-3-yl)-1H-benzo[d]imidazol-3-ium chloride (580 mg, 0.711 mmol) and monosilver(I) monosilver(III) monoxide (82 mg, 0.356 mmol) were added to a 250 mL round-bottom flask with a stirbar. 1,2-dichloroethane (10 ml) was added and the reaction was stirred at r.t. overnight. The solvent was removed in vacuo and (COD)$PtCl_2$ (266 mg, 0.711 mmol) and ortho-dichlorobenzene (10.00 ml) were added and the reaction was heated at reflux for five nights. The solvent was then removed in vacuo and the compound was isolated via column chromatography (1:1 Hep:DCM) to give a yellow solid. The solid was triturated with MeOH to give the final complex (43% yield).

Synthesis of Compound 1249493436

Synthesis of 2-(3-bromo-5-(tert-butyl)phenoxy)-9-(4-(tert-butyl)pyridin-2-yl)-9H-carbazole A mixture of 1,3-dibromo-5-(tert-butyl)benzene (5.45 g, 18.65 mmol), 9-(4-(tert-butyl)pyridin-2-yl)-9H-carbazol-2-ol (2.95 g, 9.32 mmol), copper(I) iodide (0.355 g, 1.865 mmol), picolinic acid (0.459 g, 3.73 mmol), and potassium phosphate (3.96 g, 18.65 mmol) was vacuumed and back-filled with nitrogen several times. DMSO (20 ml) was added to the reaction mixture and heated at 120° C. overnight. Cooled down and added water. The resulting brown solid was collected by filtration and dissolved in DCM, washed with brine, dried over $MgSO_4$, and isolated by column chromatography (2:1 DCM:Hep) to give the final compound (59% yield).

Synthesis of N1-(3-(tert-butyl)-5-((9-(4-(tert-butyl) pyridin-2-yl)-9H-carbazol-2-yl)oxy)phenyl)-N2-(2-(tert-butyl)phenyl)benzene-1,2-diamine N1-(2-(tert-butyl)phenyl)benzene-1,2-diamine (0.506 g, 2.106 mmol), 2-(3-bromo-5-(tert-butyl)phenoxy)-9-(4-(tert-butyl)pyridin-2-yl)-9H-carbazole (1.01 g, 1.915 mmol), Pd(allyl)Cl dimer (0.021 g, 0.057 mmol), di-tert-butyl(1-methyl-2,2-diphenylcyclopropyl)phosphane (0.081 g, 0.230 mmol), and sodium 2-methylpropan-2-olate (0.460 g, 4.79 mmol) were added to a 250 mL round-bottom flask with a stirbar. The reaction was cycled onto the line via three vacuum/N2 refill cycles. Anhydrous toluene (20 ml) was added and the reaction was heated to reflux overnight. The solvent was removed in vacuo and the compound was isolated via column chromatography (4:1 DCM:Hep) to give an off-white foam (82% yield).

Synthesis of 3-(3-(tert-butyl)-5-((9-(4-(tert-butyl) pyridin-2-yl)-9H-carbazol-2-yl)oxy)phenyl)-1-(2-(tert-butyl)phenyl)-1H-benzo[d]imidazol-3-ium chloride N1-(3-(tert-butyl)-5-((9-(4-(tert-butyl)pyridin-2-yl)-9H-carbazol-2-yl)oxy)phenyl)-N2-(2-(tert-butyl)phenyl)benzene-1,2-diamine (1.08 g, 1.572 mmol) was added to a 100 mL round-bottom flask with a stirbar. Triethoxymethane (13.08 ml, 79 mmol) was added followed by the addition of hydrogen chloride (0.155 ml, 1.887 mmol). The solution was placed to heat at 80° C. overnight. The reaction solvent was removed in vacuo to give the target compound as a reddish-white solid in quantitative yield.

Synthesis of Compound 1249493436

3-(3-(tert-butyl)-5-((9-(4-(tert-butyl)pyridin-2-yl)-9H-carbazol-2-yl)oxy)phenyl)-1-(2-(tert-butyl)phenyl)-1H-benzo[d]imidazol-3-ium chloride (1.1 g, 1.500 mmol) and monosilver(I) monosilver(III) monoxide (0.174 g, 0.750 mmol) were added to a 100 mL round-bottom flask with a stirbar. 1,2-dichloroethane (10 ml) was added and the reaction was stirred at r.t. overnight. The reaction solvent was removed in vacuo. Ortho-dichlorobenzene (10.00 ml) and (COD)$PtCl_2$ (0.561 g, 1.500 mmol) were added and the reaction cycled onto the line via three vacuum/$N_2$ refill cycles. It was placed to heat at reflux for eight days. The reaction was cooled to r.t. and the solvent was removed on the Kugelrohr. The target compound was isolated via column chromatography (1:1 Hep:DCM) as a yellow solid. The yellow solid was triturated in MeOH and dried in the vacuum oven (50% yield).

Synthesis of Compound 88227

Synthesis of 2-(3-bromo-5-(tert-butyl)phenoxy)-9-(4-(tert-butyl)pyridin-2-yl)-9H-carbazole A mixture of 1,3-dibromo-5-(tert-butyl)benzene (5.45 g, 18.65 mmol), 9-(4-(tert-butyl)pyridin-2-yl)-9H-carbazol-2-ol (2.95 g, 9.32 mmol), copper(I) iodide (0.355 g, 1.865 mmol), picolinic acid (0.459 g, 3.73 mmol), and potassium phosphate (3.96 g, 18.65 mmol) was vacuumed and back-filled with nitrogen several times. DMSO (20 ml) was added to the reaction mixture and heated at 120° C. overnight. Cooled down and added water. The resulting brown solid was collected by filtration and dissolved in DCM, washed with brine, dried over $MgSO_4$, and isolated by column chromatography (2:1 DCM:Hep) to give the final compound (59% yield).

Synthesis of N1-([1,1':3',1"-terphenyl]-2'-yl)-N2-(3-(tert-butyl)-5-((9-(4-(tert-butyl)pyridin-2-yl)-9H-carbazol-2-yl)oxy)phenyl)benzene-1,2-diamine N-(2-(chloro-15-azaneyl)phenyl)-[1,1':3',1"-terphenyl]-2'-amine (0.762 g, 2.044 mmol), 2-(3-bromo-5-(tert-butyl) phenoxy)-9-(4-(tert-butyl)pyridin-2-yl)-9H-carbazole (0.98 g, 1.858 mmol), Pd(allyl)Cl dimer (0.020 g, 0.056 mmol), di-tert-butyl(1-methyl-2,2-diphenylcyclopropyl)phosphane (0.079 g, 0.223 mmol), and sodium 2-methylpropan-2-olate (0.625 g, 6.50 mmol) were added to a 250 mL round-bottom flask with a stirbar and cycled onto the line via three vacuum/$N_2$ refill cycles. Anhydrous toluene (20 ml) was added and the reaction was heated to reflux overnight. The solvent was then removed in vacuo and the target compound was isolated via column chromatography (4:1 DCM:Hep) as a white foam (82% yield).

Synthesis of 1-([1,1':3',1"-terphenyl]-2'-yl)-3-(3-(tert-butyl)-5-((9-(4-(tert-butyl)pyridin-2-yl)-9H-carbazol-2-yl)oxy)phenyl)-1H-benzo[d]imidazol-3-ium chloride N1-([1,1':3',1"-terphenyl]-2'-yl)-N2-(3-(tert-butyl)-5-((9-(4-(tert-butyl)pyridin-2-yl)-9H-carbazol-2-yl)oxy)phenyl)

benzene-1,2-diamine (1.2 g, 1.533 mmol) was added to a 100 mL round-bottom flask with a stirbar. Triethoxymethane (12.75 ml, 77 mmol) was added followed by hydrogen chloride (0.151 ml, 1.839 mmol) and the reaction was placed to heat at 80° C. overnight. The reaction was cooled to r.t. and heptanes was added to give a sticky solid. The solvent was removed via filtration and the sticky solid was dissolved in DCM and pumped down. Heptanes was added and the material was scraped to give a white powder in (82% yield).

Synthesis of Compound 88227

1-([1,1':3',1"-terphenyl]-2'-yl)-3-(3-(tert-butyl)-5-((9-(4-(tert-butyl)pyridin-2-yl)-9H-carbazol-2-yl)oxy)phenyl)-1H-benzo[d]imidazol-3-ium chloride (1.04 g, 1.254 mmol) and monosilver(I) monosilver(III) monoxide (0.145 g, 0.627 mmol) were added to a 250 mL round-bottom flask with a stirbar. 1,2-dichloroethane (10 ml) was added and the reaction was stirred at r.t. After 4 hrs the reaction was pumped down on the rotovap. (COD)$PtCl_2$ (0.469 g, 1.254 mmol) and ortho-dichlorobenzene (10.00 ml) were added and the reaction was cycled onto the line via three vacuum/$N_2$ refill cycles. The reaction was heated to reflux for seven days. The solvent was removed on the Kugelrohr and the compound was isolated via column chromatography (1:1 Hep:DCM) as a yellow solid that was then triturated in MeOH and dried in the vacuum oven (29% yield).

Synthesis of Compound 1249509397

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-(3-chlorophenoxy)-9H-carbazole 2-bromo-9-(4-(tert-butyl)pyridin-2-yl)-9H-carbazole (5.96 g, 15.71 mmol), picolinic acid (0.774 g, 6.29 mmol), copper(I) iodide (0.599 g, 3.14 mmol), and potassium phosphate, tribasic (6.67 g, 31.4 mmol) were added to a 500 mL round-bottom flask with a stirbar. This was cycled onto the line via three vacuum/$N_2$ refill cycles. Anhydrous DMSO (79 ml) and 3-chlorophenol (1.704 ml, 16.50 mmol) were then added and the reaction was heated to 140° C. overnight. The reaction was cooled to r.t. and water was added to give a precipitate. The solid remaining after filtration was dissolved in DCM and washed with brine. The organic layer was dried over $MgSO_4$, filtered, and coated onto Celite. The product was isolated via column chromatography (4:1 DCM:Hep) to give a white foam (76% yield).

Synthesis of N1-(3-((9-(4-(tert-butyl)pyridin-2-yl)-9H-carbazol-2-yl)oxy)phenyl)-N2-(3,5-di-tert-butylphenyl)benzene-1,2-diamine 3,5-di-tert-butyl-N-(2-(chloro-15-azaneyl)phenyl)aniline (0.873 g, 2.62 mmol), 9-(4-(tert-butyl)pyridin-2-yl)-2-(3-chlorophenoxy)-9H-carbazole (1.018 g, 2.384 mmol), Pd(allyl)Cl (0.026 g, 0.072 mmol), di-tert-butyl(1-methyl-2,2-diphenylcyclopropyl)phosphane (0.101 g, 0.286 mmol), and sodium 2-methylpropan-2-olate (0.802 g, 8.35 mmol) were added to a 500 mL round-bottom flask with a stirbar. Anhydrous toluene (23.84 ml) was added and the reaction was heated to reflux overnight. The reaction was cooled to r.t. and the solvent was removed in vacuo. The target compound was isolated via column chromatography (4:1 DCM:Hep) as a white foam (67% yield).

Synthesis of 3-(3-((9-(4-(tert-butyl)pyridin-2-yl)-9H-carbazol-2-yl)oxy)phenyl)-1-(3,5-di-tert-butylphenyl)-1H-benzo[d]imidazol-3-ium chloride N1-(3-((9-(4-(tert-butyl)pyridin-2-yl)-9H-carbazol-2-yl)oxy)phenyl)-N2-(3,5-di-tert-butylphenyl)benzene-1,2-diamine (1.1 g, 1.601 mmol) was added to a 100 mL round-bottom flask with a stirbar. Triethoxymethane (13.32 ml, 80 mmol) and hydrogen chloride (0.158 ml, 1.922 mmol) were added and the reaction was heated to 80° C. overnight. The reaction was cooled to r.t and the solvent was removed on the Kugelrohr to give an off-white solid (84% yield).

Synthesis of Compound 1249509397

3-(3-((9-(4-(tert-butyl)pyridin-2-yl)-9H-carbazol-2-yl)oxy)phenyl)-1-(3,5-di-tert-butylphenyl)-1H-benzo[d]imidazol-3-ium chloride (0.99 g, 1.350 mmol) and monosilver(I) monosilver(III) monoxide (0.156 g, 0.675 mmol) were added to a 250 mL round-bottom flask with a stirbar. 1,2-dichloroethane (10 ml) was added and the reaction was stirred at r.t. overnight. The solvent was removed in vacuo and (COD)$PtCl_2$ (0.505 g, 1.350 mmol) and ortho-dichlorobenzene (10.00 ml) were added. The reaction was cycled onto the line via three vacuum/$N_2$ refill cycles. The reaction was heated to reflux for three nights. The reaction was cooled to r.t. and the solvent was removed on the Kugelrohr. The compound was isolated via column chromatography (1:1 DCM:Hep) to give a yellow solid that was triturated in MeOH and dried in the vacuum oven (64% yield).

Synthesis of Compound 1249509383

Synthesis of 2-bromo-9-(4-(tert-butyl)pyridin-2-yl)-9H-carbazole 2-bromo-4-(tert-butyl)pyridine (5.75 g, 26.8 mmol), 2-bromo-9H-carbazole (5.08 g, 20.64 mmol), copper(I) iodide (1.572 g, 8.26 mmol), 1-methyl-1H-imidazole (1.637 ml, 20.64 mmol), and lithium 2-methylpropan-2-olate (3.30 g, 41.3 mmol) were added to a two-neck round-bottom flask with a stirbar. The reaction was cycled onto the line via three vacuum/$N_2$ refill cycles. Anhydrous toluene (50 ml) was added and the reaction was heated to reflux overnight. The reaction was cooled down and partitioned between EA and water with ~30 mL 30% $NH_4OH$(aq). The organic layer was separated, and the aqueous layer was extracted with DCM. Chromatographed on silica (DCM). Pure fractions were combined and pumped down to give a tan solid (73% yield).

Synthesis of 9-(4-(tert-butyl)pyridin-2-yl)-2-(3-chlorophenoxy)-9H-carbazole 2-bromo-9-(4-(tert-butyl)pyridin-2-yl)-9H-carbazole (5.96 g, 15.71 mmol), picolinic acid (0.774 g, 6.29 mmol), copper(I) iodide (0.599 g, 3.14 mmol), and potassium phosphate, tribasic (6.67 g, 31.4 mmol) were added to a 500 mL round-bottom flask with a stirbar. This was cycled onto the line via three vacuum/$N_2$ refill cycles. Anhydrous DMSO (79 ml) and 3-chlorophenol (1.704 ml, 16.50 mmol) were then added and the reaction was heated to 140° C. overnight. The reaction was cooled to r.t. and water was added to give a precipitate. The solid remaining after filtration was dissolved in DCM and washed with brine. The organic layer was dried over $MgSO_4$, filtered, and coated onto Celite. The product was isolated via column chromatography (4:1 DCM:Hep) to give a white foam (76% yield).

Synthesis of N1-([1,1':3',1"-terphenyl]-2'-yl-2,2",3,3",4,4",5,5",6,6"-d10)-N2-(3-((9-(4-(tert-butyl)pyridin-2-yl)-9H-carbazol-2-yl)oxy)phenyl)benzene-1,2-diamine N-(2-(chloro-15-azaneyl)phenyl)-[1,1': 3',1"-terphenyl]-2,2",3,3",4,4",5,5",6,6"-d10-2'-amine (1.717 g, 4.48 mmol), 9-(4-(tert-butyl)pyridin-2-yl)-2-(3-chlorophenoxy)-9H-carbazole (1.74 g, 4.08 mmol), Pd(allyl)Cl (0.045 g, 0.122 mmol), di-tert-butyl(1-methyl-2,2-diphenylcyclopropyl) phosphane (0.172 g, 0.489 mmol), and sodium 2-methylpropan-2-olate (1.371 g, 14.26 mmol) were added to a 500 mL round-bottom flask with a stirbar. Anhydrous toluene (30 ml) was added and the reaction was heated to reflux overnight. The reaction was cooled to r.t. and the solvent was removed in vacuo. The target compound was isolated via column chromatography (4:1 DCM:Hep) as a white solid (83% yield).

Synthesis of 1-([1,1':3',1"-terphenyl]-2'-yl-2,2",3,3",4,4",5,5",6,6"-d10)-3-(3-((9-(4-(tert-butyl)pyridin-2-yl)-9H-carbazol-2-yl)oxy)phenyl)-1H-benzo[d]imidazol-3-ium chloride N1-([1,1':3',1"-terphenyl]-2'-yl-2,2",3,3",4,4",5,5",6,6"-d10)-N2-(3-((9-(4-(tert-butyl)pyridin-2-yl)-9H-carbazol-2-yl)oxy)phenyl)benzene-1,2-diamine (2.5 g, 3.39 mmol) was added to a 100 mL round-bottom flask with a stirbar. Triethoxymethane (28.2 ml, 170 mmol) and hydrogen chloride (0.334 ml, 4.07 mmol) were added and the solution was heated to 80° C. overnight. The solvent was removed in vacuo and then heptanes was added. The solution was sonicated in heptanes and the white solid was collected via filtration and dried in the vacuum oven (86% yield).

Synthesis of Compound 1249509383

1-([1,1':3',1"-terphenyl]-2'-yl-2,2,3,3",4,4",5,5",6,6"-d10)-3-(3-((9-(4-(tert-butyl)pyridin-2-yl)-9H-carbazol-2-yl)oxy)phenyl)-1H-benzo[d]imidazol-3-ium chloride (0.98 g, 1.251 mmol) and monosilver(I) monosilver(III) monoxide (0.145 g, 0.625 mmol) were added to a 250 mL round-bottom flask with a stirbar. 1,2-dichloroethane (10 ml) was added and the reaction was stirred at r.t. The solvent was removed in vacuo and (COD)$PtCl_2$ (0.468 g, 1.251 mmol) and ortho-dichlorobenzene (10.00 ml) were added. The reaction was degassed via three vacuum/$N_2$ refill cycles and heated to reflux for three nights. The reaction was cooled to r.t. and the solvent was removed using the Kugelrohr. The target compound was isolated via column chromatography (1:1 DCM:Hep→2:1 DCM:Hep) as a yellow solid. The compound was triturated in MeOH, collected via filtration, and dried in the vacuum oven overnight (33% yield).

Synthesis of Compound 82166980

Synthesis of 1-(3-(3-(1H-imidazol-1-yl)phenoxy)phenyl)-4-(2,6-diisopropylphenyl)-1H-pyrazole 3-(1H-imidazol-1-yl)phenol (0.795 g, 4.96 mmol), 1-(3-bromophenyl)-4-(2,6-diisopropylphenyl)-1H-pyrazole (1.73 g, 4.51 mmol), picolinic acid (0.222 g, 1.805 mmol), copper (I) iodide (0.172 g, 0.903 mmol), and potassium phosphate, tribasic (1.916 g, 9.03 mmol) were added to a 100 mL Schlenk tube with a stirbar. The flask was cycled onto the line via three vacuum/N2 refill cycles. Anhydrous DMSO (45.1 ml) was added and the reaction was heated to 140° C. overnight. The reaction was cooled to r.t. and water was added giving a beige precipitate. The solid was collected via filtration and then dissolved in DCM and partitioned with water. The aq layer was extracted with DCM several times. The organic layers were combined and washed with brine. The organic fraction was then dried with $MgSO_4$, filtered, and coated onto Celite. The compound was isolated via column chromatography (2:1 DCM:Hep) to give a white solid (1.39 g, 67%).

Synthesis of 1-(3-(3-(4-(2,6-diisopropylphenyl)-1H-pyrazol-1-yl)phenoxy)phenyl)-3-(methyl-d3)-1H-imidazol-3-ium iodide 1-(3-(3-(1H-imidazol-1-yl)phenoxy)phenyl)-4-(2,6-diisopropylphenyl)-1H-pyrazole (1.39 g, 3.00 mmol) was dissolved in ethyl acetate (10 mL) in a 100 mL Schlenk tube under N2. iodomethane-$d_3$ (0.935 mL, 15.02 mmol) was added via syringe and the reaction was heated to 60° C. overnight. A white precipitate formed in the reaction. The reaction was cooled to r.t. and heptanes was added. The solid was collected via filtration and dried in the vacuum oven to give an off-white solid (1.63 g, 89%).

Synthesis of Compound 82166980

1-(3-(3-(4-(2,6-diisopropylphenyl)-1H-pyrazol-1-yl)phenoxy)phenyl)-3-(methyl-d3)-1H-imidazol-3-ium iodide (0.623 g, 1.025 mmol) and monosilver(I) monosilver(III) monoxide (0.119 g, 0.513 mmol) were added to a 250 mL round-bottom flask with a stirbar. 1,2-dichloroethane (10 ml) was added and the reaction was stirred at r.t. overnight. The colorless solution was pumped down to dryness. The compound was dissolved in ortho-dichlorobenzene (10.00 ml) and added to a 100 mL Schlenk tube with a stirbar. (COD)$PtCl_2$ (0.384 g, 1.03 mmol) was added to the reaction and the reaction was cycled onto the line via ten vacuum/N2 refill cycles. The reaction was placed to heat at reflux for several days. The reaction was cooled to r.t. and the solvent was removed in vacuo. The reaction was coated onto Celite and isolated by column chromatography (2:1 DCM:Hep) to give a yellow solid (0.53 g, 76%).

Synthesis of Compound 82606180

Synthesis of 8-(3-(1H-imidazol-1-yl)phenoxy)-4,4,5,5-tetramethyl-3-phenyl-4,5-dihydropyrazolo[1,5-a]quinoline 3-(1H-imidazol-1-yl)phenol (0.481 g, 3.00 mmol), 8-bromo-4,4,5,5-tetramethyl-3-phenyl-4,5-dihydropyrazolo

[1,5-a]quinoline (1.04 g, 2.73 mmol), picolinic acid (0.134 g, 1.091 mmol), copper(I) iodide (0.104 g, 0.545 mmol), and potassium phosphate, tribasic (1.158 g, 5.45 mmol) were added to a 100 mL Schlenk tube with a stirbar. The flask was cycled onto the line via three vacuum/N2 refill cycles. Anhydrous DMSO (27.3 ml) was added and the reaction was heated to 140° C. overnight. The reaction was cooled to r.t. and water was added to give a beige precipitate. The precipitate was collected via filtration and dissolved in DCM and partitioned between DCM/water. The aq layer was extracted several times with DCM. The organic layers were combined and washed with brine. The organic fraction was dried with $MgSO_4$, filtered, and coated onto Celite. The product was isolated via column chromatography (1:1 DCM:Hep→1:1 DCM:EtOAc) to give a white solid (0.81 g, 65%).

Synthesis of 3-(methyl-d3)-1-(3-((4,4,5,5-tetramethyl-3-phenyl-4,5-dihydropyrazolo[1,5-a]quinolin-8-yl)oxy)phenyl)-1H-imidazol-3-ium iodide 8-(3-(1H-imidazol-1-yl)phenoxy)-4,4,5,5-tetramethyl-3-phenyl-4,5-dihydropyrazolo[1,5-a]quinoline (0.81 g, 1.759 mmol) was added to a 100 mL Schlenk tube with a stirbar. Ethyl acetate (11.72 ml) was added followed by iodomethane-$d_3$ (0.547 ml, 8.79 mmol). The reaction was placed to heat at 60° C. overnight. A white precipitate formed in the reaction. The reaction was cooled to r.t. and heptanes was added. The solid was collected via filtration and dried in the vacuum oven to give an off-white solid (0.89 g, 83%).

Synthesis of Compound 82606180

3-(methyl-d3)-1-(3-((4,4,5,5-tetramethyl-3-phenyl-4,5-dihydropyrazolo[1,5-a]quinolin-8-yl)oxy)phenyl)-1H-imidazol-3-ium iodide (0.491 g, 0.811 mmol) and monosilver(I) monosilver(III) monoxide (0.094 g, 0.405 mmol) were added to a 250 mL round-bottom flask with a stirbar. ClCH2CH2Cl (10 ml) was added and the reaction was stirred at r.t. overnight. The colorless solution was pumped down to dryness. The compound was dissolved in ortho-dichlorobenzene (10.00 ml) and added to a 100 mL Schlenk tube with a stirbar. (COD)PtCl2 (0.303 g, 0.811 mmol) was added to the reaction and the reaction was cycled onto the line via ten vacuum/N2 refill cycles. The reaction was placed to heat at reflux for several days. The reaction was cooled to r.t. and the solvent was removed in vacuo. The reaction was coated onto Celite and isolated by column chromatography (2:1 Hep:DCM) to give a yellow solid (0.38 g, 70%).

TABLE 1

| | Structure | λmax in PMMA (nm) | PLQY in PMMA (%) | Excited state lifetime at 77K (μs) |
|---|---|---|---|---|
| Compound 20 ($L_{A20}$, $L_{B1}$) | 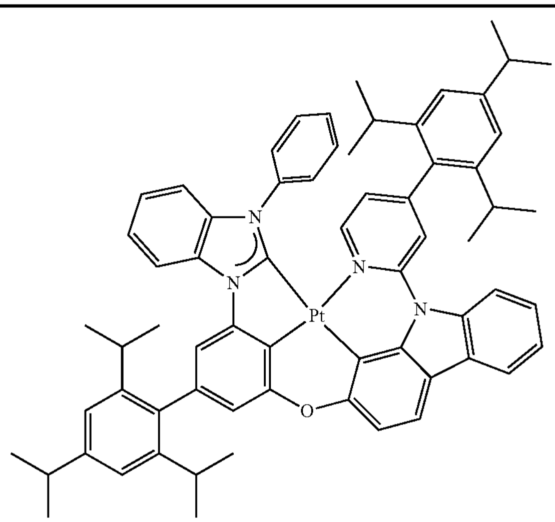 | 458 | 77 | 2.6 |
| Compound 7300 ($L_{A7300}$, $L_{B1}$) | 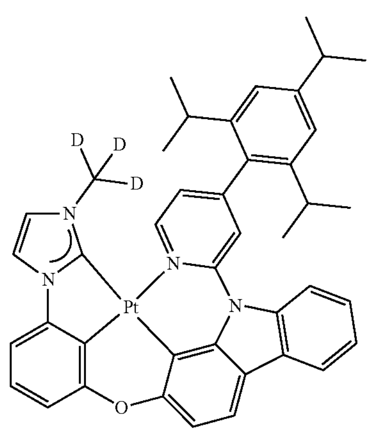 | 453 | 95 | 5.2 |

TABLE 1-continued
| | Structure | λmax in PMMA (nm) | PLQY in PMMA (%) | Excited state lifetime at 77K (μs) |
|---|---|---|---|---|
| Compound 87920 ($L_{A80}$, $L_{B13}$) | 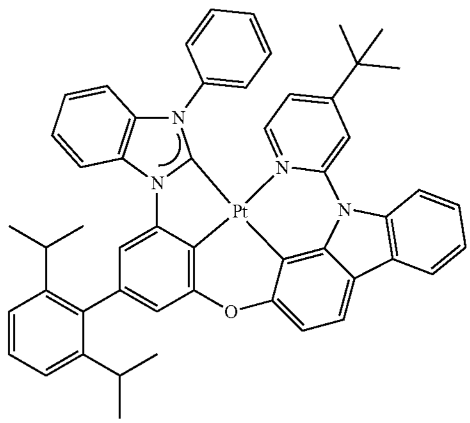 | 455 | 84 | 2.8 |
| Compound 95050 ($L_{A7210}$, $L_{B13}$) | 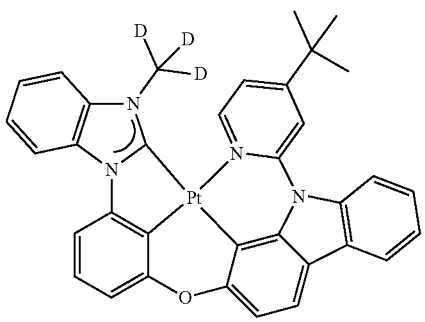 | 449 | 81 | 5.8 |
| Compound 226820 ($L_{A7220}$, $L_{B31}$) | 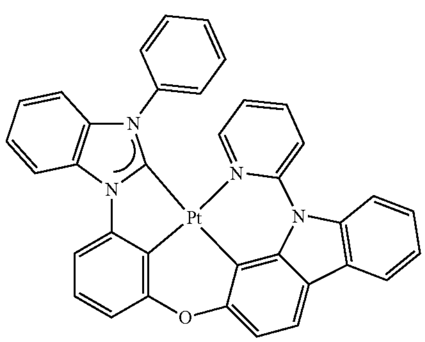 | 455 | 48 | 3.4 |
| Compound 82166890 ($L_{A7210}$, $L_{B11225}$) | 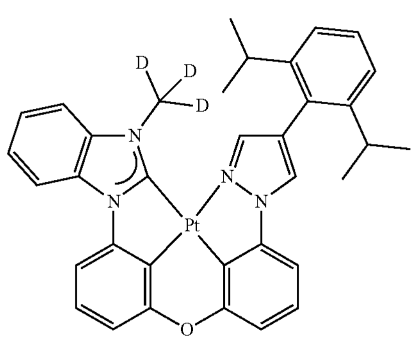 | 459 | 98 | 2.8 |

TABLE 1-continued
| | Structure | λmax in PMMA (nm) | PLQY in PMMA (%) | Excited state lifetime at 77K (μs) |
|---|---|---|---|---|
| Compound 89355323 ($L_{A83}$, $L_{B12208}$) | 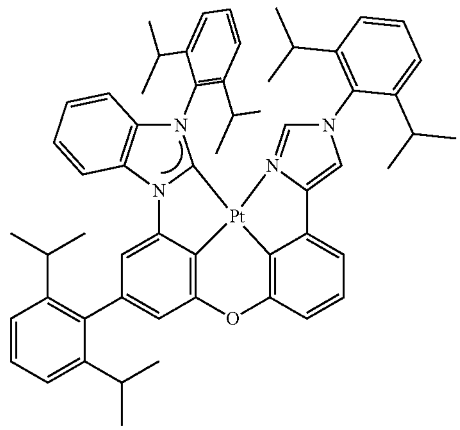 | 470 | 100 | 3.3 |
| Compound 87893 ($L_{A53}$, $L_{B13}$) | 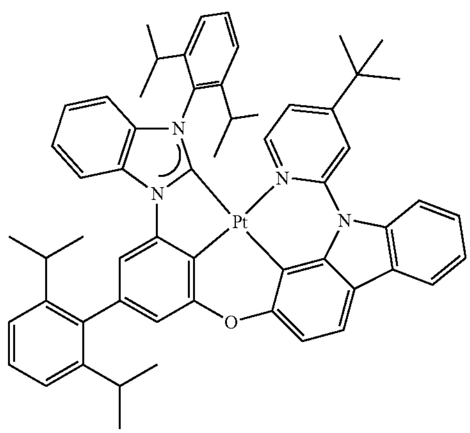 | 455 | 100 | 3.2 |
| Compound 87894 ($L_{A54}$, $L_{B13}$) | 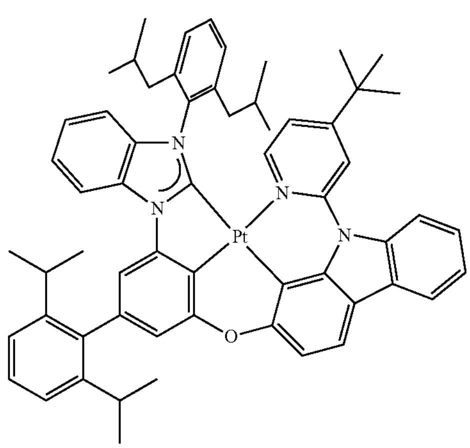 | 455 | 86 | 3.2 |

TABLE 1-continued
| | Structure | λmax in PMMA (nm) | PLQY in PMMA (%) | Excited state lifetime at 77K (μs) |
|---|---|---|---|---|
| Compound 1249492644 ($L_{A7404}$, $L_{B13}$) | 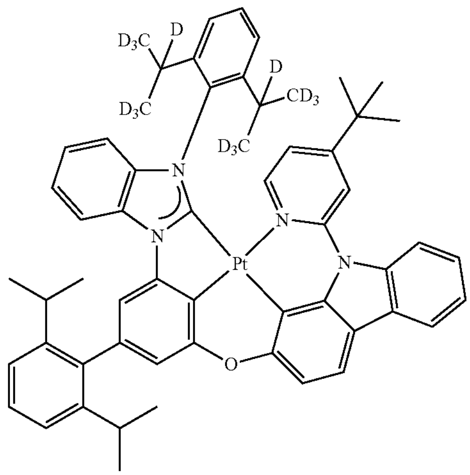  | 455 | 100 | 3.2 |
| Compound 1249492638 ($L_{A7398}$, $L_{B13}$) | 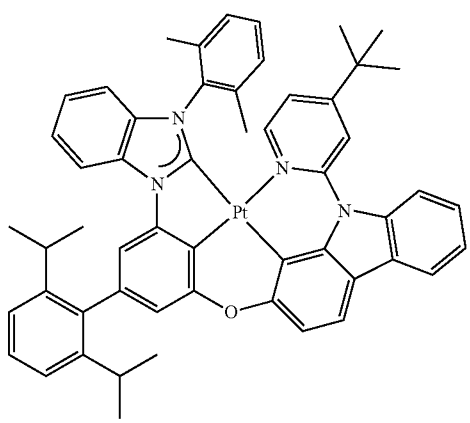  | 454 | 80 | 3.0 |
| Compound 87897 ($L_{A57}$, $L_{B13}$) | 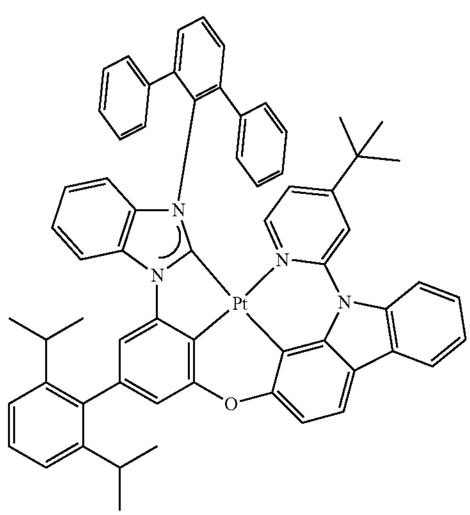  | 458 | 100 | 3.0 |

TABLE 1-continued
| | Structure | λmax in PMMA (nm) | PLQY in PMMA (%) | Excited state lifetime at 77K (μs) |
|---|---|---|---|---|
| Compound 1249492666 ($L_{A7426}$, $L_{B13}$) | 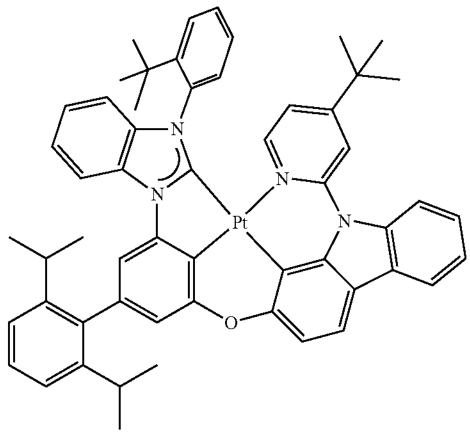 | 452 | 82 | 3.5 |
| Compound 95067 ($L_{A7227}$, $L_{B13}$) | 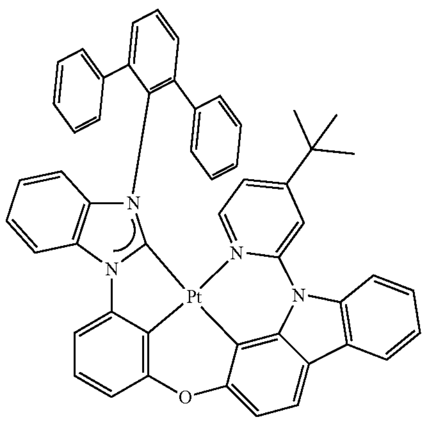 | 455 | 83 | 3.4 |
| Compound 1249509396 ($L_{A24156}$, $L_{B13}$) | 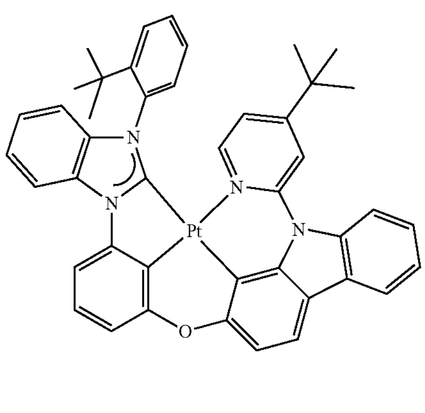 | 448 | 85 | 4.6 |

TABLE 1-continued
| | Structure | λmax in PMMA (nm) | PLQY in PMMA (%) | Excited state lifetime at 77K (μs) |
|---|---|---|---|---|
| Compound 1249492640 ($L_{A7400}$, $L_{B13}$) | 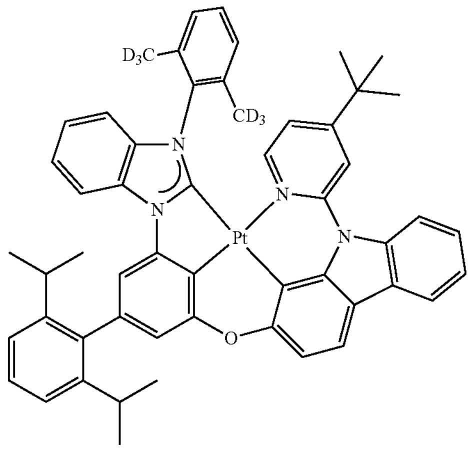 | 454 | 80 | 3.0 |
| Compound 1249493436 ($L_{A8196}$, $L_{B13}$) | 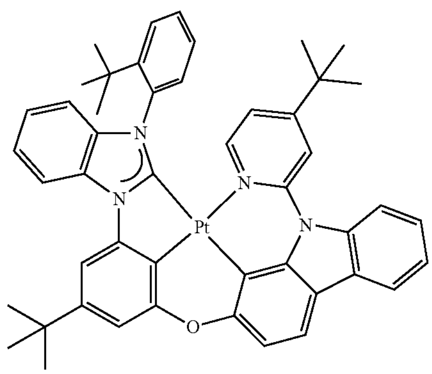 | 452 | 97 | 3.8 |
| Compound 88227 ($L_{A387}$, $L_{B13}$) | 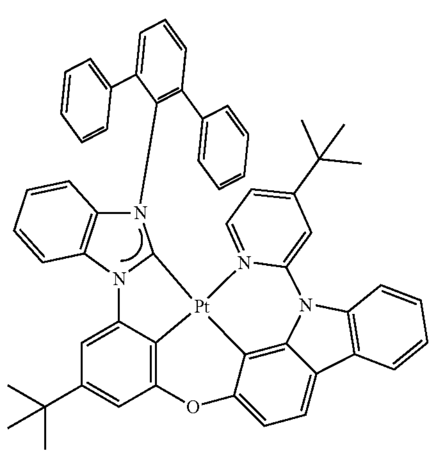 | 461 | 93 | 3.1 |

TABLE 1-continued
| | Structure | λmax in PMMA (nm) | PLQY in PMMA (%) | Excited state lifetime at 77K (μs) |
|---|---|---|---|---|
| Compound 1239509397 ($L_{A24157}$, $L_{B13}$) | 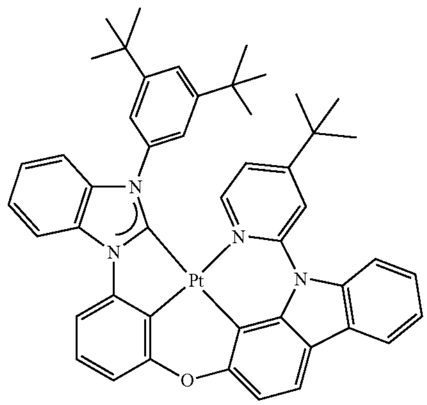 | 452 | 94 | 3.6 |
| Compound 1249509383 ($L_{A24143}$, $L_{B13}$) | 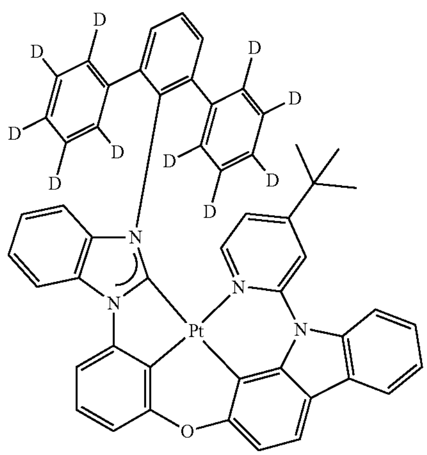 | 455 | 83 | 3.4 |
| Compound 82166980 ($L_{A7300}$, $L_{B11225}$) | 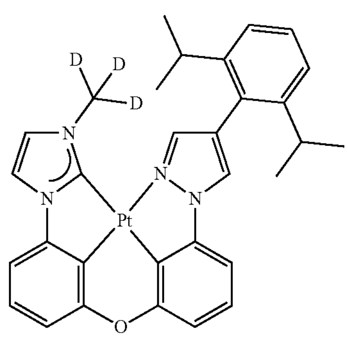 | 452 | 80 | 3.1 |
| Compound 82606180 ($L_{A7300}$, $L_{B11285}$) | 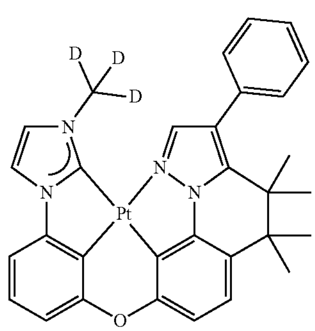 | 449 | 100 | 3.1 |

TABLE 1-continued

| | Structure | λmax in PMMA (nm) | PLQY in PMMA (%) | Excited state lifetime at 77K (μs) |
|---|---|---|---|---|
| Comparative Example | 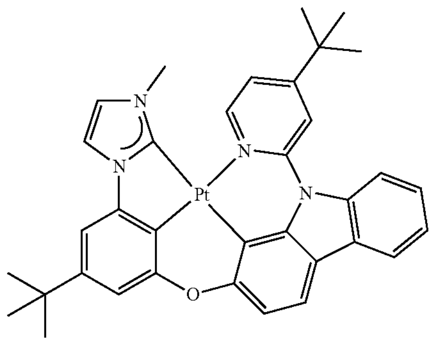 | 447 | 91 | 5.5 |

Table 1 shows the emission peak, PLQY, and excited state lifetime for the inventive compounds and Comparative Example. All inventive compounds showed higher PLQYs and shorter excited state lifetime (except for Compound 226820), indicating that they are very efficient emitters, which usually lead to higher device efficiencies. Their emissions in PMMA are in a range of 449-470 nm. Compound 95050 showed a very deep blue emission of 449 nm which is an excellent candidate for generating saturate blue for display application. Experiments have shown that $R^A$ and $R^C$ play an important role for physical property tuning. For example, when both $Ar^1$ and $Ar^2$=H (Compound 52843111), the complex decomposes before sublimation whereas Compound 20 and 87920 sublime cleanly to allow us to evaluate its device performance. These results suggest the physical properties of this family are very sensitive to the ligand structure. The Comparative Example also shows efficient and blue emission property; however, the device based on it is much less efficient.

OLED Device Fabrication:

OLEDs were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with ultra violet (UV) ozone for 5 minutes.

The devices in Tables 1 were fabricated in high vacuum (<$10^{-6}$ Torr) by thermal evaporation. The anode electrode was 750 Å of ITO. The device example had organic layers consisting of, sequentially, from the ITO surface, 100 Å thick Compound A (HIL), 250 Å layer of Compound B (HTL), 50 Å of Compound C (EBL), 300 Å of Compound D doped with 10% of Emitter (EML), 50 Å of Compound E (BL), 300 Å of Compound G doped with 35% of Compound F (ETL), 10 Å of Compound G (EIL) followed by 1,000 Å of Al (Cathode). All devices were encapsulated with a glass lid sealed with an epoxy resin in a nitrogen glove box (<1 ppm of $H_2O$ and $O_2$,) immediately after fabrication with a moisture getter incorporated inside the package. The doping percentages are in volume percent.

The structures of the compounds used in the experimental devices are shown below:

Compound A

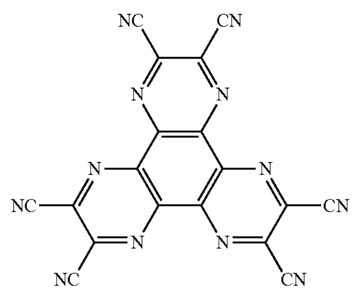

Compound B

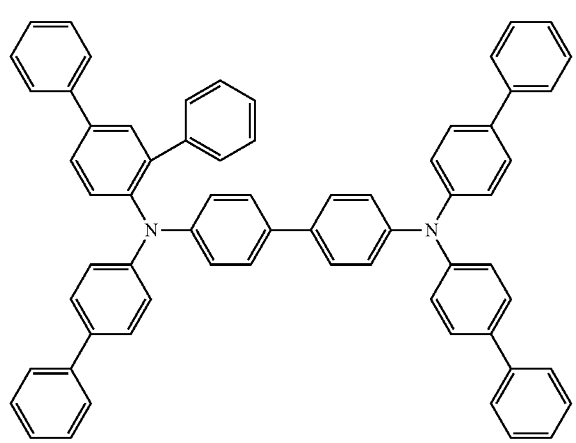

-continued
Compound C
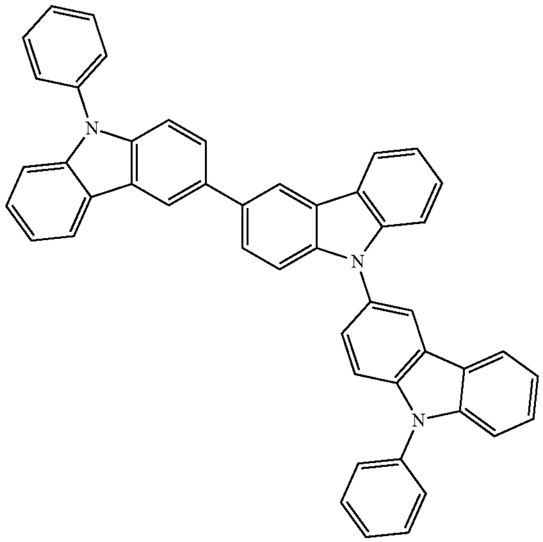
Compound D
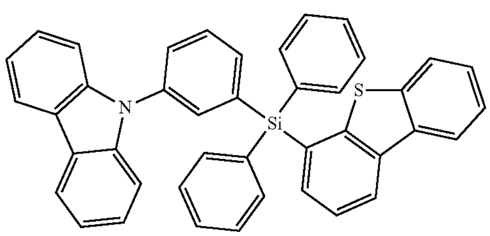
-continued
Compound E
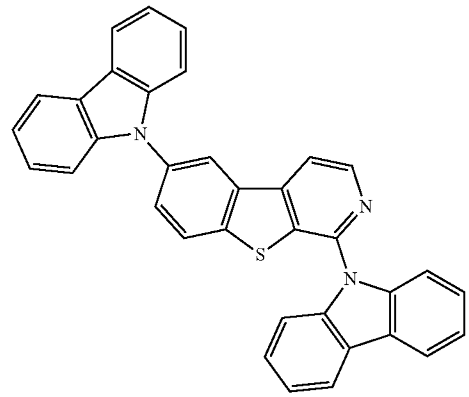
Compound F
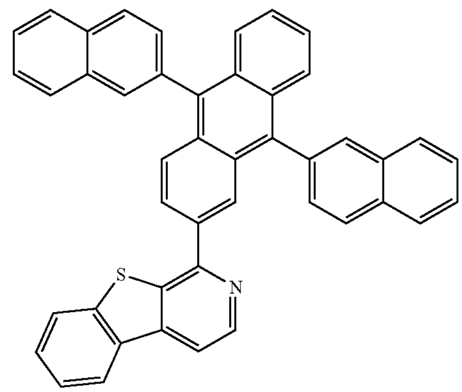
Compound G
TABLE 2
| Device Data | | | | | | | | |
|---|---|---|---|---|---|---|---|---|
| | | | | | at 1,000 nit | | | |
| | 1931 CIE | | λ max | FWHM | Voltage | LE | EQE | PE |
| Device | x | y | [nm] | [nm] | [a.u.][a] | [a.u.] | [a.u.] | [a.u.] |
| Compound 20 | 0.129 | 0.199 | 468 | 37 | 0.93 | 1.81 | 1.93 | 1.94 |
| Compound 7300 | 0.149 | 0.279 | 475 | 62 | 0.90 | 2.69 | 2.19 | 3.02 |
| Compound 87920 | 0.133 | 0.193 | 466 | 41 | 0.93 | 1.26 | 1.36 | 1.35 |
| Compound 95050 | 0.136 | 0.148 | 460 | 40 | 0.88 | 1.20 | 1.53 | 1.36 |
| Compound 82166890 | 0.318 | 0.319 | 467 | 45 | 0.88 | 3.19 | 2.55 | 3.69 |
| Compound 89355323 | 0.131 | 0.273 | 473 | 41 | 0.85 | 2.50 | 2.19 | 2.96 |
| Compound 87893 | 0.132 | 0.144 | 461 | 22 | 0.93 | 1.57 | 2.07 | 1.72 |
| Compound 87894 | 0.138 | 0.146 | 459 | 35 | 0.85 | 1.37 | 1.74 | 1.60 |
| Compound 1249492644 | 0.133 | 0.146 | 461 | 22 | 0.87 | 1.53 | 1.99 | 1.76 |
| Compound 1249492638 | 0.132 | 0.153 | 462 | 24 | 0.93 | 1.41 | 1.78 | 1.56 |
| Compound 87897 | 0.130 | 0.194 | 467 | 39 | 0.85 | 2.08 | 2.26 | 2.48 |
| Compound 1249492666 | 0.134 | 0.151 | 461 | 39 | 0.90 | 1.20 | 1.52 | 1.33 |
| Compound 95067 | 0.132 | 0.160 | 463 | 25 | 0.85 | 1.62 | 2.00 | 1.92 |
| Compound 1249509396 | 0.137 | 0.118 | 456 | 22 | 1.03 | 1.13 | 1.68 | 1.09 |
| Compound 1249492640 | 0.132 | 0.148 | 462 | 25 | 0.90 | 1.31 | 1.68 | 1.48 |
| Compound 1249493436 | 0.135 | 0.153 | 460 | 38 | 1.03 | 1.59 | 1.97 | 1.56 |
| Compound 88227 | 0.131 | 0.209 | 468 | 26 | 0.90 | 1.91 | 1.96 | 2.15 |
| Compound 1249509397 | 0.134 | 0.155 | 462 | 37 | 0.93 | 2.00 | 2.48 | 2.15 |

TABLE 2-continued

| Device Data | | | | | | | | | |
|---|---|---|---|---|---|---|---|---|---|
| | | | | | at 1,000 nit | | | | |
| | 1931 CIE | | λ max | FWHM | Voltage | LE | EQE | PE |
| Device | x | y | [nm] | [nm] | [a.u.][a] | [a.u.] | [a.u.] | [a.u.] |
| Compound 1249509383 | 0.132 | 0.147 | 462 | 22 | 0.98 | 1.77 | 2.30 | 1.81 |
| Comparative Example | 0.155 | 0.196 | 457 | 50 | 1.00 | 1.00 | 1.00 | 1.00 |

[a]a.u. = arbitrary units; all data is normalized relative to Comparative Example.

Table 2 shows device data for the inventive compounds, and Comparative Example. All inventive compounds exhibited lower voltage and higher efficiencies at 1000 nit as compared to those of Comparative Example. Compound 87893, 87894, 95050, 1249492640, 1249492644, 1249509383, and 1249509396 produced a CIE-y of 0.148 which is comparable or better to that of commercial fluorescent blue. Although the Comparative Example exhibited good deep blue color, its CIE-y is worse than most of inventive compounds. The device based on Comparative Example is much less efficient with a higher voltage.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having the formula:

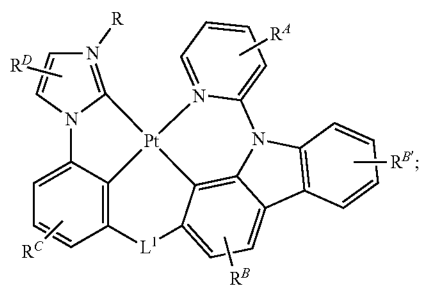

wherein $L^1$ is O;

wherein $R^B$, $R^{B'}$, and $R^C$ each represents mono to a maximum possible number of substitutions, or no substitution;

wherein each of $R^B$ and $R^{B'}$ is independently a hydrogen or a substituent selected from the group consisting of deuterium, alkyl, cycloalkyl, partially or fully deuterated variants thereof, and partially or fully fluorinated variants thereof, which may be further substituted by one or more alkyl, cycloalkyl, aryl, partially or fully fluorinated variants thereof, or partially or fully deuterated variants thereof;

wherein two $R^D$ are joined to form a benzo ring fused to the imidazole, and the benzo ring may be further substituted by up to four substituents that are each independently selected from the group consisting of hydrogen, alkyl, cycloalkyl, partially or fully fluorinated variants thereof, and partially or fully deuterated variants thereof, which may be further substituted by one or more alkyl, cycloalkyl, partially or fully fluorinated variants thereof, or partially or fully deuterated variants thereof;

wherein R is aryl, which may be substituted by one or more substituents selected from the group consisting of deuterium, alkyl, cycloalkyl, heteroalkyl, arylalkyl, silyl, aryl, heteroaryl, and combinations thereof;

wherein any substitutions in $R^A$, $R^B$, $R^{B'}$, $R^C$, and $R^D$ may be joined or fused into a ring;

wherein each $R^A$ is independently selected from the group consisting of hydrogen, alkyl, cycloalkyl, partially or fully deuterated variants thereof, and partially or fully fluorinated variants thereof, and at least one $R^A$ is not hydrogen; and wherein each $R^C$ is independently H or aryl, which may be substituted by one or more substituents selected from the group consisting of deuterium, alkyl, cycloalkyl, aryl, heteroaryl, and combinations thereof.

2. The compound of claim 1, wherein each of $R^B$ and $R^{B'}$ is independently selected from the group consisting of hydrogen, deuterium, alkyl, partially or fully deuterated alkyl, and combinations thereof, and two $R^D$ are joined to form a benzo ring fused to the imidazole, and the benzo ring may be further substituted by up to two substituents that are each independently selected from the group consisting of alkyl, partially or fully fluorinated variants thereof, and partially or fully deuterated variants thereof.

3. The compound of claim 1, wherein the two adjacent $R^D$ substituents that are joined to form a benzo ring are substituted by one or more substituents selected from the group consisting of alkyl, partially and fully deuterated alkyl, and partially and fully fluorinated alkyl.

4. The compound of claim 1, wherein R is a 6-membered aromatic ring, which can be further substituted.

5. An organic light emitting device (OLED) comprising:

an anode;

a cathode; and an organic layer, disposed between the anode and the cathode, comprising a compound having the formula:

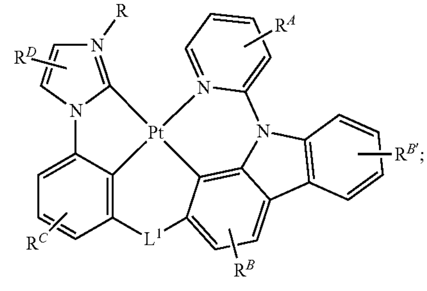

wherein $L^1$ is O;

wherein $R^B$, $R^{B'}$, and $R^C$ each represents mono to a maximum possible number of substitutions, or no substitution;

wherein each of $R^B$ and $R^{B'}$ is independently a hydrogen or a substituent selected from the group consisting of deuterium, alkyl, cycloalkyl, partially or fully deuterated variants thereof, and partially or fully fluorinated variants thereof, which may be further substituted by one or more alkyl, cycloalkyl, aryl, partially or fully fluorinated variants thereof, or partially or fully deuterated variants thereof;

wherein two $R^D$ are joined to form a benzo ring fused to the imidazole, and the benzo ring may be further substituted by up to four substituents that are each independently selected from the group consisting of hydrogen, alkyl, cycloalkyl, partially or fully fluorinated variants thereof, and partially or fully deuterated variants thereof, which may be further substituted by one or more alkyl, cycloalkyl, partially or fully fluorinated variants thereof, or partially or fully deuterated variants thereof;

wherein R is aryl, which may be substituted by one or more substituents selected from the group consisting of deuterium, alkyl, cycloalkyl, heteroalkyl, arylalkyl, silyl, aryl, heteroaryl, and combinations thereof;

wherein any substitutions in $R^A$, $R^B$, $R^{B'}$, $R^C$, and $R^D$ may be joined or fused into a ring;

wherein each $R^A$ is independently selected from the group consisting of hydrogen, alkyl, cycloalkyl, partially or fully deuterated variants thereof, and partially or fully fluorinated variants thereof, and at least one $R^A$ is not hydrogen; and wherein each $R^C$ is independently H or aryl, which may be substituted by one or more substituents selected from the group consisting of deuterium, alkyl, cycloalkyl, aryl, heteroaryl, and combinations thereof.

6. The OLED of claim 5, wherein the organic layer is an emissive layer and the compound is an emissive dopant or a non-emissive dopant.

7. The OLED of claim 5, wherein the organic layer further comprises a host, wherein the host comprises at least one chemical group selected from the group consisting of metal complex, triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

8. The OLED of claim 5, wherein the organic layer further comprises a host, wherein the host is selected from the group consisting of:

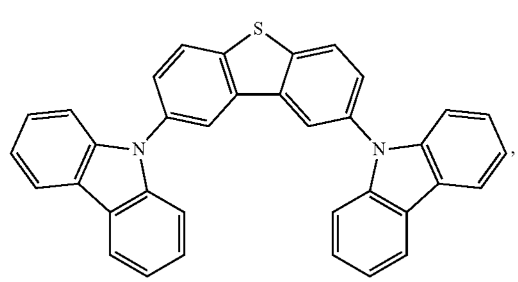

-continued

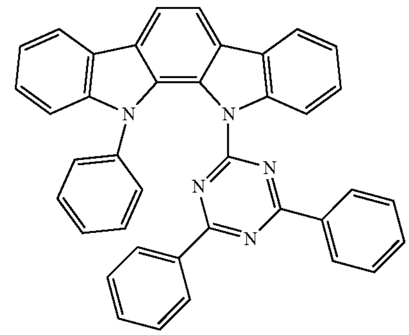

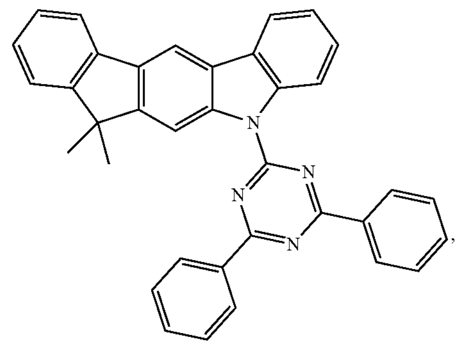

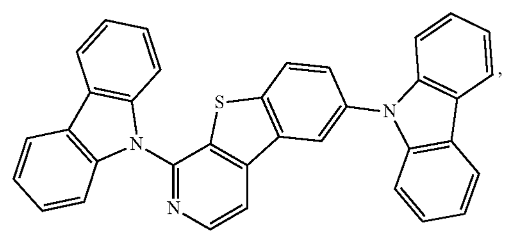

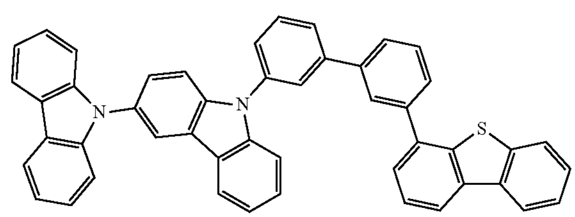

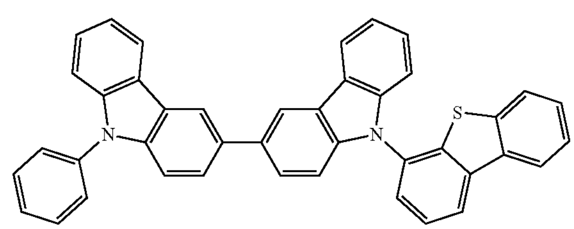

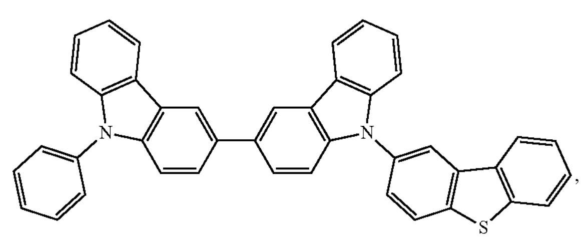

-continued
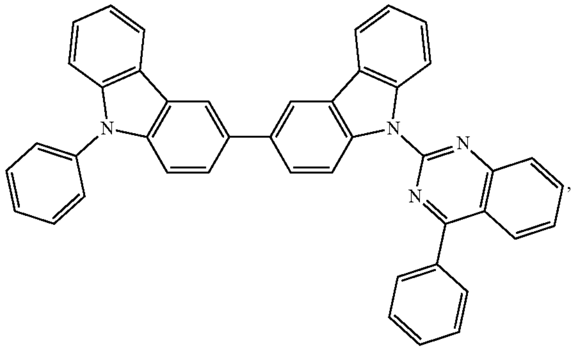
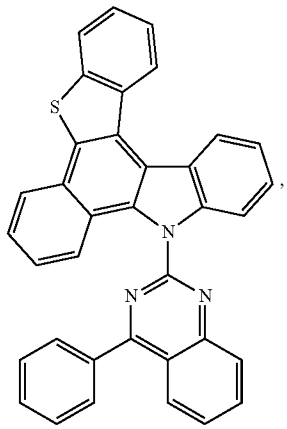
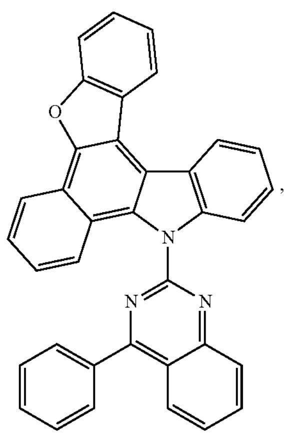
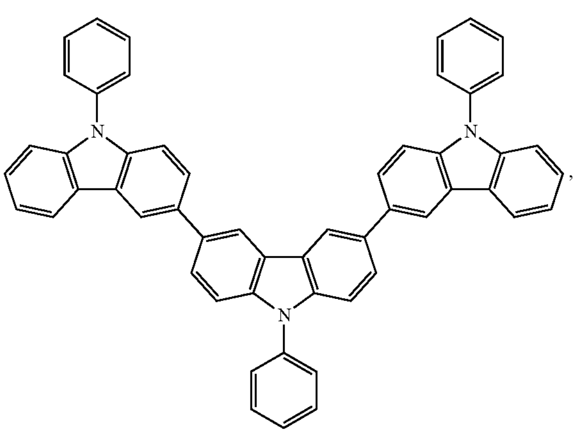
-continued
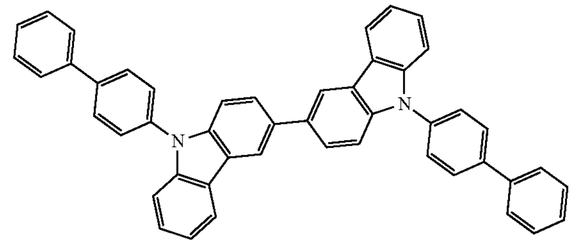
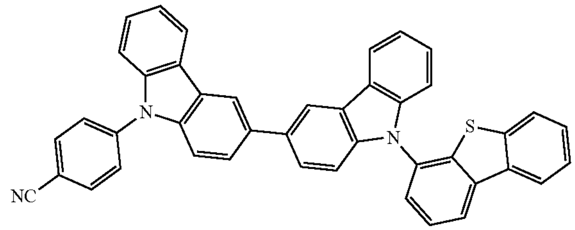
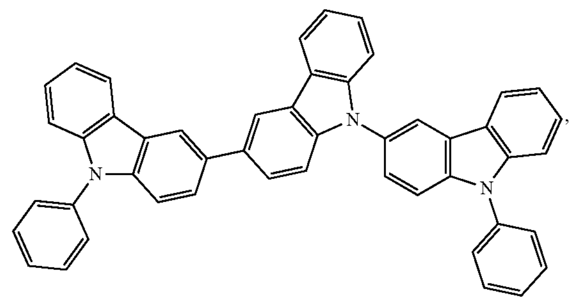
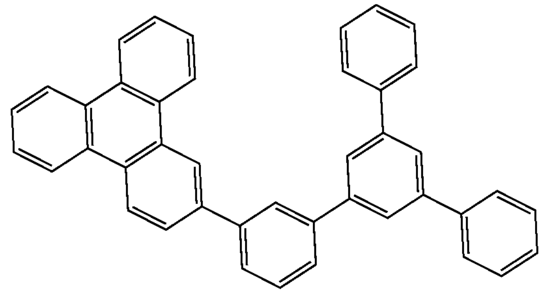
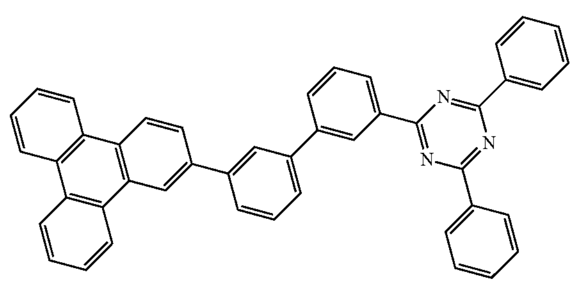
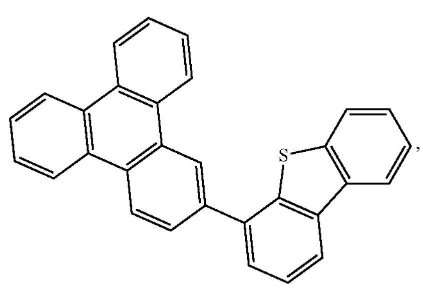

-continued

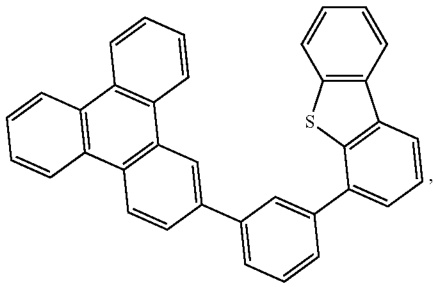

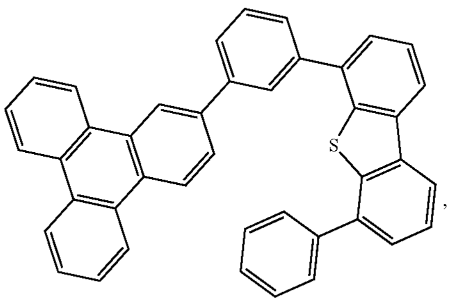

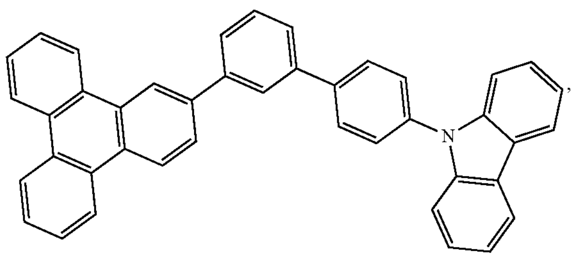

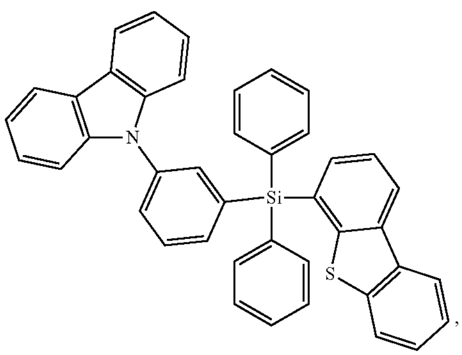

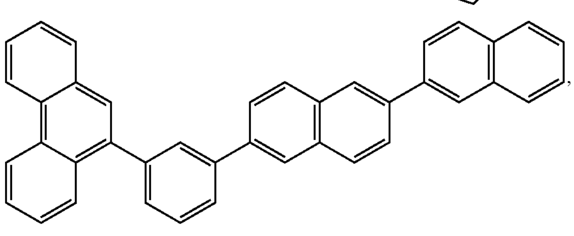

and combinations thereof.

9. A consumer product comprising an organic light-emitting device (OLED) comprising:

an anode;

a cathode; and an organic layer, disposed between the anode and the cathode, comprising a compound having the formula:

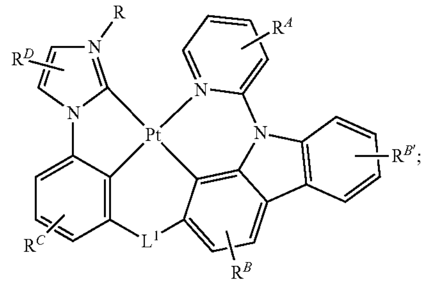

wherein $L^1$ is O;

wherein $R^B$, $R^{B'}$, and $R^C$ each represents mono to a maximum possible number of substitutions, or no substitution;

wherein each of $R^B$ and $R^{B'}$ is independently a hydrogen or a substituent selected from the group consisting of deuterium, alkyl, cycloalkyl, partially or fully deuterated variants thereof, and partially or fully fluorinated variants thereof, which may be further substituted by one or more alkyl, cycloalkyl, aryl, partially or fully fluorinated variants thereof, or partially or fully deuterated variants thereof;

wherein two $R^D$ are joined to form a benzo ring fused to the imidazole, and the benzo ring may be further substituted by up to four substituents that are each independently selected from the group consisting of hydrogen, alkyl, cycloalkyl, partially or fully fluorinated variants thereof and partially or fully deuterated variants thereof, which may be further substituted by one or more alkyl, cycloalkyl, partially or fully fluorinated variants thereof, or partially or fully deuterated variants thereof;

wherein R is aryl, which may be substituted by one or more substituents selected from the group consisting of deuterium, alkyl, cycloalkyl, heteroalkyl, arylalkyl, silyl, aryl, heteroaryl, and combinations thereof;

wherein any substitutions in $R^A$, $R^B$, $R^{B'}$, $R^C$, and $R^D$ may be joined or fused into a ring;

wherein each $R^A$ is independently selected from the group consisting of hydrogen, alkyl, cycloalkyl, partially or fully deuterated variants thereof, and partially or fully fluorinated variants thereof, and at least one $R^A$ is not hydrogen; and wherein each $R^C$ is independently H or aryl, which may be substituted by one or more substituents selected from the group consisting of deuterium, alkyl, cycloalkyl, aryl, heteroaryl, and combinations thereof.

10. The consumer product of claim 9, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video walls comprising multiple displays tiled together, a theater or stadium screen, and a sign.

11. A formulation comprising the compound of claim 1.

12. The compound of claim 1, wherein exactly one $R^C$ is aryl, which can be substituted by alkyl or aryl, and can be partially of fully deuterated.

13. The compound of claim 1, wherein the two adjacent $R^D$ substituents that are joined to form a benzo ring are not further substituted.

14. The compound of claim 1, wherein each $R^C$ is H.

15. The compound of claim 12, wherein the two adjacent $R^D$ substituents that are joined to form a benzo ring are substituted by one or more substituents selected from the group consisting of alkyl, partially and fully deuterated alkyl, and partially and fully fluorinated alkyl.

16. The compound of claim 1, wherein at least one $R^A$ is partially or fully fluorinated alkyl or cycloalkyl, partially or fully deuterated alkyl or cycloalkyl, or a combination of both.

17. The compound of claim 1, wherein the $R^A$ para to the Pt is tert-butyl, partially or fully fluorinated tert-butyl, or partially or fully deuterated tert-butyl, and the remaining $R^A$ are H.

18. The compound of claim 1, wherein the compound has the formula $Pt(L_{Ay})(L_{Bz})$, wherein $L_{Ay}$ has the following structures:

| $L_{Ay}$ | Structure of $L_{Ay}$ | $Ar^1$, $R^1$ | y |
|---|---|---|---|
| | 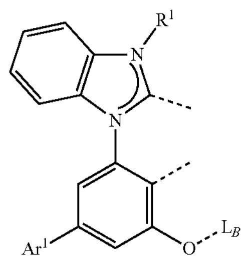 | wherein $Ar^1$ = Ai and $R^1$ = Rk, wherein i is an integer from 1 to 10, and k is an integer from 20 to 25 and 27 to 30, and | y = 30(i − 1) + k |
| | 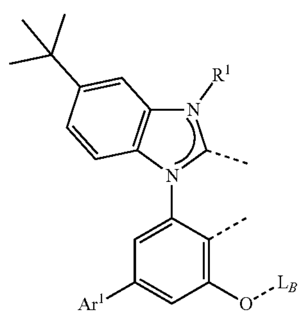 | wherein $Ar^1$ = Ai and $R^1$ = Rk, wherein i is an integer from 1 to 10 and k is an integer from 20 to 25 and 27 to 30, and | y = 30(i − 1) + k + 900 |
| | 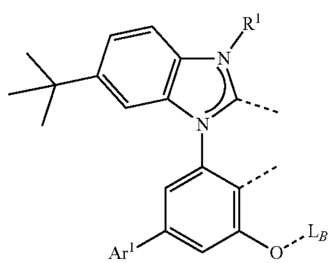 | wherein $Ar^1$ = Ai and $R^1$ = Rk, wherein i is an integer from 1 to 10 and k is an integer from 20 to 25 and 27 to 30, and | y = 30(i − 1) + k + 1800 |
| | 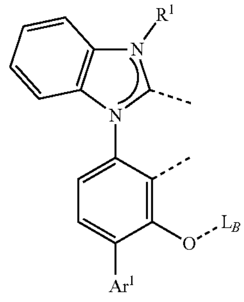 | wherein $Ar^1$ = Ai and $R^1$ = Rk, wherein i is an integer from 1 to 10 and k is an integer from 20 to 25 and 27 to 30, and | y = 30(i − 1) + k + 2700 |

-continued

| $L_{Ay}$ | Structure of $L_{Ay}$ | $Ar^1$, $R^1$ | y |
|---|---|---|---|
| | 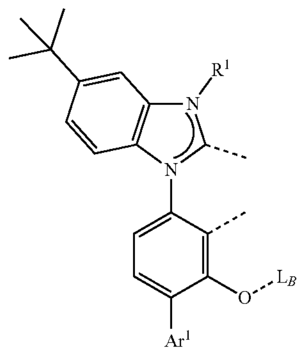 | wherein $Ar^1$ = Ai and $R^1$ = Rk, wherein i is an integer from 1 to 10 and k is an integer from 20 to 25 and 27 to 30, and | y = 30(i − 1) + k + 3600 |
| | 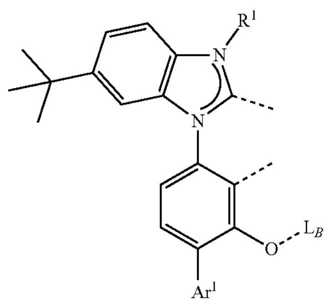 | wherein $Ar^1$ = Ai and $R^1$ = Rk, wherein i is an integer from 1 to 10 and k is an integer from 20 to 25 and 27 to 30, and | y = 30(i − 1) + k + 4500 |
| | 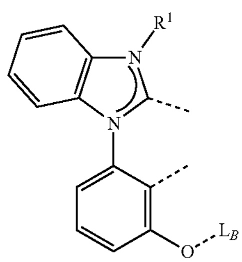 | wherein $R^1$ = Rk, wherein k is an integer from 20 to 25 and 27 to 30, and | y = k + 7200 |
| | 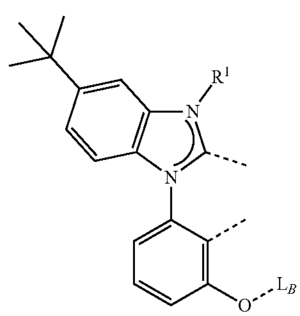 | wherein $R^1$ = Rk, wherein k is an integer from 20 to 25 and 27 to 30, and | y = k + 7230 |
| | 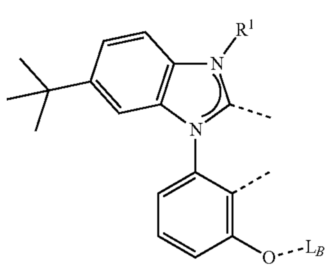 | wherein $R^1$ = Rk, wherein k is an integer from 20 to 25 and 27 to 30, and | y = k + 7260 |

-continued

| $L_{Ay}$ | Structure of $L_{Ay}$ | $Ar^1$, $R^1$ | y |
|---|---|---|---|
| | 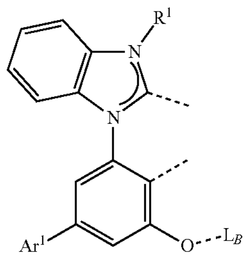 | wherein $Ar^1$ = Ai and $R^1$ = Rk, wherein i is an integer from 1 to 10 and k is an integer from 37-49, 52-61, 63-74, 81-86, and 95-96, and | y = 70(i − 1) + (k − 30) + 7320 |
| | 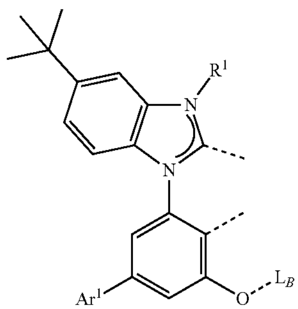 | wherein $Ar^1$ = Ai and $R^1$ = Rk, wherein i is an integer from 1 to 10 and k is an integer from 37-49, 52-61, 63-74, 81-86, and 95-96, and | y = 70(i − 1) + (k − 30) + 9420 |
| | 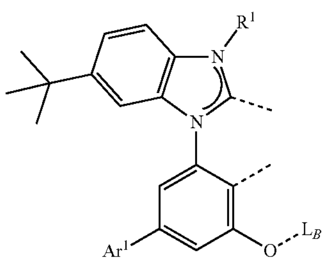 | wherein $Ar^1$ = Ai and $R^1$ = Rk, wherein i is an integer from 1 to 10 and k is an integer from 37-49, 52-61, 63-74, 81-86, and 95-96, and | y = 70(i − 1) + (k − 30) + 11520 |
| | 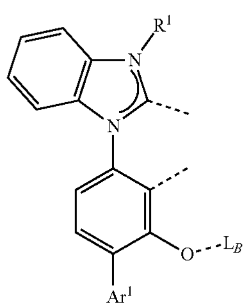 | wherein $Ar^1$ = Ai and $R^1$ = Rk, wherein i is an integer from 1 to 10 and k is an integer from 37-49, 52-61, 63-74, 81-86, and 95-96, and | y = 70(i − 1) + (k − 30) + 13620 |
| | 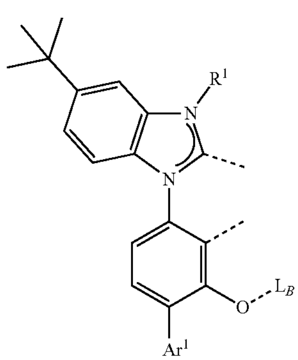 | wherein $Ar^1$ = Ai and $R^1$ = Rk, wherein i is an integer from 1 to 10 and k is an integer from 37-49, 52-61, 63-74, 81-86, and 95-96, and | y = 70(i − 1) + (k − 30) + 15720 |

-continued

| $L_{Ay}$ | Structure of $L_{Ay}$ | $Ar^1$, $R^1$ | y |
|---|---|---|---|
| | 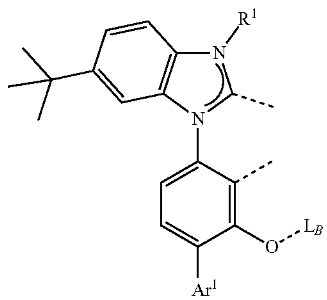 | wherein $Ar^1$ = Ai and $R^1$ = Rk, wherein i is an integer from 1 to 10 and k is an integer from 37-49, 52-61, 63-74, 81-86, and 95-96, and | y = 70(i − 1) + (k − 30) + 17820 |
| | 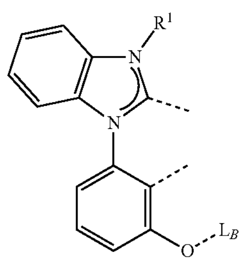 | wherein $R^1$ = Rk, wherein k is an integer from 37-49, 52-61, 63-74, 81-86, and 95-96, and | y = (k − 30) + 24120 |
| | 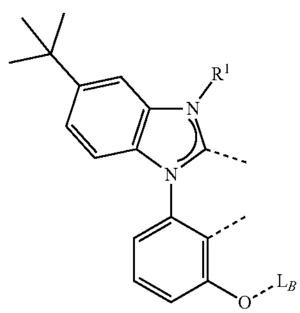 | wherein $R^1$ = Rk, wherein k is an integer from 37-49, 52-61, 63-74, 81-86, and 95-96, and | y = (k − 30) + 24190 |
| | 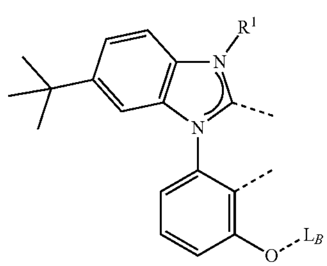 | wherein $R^1$ = Rk, wherein k is an integer from 37-49, 52-61, 63-74, 81-86, and 95-96, and | y = (k − 30) + 24260 |
| | 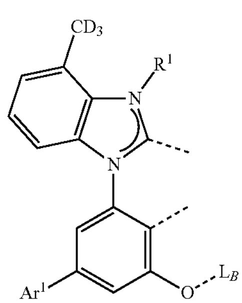 | wherein $Ar^1$ = Ai and $R^1$ = Rk, wherein i is an integer from 1 to 10 and k is an integer from 20-25, 27-30, 37-49, 52-61, 63-74, 81-86, and 95-96, and | y = 100(i − 1) + k + 24400 |

-continued

| $L_{Ay}$ | Structure of $L_{Ay}$ | $Ar^1$, $R^1$ | y |
|---|---|---|---|
| | 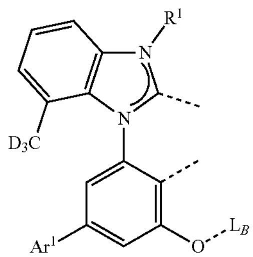 | wherein $Ar^1$ = Ai and $R^1$ = Rk, wherein i is an integer from 1 to 10 and k is an integer from 20-25, 27-30, 37-49, 52-61, 63-74, 81-86, and 95-96, and | y = 100(i − 1) + k + 27400 |
| | 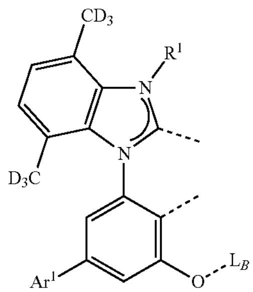 | wherein $Ar^1$ = Ai and $R^1$ = Rk, wherein i is an integer from 1 to 10 and k is an integer from 20-25, 27-30, 37-49, 52-61, 63-74, 81-86, and 95-96, and | y = 100(i − 1) + k + 27400 |
| | 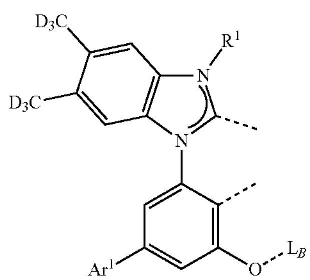 | wherein $Ar^1$ = Ai and $R^1$ = Rk, wherein i is an integer from 1 to 10 and k is an integer from 20-25, 27-30, 37-49, 52-61, 63-74, 81-86, and 95-96, and | y = 100(i − 1) + k + 30400 |
| | 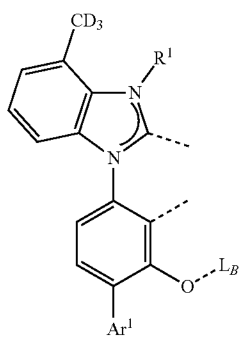 | wherein $Ar^1$ = Ai and $R^1$ = Rk, wherein i is an integer from 1 to 10 and k is an integer from 20-25, 27-30, 37-49, 52-61, 63-74, 81-86, and 95-96, and | y = 100(i − 1) + k + 36400 |
| | 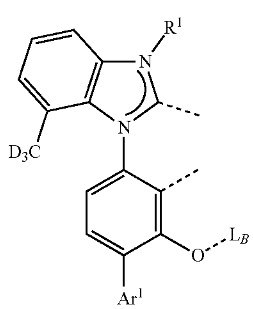 | wherein $Ar^1$ = Ai and $R^1$ = Rk, wherein i is an integer from 1 to 10 and k is an integer from 20-25, 27-30, 37-49, 52-61, 63-74, 81-86, and 95-96, and | y = 100(i − 1) + k + 39400 |

-continued

| $L_{Ay}$ | Structure of $L_{Ay}$ | $Ar^1$, $R^1$ | y |
|---|---|---|---|
| | 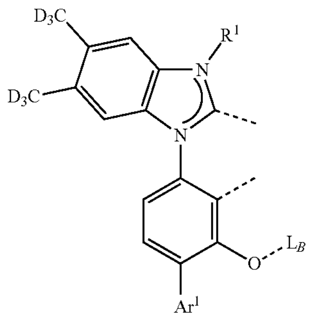 | wherein $Ar^1$ = Ai and $R^1$ = Rk, wherein i is an integer from 1 to 10 and k is an integer from 20-25, 27-30, 37-49, 52-61, 63-74, 81-86, and 95-96, and | y = 100(i − 1) + k + 42400 |
| | 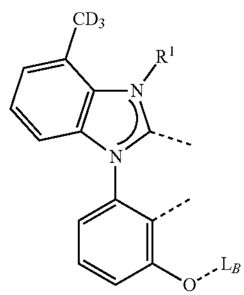 | wherein $R^1$ = Rk, wherein k is an integer from 20-25, 27-30, 37-49, 52-61, 63-74, 81-86, and 95-96, and | y = k + 48400 |
| | 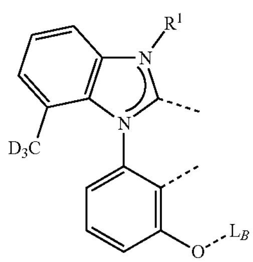 | wherein $R^1$ = Rk, wherein k is an integer from 20-25, 27-30, 37-49, 52-61, 63-74, 81-86, and 95-96, and | y = k + 48500 |
| | 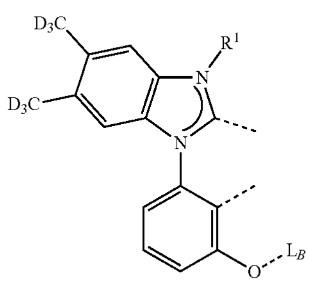 | wherein $R^1$ = Rk, wherein k is an integer from 20-25, 27-30, 37-49, 52-61, 63-74, 81-86, and 95-96, and | y = k + 48600 |

wherein $L_{Bz}$ has the following structures:

| $L_{Bz}$ | $L_{Bz}$ structure | $Ar^2$, $Ar^3$, $R^2$ | Z |
|---|---|---|---|
| | 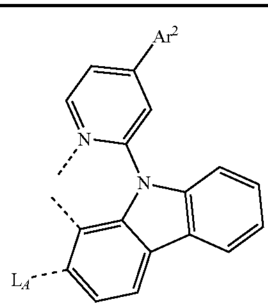 | wherein $Ar^2$ = Aj, wherein j is an integer from 11-18 and 21-30, and | z = j |

-continued

| $L_{Bz}$ | $L_{Bz}$ structure | $Ar^2$, $Ar^3$, $R^2$ | Z |
|---|---|---|---|
| | 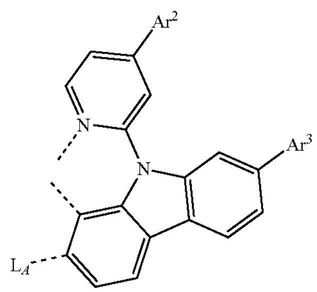 | wherein $Ar^2$ = Aj and $Ar^3$ = Am, wherein each of j and m is independently an integer from 11-18 and 21-30, and | z = 30(j − 1) + m + 31 |
| | 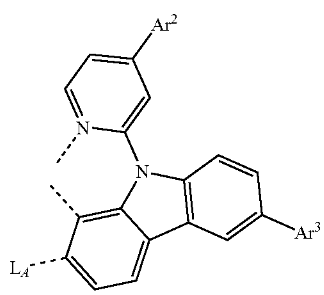 | wherein $Ar^2$ = Aj and $Ar^3$ = Am, wherein each of j and m is independently an integer from 11-18 and 21-30, and | z = 30(j − 1) + m + 961 |
| | 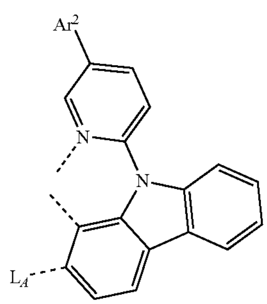 | wherein $Ar^2$ = Aj, wherein j is an integer from 11-18 and 21-30, and | z = j + 1891 |
| | 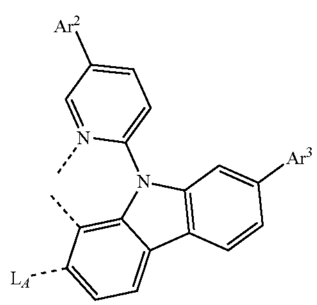 | wherein $Ar^2$ = Aj and $Ar^3$ = Am, wherein each of j and m is independently an integer from 11-18 and 21-30, and | z = 30(j − 1) + m + 1921 |
| | 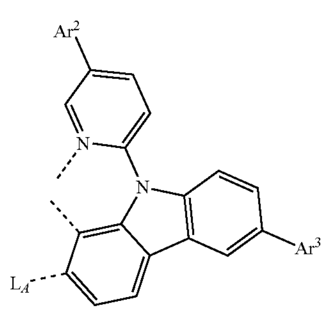 | wherein $Ar^2$ = Aj and $Ar^3$ = Am, wherein each of j and m is independently an integer from 11-18 and 21-30, and | z = 30(j − 1) + m + 2821 |

-continued

| $L_{Bz}$ | $L_{Bz}$ structure | $Ar^2$, $Ar^3$, $R^2$ | Z |
|---|---|---|---|
| | 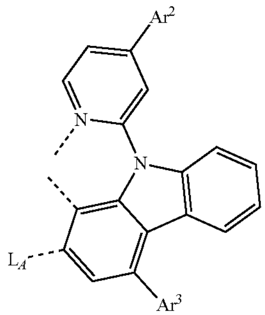 | wherein $Ar^2$ = Aj and $Ar^3$ = Am, wherein each of j and m is independently an integer from 11-18 and 21-30, and | z = 30(j − 1) + m + 3721 |
| | 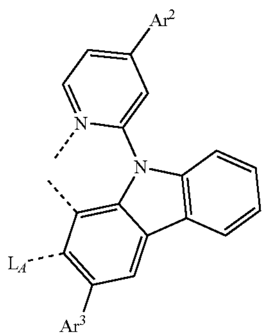 | wherein $Ar^2$ = Aj and $Ar^3$ = Am, wherein each of j and m is independently an integer from 11-18 and 21-30, and | z = 30(j − 1) + m + 4651 |
| | 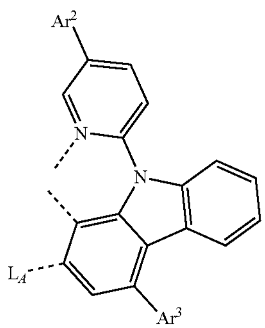 | wherein $Ar^2$ = Aj and $Ar^3$ = Am, wherein each of j and m is independently an integer from 11-18 and 21-30, and | z = 30(j − 1) + m + 5581 |
| | 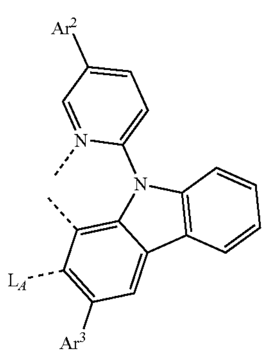 | wherein $Ar^2$ = Aj and $Ar^3$ = Am, wherein each of j and m is independently an integer from 11-18 and 21-30, and | z = 30(j − 1) + m + 6481 |

-continued
| $L_{Bz}$ | $L_{Bz}$ structure | $Ar^2$, $Ar^3$, $R^2$ | Z |
|---|---|---|---|
| | 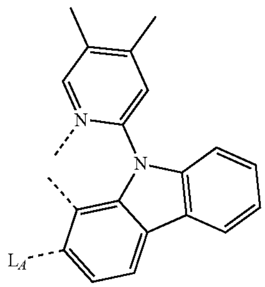 | | z = 7382 |
| | 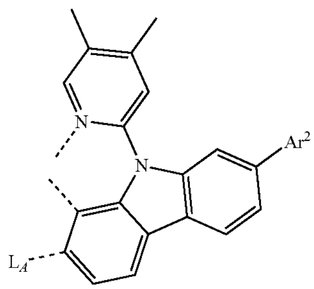 | wherein $Ar^2$ = Aj, wherein j is an integer from 11 to 18 and 21 to 30, and | z = j + 7382 |
| | 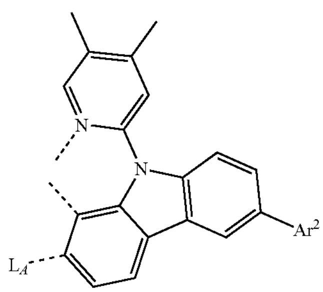 | wherein $Ar^2$ = Aj, wherein j is an integer from 11 to 18 and 21 to 30, and | z = j + 7412 |
| | 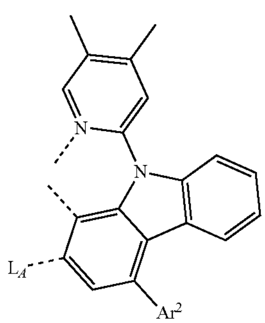 | wherein $Ar^2$ = Aj, wherein j is an integer from 11 to 18 and 21 to 30, and | z = j + 7442 |
| | 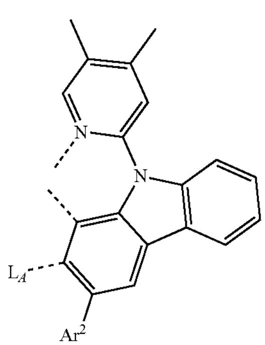 | wherein $Ar^2$ = Aj, wherein j is an integer from 11 to 18 and 21 to 30, and | z = j + 7472 |

-continued

| $L_{Bz}$ | $L_{Bz}$ structure | $Ar^2$, $Ar^3$, $R^2$ | Z |
|---|---|---|---|
| | 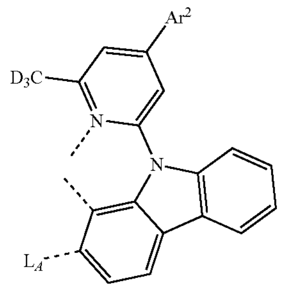 | wherein $Ar^2$ = Aj, wherein j is an integer from 11-18 and 21-30, and | z = j + 19686 |
| | 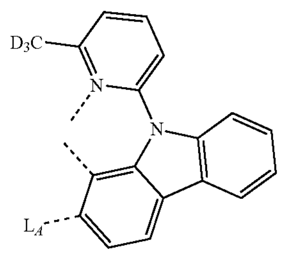 | | z = 19717 |
| | 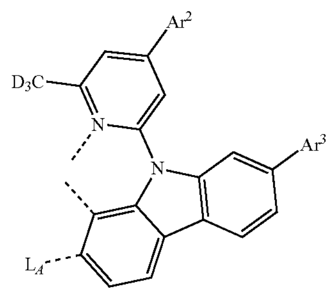 | wherein $Ar^2$ = Aj and $Ar^3$ = Am, wherein each of j and m is independently an integer from 11-18 and 21-30, and | z = 30(j − 1) + m + 19717 |
| | 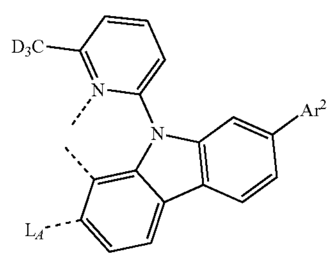 | wherein $Ar^2$ = Aj, wherein j is an integer from 11 to 18 and 21 to 30, and | z = j + 20617 |
| | 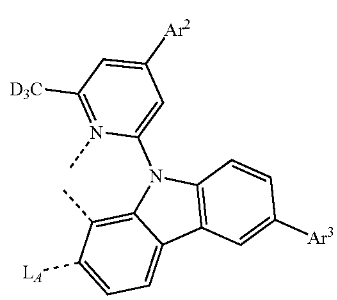 | wherein $Ar^2$ = Aj and $Ar^3$ = Am, wherein each of j and m is independently an integer from 11-18 and 21-30, and | z = 30(j − 1) + m + 20647 |

-continued

| $L_{Bz}$ | $L_{Bz}$ structure | $Ar^2$, $Ar^3$, $R^2$ | Z |
|---|---|---|---|
| | 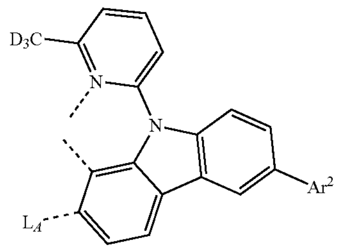 | wherein $Ar^2$ = Aj, wherein j is an integer from 11 to 18 and 21 to 30, and | z = j + 21547 |
| | 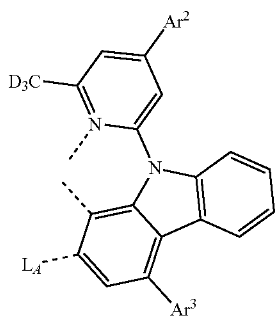 | wherein $Ar^2$ = Aj and $Ar^3$ = Am, wherein each of j and m is independently an integer from 11-18 and 21-30, and | z = 30(j − 1) + m + 23437 |
| | 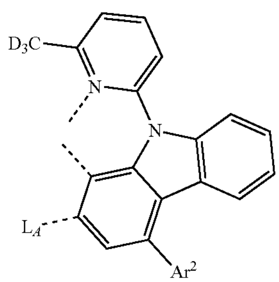 | wherein $Ar^2$ = Aj, wherein j is an integer from 11 to 18 and 21 to 30, and | z = j + 24337 |
| | 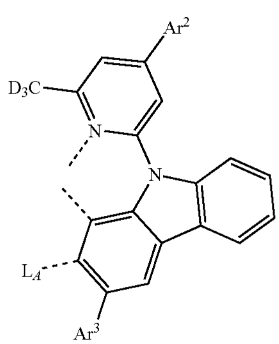 | wherein $Ar^2$ = Aj and $Ar^3$ = Am, wherein each of j and m is independently an integer from 11-18 and 21-30, and | z = 30(j − 1) + m + 24367 |
| | 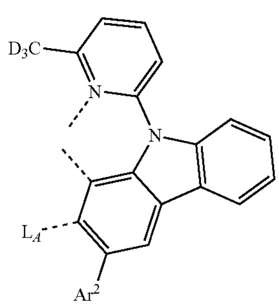 | wherein $Ar^2$ = Aj, wherein j is an integer from 11 to 18 and 21 to 30, and | z = j + 25267 |

wherein A1 to A18 and A21 to A30 have the following structures:
A1
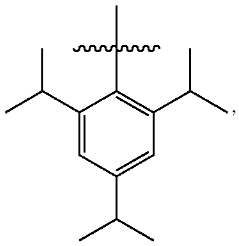
A2
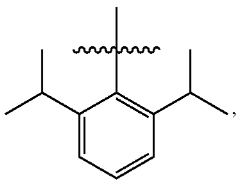
A3
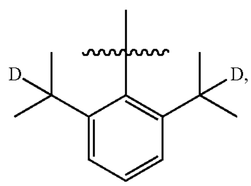
A4
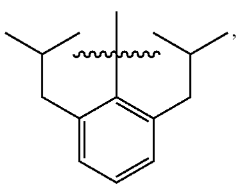
A5
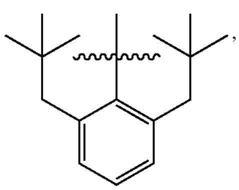
A6
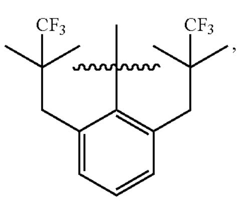
A7
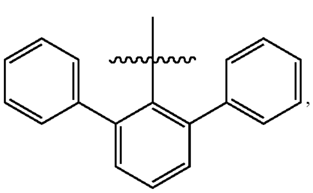
-continued
A8
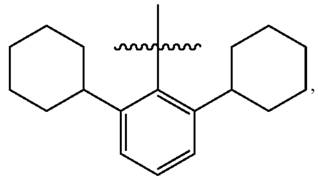
A9
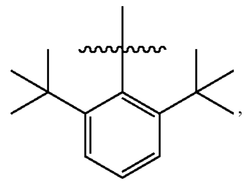
A10
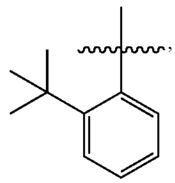
A11
Me,
A12
iPr,
A13
tBu,
A14
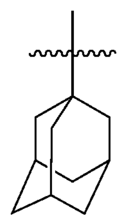
A15
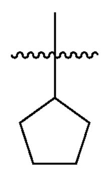
A16
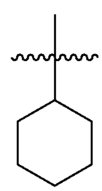
A17
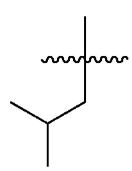
A18
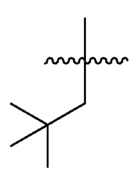

-continued
A21
$CD_3$,
A22
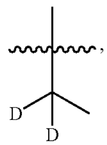
A23
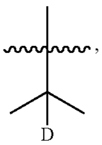
A24
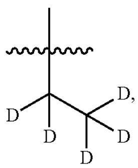
A25
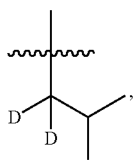
A26
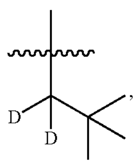
A27
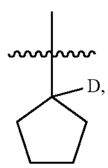
A28
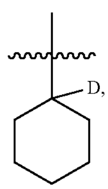
A29
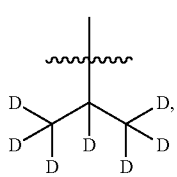
and
A30
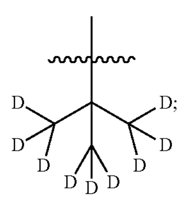
and
wherein R20-R25, R27-R30, R37-R49, R52-R61, R63-R74, R81-R86, and R95-R96 have the following structures:
R20
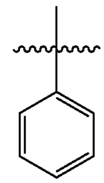
R21
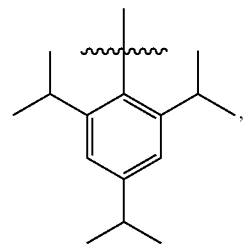
R22
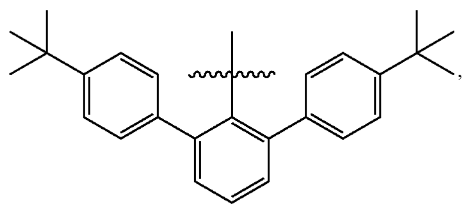
R23
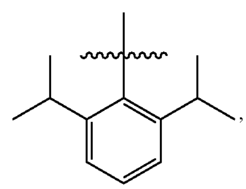
R24
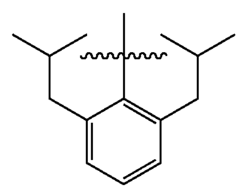
R25
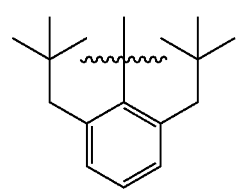
R27
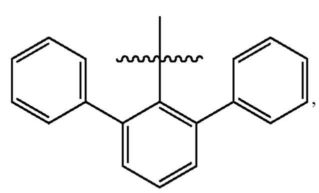

-continued
R28
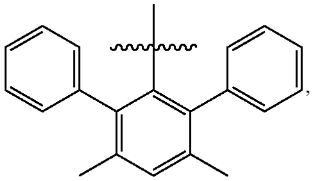
R29
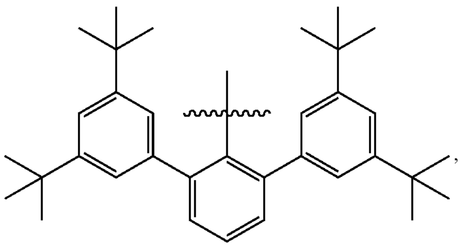
R30
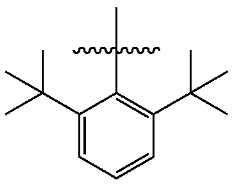
R37
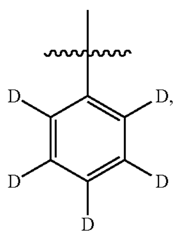
R38
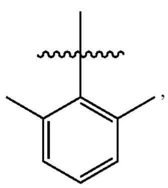
R39
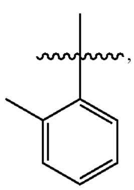
R40
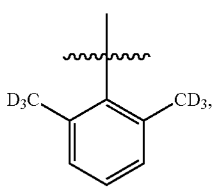
R41
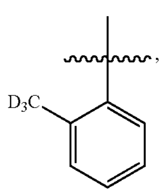
-continued
R42
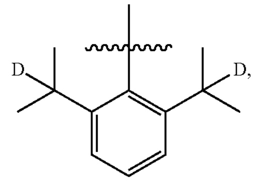
R43
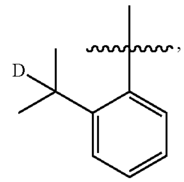
R44
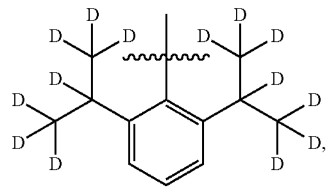
R45
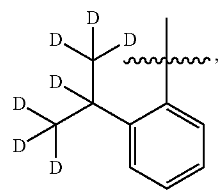
R46
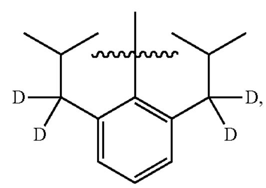
R47
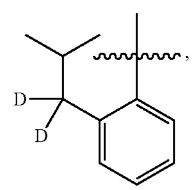
R48
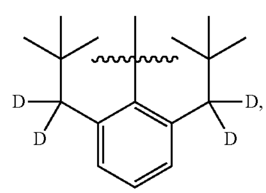
R49
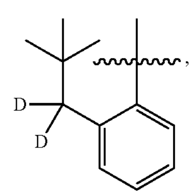

R52
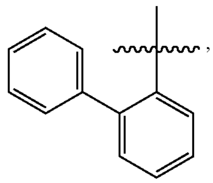
R53
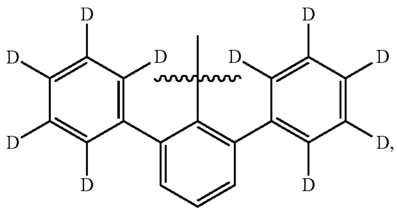
R54
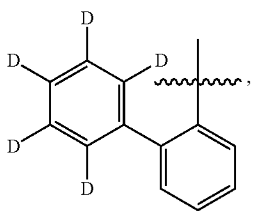
R55
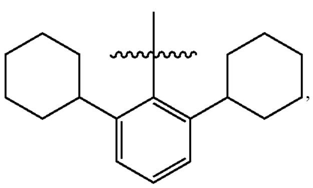
R56
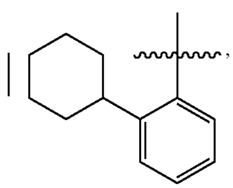
R57
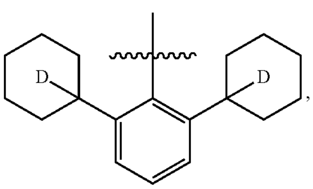
R58
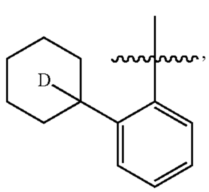
R59
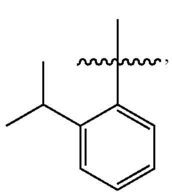
R60
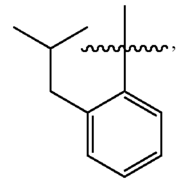
R61
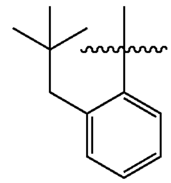
R63
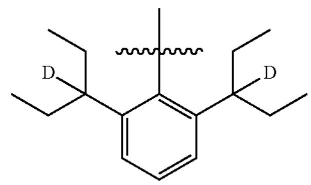
R64
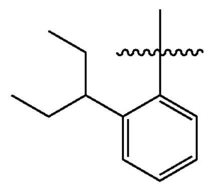
R65
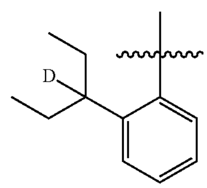
R66
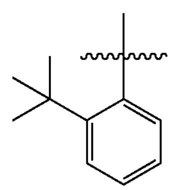
R67
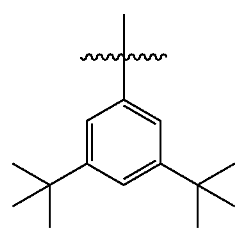
R68
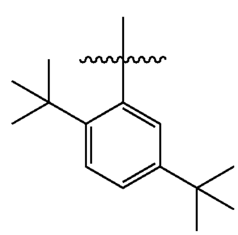

R69
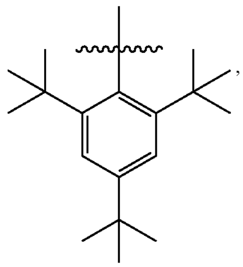
R70
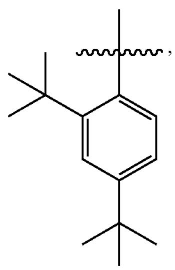
R71
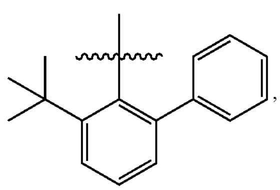
R72
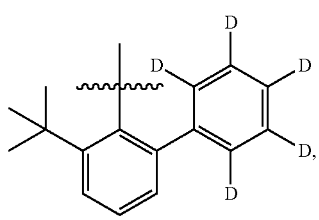
R73
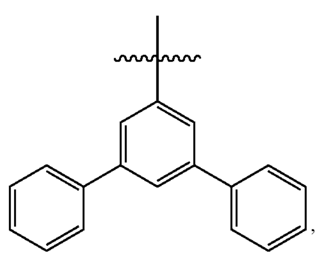
R74
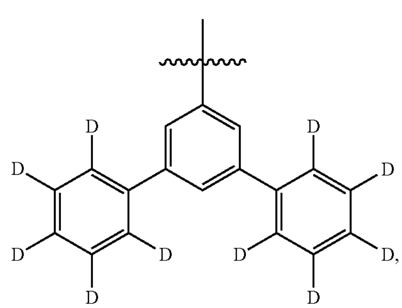
R81
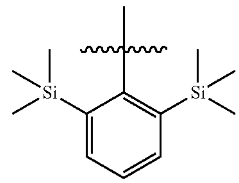
R82
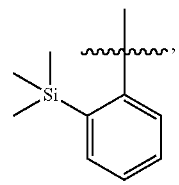
R83
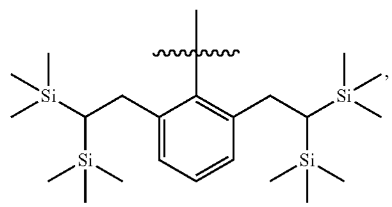
R84
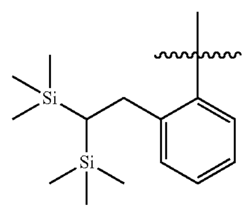
R85
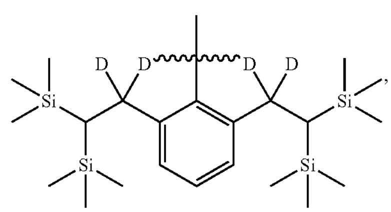
R86
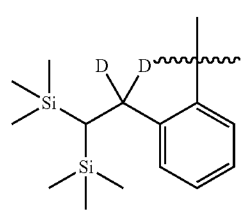
R95
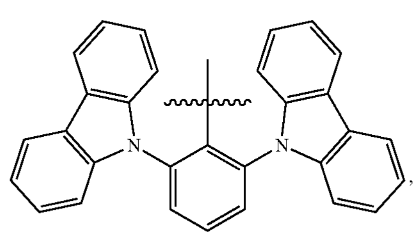
and -continued
R96
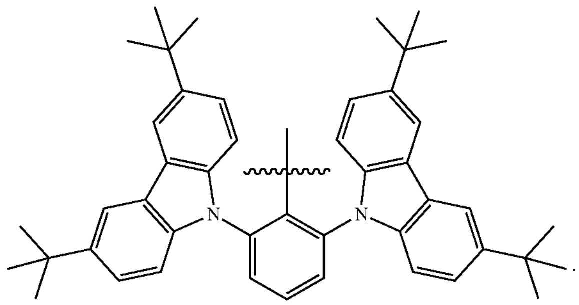
* * * * *